US012777841B2

(12) United States Patent
Ko et al.

(10) Patent No.: US 12,777,841 B2
(45) Date of Patent: Oct. 27, 2026

(54) LIGHT-EMITTING DEVICE AND ELECTRONIC APPARATUS INCLUDING THE LIGHT-EMITTING DEVICE

(71) Applicant: Samsung Display Co., Ltd., Yongin-si (KR)

(72) Inventors: Heejoo Ko, Yongin-si (KR); Changwoong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 919 days.

(21) Appl. No.: 17/990,927

(22) Filed: Nov. 21, 2022

(65) Prior Publication Data

US 2023/0232709 A1 Jul. 20, 2023

(30) Foreign Application Priority Data

Jan. 20, 2022 (KR) ........................ 10-2022-0008523

(51) Int. Cl.

| | |
|---|---|
| ***H10K 50/11*** | (2023.01) |
| ***C09K 11/06*** | (2006.01) |
| ***H10K 85/30*** | (2023.01) |
| ***H10K 85/40*** | (2023.01) |
| ***H10K 85/60*** | (2023.01) |
| *H10K 50/13* | (2023.01) |
| *H10K 101/10* | (2023.01) |
| *H10K 101/30* | (2023.01) |

(52) U.S. Cl.

CPC ............ *H10K 85/654* (2023.02); *C09K 11/06* (2013.01); *H10K 85/346* (2023.02); *H10K 85/40* (2023.02); *H10K 85/6572* (2023.02); *C09K 2211/1044* (2013.01); *C09K 2211/185* (2013.01); *H10K 50/11* (2023.02); *H10K 50/13* (2023.02); *H10K 2101/10* (2023.02); *H10K 2101/30* (2023.02)

(58) Field of Classification Search

None

See application file for complete search history.

(56) References Cited

U.S. PATENT DOCUMENTS

| | | | | |
|---|---|---|---|---|
| 4,539,507 | A | 9/1985 | VanSlyke et al. | |
| 9,184,405 | B2 | 11/2015 | Song et al. | |
| 11,832,510 | B2 * | 11/2023 | Chen | H10K 85/346 |
| 2005/0168137 | A1 * | 8/2005 | Adamovich | H10K 50/11 313/506 |
| 2006/0194076 | A1 | 8/2006 | Nariyuki | |
| 2020/0395557 | A1 * | 12/2020 | Ko | C09K 11/06 |
| 2021/0151691 | A1 | 5/2021 | Yoon et al. | |
| 2021/0151696 | A1 * | 5/2021 | Lee | C09K 11/06 |
| 2021/0171548 | A1 * | 6/2021 | Min | H10K 85/346 |
| 2021/0184135 | A1 | 6/2021 | Kim et al. | |
| 2021/0359226 | A1 * | 11/2021 | Ko | H10K 85/346 |
| 2022/0158096 | A1 * | 5/2022 | Fleetham | C09K 11/06 |
| 2023/0050840 | A1 * | 2/2023 | Yi | H10K 85/342 |
| 2024/0239825 | A1 * | 7/2024 | Li | C07F 15/00 |

FOREIGN PATENT DOCUMENTS

| | | |
|---|---|---|
| CN | 113629215 | 11/2021 |
| EP | 3907772 | 11/2021 |
| JP | 2006-270053 | 10/2006 |
| JP | 2012-124360 | 6/2012 |
| JP | 2021-177547 | 11/2021 |
| KR | 10-2089329 | 3/2020 |
| KR | 10-2021-0059153 | 5/2021 |
| KR | 10-2021-0076220 | 6/2021 |
| KR | 10-2021-0137305 | 11/2021 |

OTHER PUBLICATIONS

Li, Guijie, and Yuanbin She. "Tetradentate cyclometalated platinum (II) complexes for efficient and stable organic light-emitting diodes." Light-Emitting Diode—An Outlook On the Empirical Features and Its Recent Technological Advancements (2018): 77-101. (Year: 2018).*

"Single-layer blue Hyperfluorescence emitters found to be efficient and stable", no author provided, no publication date, internet article. (Year: None) (Year: None).*

An enlarged figure shown in the internet article "Single-layer blue Hyperfluorescence emitters found to be efficient and stable", no author provided, no publication date, internet article. (Year: None).*

(Continued)

*Primary Examiner* — Robert S Loewe

(74) *Attorney, Agent, or Firm* — Womble Bond Dickinson (US) LLP

(57) ABSTRACT

Provided is a light-emitting device which may include a first electrode, a second electrode facing the first electrode, and an interlayer between the first electrode and the second electrode and including an emission layer, wherein the emission layer includes a host and a dopant, the host includes a first compound and a second compound, the dopant includes a third compound and a fourth compound, the first compound, the second compound, the third compound, and the fourth compound are different from each other, the third compound is a platinum-containing organometallic compound, the platinum-containing organometallic compound includes platinum and a first ligand bonded to the platinum, the first ligand includes a carbene group, the carbon of the carbene group and the platinum are bonded together, and Expression 1 is satisfied, which is explained in the specification.

19 Claims, 4 Drawing Sheets

(56) References Cited

OTHER PUBLICATIONS

Hsin-Hung Kuo et al., "Bis-Tridentate Iridium(III) Phosphors with Very High Photostability and Fabrication of Blue-Emitting OLEDs", Adv. Sci. 2018, 5.
Hsin-Hung Kuo et al., "Bis-Tridentate Ir(III) Metal Phosphors for Efficient Deep-Blue Organic Light-Emitting Diodes", Adv. Mater. 2017, 29.
Tyler Fleetham et al., "Development of Tetradentate Pt Complexes for Efficient, Stable, and High Color Purity Blue OLEDs", SID Symposium Digest of Technical Papers, 46(1), 411-414.
Yirang Im et al., "Recent Progress in High-Efficiency Blue-Light-Emitting Materials for Organic Light-Emitting Diodes", Adv. Funct. Mater. 2017, 27.

* cited by examiner

LIGHT-EMITTING DEVICE AND ELECTRONIC APPARATUS INCLUDING THE LIGHT-EMITTING DEVICE

CROSS-REFERENCE TO RELATED APPLICATION(S)

This application claims priority to and benefits of Korean Patent Application No. 10-2022-0008523 under 35 U.S.C. § 119, filed on Jan. 20, 2022 in the Korean Intellectual Property Office, the entire contents of which are incorporated herein by reference.

BACKGROUND

1. Technical Field

Embodiments relate to a light-emitting device and an electronic apparatus including the light-emitting device.

2. Description of the Related Art

In comparison to devices of the related art, light-emitting devices are self-emissive devices which have wide viewing angles, high contrast ratios, short response times, and excellent characteristics in terms of luminance, driving voltage, and response speed, and produce full-color images.

A light-emitting device may have a structure in which a first electrode is arranged on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in such an emission layer region to produce excitons. These excitons transition from an excited state to a ground state to thereby generate light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Provided are a light-emitting device having high efficiency and long lifespan and an electronic apparatus including the light-emitting device.

Additional aspects will be set forth in part in the description which follows and, in part, will be apparent from the description, or may be learned by practice of the embodiments of the disclosure.

According to embodiments, provided is a light-emitting device which may include a first electrode; a second electrode facing the first electrode; and an interlayer between the first electrode and the second electrode and including an emission layer, wherein the emission layer may include a host and a dopant; the host may include a first compound and a second compound; the dopant may include a third compound and a fourth compound; the first compound, the second compound, the third compound, and the fourth compound may be different from each other; the third compound may be a platinum-containing organometallic compound; the platinum-containing organometallic compound may include platinum and a first ligand bonded to the platinum; the first ligand may include a carbene group; carbon of the carbene group and the platinum may be bonded together; and Expression 1 may be satisfied:

$$|HOMO(H1)|-|HOMO(D1)|\leq 0.3\ eV \quad \text{[Expression 1]}$$

In Expression 1,

HOMO(D1) is a highest occupied molecular orbital (HOMO) energy level (eV) of the third compound, HOMO(H1) is a HOMO energy level (eV) of the first compound, and HOMO(D1) and HOMO(H1) are each a negative value evaluated by a density functional theory (DFT) method.

In an embodiment, HOMO(D1) may be less than or equal to about −5.0 eV.

In an embodiment, the light-emitting device may satisfy Expression 2, which is explained below.

In an embodiment, the light-emitting device may satisfy Expression 4, which is explained below.

In an embodiment, the first compound may be a hole transporting host, and the second compound may be an electron transporting host or a bipolar host.

In an embodiment, the first compound may include at least one of groups represented by Formulae 3-1 to 3-3, and the second compound may include at least one π electron-deficient nitrogen-containing $C_1$-$C_{60}$ cyclic group, wherein Formulae 3-1 to 3-3 are explained below.

In an embodiment, the first compound may be a compound including at least one Si atom.

In an embodiment, the second compound may be a compound represented by Formula 4, which is explained below.

In an embodiment, the third compound may be an organometallic compound represented by Formula 1, and the fourth compound is an organometallic compound represented by Formula 2, wherein Formulae 1 and 2 are explained below.

In an embodiment, in Formula 1, n11 may be 1, and n12 may be 0.

In an embodiment, in Formula 1D, a4 may be 0, and a group represented by

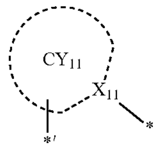

may be a group represented by one of Formulae CY11-1 to CY11-8, which are explained below.

In an embodiment, the third compound may be a compound represented by Formula 1-1 or Formula 1-2, and the fourth compound may be a compound represented by Formula 2-1 or Formula 2-2, wherein Formulae 1-1, 1-2, 2-1, and 2-2 are explained below.

In an embodiment, in Formulae 1-1 and 1-2, $R_{11a}$ and at least one of $R_{14a}$ to $R_{14d}$ may each independently be an electron-donating group; in Formulae 2-1 and 2-2, $R_{21a}$ and at least one of $R_{23a}$, $R_{23b}$, $R_{24a}$ to $R_{24d}$, and $R_{25a}$ to $R_{25d}$ may each independently be an electron-donating group; and the electron-donating group may be an iso-propyl group, a tert-butyl group, or a group represented by one of Formulae 10-1 to 10-124, which are explained below.

In an embodiment, the light-emitting device may further include a capping layer on the second electrode, wherein the capping layer may have a refractive index equal to or greater than about 1.6, with respect to a wavelength of about 589 nm.

In an embodiment, the emission layer may include a mixture of the first compound, the second compound, the third compound, and the fourth compound.

In an embodiment, the emission layer comprises a first emission layer and a second emission layer; the first emission layer may be between the first electrode and the second emission layer; the first emission layer may include the first compound, the second compound, and a first dopant; the second emission layer may include the first compound, the second compound, and a second dopant; the first dopant may be one of the third compound and the fourth compound; and the second dopant may be the other from among the third compound and the fourth compound.

In an embodiment, the emission layer may include a first emission layer, a second emission layer, and a third emission layer; the first emission layer may be between the first electrode and the second emission layer; the second emission layer may be between the first electrode and the third emission layer; the first emission layer may include the first compound, the second compound, and a first dopant; the second emission layer may include the first compound, the second compound, and a second dopant; the third emission layer may include the first compound, the second compound, and a third dopant; the first dopant and the third dopant may each independently be the third compound or the fourth compound; and the second dopant may be the third compound or the fourth compound and may be different from the first dopant.

In an embodiment, at least one of the third compound and the fourth compound may be non-uniformly doped in the emission layer.

According to embodiments, provided is a light-emitting device which may include a first electrode, a second electrode facing the first electrode, and an interlayer arranged between the first electrode and the second electrode and including an emission layer, wherein the emission layer may include a host and a dopant; the host may include a first compound and a second compound; the dopant may include a third compound and a fourth compound; the first compound, the second compound, the third compound, and the fourth compound may be different from each other; the third compound may be a platinum-containing organometallic compound; the platinum-containing organometallic compound may include platinum and a first ligand bonded to the platinum; the first ligand may include a carbene group; carbon of the carbene group and the platinum may be bonded together; and Expression 4 may be satisfied:

$$0.05\ eV \leq |HOMO(D1) - HOMO(D2)| \leq 0.15\ eV \quad \text{[Expression 4]}$$

In Expression 4,

HOMO(D1) is a highest occupied molecular orbital (HOMO) energy level (eV) of the third compound, HOMO(D2) is a HOMO energy level (eV) of the fourth compound, and HOMO(D1) and HOMO(D2) are each a negative value evaluated by a DFT method.

According to embodiments, provided is an electronic apparatus which may include the light-emitting device and a thin-film transistor, wherein the thin-film transistor may include a source electrode and a drain electrode, and the first electrode of the light-emitting device may be electrically connected to the source electrode or the drain electrode.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will be more apparent by describing in detail embodiments thereof with reference to the accompanying drawings, in which.

DETAILED DESCRIPTION OF THE EMBODIMENTS

Figure 1:
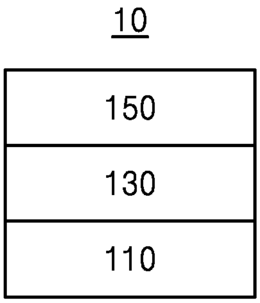
FIG. 1 is a schematic cross-sectional view of a structure of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B"

may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within +20%, 10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

According to embodiments, provided is a light-emitting device which may include:

a first electrode;

a second electrode facing the first electrode; and an interlayer between the first electrode and the second electrode and including an emission layer, wherein the emission layer may include a host and a dopant, the host may include a first compound and a second compound, the dopant may include a third compound and a fourth compound, the first compound, the second compound, the third compound, and the fourth compound may be different from each other, the third compound may be a platinum-containing organometallic compound, the platinum-containing organometallic compound may include platinum and a first ligand bonded to the platinum, the first ligand may include a carbene group, the carbon of the carbene group and the platinum may be bonded together, and Expression 1 may be satisfied:

$$|HOMO(H1)|-|HOMO(D1)|\leq 0.3\text{ eV} \quad \text{[Expression 1]}$$

In Expression 1,

HOMO(D1) may be a highest occupied molecular orbital (HOMO) energy level (eV) of the third compound, HOMO(H1) may be a HOMO energy level (eV) of the first compound, and HOMO(D1) and HOMO(H1) may each be a negative value.

For example, HOMO(D1) and HOMO(H1) may each be evaluated by a density functional theory (DFT) method. For example, HOMO(D1) and HOMO(H1) may each be evaluated using the DFT method of the Gaussian program, which is structure-optimized at the B3LYP/6-31 G(d,p) level. HOMO(D2) and HOMO(H2) are each also a negative value. For example, HOMO(D2) and HOMO(H2) may each be evaluated by DFT method, and may each be evaluated in a same manner as used to evaluate HOMO(D1) and HOMO (H1).

According to Expression 1, a HOMO energy level of the first compound has a smaller negative value than that of a HOMO energy level of the third compound, and a difference between an absolute value of the HOMO energy level of the first compound and an absolute value of the HOMO energy level of the third compound may be less than or equal to 0.3 eV. Thus, the HOMO energy level of the third compound is shallower by, at most, 0.3 eV than the HOMO energy level of the first compound In the light-emitting device according to embodiment, the emission layer includes two different hosts (the first compound and the second compound), and thus, hole-electron balance in the emission layer may be improved. In the light-emitting device, the third compound improves luminescence efficiency of the light-emitting device, and the fourth compound improves lifespan of the light-emitting device. Furthermore, in the light-emitting device, the HOMO energy level of the third compound is shallower by, at most, 0.3 eV than the HOMO energy level of the first compound, and thus, hole traps may be eliminated and driving voltage may decrease. Accordingly, the light-emitting device (for example, an organic light-emitting device) may have significantly improved characteristics in terms of driving voltage, luminescence efficiency, and lifespan.

In an embodiment, the first ligand may be a tetradentate ligand.

In an embodiment, a bond between the carbon of the carbene group of the first ligand and the platinum may be a coordinate bond.

In an embodiment, the first ligand may be a ligand represented by Formula 1 D in the specification.

In an embodiment, the fourth compound may be a platinum-containing organometallic compound, the platinum-containing organometallic compound may include platinum and a second ligand bonded to the platinum, the second ligand may include a carbene group, and the carbon of the carbene group and the platinum may be bonded together.

In an embodiment, the second ligand may be a tetradentate ligand.

In an embodiment, a bond between the carbon of the carbene group of the second ligand and the platinum may be a coordinate bond.

In an embodiment, the second ligand may be a ligand represented by Formula 1 D in the specification.

In an embodiment, the light-emitting device may satisfy Expression 2:

$$|HOMO(H1)-HOMO(H2)|\leq 0.5\text{ eV} \qquad \text{[Expression 2]}$$

In Expression 2, HOMO(H1) may be a HOMO energy level (eV) of the first compound, and HOMO(H2) may be a HOMO energy level (eV) of the second compound. In Expression 2, HOMO(H1) and HOMO(H2) may each be a negative value. For example, HOMO(H1) and HOMO(H2) may each be evaluated by a density functional theory (DFT) method, as described herein.

According to Expression 2, an absolute value of a difference between a HOMO energy level of the first compound and a HOMO energy level of the second compound is less than or equal to 0.5 eV. Accordingly, hole leakage may be controlled, or hole current may increase.

In an embodiment, the light-emitting device may satisfy Expression 3:

$$|HOMO(H2)|-|HOMO(H1)|\leq 0.5\text{ eV} \qquad \text{[Expression 3]}$$

In Expression 3, HOMO(H2) may be a HOMO energy level (eV) of the second compound, and HOMO(H1) may be a HOMO energy level (eV) of the first compound.

According to Expression 3, a HOMO energy level of the second compound has a smaller negative value than that of a HOMO energy level of the first compound, and a difference between an absolute value of the HOMO energy level of the second compound and an absolute value of the HOMO energy level of the first compound is less than or equal to 0.5 eV. Thus, the HOMO energy level of the first compound is shallower by, at most, 0.5 eV than the HOMO energy level of the second compound. Accordingly, exciton confinement via hole leakage control may be achieved.

In an embodiment, HOMO(D1) may be less than or equal to about −5.0 eV. For example, HOMO(D1) may be in a range of about −5.3 eV to about −5.0 eV. For example, HOMO(D1) may be in a range of about −5.2 eV to about −5.0 eV. For example, HOMO(D1) may be in a range of about −5.15 eV to about −5.0 eV. For example, HOMO(D1) may be in a range of about −5.1 eV to about −5.0 eV.

In an embodiment, HOMO(D2) may be greater than or equal to about −5.0 eV. For example, HOMO(D2) may be in a range of about −5.0 eV to about −4.90 eV. For example, HOMO(D2) may be in a range of about −5.0 eV to about −4.89 eV.

In an embodiment, the light-emitting device may satisfy Expression 4:

$$0.05\text{ eV}\leq|HOMO(D1)-HOMO(D2)|\leq 0.15\text{ eV} \qquad \text{[Expression 4]}$$

In Expression 4, HOMO(D1) may be a HOMO energy level (eV) of the third compound, and HOMO(D2) is a HOMO energy level (eV) of the fourth compound. In Expression 4, HOMO(D1) and HOMO(D2) may each be a negative value. For example, HOMO(D1) and HOMO(D2) may each be evaluated by a density functional theory (DFT) method, as described herein.

In other words, an absolute value of a difference between a HOMO energy level of the third compound and a HOMO energy level of the fourth compound may be in a range of 0.05 eV to 0.15 eV. Accordingly, deterioration of a dopant may be reduced by eliminating hole traps and overcrowding of excitons. In an embodiment, when each of the third compound and the fourth compound is a transition metal-containing organometallic compound including a transition metal and a ligand, a difference in the HOMO energy level may be adjusted by adjusting the type and/or bonding position of a substituent bonded to the ligand of each compound. In an embodiment, a difference between a HOMO energy level of the third compound and a HOMO energy level of the fourth compound may be in a range of about 0.07 eV to about 0.15 eV. For example, the difference between a HOMO energy level of the third compound and a HOMO energy level of the fourth compound may be in a range of about 0.09 eV to about 0.15 eV. For example, the difference between a HOMO energy level of the third compound and a HOMO energy level of the fourth compound may be in a range of about 0.11 eV to about 0.15 eV.

In an embodiment, a y coordinate of a CIE color coordinates of light emitted from the emission layer of the light-emitting device may be in a range of 0.045 to 0.06. Therefore, the light-emitting device may emit blue light having high color purity.

In the specification, the CIE color coordinates indicate x, y, and z coordinates of light according to the CIE 1931 color space.

According to embodiments, provided is a light-emitting device which may include:

a first electrode;

a second electrode facing the first electrode; and an interlayer between the first electrode and the second electrode and including an emission layer, wherein the emission layer may include a host and a dopant, the host may include a first compound and a second compound, the dopant may include a third compound and a fourth compound, the first compound, the second compound, the third compound, and the fourth compound may be different from each other, the third compound may be a platinum-containing organometallic compound, the platinum-containing organometallic compound may include platinum and a first ligand bonded to the platinum, the first ligand may include a carbene group, the carbon of the carbene group and the platinum may be bonded together, and Expression 4 may be satisfied.

According to embodiments, provided is a light-emitting device which may include:

a first electrode;

a second electrode facing the first electrode; and an interlayer between the first electrode and the second electrode and including an emission layer, wherein the emission layer may include a host and a dopant, the dopant may include a third compound and a fourth compound, the third compound and the fourth compound may be different from each other, the third compound may be a platinum-containing organometallic compound, the platinum-containing organometallic compound may include platinum and a first ligand bonded to the platinum, the first ligand may include a carbene group, the carbon of the carbene group and the platinum may be bonded together, and Expression 4 may be satisfied.

The first compound to the fourth compound are respectively the same as described herein.

Description of First Compound and Second Compound

In an embodiment, the first compound and the second compound may be hosts transporting charges (holes or electrons) having different characteristics.

In an embodiment, the first compound may be a hole transporting host, and the second compound may be an electron transporting host or a bipolar host.

In an embodiment, the first compound may include at least one of groups represented by Formulae 3-1 to 3-3; and the second compound may include at least one π electron-deficient nitrogen-containing $C_1$-$C_{60}$ cyclic group:

3-1

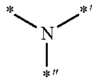

3-2

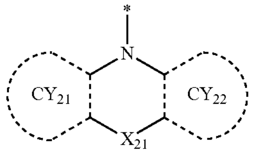

-continued 3-3

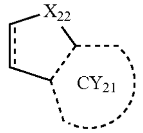

In Formulae 3-1 to 3-3, ring $CY_{21}$ and ring $CY_{22}$ may each independently be a π electron-rich $C_3$-$C_{60}$ cyclic group or a pyridine group, $X_{21}$ may be a single bond, or a linking group including O, S, N, B, C, Si, or any combination thereof, $X_{22}$ may be a linking group including O, S, N, B, C, Si, or any combination thereof,

 in Formula 3-3 may indicate a single bond or a double bond, and

*, *', and *" may each indicate a binding site to a neighboring atom in the first compound.

The term "π electron-rich $C_3$-$C_{60}$ cyclic group" may be a carbocyclic group or heterocyclic group that has three to sixty carbon atoms and may not include *—N=*' as a ring-forming moiety, and may be the same as described herein.

[First Compound]

The first compound may be a compound including at least one hole transporting moiety. In an embodiment, the hole transporting moiety may include an amine group, a carbazole group, a dibenzofuran group, a dibenzothiophene group, or a fluorene group, but is not limited thereto.

In an embodiment, the first compound may be a compound represented by one of Formulae 3-11 to 3-16:

[Formula 3-11]

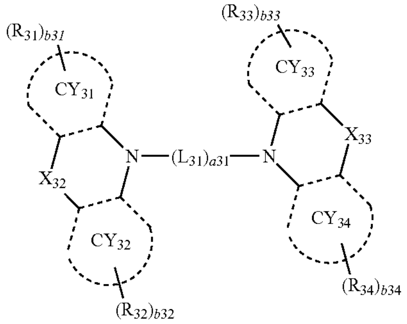

[Formula 3-12]

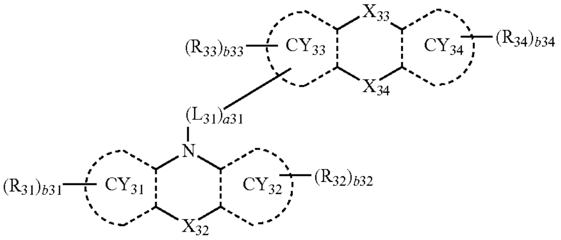

[Formula 3-13]

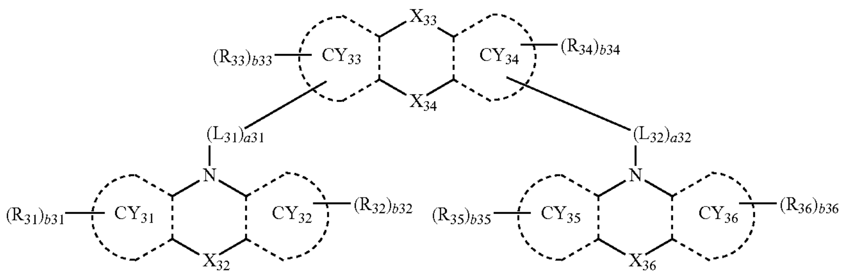

-continued

[Formula 3-14]

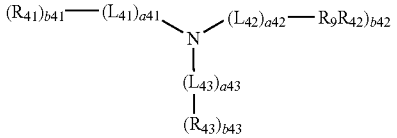

[Formula 3-15]

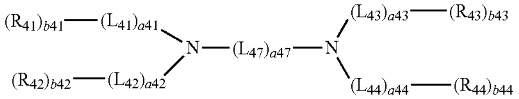

[Formula 3-16]

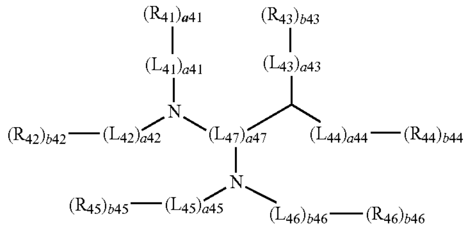

In Formulae 3-11 and 3-13, $CY_{31}$ to $CY_{36}$ may each independently be a π electron-rich $C_3$-$C_{60}$ cyclic group or a pyridine group, $X_{32}$ may be a single bond, O, S, N-[$(L_{62})_{a62}$-$(R_{62})_{b62}$], $C(R_{62a})(R_{62b})$, or $Si(R_{62a})(R_{62b})$, $X_{33}$ may be a single bond, O, S, N-[$(L_{63})_{a63}$-$(R_{63})_{b63}$], $C(R_{63a})(R_{63b})$, or $Si(R_{63a})(R_{63b})$, $X_{34}$ may be a single bond, O, S, N-[$(L_{64})_{a64}$-$(R_{64})_{b64}$], $C(R_{64a})(R_{64b})$, or $Si(R_{64a})(R_{64b})$, and $X_{36}$ may be a single bond, O, S, N-[$(L_{66})_{a66}$-$(R_{66})_{b66}$], $C(R_{66a})(R_{66b})$, or $Si(R_{66a})(R_{66b})$, $L_{31}$, $L_{32}$, $L_{41}$ to $L_{47}$, $L_{62}$ to $L_{64}$, and $L_{66}$ may each independently be a single bond, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, a31, a32, a41 to a47, a62 to a64, and a66 may each independently be an integer from 1 to 5, $R_{31}$ to $R_{36}$, $R_{41}$ to $R_{46}$, $R_{62}$ to $R_{64}$, $R_{66}$, $R_{62a}$, $R_{62b}$, $R_{63a}$, $R_{63b}$, $R_{64a}$, $R_{64b}$, $R_{66a}$, and $R_{66b}$ may each independently be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, b31 to b36, b41 to b46, b62 to b64, and b66 may each independently be an integer from 1 to 10, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{11})(Q_{12})(Q_{13})$, $—N(Q_{11})(Q_{12})$, $—B(Q_{11})(Q_{12})$, $—C(=O)(Q_{11})$, $—S(=O)_2(Q_{11})$, $—P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, $—Si(Q_{21})(Q_{22})(Q_{23})$, $—N(Q_{21})(Q_{22})$, $—B(Q_{21})(Q_{22})$, $—C(=O)(Q_{21})$, $—S(=O)_2(Q_{21})$, $—P(=O)(Q_{21})(Q_{22})$, or any combination thereof; or $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, in Formulae 3-11 to 3-13, $CY_{31}$ to $CY_{36}$ may each independently be a benzene group, a naphthalene group, an anthracene group, a phenanthrene group, a fluoranthene group, a triphenylene group, a pyrene group, a chrysene group, an indene group, a fluorene group, a spiro-bifluorene group, a benzofluorene group, a dibenzofluorene group, a carbazole group, a benzocarbazole group, a dibenzocarbazole group, a dibenzosilole group, a dibenzofuran group, or a dibenzothiophene group.

In an embodiment, $CY_{31}$ to $CY_{36}$ may each independently be a benzene group, a naphthalene group, a phenanthrene group, a fluorene group, a carbazole group, a dibenzosilole group, a dibenzofuran group, or a dibenzothiophene group.

In an embodiment, in Formulae 3-11 to 3-16, $L_{31}$, $L_{32}$, $L_{41}$ to $L_{47}$, $L_{62}$ to $L_{64}$, and $L_{66}$ may each independently be a single bond or a substituted or unsubstituted π electron-rich cyclic group having 3 to 30 carbon atoms.

In an embodiment, $L_{31}$, $L_{32}$, $L_{41}$ to $L_{47}$, $L_{62}$ to $L_{64}$, and $L_{66}$ may each independently be:

a single bond, a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an iso-indole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, or a dihydroacridine group; or a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a coronene group, an ovalene group, a pyrrole group, an iso-indole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, or a dihydroacridine group, each substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, or any combination thereof.

In Formulae 3-11 to 3-16, a31, a32, a41 to a47, a62 to a64, and a66 respectively indicate the numbers of $L_{31}$, $L_{32}$, $L_{41}$ to $L_{47}$, $L_{62}$ to $L_{64}$, and $L_{66}$, and may each independently be an integer from 1 to 5.

In an embodiment, in Formulae 3-11 to 3-16, $R_{31}$ to $R_{36}$, $R_{41}$ to $R_{46}$, $R_{62}$ to $R_{64}$, $R_{66}$, $R_{62a}$, $R_{62b}$, $R_{63a}$, $R_{63b}$, $R_{64a}$, $R_{64b}$, $R_{66a}$, and $R_{66b}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $P(=O)(Q_1)(Q_2)$, and $Q_1$ to $Q_3$ and $Q_{31}$ to $Q_{33}$ may each independently be:

hydrogen, deuterium, $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, in Formulae 3-11 to 3-16, $R_{41}$ to $R_{46}$ and $R_{62}$ to $R_{64}$ may each independently be hydrogen, a substituted or unsubstituted monovalent π electron-rich cyclic group, $—Si(Q_1)(Q_2)(Q_3)$, or $—N(Q_1)(Q_2)$, and $Q_1$ to $Q_3$ may each independently be hydrogen, deuterium, a $C_1$-$C_{10}$ alkyl group, a $C_1$-$C_{10}$ alkoxy group, a π electron-rich cyclic group, a biphenyl group, or a terphenyl group.

In an embodiment, in Formulae 3-11 to 3-16, $R_{41}$ to $R_{46}$ and $R_{62}$ to $R_{64}$ may each independently be:

a phenyl group, a biphenyl group, a terphenyl group, a tetraphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, an isoindolyl group, an indolyl group, a furanyl group, a thiophenyl group, a benzofuranyl group, a benzothiophenyl group, a benzosilolyl group, a dibenzofuranyl group, a dibenzothiophenyl group, a carbazolyl group, a benzocarbazolyl group, a dibenzocarbazolyl group, a dibenzosilolyl group, an indenocarbazolyl group, an indolocarbazolyl group, a benzofurocarbazolyl group, a benzothienocarbazolyl group, a benzosilolocarbazolyl group, an acridinyl group, or a dihydroacridinyl group;

a phenyl group, a biphenyl group, a terphenyl group, a tetraphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, an isoindolyl group, an indolyl group, a furanyl group, a thiophenyl group, a benzofuranyl group, a benzothiophenyl group, a benzosilolyl group, a dibenzofuranyl group, a dibenzothiophenyl group, a carbazolyl group, a benzocarbazolyl group, a dibenzocarbazolyl group, a dibenzosilolyl group, an indenocarbazolyl group, an indolocarbazolyl group, a benzofurocarbazolyl group, a benzothienocarbazolyl group, a benzosilolocarbazolyl group, an acridinyl group, and a dihydroacridinyl group, each substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, or any combination thereof; or $—Si(Q_1)(Q_2)(Q_3)$ or $—N(Q_1)(Q_2)$, and $Q_1$ to $Q_3$ may each independently be hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, or a terphenyl group.

In an embodiment, the first compound may be a compound including at least one Si atom. In an embodiment, the first compound may include a silane group (for example, an alkylsilane group, an arylsilane group, etc.), and thus, may have bipolar characteristics.

In an embodiment, the first compound may be selected from the following compounds, but is not limited thereto:

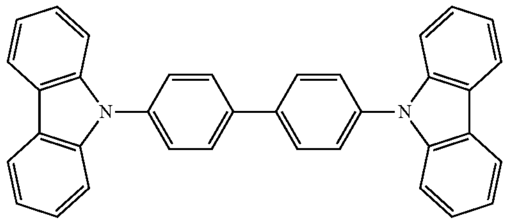

CBP

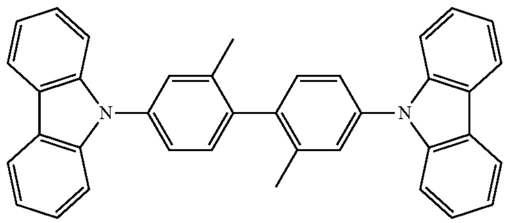

CDBP

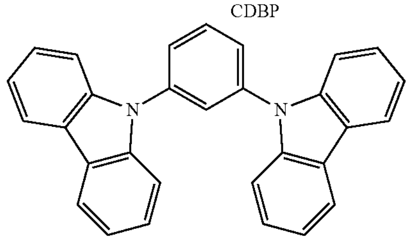

mCP

-continued
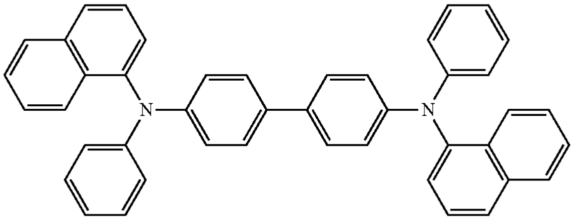
NPB
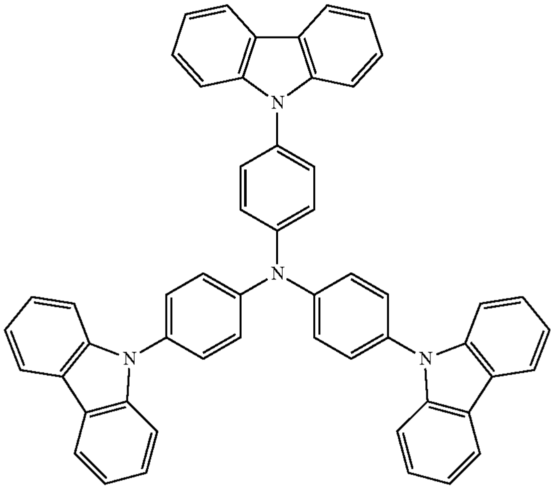
TCTA
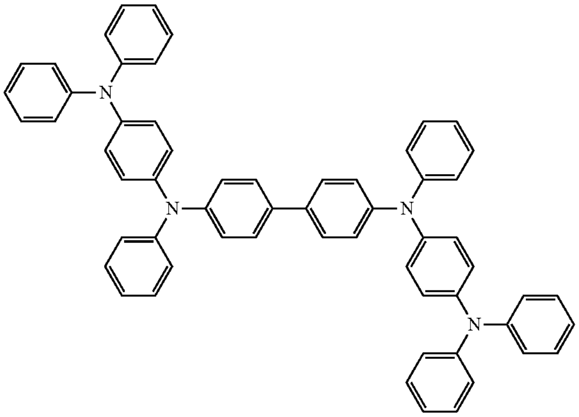
NPNPB
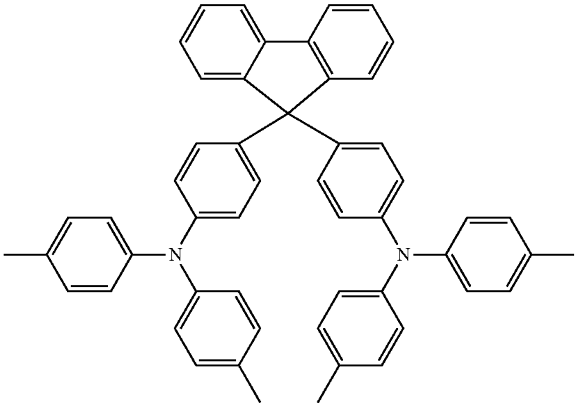
DTAF
-continued
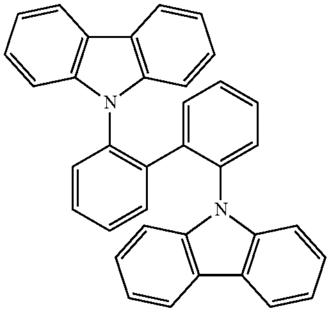
oCBP
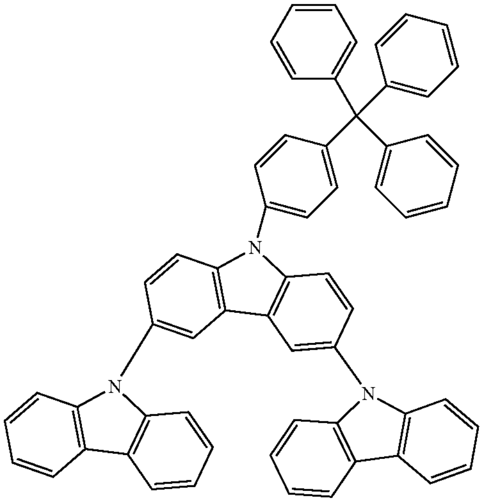
HT host1
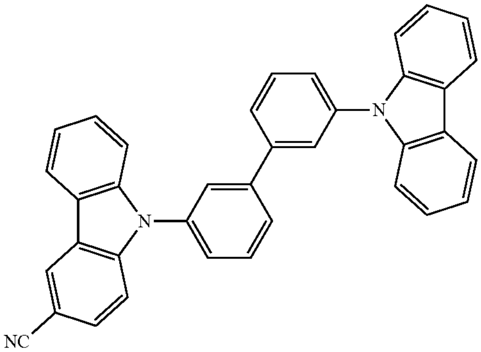
HT host2
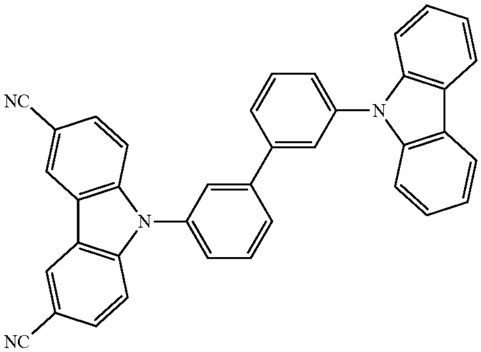
HT host3

-continued

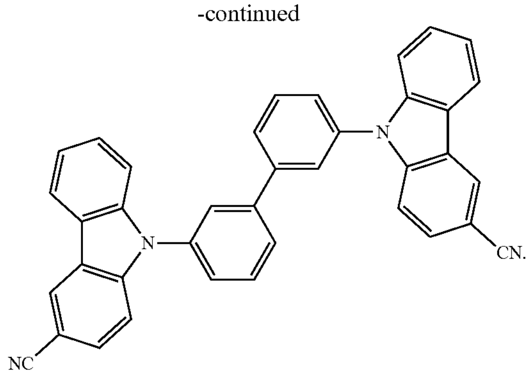

HT host4

[Second Compound]

The second compound may include at least one electron transporting moiety. In an embodiment, the electron transporting moiety may include —F, a cyano group, a $C_1$-$C_{60}$ alkyl group that is substituted with —F or a cyano group, a $C_6$-$C_{60}$ aryl group that is substituted with —F or a cyano group, or a π electron-deficient nitrogen-containing cyclic group, but is not limited thereto.

In an embodiment, the second compound may be a bipolar host including at least one hole transporting moiety and at least one electron transporting moiety. In an embodiment, the hole transporting moiety may include an amine group, a carbazole group, a dibenzofuran group, a dibenzothiophene group, or a fluorene group, and the electron transporting moiety may include —F, a cyano group, a $C_1$-$C_{60}$ alkyl group that is substituted with —F or a cyano group, a $C_6$-$C_{60}$ aryl group that is substituted with —F or a cyano group, or a π electron-deficient nitrogen-containing cyclic group, but is not limited thereto.

In an embodiment, the second compound may be a compound represented by Formula 4:

[Formula 4]

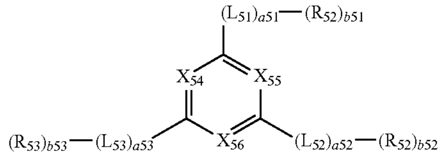

In Formula 4, $X_{54}$ may be N or $C[(L_{54})_{a54}$-$(R_{54})_{b54}]$, $X_{55}$ may be N or $C[(L_{55})_{a55}$-$(R_{55})_{b55}]$, $X_{56}$ may be N or $C[(L_{56})_{a56}$-$(R_{56})_{b56}]$, and at least one of $X_{54}$ to $X_{56}$ may be N, $L_{51}$ to $L_{56}$ may each independently be a single bond, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, a51 to a56 may each independently be an integer from 1 to 5, $R_{51}$ to $R_{56}$ may each independently be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b51 to b56 may each independently be an integer from 1 to 10, and $R_{10a}$ may be the same as described herein.

In an embodiment, in Formula 4, $L_{51}$ to $L_{56}$ may each independently be: a single bond, a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an iso-benzothiazole group, a benzoxazole group, a benzoisoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, or an azadibenzosilole group; or a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an iso-benzothiazole group, a benzoxazole group, a benzoisoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, and an azadibenzosilole group, each substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a naphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a dibenzofuranyl group, a dibenzothiophenyl group, a carbazolyl group, an imidazolyl group, a pyrazolyl group, a thiazolyl group, an isothiazolyl group, an oxazolyl group, an isoxazolyl group, a pyridinyl group, a pyrazinyl group, a pyridazinyl group, a pyrimidinyl group, an indazolyl group, a purinyl group, a quinolinyl group, an isoquinolinyl group, a benzoquinolinyl group, a benzoisoquinolinyl group, a phthalazinyl group, a naphthyridinyl group, a quinoxalinyl group, a benzoquinoxalinyl group, a quinazolinyl group, a cinnolinyl group, a phenanthridinyl group, a phenanthrolinyl group, a phenazinyl group, a benzoimidazolyl group, a benzoisothiazolyl group, a benzoxazolyl group, an isobenzoxazolyl group, a triazolyl group, a tetrazolyl group, an oxadiazolyl group, a triazinyl group, a thiadiazolyl group, an imidazopyridinyl group, an imidazopyrimidinyl group, an azaindenyl group, an azaindolyl group, an azabenzofuranyl group, an azabenzothiophenyl group, an azabenzosilolyl group, an azafluorenyl group, an azacarbazolyl group, an azadibenzofuranyl group, an azadibenzothiophenyl group, an azadibenzosilolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof, and $Q_{31}$ to $Q_{33}$ may each independently be a $C_1$-$C_{10}$ alkyl group, a $C_1$-$C_{10}$ alkoxy group, a phenyl group, a phenyl group that is substituted with a $C_1$-$C_{10}$ alkyl group, a biphenyl group, a terphenyl group, or a naphthyl group.

In an embodiment, in Formula 4, a51 to a56 may each independently be 1, 2, or 3.

In an embodiment, in Formula 4, $R_{51}$ to $R_{56}$ may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $-Si(Q_{31})(Q_{32})(Q_{33})$, $-N(Q_{31})(Q_{32})$, $-B(Q_{31})(Q_{32})$, $-P(Q_{31})(Q_{32})$, $-C(=O)(Q_{31})$, $-S(=O)_2(Q_{31})$, $-P(=O)(Q_{31})(Q_{32})$, or any combination thereof; or $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, or $P(=O)(Q_1)(Q_2)$, and $Q_1$ to $Q_3$ and $Q_{31}$ to $Q_{33}$ may each independently be:

hydrogen, deuterium, $-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, or $-CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, in Formula 4, b51 to b56 may each independently be an integer from 1 to 5.

In an embodiment, in Formula 4, at least one of $R_{51}$(s) in the number of b51 and $R_{52}$(s) in the number of b52 may be $-Si(Q_1)(Q_2)(Q_3)$, and $Q_1$ to $Q_3$ may each independently be hydrogen, deuterium, a $C_1$-$C_{10}$ alkyl group, a $C_1$-$C_{10}$ alkoxy group, a phenyl group, a phenyl group that is substituted with a $C_1$-$C_{10}$ alkyl group, a naphthyl group, a fluorenyl group, a carbazolyl group, a dibenzofuranyl group, a dibenzothiophenyl group, a triphenylenyl group, a biphenyl group, or a terphenyl group.

In an embodiment, the second compound may include a silane group (for example, an alkylsilane group, an arylsilane group, etc.). Accordingly, intramolecular bond stability may increase.

In an embodiment, the second compound may be selected from the following compounds, but is not limited thereto:

ETH1

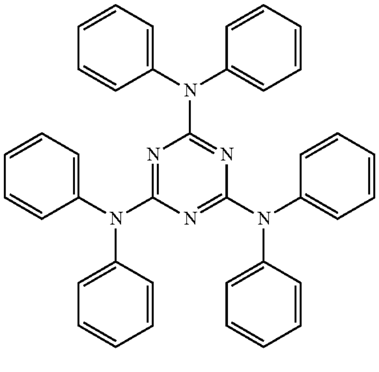

-continued

ETH2

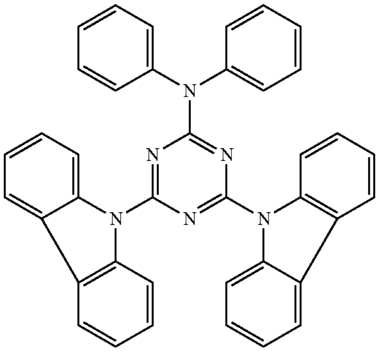

ETH3

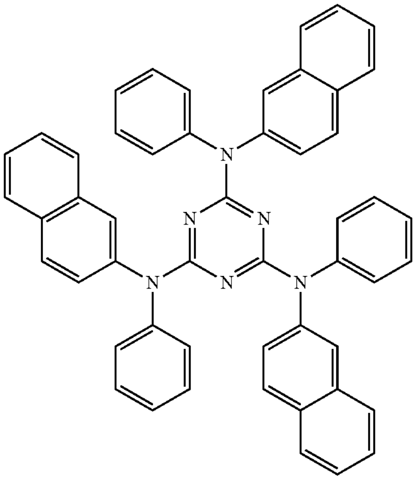

ETH4

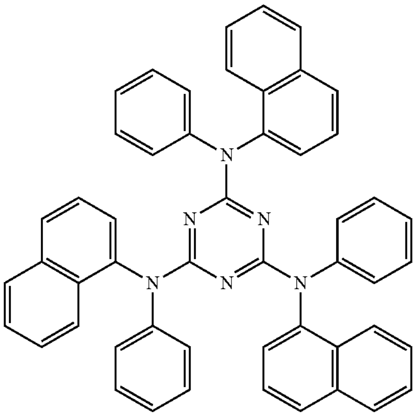

ETH5

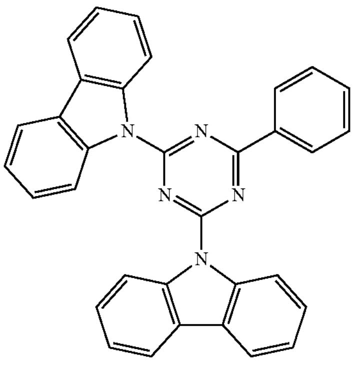

-continued
ETH6
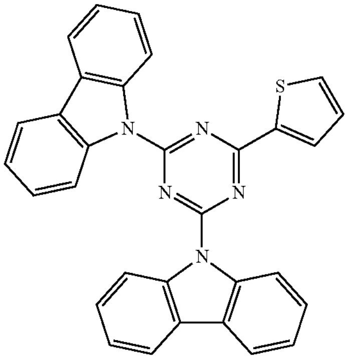
ETH7
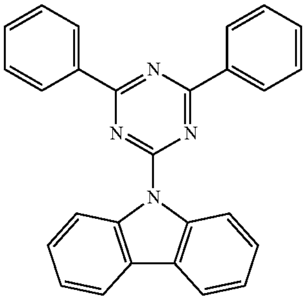
ETH8
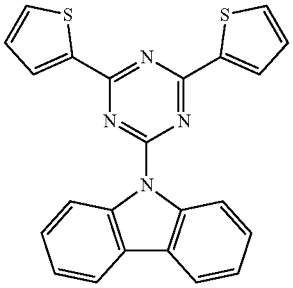
ETH9
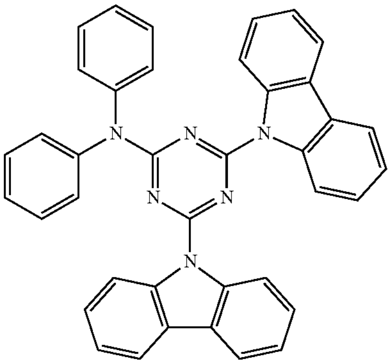
-continued
ETH10
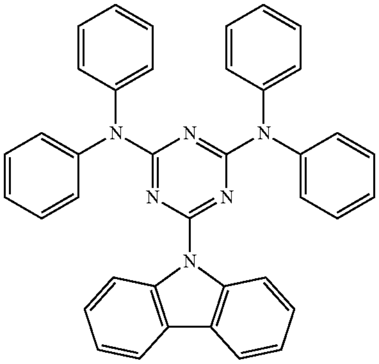
ETH11
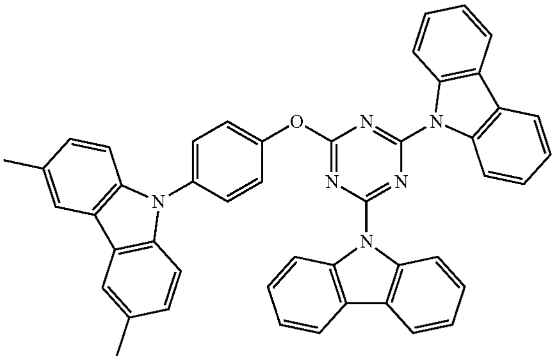
ETH12
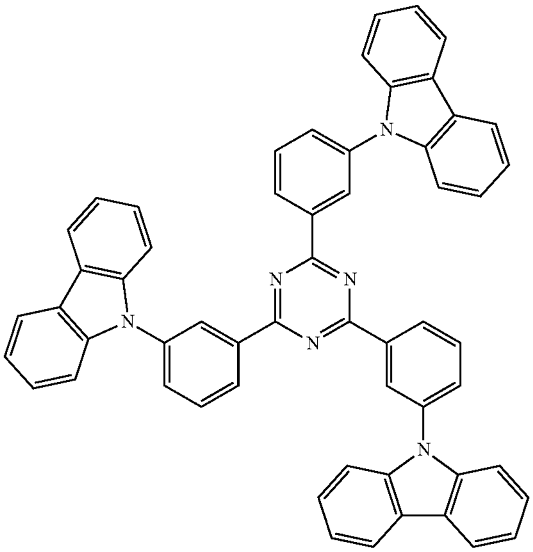

ETH13
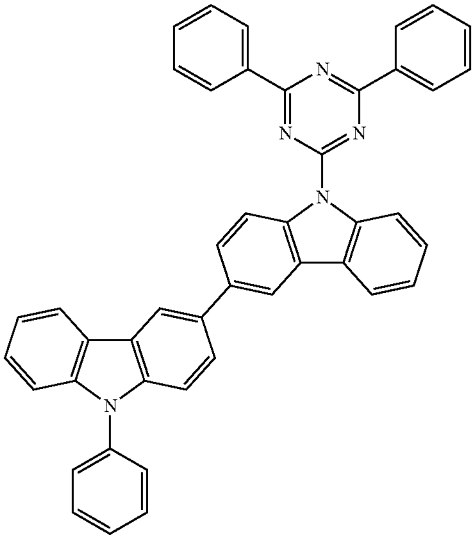
ETH14
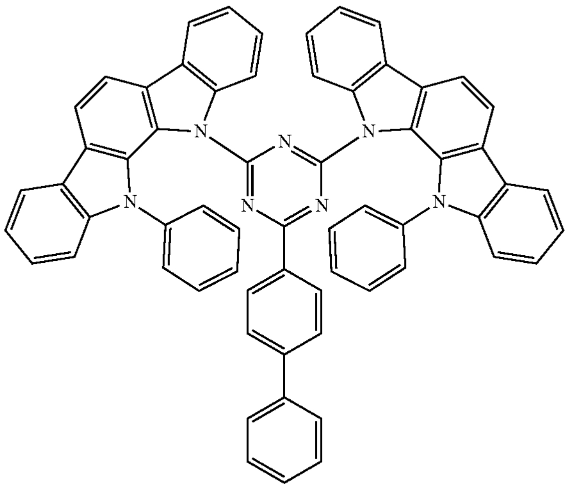
ETH15
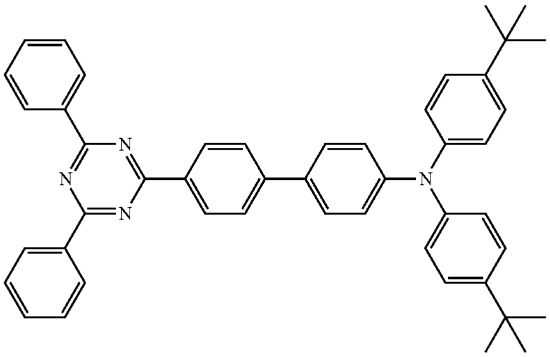
ETH16
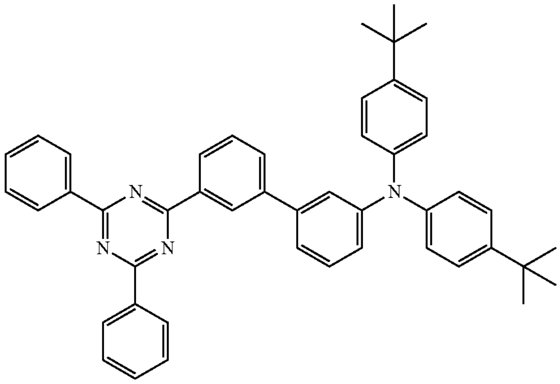
ETH17
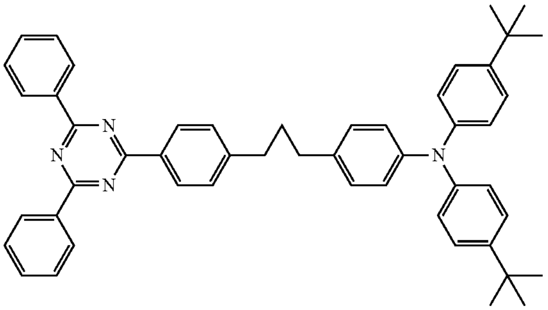
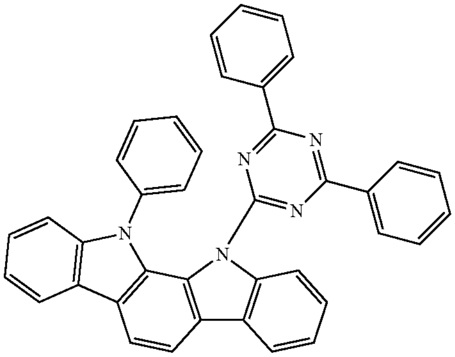
DIC-TRZ
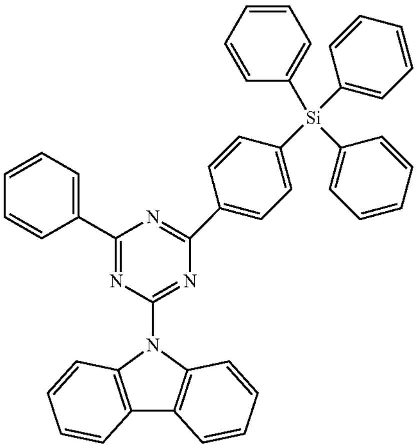
ET host1

-continued

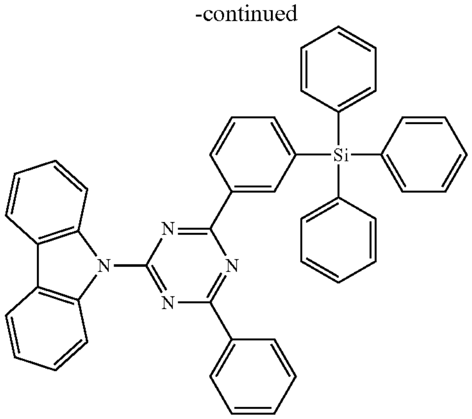

ET host2

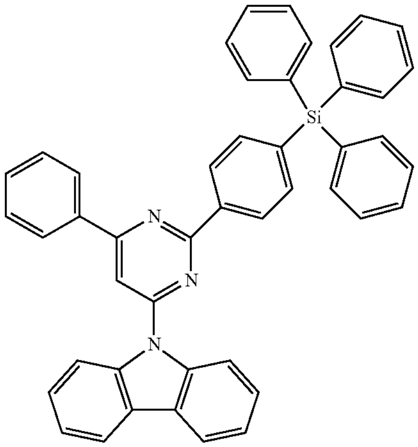

ET host3

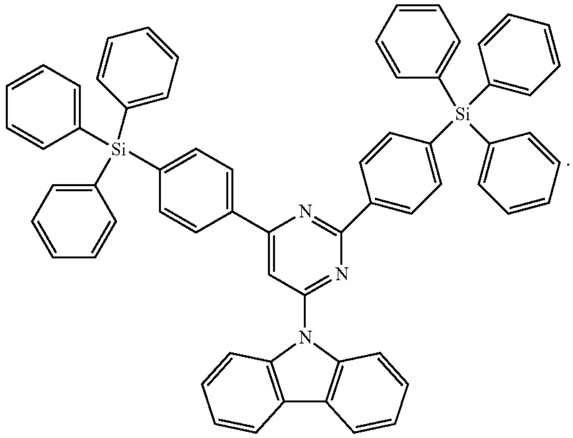

ET host4

The light-emitting device includes mixed hosts of the first compound and the second compound. Accordingly, compared to a light-emitting device including a single host, charge balance of the emission layer may be improved. In an embodiment, when the first compound and the second compound are hosts transporting charges (e.g., holes or electrons) having different characteristics, driving characteristics of the light-emitting device may be improved by maintaining the balance of holes and electrons. Thus, the efficiency of the light-emitting device may be improved by optimizing exciton profile in the emission layer.

Description of Third Compound and Fourth Compound

In an embodiment, the third compound may be an organometallic compound represented by Formula 1, and the fourth compound may be an organometallic compound represented by Formula 2:

$$M_1(L_{11})_{n11}(L_{12})_{n12}$$ [Formula 1]

$$M_2(L_{21})_{n21}(L_{22})_{n22}$$ [Formula 2]

1A

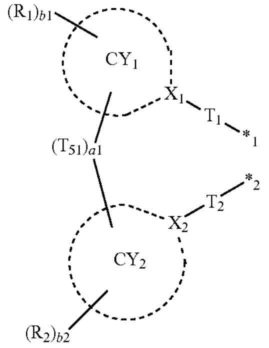

1B

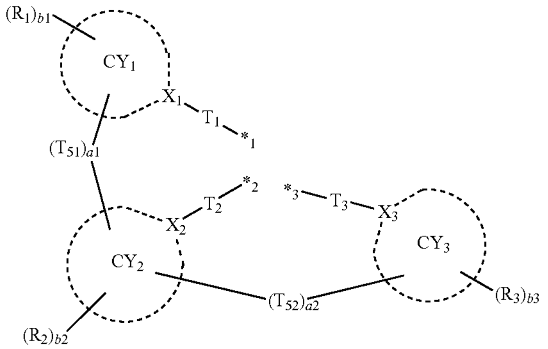

1C

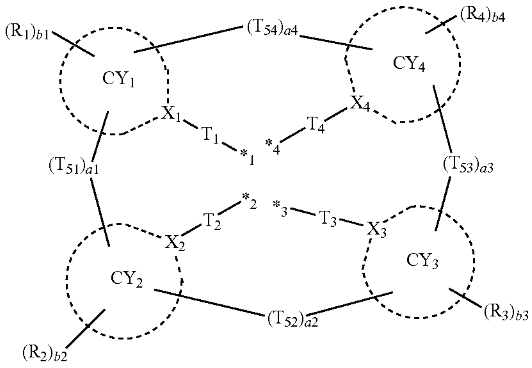

-continued

1D

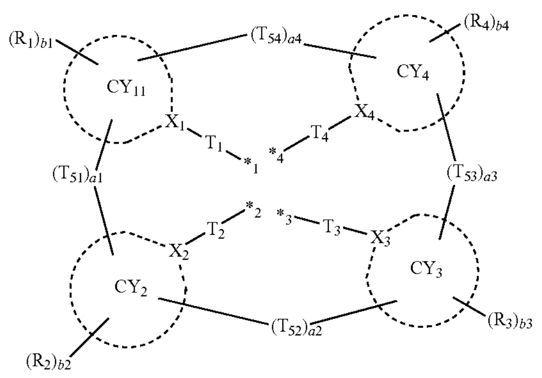

In Formulae 1, 2, and 1A to 1D, $M_1$ may be platinum (Pt), $M_2$ may be platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $L_{11}$ may be a ligand represented by Formula 1D, $L_{12}$, $L_{21}$, and $L_{22}$ may each independently be a ligand represented by one of Formulae 1A to 1D, n11 and n21 may each independently be 1, 2, or 3, n12 and n22 may each independently be 0, 1, 2, 3, or 4, $X_1$ to $X_4$ may each independently be nitrogen or carbon, $X_{11}$ may be carbon, $CY_1$ to $CY_4$ and $CY_{11}$ may each independently be a $C_5$-$C_{30}$ carbocyclic group or a $C_1$-$C_{30}$ heterocyclic group, $T_{11}$ to $T_{54}$ may each independently be a single bond, *—O—*', *—S—*', *—C(═O)—*' *—S(═O)—*', *—C($R_5$)($R_6$)—*', *—C($R_5$)═C($R_6$)—*', *—C($R_5$)═*', *═C═*', *—Si($R_5$)($R_6$)—*', *—B($R_5$)—*, *—N($R_5$)—*', or *—P($R_5$)—*' a1 to a3 may each independently be 1, 2, or 3, a4 may be 0, 1, 2, or 3, when a4 in Formula 1C is 0, $CY_1$ and $CY_4$ may not be linked together, and when a4 in Formula 1 D is 0, $CY_{11}$ and $CY_4$ may not be linked together, $T_1$ to $T_4$ may each independently be a chemical bond, *—O—*', *—S—*', *—N($R_7$)—*, *—B($R_7$)—*, *—P($R_7$)—*' *—C($R_7$)($R_8$)—*', Si($R_7$)($R_8$)—*, *—C(═O)—*', or *—C(═S)—*', $T_{11}$ may be a coordinate bond, $*_1$, $*_2$, $*_3$, and $*_4$ may each indicate a binding site to $M_1$ or $M_2$, $R_1$ to $R_8$ may each independently be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b1 to b4 may each independently be an integer from 0 to 10, two or more adjacent groups of $R_1$ to $R_8$ and $T_{51}$ to $T_{54}$ may optionally be bonded together to form a $C_5$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and $R_{10a}$ and $Q_1$ to $Q_3$ may respectively be the same as described herein.

In an embodiment, in Formula 1, n11 may be 1.

In an embodiment, in Formula 1, n12 may be 0.

In an embodiment, in Formula 1, n11 may be 1, and n12 may be 0.

In an embodiment, in Formula 2, $M_2$ may be platinum, palladium, or iridium. In an embodiment, $M_2$ may be platinum.

In an embodiment, in Formula 2, $L_{21}$ may be a ligand represented by Formula 1C or Formula 1 D. In an embodiment, in Formula 2, $L_{21}$ may be a ligand represented by Formula 1 D.

In an embodiment, in Formula 2, n21 may be 1.

In an embodiment, in Formula 2, n22 may be 0.

In an embodiment, in Formula 2, $M_2$ may be platinum, $L_{21}$ may be a ligand represented by Formula 1C or Formula 1 D, n21 may be 1, and n22 may be 0.

In an embodiment, in Formula 2, $M_2$ may be platinum, $L_{21}$ may be a ligand represented by Formula 1D, n21 may be 1, and n22 may be 0.

In an embodiment, in Formulae 1C and 1 D, $T_{51}$ to $T_{54}$ may each independently be a single bond, *—O—*', *—S—*', or *—N($R_5$)—*'.

In an embodiment, in Formulae 1C and 1D, a1 may be 1 or 2. In an embodiment, in Formulae 1C and 1 D, a1 may be 1.

In an embodiment, in Formulae 1C and 1D, a2 may be 1 or 2. In an embodiment, in Formulae 1C and 1 D, a2 may be 1.

In an embodiment, in Formulae 1C and 1D, a3 may be 1 or 2. In an embodiment, in Formulae 1C and 1 D, a3 may be 1.

In an embodiment, in Formulae 1C and 1D, a4 may be 0 or 1. In an embodiment, in Formulae 1C and 1 D, a4 may be 0.

In an embodiment, in Formula 1 D, $T_{51}$ and $T_{53}$ may each be a single bond, $T_{52}$ may be *—O—*', a1 to a3 may each be 1, and a4 may be 0.

In an embodiment, the term "chemical bond" may be interpreted as a single bond or a double bond or may be interpreted as a covalent bond or a coordinate bond, according to a corresponding formula. In an embodiment, in Formulae 1C and 1 D, $T_1$ to $T_4$ may each independently be a covalent bond or a coordinate bond. In an embodiment, in Formula 1 D, $T_2$ and $T_3$ may each be a covalent bond, and $T_4$ may be a coordinate bond.

In an embodiment, $CY_1$ to $CY_4$ in Formulae 1A to 1D may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, an indene group, a benzosilole group, a benzothiophene group, a benzofuran group, a carbazole group, a fluorene group, a dibenzosilole group, a dibenzothiophene group, a dibenzofuran group, an azaindole group, an azabenzothiophene group, an azabenzofuran group, an azacarbazole group, an azafluorene group, an azadibenzosilole group, an azadibenzothiophene group, an azadibenzofuran group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In an embodiment, ring $CY_1$ in Formula 1C and ring $CY_{11}$ in Formula 1D may each independently be a $C_1$-$C_{60}$ nitrogen-containing heterocyclic group.

In an embodiment, in Formula 1D, ring $CY_{11}$ may be an $X_{11}$-containing 5-membered ring; an $X_{11}$-containing 5-membered ring to which at least one 6-membered ring is condensed; or an $X_{11}$-containing 6-membered ring. In an embodiment, in Formula 1D, ring $CY_{11}$ may be an $X_{11}$-containing 5-membered ring; or an $X_{11}$-containing 5-membered ring to which at least one 6-membered ring is condensed. For example, in an embodiment, in Formula 1 D, ring $CY_{11}$ may include a 5-membered ring that is bonded to $M_2$ in Formula 2 via $X_{11}$.

For example, in Formula 1 D, the $X_{11}$-containing 5-membered ring may be a pyrrole group, a pyrazole group, an imidazole group, a triazole group, an oxazole group, an iso-oxazole group, a thiazole group, an isothiazole group, an oxadiazole group, or a thiadiazole group. For example, in Formula 1 D, a 6-membered ring which may be optionally condensed with the $X_{11}$-containing 5-membered-ring or an $X_{11}$-containing 6-membered ring may each independently be a benzene group, a pyridine group, or a pyrimidine group.

In an embodiment, in Formula 1D, ring $CY_{11}$ may be an $X_{11}$-containing 5-membered ring, and the $X_{11}$-containing 5-membered ring may be an imidazole group or a triazole group.

In an embodiment, in Formula 1D, ring $CY_{11}$ may be an $X_{11}$-containing 5-membered ring to which at least one 6-membered ring is condensed, and the $X_{11}$-containing 5-membered ring to which at least one 6-membered ring is condensed may be a benzimidazole group or an imidazopyridine group.

In an embodiment, in Formula 1D, ring $CY_{11}$ may be an imidazole group, a triazole group, a benzimidazole group, or an imidazopyridine group.

In an embodiment, in Formulae 1A to 1D, $R_1$ to $R_8$ may each independently be: hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a naphthyl group, a pyridinyl group, a pyrimidinyl group, or any combination thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, an azafluorenyl group, an azacarbazolyl group, an azadibenzofuranyl group, an azadibenzothiophenyl group, or an azadibenzosilolyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a terphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an indenyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzosilolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzofluorenyl group, a benzocarbazolyl group, a naphthobenzofuranyl group, a naphthobenzothiophenyl group, a naphthobenzosilolyl group, a dibenzofluorenyl group, a dibenzocarbazolyl group, a dinaphthofuranyl group, a dinaphthothiophenyl group, a dinaphthosilolyl group, an indenocarbazolyl group, an indolocarbazolyl group, a benzofuranocarbazolyl group, a benzothienocarbazolyl group, a benzosilolocarbazolyl group, an imidazopyridinyl group, an imidazopyrimidinyl group, $-Si(Q_{31})(Q_{32})(Q_{33})$, $-N(Q_{31})(Q_{32})$, $-B(Q_{31})(Q_{32})$, $-P(Q_{31})(Q_{32})$, $-C(=O)(Q_{31})$, $-S(=O)_2(Q_{31})$, $-P(=O)(Q_{31})(Q_{32})$, or any combination thereof; or $-Si(Q_1)(Q_2)(Q_3)$, $-N(Q_1)(Q_2)$, $-B(Q_1)(Q_2)$, $-C(=O)(Q_1)$, $-S(=O)_2(Q_1)$, or $P(=O)(Q_1)(Q_2)$, and $Q_1$ to $Q_3$ and $Q_{31}$ to $Q_{33}$ may each independently be:

$-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, or $-CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{20}$ alkyl group, a phenyl group, a biphenyl group, a pyridinyl group, a pyrimidinyl group, a pyridazinyl group, a pyrazinyl group, a triazinyl group, or any combination thereof.

In an embodiment, in Formulae 1A to 1D, b1 to b4 may each independently be an integer from 0 to 5.

In an embodiment, the third compound may be a compound represented by Formula 1-1 or Formula 1-2, and the fourth compound may be a compound represented by Formula 2-1 or Formula 2-2:

[Formula 1-1]

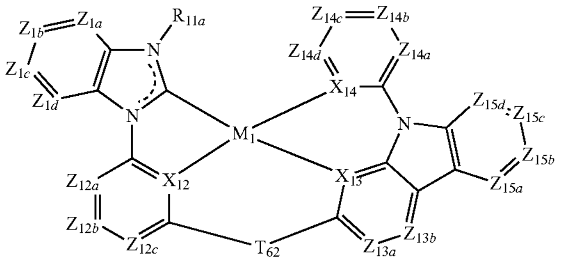

[Formula 1-2]

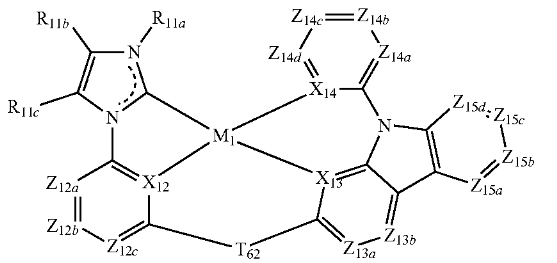

-continued

[Formula 2-1]

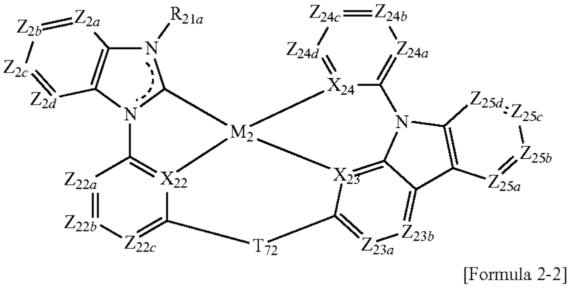

[Formula 2-2]

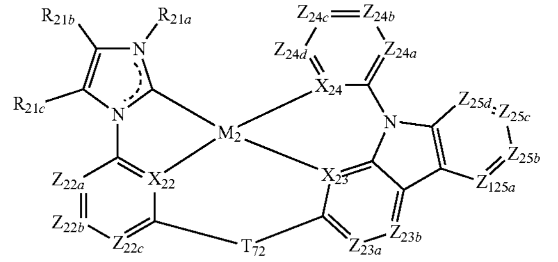

In Formulae 1-1, 1-2, 2-1, and 2-2, $M_1$ and $M_2$ may respectively be the same as described herein, $X_{12}$ to $X_{14}$ and $X_{22}$ to $X_{24}$ may each independently be nitrogen or carbon, $T_{62}$ and $T_{72}$ are respectively the same as described in connection with $T_{52}$ in Formula 1D, $Z_{1a}$ may be $C(R_{1a})$ or N, $Z_{1b}$ may be $C(R_{1b})$ or N, $Z_{1c}$ may be $C(R_{1c})$ or N, and $Z_{1d}$ may be $C(R_{1d})$ or N, $Z_{12a}$ may be $C(R_{12a})$ or N, $Z_{12b}$ may be $C(R_{12b})$ or N, $Z_{12c}$ may be $C(R_{12c})$ or N, $Z_{13a}$ may be $C(R_{13a})$ or N, $Z_{13b}$ may be $C(R_{13b})$ or N, $Z_{14a}$ may be $C(R_{14a})$ or N, $Z_{14b}$ may be $C(R_{14b})$ or N, $Z_{14c}$ may be $C(R_{14c})$ or N, and $Z_{14d}$ may be $C(R_{14d})$ or N, $Z_{15a}$ may be $C(R_{15a})$ or N, $Z_{15b}$ may be $C(R_{15b})$ or N, $Z_{15c}$ may be $C(R_{15c})$ or N, and $Z_{15d}$ may be $C(R_{15d})$ or N, $Z_{2a}$ may be $C(R_{2a})$ or N, $Z_{2b}$ may be $C(R_{2b})$ or N, $Z_{2c}$ may be $C(R_{2c})$ or N, and $Z_{2d}$ may be $C(R_{2d})$ or N, $Z_{22a}$ may be $C(R_{22a})$ or N, $Z_{22b}$ may be $C(R_{22b})$ or N, $Z_{22c}$ may be $C(R_{22c})$ or N, $Z_{23a}$ may be $C(R_{23a})$ or N, $Z_{23b}$ may be $C(R_{23b})$ or N, $Z_{24a}$ may be $C(R_{24a})$ or N, $Z_{24b}$ may be $C(R_{24b})$ or N, $Z_{24c}$ may be $C(R_{24c})$ or N, and $Z_{24d}$ may be $C(R_{24d})$ or N, $Z_{25a}$ may be $C(R_{25a})$ or N, $Z_{25b}$ may be $C(R_{25b})$ or N, $Z_{25c}$ may be $C(R_{25c})$ or N, and $Z_{25d}$ may be $C(R_{25d})$ or N, $R_{1a}$ to $R_{1d}$, $R_{11a}$ to $R_{11c}$, $R_{12a}$ to $R_{12c}$, $R_{13a}$, $R_{13b}$, $R_{14a}$ to $R_{14d}$, $R_{15a}$ to $R_{15d}$, $R_{2a}$ to $R_{2d}$, $R_{21a}$ to $R_{21c}$, $R_{22a}$ to $R_{22c}$, $R_{23a}$, $R_{23b}$, $R_{24a}$ to $R_{24d}$, and $R_{25a}$ to $R_{25d}$ may each independently be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), two or more adjacent groups of $R_{1a}$ to $R_{1d}$, $R_{11a}$ to $R_{11c}$, $R_{12a}$ to $R_{12c}$, $R_{13a}$, $R_{13b}$, $R_{14a}$ to $R_{14d}$, $R_{15a}$ to $R_{15d}$, $R_{2a}$ to $R_{2d}$, $R_{21a}$ to $R_{21c}$, $R_{22a}$ to $R_{22c}$, $R_{23a}$, $R_{23b}$, $R_{24a}$ to $R_{24d}$, and $R_{25a}$ to $R_{25d}$ may optionally be bonded together to form a $C_5$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and $R_{10a}$ and $Q_1$ to $Q_3$ may respectively be the same as described herein.

In an embodiment, in Formulae 1-1 and 1-2, at least one of $Z_{13a}$, $Z_{13b}$, $Z_{15a}$, $Z_{15b}$, $Z_{15c}$, and $Z_{15d}$ may not be N. In an embodiment, $Z_{13a}$ may be C($R_{13a}$), or $Z_{13b}$ may be C($R_{13b}$).

In an embodiment, in Formulae 1-1 and 1-2, at least one of $Z_{14a}$, $Z_{14b}$, $Z_{14c}$, and $Z_{14d}$ may not be N. In an embodiment, $Z_{14b}$ may be C($R_{14b}$).

In an embodiment, in Formulae 2-1 and 2-2, at least one of $Z_{23}$a, $Z_{23b}$, $Z_{25a}$, $Z_{25b}$, $Z_{25c}$, and $Z_{25d}$ may not be N. In an embodiment, $Z_{25a}$ may be C($R_{25a}$), $Z_{25b}$ may be C($R_{25b}$), $Z_{25c}$ may be C($R_{25c}$), or $Z_{25d}$ may be C($R_{25d}$).

In an embodiment, in Formulae 2-1 and 2-2, at least one of $Z_{24}$a, $Z_{24b}$, $Z_{24c}$, and $Z_{24d}$ may not be N. In an embodiment, $Z_{24b}$ may be C($R_{14b}$).

In an embodiment, in Formulae 1-1 and 1-2, $R_{11a}$ and at least one of $R_{14a}$ to $R_{14d}$ may each not be hydrogen.

In an embodiment, in Formulae 1-1 and 1-2, $R_{12a}$ to $R_{12c}$ may each be hydrogen.

In an embodiment, in Formulae 1-1 and 1-2, at least one of $R_{13a}$, $R_{13b}$, $R_{15a}$, $R_{15b}$, $R_{15c}$, and $R_{15d}$ may not be hydrogen, and the remainder of $R_{13a}$, $R_{13b}$, $R_{15a}$, $R_{15b}$, $R_{15c}$, and $R_{15d}$ may each be hydrogen.

In an embodiment, in Formulae 1-1 and 1-2, $R_{11a}$, $R_{13b}$, and $R_{14b}$ may each not be hydrogen, and $R_{12a}$ to $R_{12c}$ may each be hydrogen.

In an embodiment, in Formulae 2-1 and 2-2, $R_{21a}$ and at least one of $R_{24a}$ to $R_{24d}$ may each not be hydrogen.

In an embodiment, in Formulae 2-1 and 2-2, $R_{22a}$ to $R_{22c}$ may each be hydrogen.

In an embodiment, in Formulae 2-1 and 2-2, at least one of $R_{23a}$, $R_{23b}$, $R_{25a}$, $R_{25b}$, $R_{25c}$, and $R_{25d}$ may not be hydrogen, and the remainder of $R_{23a}$, $R_{23b}$, $R_{25a}$, $R_{25b}$, $R_{25c}$, and $R_{25d}$ may each be hydrogen.

In an embodiment, in Formulae 2-1 and 2-2, $R_{21a}$, $R_{24b}$, and $R_{25b}$ may each not be hydrogen, and $R_{22a}$, $R_{22b}$, and $R_{22c}$ may each be hydrogen.

In an embodiment, in Formula 1C, at least one of $R_1$(s) in the number of b1, $R_2$(s) in the number of b2, $R_3$(s) in the number of b3, and $R_4$(s) in the number of b4; in Formula 1 D, at least one of $R_1$(s) in the number of b1 and $R_4$(s) in the number of b4; in Formulae 1-1 and 1-2, at least one of $R_{11a}$ and $R_{14a}$ to $R_{14d}$; and in Formulae 2-1 and 2-2, at least one of $R_{21a}$, $R_{23a}$, $R_{23b}$, $R_{24a}$ to $R_{24d}$, and $R_{25a}$ to $R_{25d}$ may each independently be an electron-donating group.

In an embodiment, in Formulae 1-1 and 1-2, $R_{11a}$ and at least one of $R_{14a}$ to $R_{14d}$ may each independently be an electron-donating group; and in Formulae 2-1 and 2-2, $R_{21a}$ and at least one of $R_{23a}$, $R_{23b}$, $R_{24a}$ to $R_{24d}$, and $R_{25a}$ to $R_{25d}$ may each independently be an electron-donating group.

The electron-donating group may be a $C_3$-$C_{10}$ alkyl group that is unsubstituted or substituted with deuterium, a hydroxyl group, a nitro group, or any combination thereof, or a π electron-rich $C_3$-$C_{60}$ cyclic group that is unsubstituted or substituted with at least one $R_{20a}$.

$R_{20a}$ may be:

deuterium, a hydroxyl group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, a hydroxyl group, a nitro group, a π electron-rich $C_3$-$C_{60}$ cyclic group, a $C_6$-$C_{60}$ aryloxy group, a $C_6$-$C_{60}$ arylthio group, —Si($Q_{41}$)($Q_{42}$)($Q_{43}$), —N($Q_{41}$)($Q_{42}$), —B($Q_{41}$)($Q_{42}$), or any combination thereof;

a π electron-rich $C_3$-$C_{60}$ cyclic group, a $C_6$-$C_{60}$ aryloxy group, or a $C_6$-$C_{60}$ arylthio group, each unsubstituted or substituted with deuterium, a hydroxyl group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a π electron-rich $C_3$-$C_{60}$ cyclic group, a $C_6$-$C_{60}$ aryloxy group, a $C_6$-$C_{60}$ arylthio group, —Si($Q_{51}$)($Q_{52}$)($Q_{53}$), —N($Q_{51}$)($Q_{52}$), —B($Q_{51}$)($Q_{52}$), or any combination thereof; or —Si($Q_{61}$)($Q_{62}$)($Q_{63}$), —N($Q_{61}$)($Q_{62}$), or —B($Q_{61}$)($Q_{62}$), and $Q_{41}$ to $Q_{43}$, $Q_{51}$ to $Q_{53}$, and $Q_{61}$ to $Q_{63}$ may each independently be: hydrogen; deuterium; a hydroxyl group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a π electron-rich $C_3$-$C_{60}$ cyclic group that is unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the electron-donating group may be an iso-propyl group, a tert-butyl group, or a group represented by one of Formulae 10A-1 to 10A-4.

10A-1

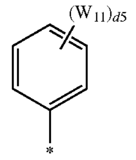

10A-2

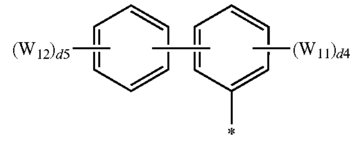

10A-3

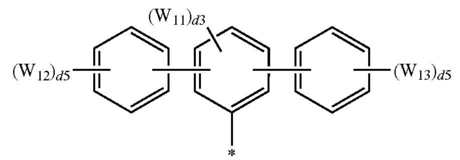

10A-4

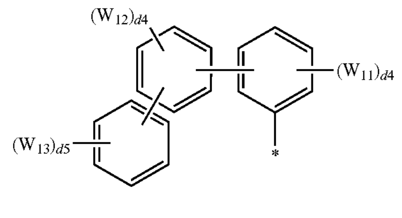

In Formulae 10A-1 to 10A-4, $W_{11}$ to $W_{13}$ may each independently be hydrogen, or may respectively be the same as described in connection with $R_{20a}$ as described herein, d3 may be an integer from 0 to 3, d4 may be an integer from 0 to 4, d5 may be an integer from 0 to 5, and

* indicates a binding site to an adjacent atom.

In an embodiment, the electron-donating group may be an iso-propyl group, a tert-butyl group, or a group represented by one of Formulae 10-1 to 10-124:

10-1

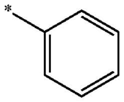

10-2

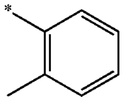

10-3

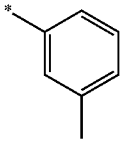

10-4

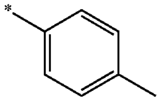

10-5

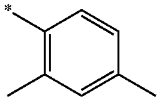

10-6

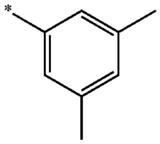

10-7

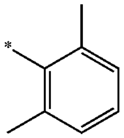

10-8

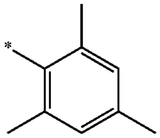

10-9

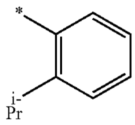

-continued 10-10

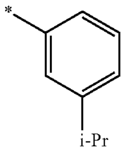

10-11

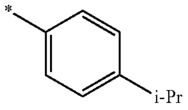

10-12

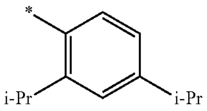

10-13

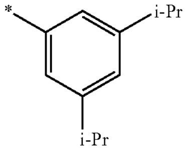

10-14

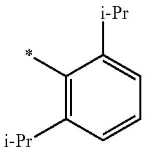

10-15

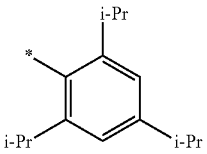

10-16

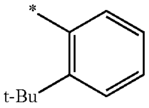

10-17

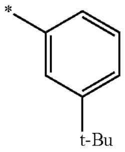

10-18

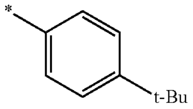

10-19

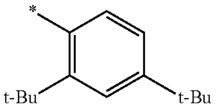

10-20

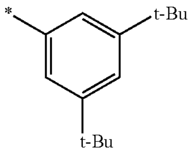

-continued
10-21
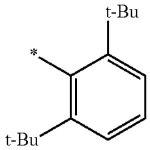
10-22
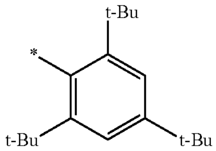
10-23
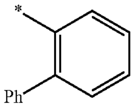
10-24
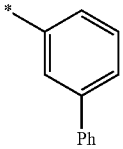
10-25
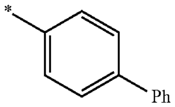
10-26
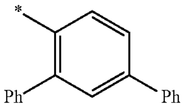
10-27
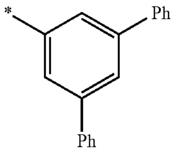
10-28
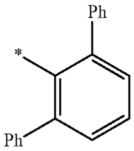
10-29
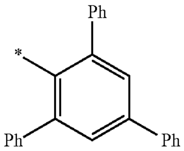
10-30
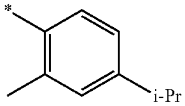
10-31
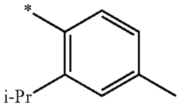
-continued
10-32
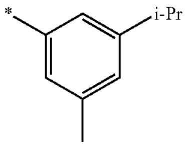
10-33
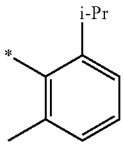
10-34
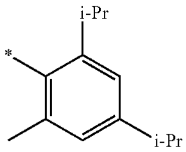
10-35
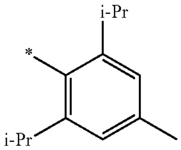
10-36
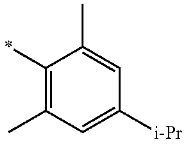
10-37
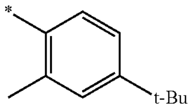
10-38
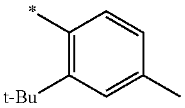
10-39
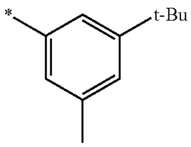
10-40
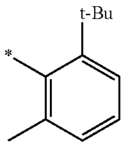
10-41
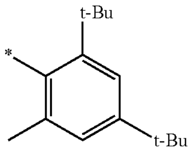

-continued
10-42
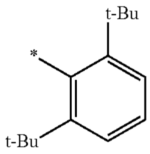
10-43
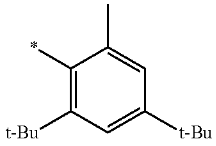
10-44
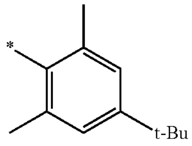
10-45
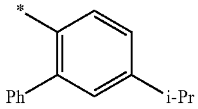
10-46
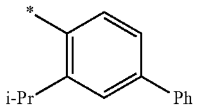
10-47
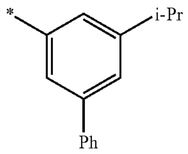
10-48
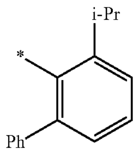
10-49
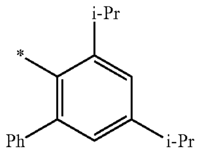
10-50
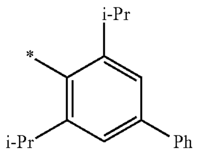
10-51
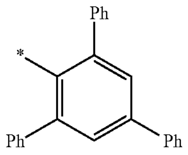
-continued
10-52
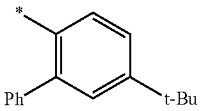
10-53
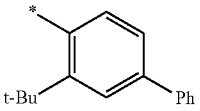
10-54
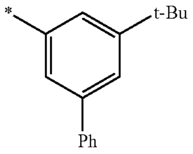
10-55
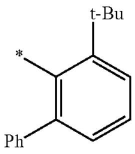
10-56
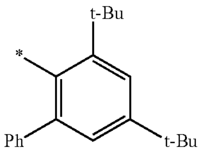
10-57
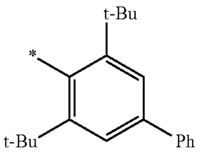
10-58
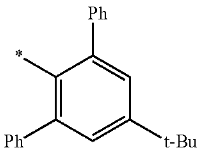
10-59
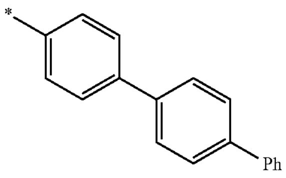
10-60
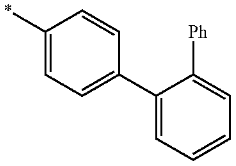
10-61
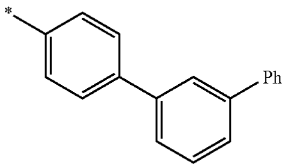

-continued
10-62
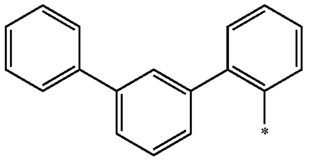
10-63
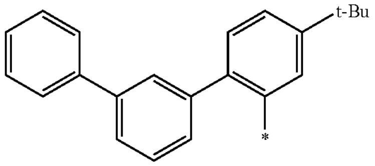
10-64
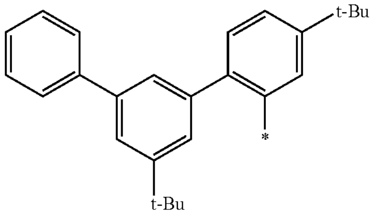
10-65
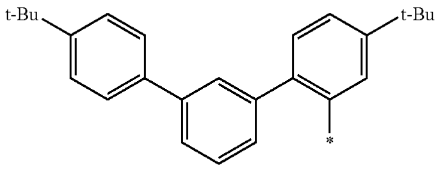
10-66
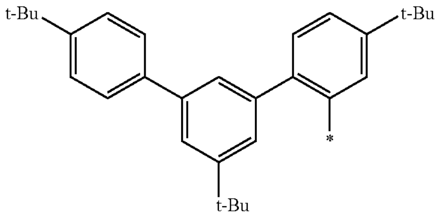
10-67
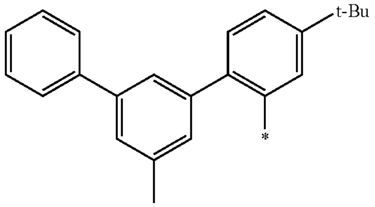
10-68
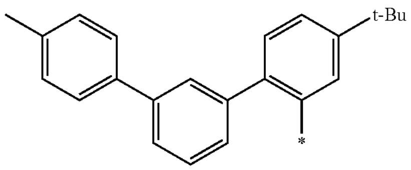
10-69
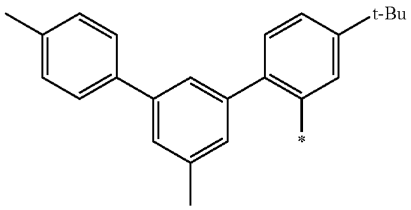
-continued
10-70
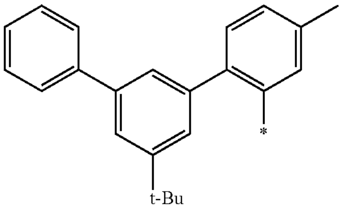
10-71
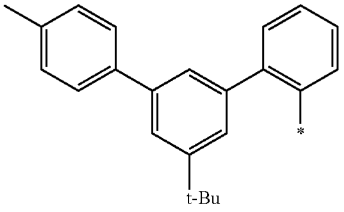
10-72
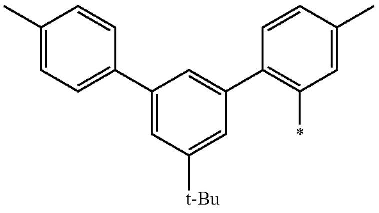
10-73
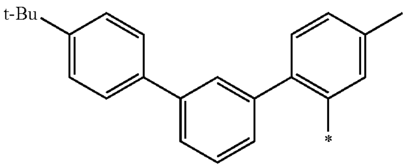
10-74
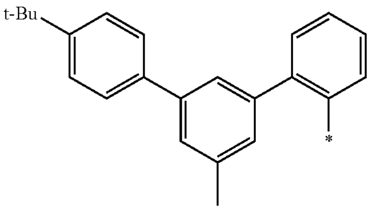
10-75
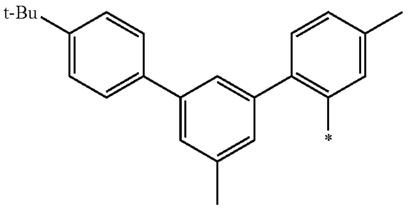
10-76
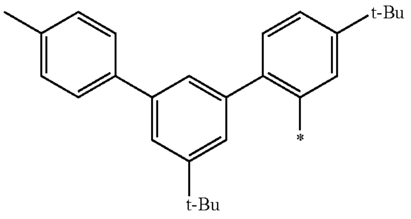

-continued
10-77
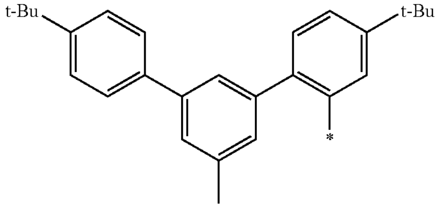
10-78
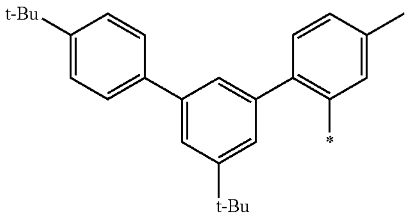
10-79
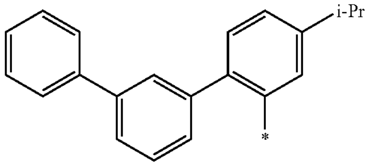
10-80
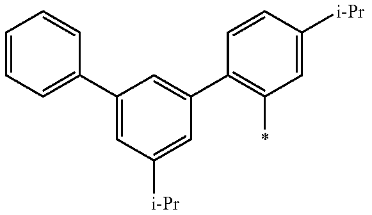
10-81
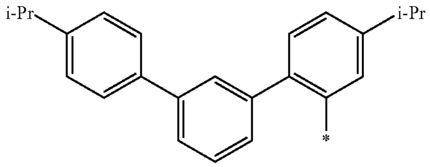
10-82
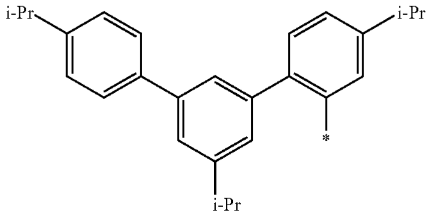
10-83
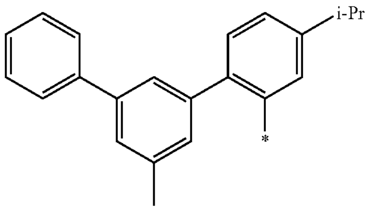
10-84
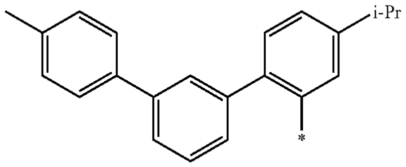
-continued
10-85
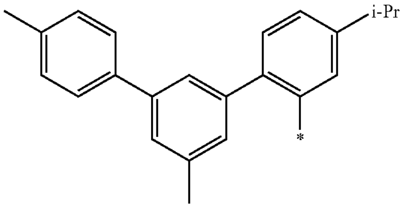
10-86
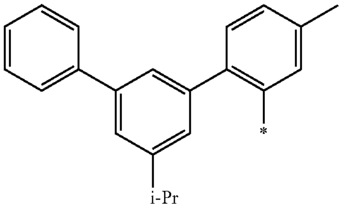
10-87
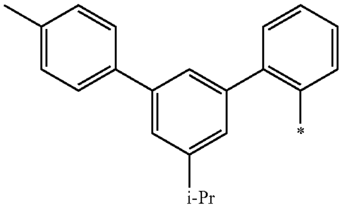
10-88
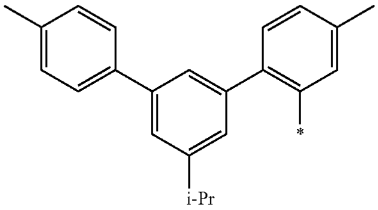
10-89
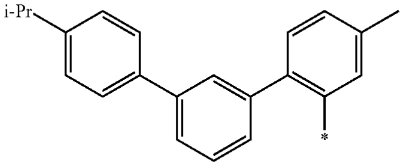
10-90
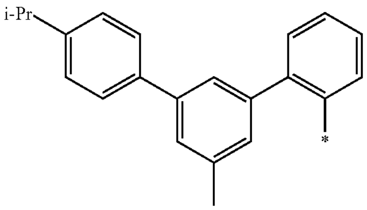
10-91
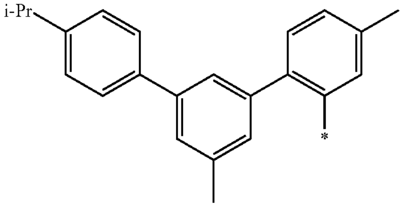

-continued
10-92
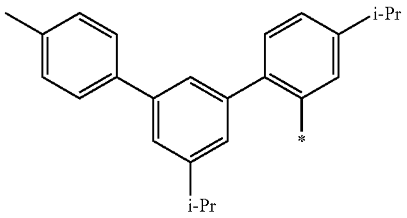
10-93
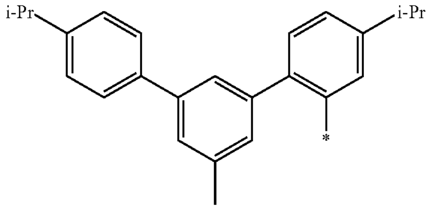
10-94
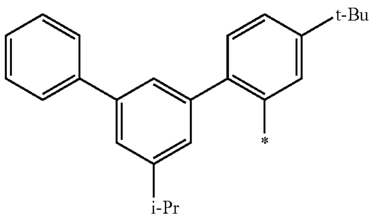
10-95
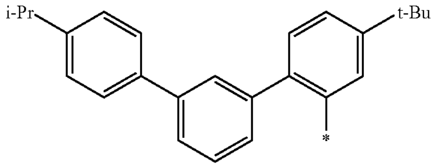
10-96
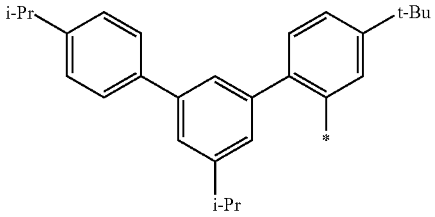
10-97
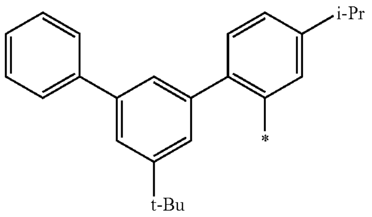
10-98
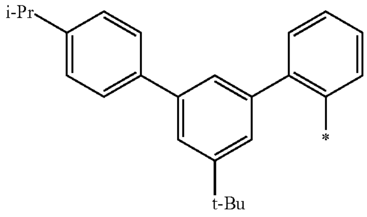
-continued
10-99
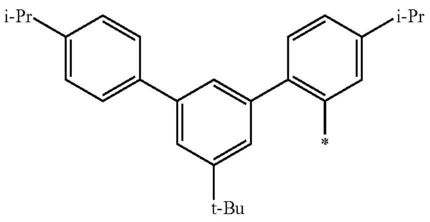
10-100
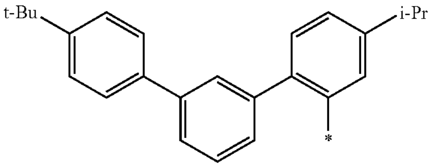
10-101
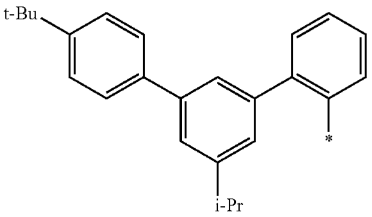
10-102
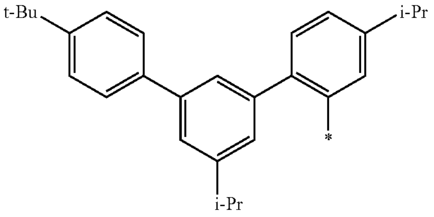
10-103
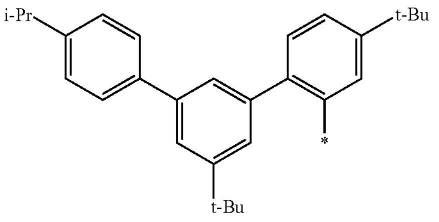
10-104
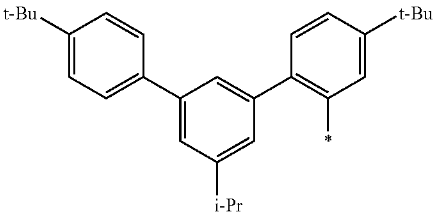
10-105
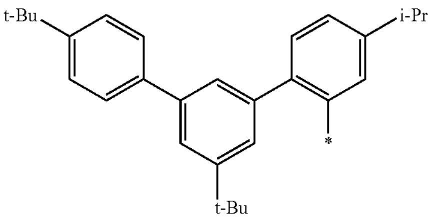

-continued
10-106
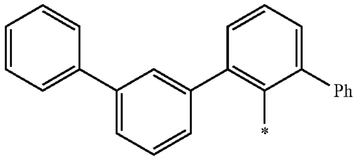
10-107
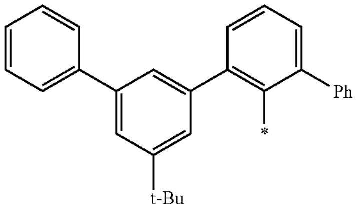
10-108
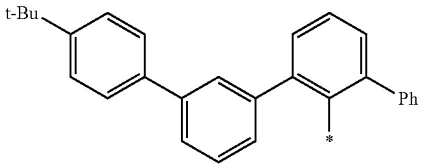
10-109
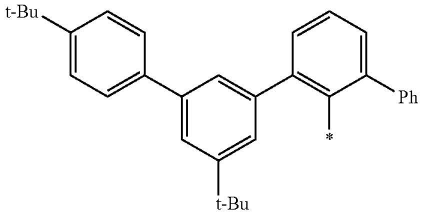
10-110
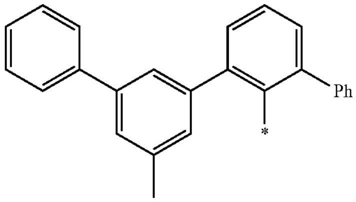
10-111
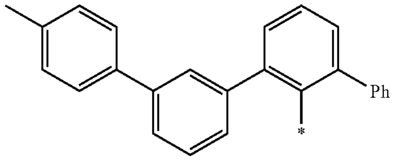
10-112
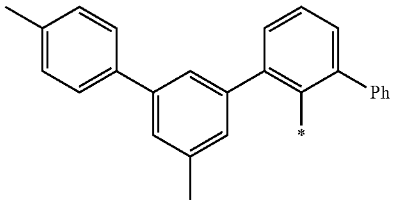
10-113
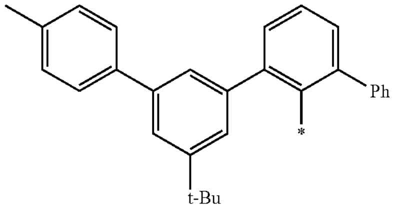
-continued
10-114
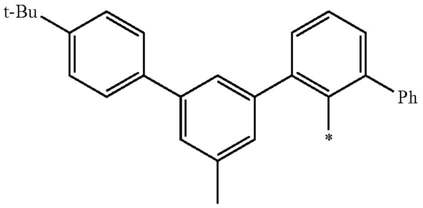
10-115
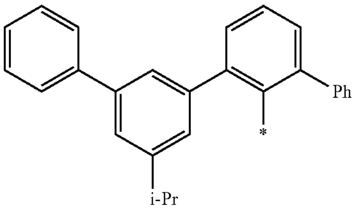
10-116
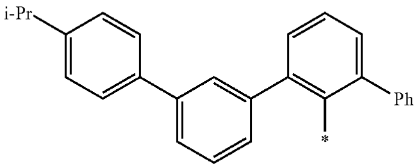
10-117
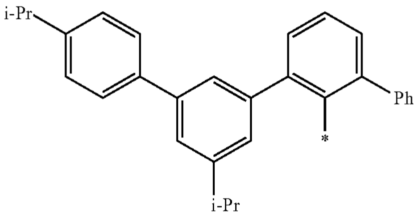
10-118
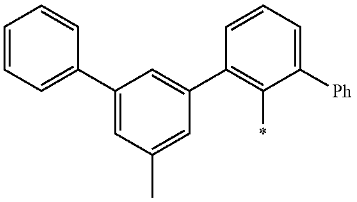
10-119
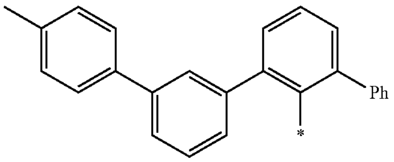
10-120
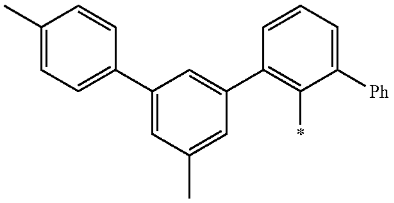

-continued 10-121

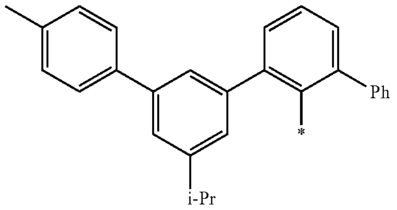

10-122

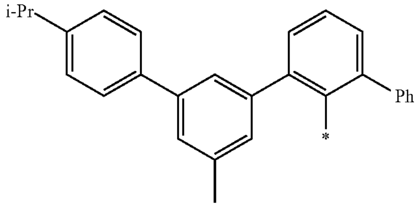

10-123

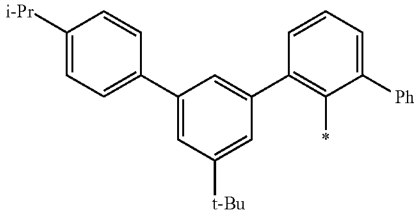

10-124

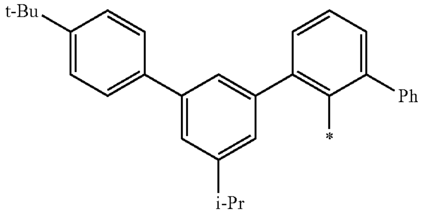

In Formulae 10-1 to 10-124, i-Pr is an iso-propyl group, t-Bu is a t-butyl group, Ph is a phenyl group, and * indicates a binding site to a neighboring atom.

In an embodiment, in Formula 1 D, at least one of $R_2$(s) in the number of b2 and $R_3$(s) in the number of b3; and in Formulae 1-1 and 1-2, at least one of $R_{12a}$, $R_{12b}$, $R_{12c}$, $R_{13a}$, $R_{13b}$, $R_{15a}$, $R_{15b}$, $R_{15c}$, and $R_{15d}$ may each independently be:

an electron-withdrawing group; or a carbazole group, a benzocarbazole group, a dibenzocarbazole group, or an azacarbazole group, each unsubstituted or substituted with —F, —CN, —$NO_2$, a fluorinated $C_1$-$C_{10}$ alkyl group, a cyano-substituted $C_1$-$C_{10}$ alkyl group, a fluorinated phenyl group, or any combination thereof.

The electron-withdrawing group may be:

—F, —$CFH_2$, —$CF_2H$, —$CF_3$, —CN, or —$NO_2$;

a $C_1$-$C_{60}$ alkyl group that is substituted with —F, —$CFH_2$, —$CF_2H$, —$CF_3$, —CN, —$NO_2$, or any combination thereof; or a π electron-deficient nitrogen-containing $C_1$-$C_{60}$ cyclic group that is unsubstituted or substituted with at least one $R_{10a}$.

In an embodiment, in Formulae 1A to 1D, at least one of $R_2$(s) in the number of b2 and $R_3$(s) in the number of b3; and in Formulae 1-1 and 1-2, at least one of $R_{12a}$, $R_{12b}$, $R_{12c}$, $R_{13a}$, $R_{13b}$, $R_{15a}$, $R_{15b}$, $R_{15c}$, and $R_{15d}$ may each independently be:

—F, —$CFH_2$, —$CF_2H$, —$CF_3$, —CN, or —$NO_2$; or a group represented by one of Formulae 11-1 to 11-13:

11-1

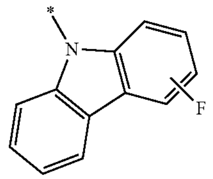

11-2

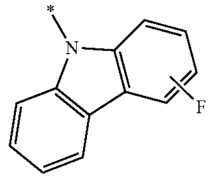

11-3

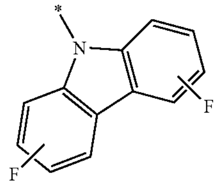

11-4

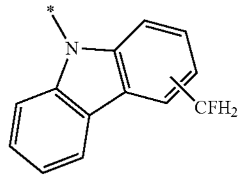

11-5

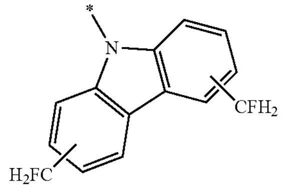

11-6

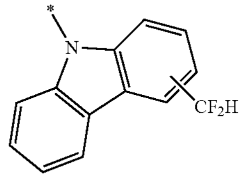

11-7

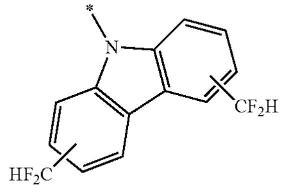

11-8

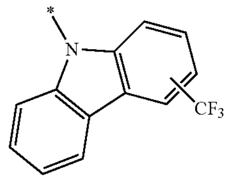

-continued 11-9

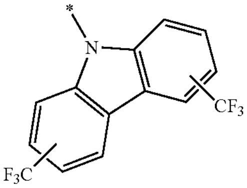

11-10

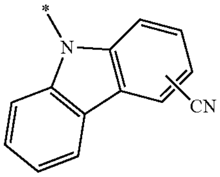

11-11

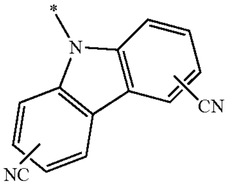

11-12

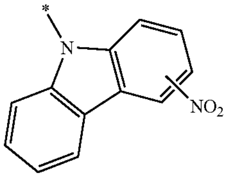

11-13

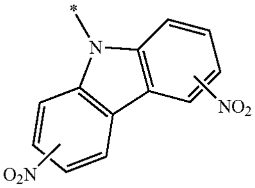

In an embodiment, in Formulae 1-1 and 1-2, $Z_{13b}$ may be $C(R_{13b})$, $R_{13b}$ may be: —F, —$CFH_2$, —$CF_2H$, —$CF_3$, —CN, or —$NO_2$, or a group represented by one of Formulae 11-1 to 11-13, $Z_{14b}$ may be $C(R_{14b})$, and $R_{11a}$ and $R_{14b}$ may each independently be an iso-propyl group, a tert-butyl group, or a group represented by one of Formulae 10-1 to 10-124.

In an embodiment, in Formulae 2-1 and 2-2, $Z_{24b}$ may be $C(R_{24b})$, $Z_{25b}$ may be $C(R_{25b})$, and $R_{21a}$, $R_{24b}$, and $R_{25b}$ may each independently be an iso-propyl group, a tert-butyl group, or a group represented by one of Formulae 10-1 to 10-124.

In an embodiment, in Formula 1C, a4 may be 0, and a group represented by

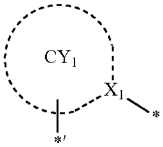

may be a group represented by one of Formulae CY1-1 to CY1-42:

CY1-1

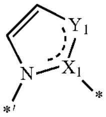

CY1-2

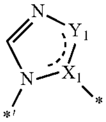

CY1-3

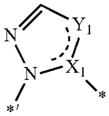

CY1-4

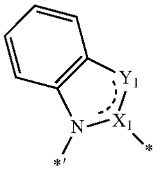

CY1-5

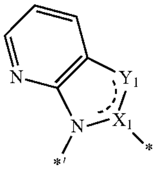

CY1-6

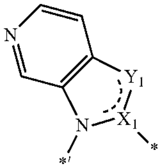

CY1-7

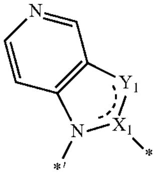

CY1-8

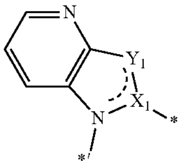

CY1-9

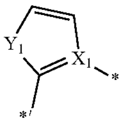

-continued
CY1-10
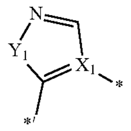
CY1-11
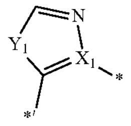
CY1-12
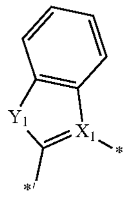
CY1-13
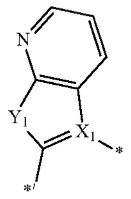
CY1-14
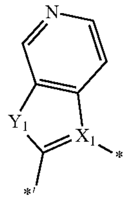
CY1-15
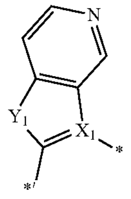
CY1-16
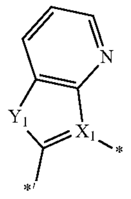
CY1-17
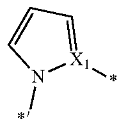
CY1-18
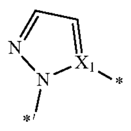
-continued
CY1-19
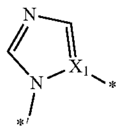
CY1-20
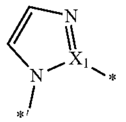
CY1-21
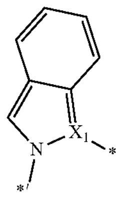
CY1-22
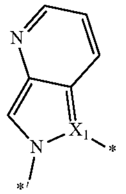
CY1-23
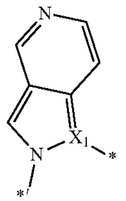
CY1-24
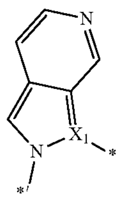
CY1-25
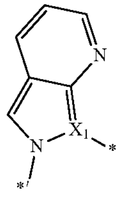
CY1-26
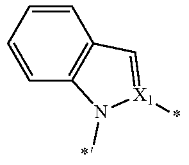
CY1-27
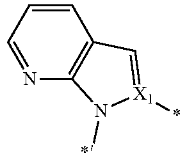

-continued

CY1-28

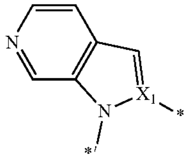

CY1-29

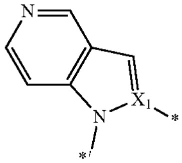

CY1-30

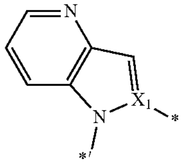

CY1-31

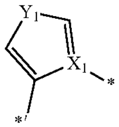

CY1-32

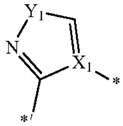

CY1-33

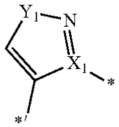

CY1-34

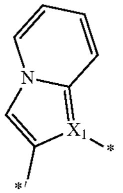

CY1-35

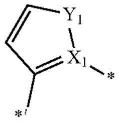

CY1-36

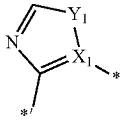

CY1-37

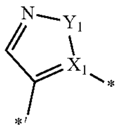

-continued

CY1-38

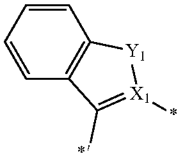

CY1-39

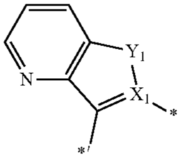

CY1-40

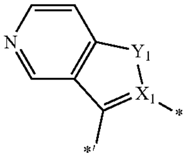

CY1-41

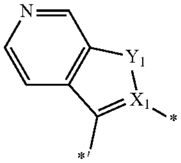

CY1-42

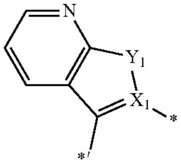

In Formulae CY1-1 to CY1-42, $X_1$ may be the same as described herein, $Y_1$ may include O, S, N, C, or Si,

* may indicate a binding site to $T_1$ in Formula 1C, and

*' may indicate a binding site to $T_{51}$ in Formula 1C.

In an embodiment, in Formulae CY1-1 to CY1-8, $X_1$ may be C, and in Formulae CY1-9 to CY1-42, $X_1$ may be N.

In an embodiment, in Formula 1 D, a4 may be 0, and a group represented by

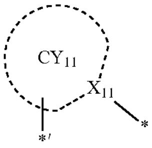

may be a group represented by one of Formulae CY11-1 to CY11-8:

CY11-1

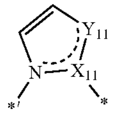

-continued
CY11-2
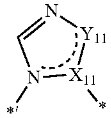
CY11-3
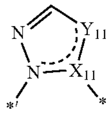
CY11-4
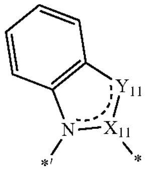
CY11-5
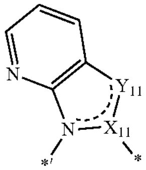
CY11-6
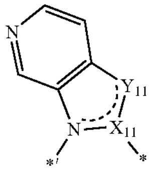
CY11-7
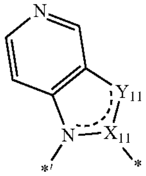
CY11-8
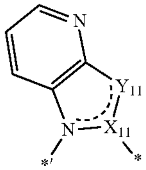
In Formulae CY11-1 to CY11-8,
$X_{11}$ may be the same as described herein,
$Y_{11}$ may include O, S, N, C, or Si,
* may indicate a binding site to $T_{11}$ in Formula 1 D, and
*' may indicate a binding site to $T_{51}$ in Formula 1 D.
In an embodiment, in Formulae 1C and 1D, a group represented by
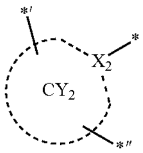
may each independently be a group represented by one of Formulae CY2-1 to CY2-11:
CY2-1
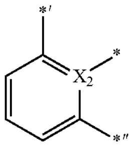
CY2-2
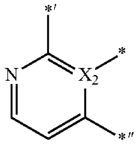
CY2-3
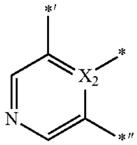
CY2-4
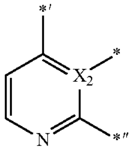
CY2-5
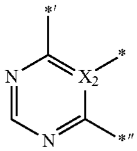
CY2-6
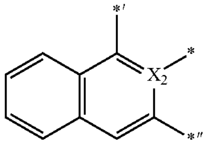
CY2-7
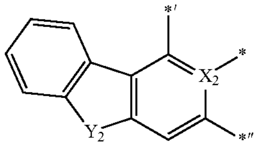
CY2-8
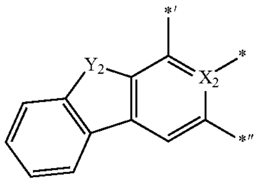
CY2-9
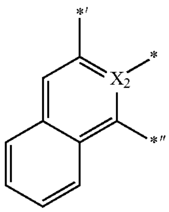

-continued

CY2-10

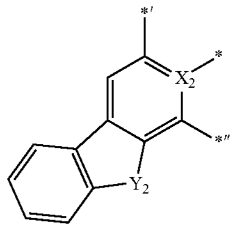

CY2-11

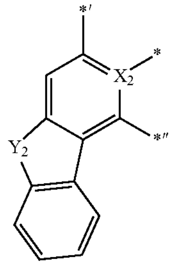

In Formulae CY2-1 to CY2-11, $X_2$ may be the same as described herein, $Y_2$ may include O, S, N, C, or Si,

* may indicate a binding site to $T_2$ in Formulae 1C and 1 D, and

*' may indicate a binding site to $T_{51}$ in Formulae 1C and 1 D, and

*" may indicate a binding site to $T_{52}$ in Formulae 1C and 1 D.

In an embodiment, in Formulae 1C and 1D, a group represented by

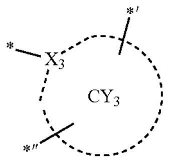

may each independently be a group represented by one of Formulae CY3-1 to CY3-23:

CY3-1

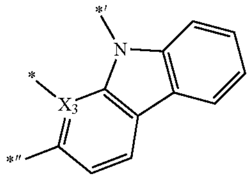

CY3-2

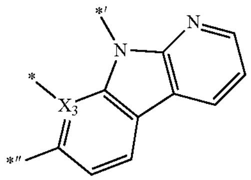

-continued

CY3-3

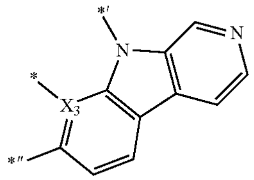

CY3-4

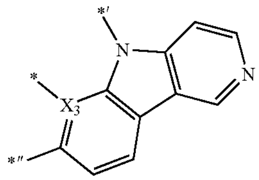

CY3-5

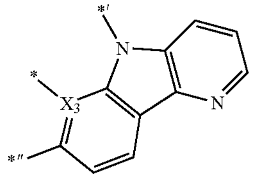

CY3-6

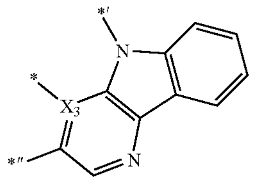

CY3-7

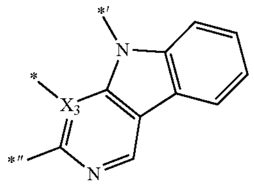

CY3-8

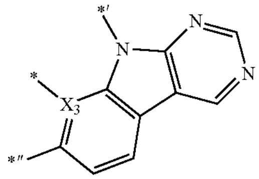

CY3-9

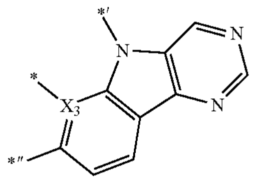

CY3-10

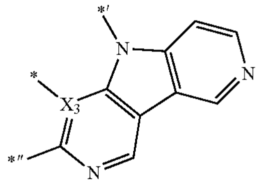

-continued
CY3-11
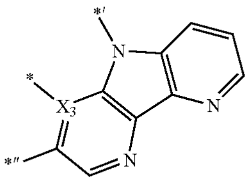
CY3-12
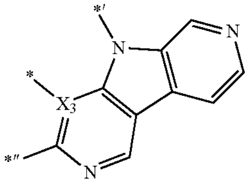
CY3-13
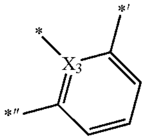
CY3-14
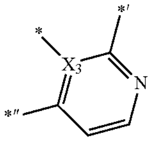
CY3-15
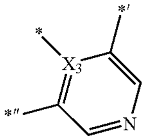
CY3-16
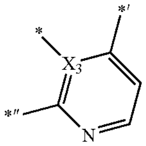
CY3-17
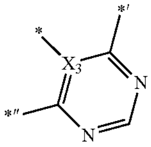
CY3-18
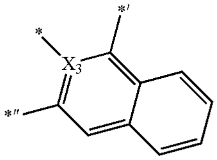
CY3-19
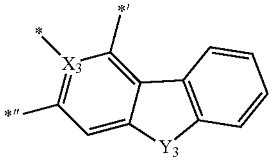
-continued
CY3-20
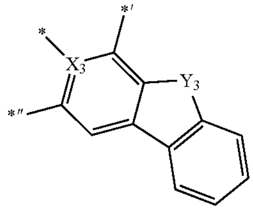
CY3-21
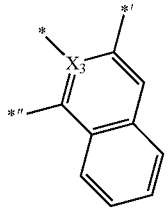
CY3-22
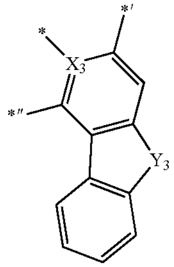
CY3-23
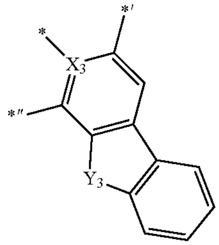
In Formulae CY3-1 to CY3-23,
$X_3$ may be the same as described herein,
$Y_3$ may include 0, 8, N, C, or Si,
* may indicate a binding site to $T_3$ in Formulae 10C and 1 D,
*' may indicate a binding site to $T_{53}$ in Formulae 10C and 1 D, and
*" may indicate a binding site to $T_{52}$ in Formulae 1C and 1 D.
In an embodiment, in Formulae 1-1 and 1-2, a group represented by
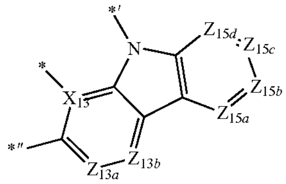

may each independently be a group represented by one of Formulae CY13(1) to CY13(12):

CY13(1)

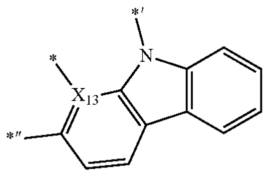

CY13(2)

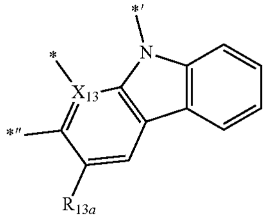

CY13(3)

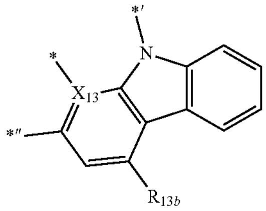

CY13(4)

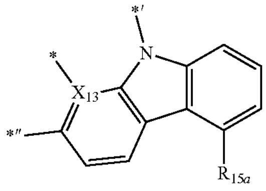

CY13(5)

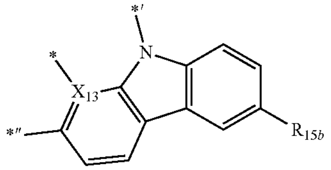

CY13(6)

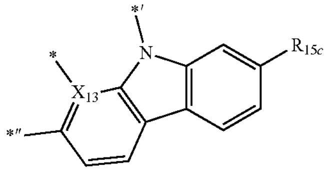

CY13(7)

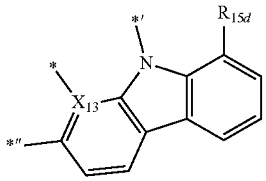

-continued

CY13(8)

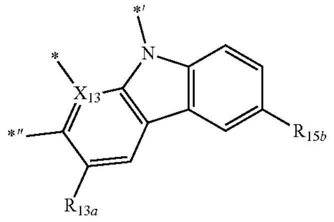

CY13(9)

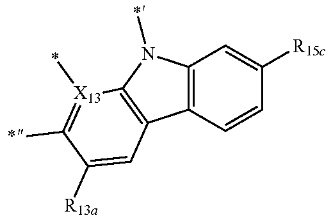

CY13(10)

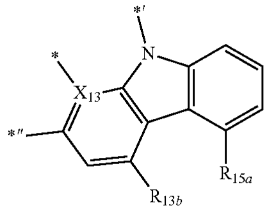

CY13(11)

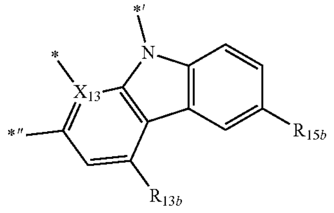

CY13(12)

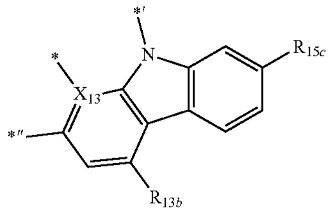

In Formulae CY13(1) to CY13(12), $X_{13}$ may be the same as described herein, $R_{13a}$, $R_{13b}$, and $R_{15a}$ to $R_{15d}$ are respectively the same as described herein, wherein $R_{13a}$, $R_{13b}$, and $R_{15a}$ to $R_{15d}$ may each not be hydrogen,

* may indicate a binding site to $M_1$ in Formulae 1-1 and 1-2,

*' may indicate a binding site to a neighboring atom in Formulae 1-1 and 1-2, and

*" may indicate a binding site to $T_{62}$ in Formulae 1-1 and 1-2.

In an embodiment, in Formulae 2-1 and 2-2, a group represented by

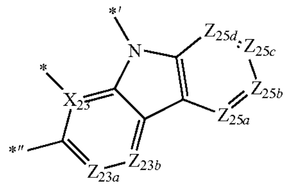

may each independently be a group represented by one of Formulae CY23(1) to CY23(12):

CY23(1)

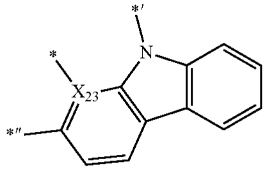

CY23(2)

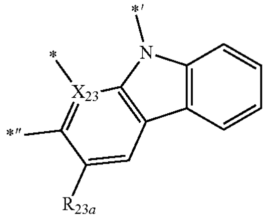

CY23(3)

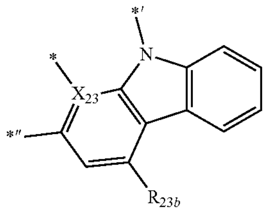

CY23(4)

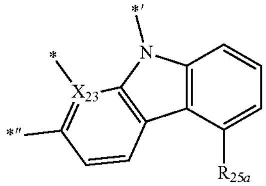

CY23(5)

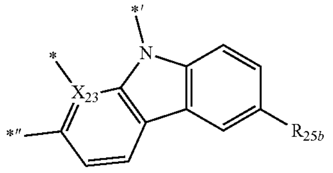

CY23(6)

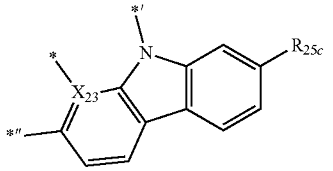

-continued

CY23(7)

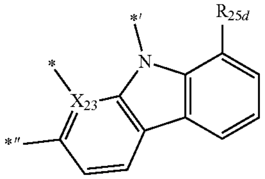

CY23(8)

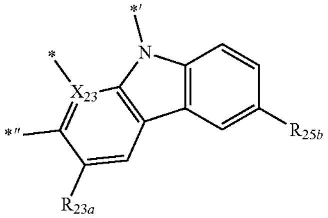

CY23(9)

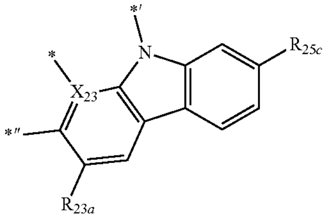

CY23(10)

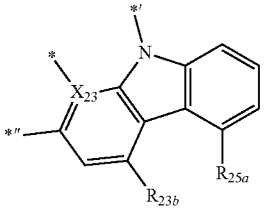

CY23(11)

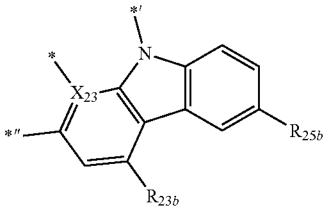

CY23(12)

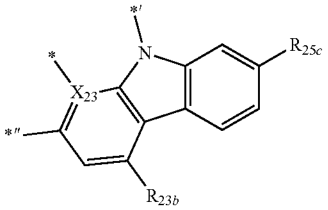

In Formulae CY23(1) to CY23(12), $X_{23}$ may be the same as described herein, $R_{23a}$, $R_{23b}$, and $R_{25a}$ to $R_{25d}$ are respectively the same as described herein, wherein $R_{23a}$, $R_{23b}$, and $R_{25a}$ to $R_{25d}$ may each not be hydrogen,

* may indicate a binding site to $M_2$ in Formulae 2-1 and 2-2,

*' may indicate a binding site to a neighboring atom in Formulae 2-1 and 2-2, and

*" may indicate a binding site to $T_{72}$ in Formulae 2-1 and 2-2.

In an embodiment, the third compound and the fourth compound may each be a phosphorescent dopant.

In an embodiment, the third compound may be selected from BD1, BD2, Pt-1, Pt-5, Pt-8, Pt-10 to 12, and Pt-19 to 22 among the following compounds, and the fourth compound may be selected from the following compounds, but embodiments are not limited thereto:
BD1
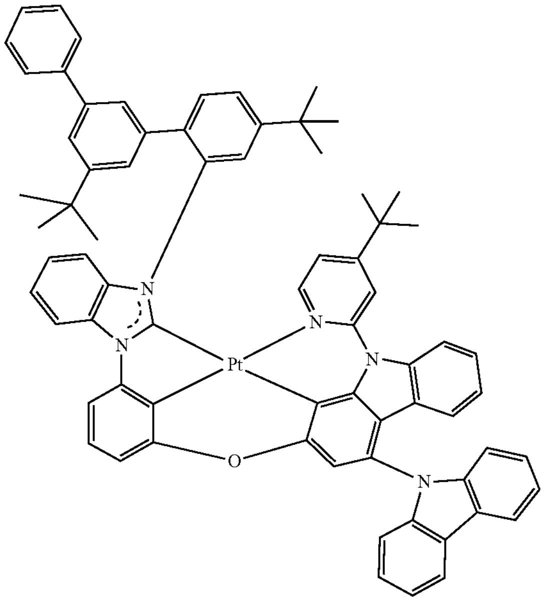
BD2
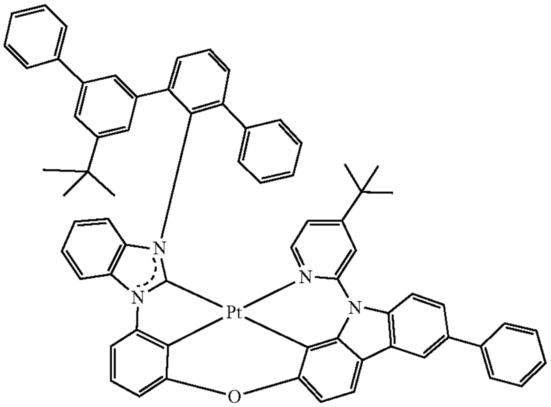
Pt-1
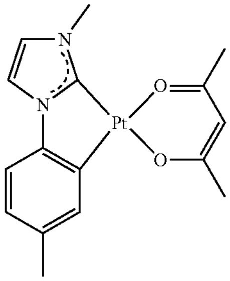
-continued
Pt-2
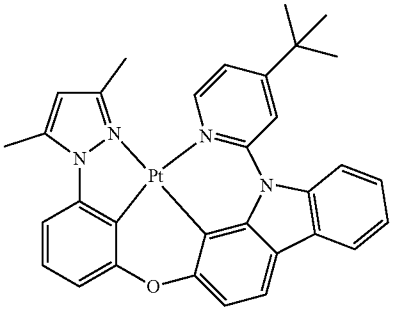
Pt-3
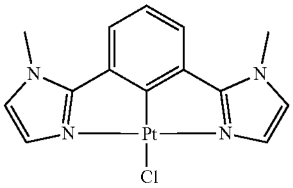
Pt-4
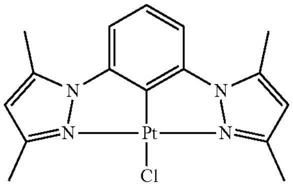
Pt-5
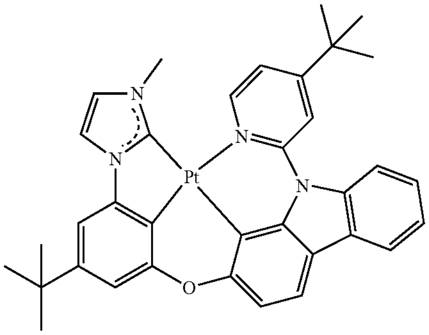
Pt-6
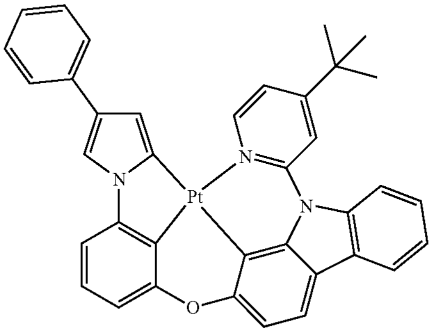
Pt-7
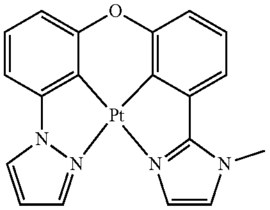

-continued
Pt-8
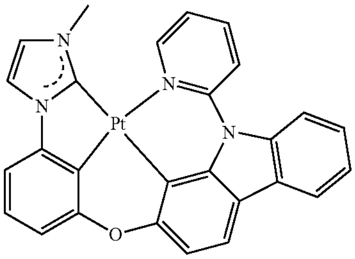
Pt-9
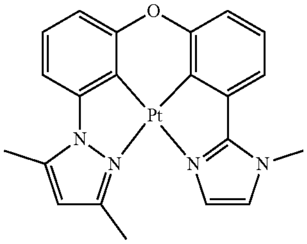
Pt-10
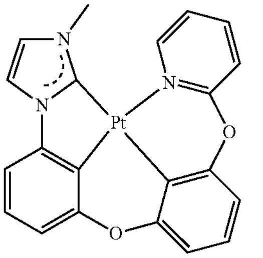
Pt-11
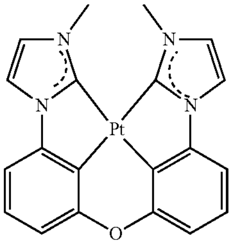
Pt-12
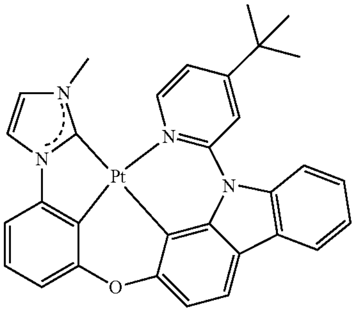
Pt-13
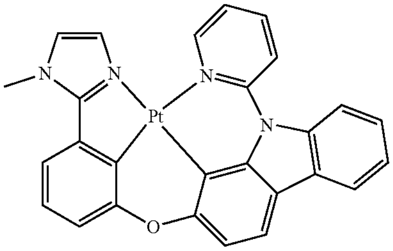
-continued
Pt-14
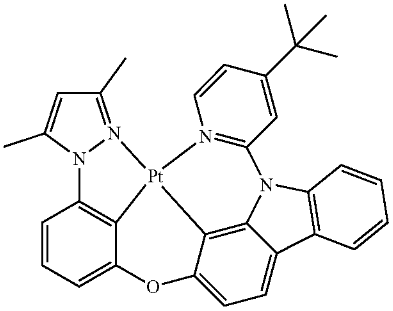
Pt-15
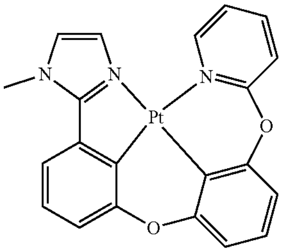
Pt-16
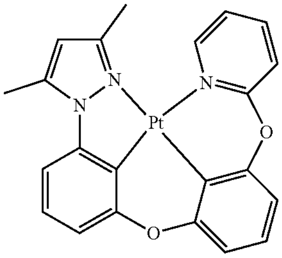
Pt-17
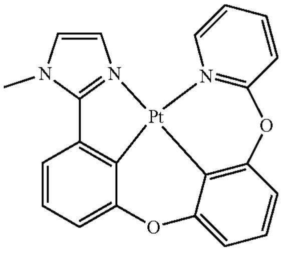
Pt-18
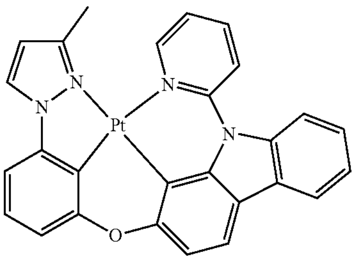

-continued
Pt-19
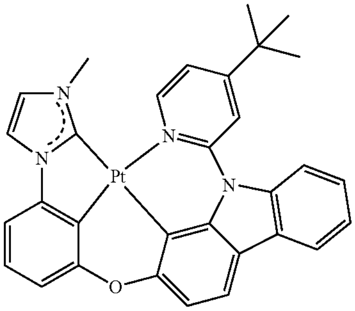
Pt-20
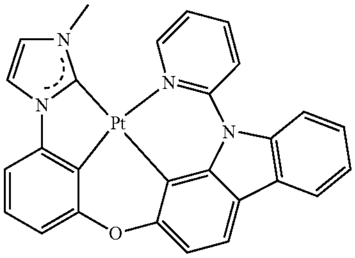
Pt-21
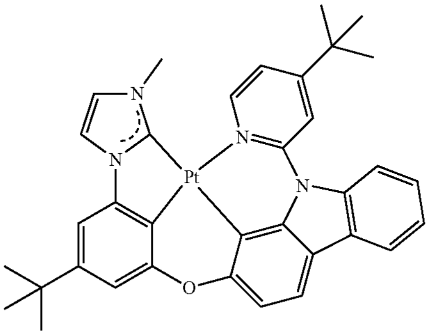
Pt-22
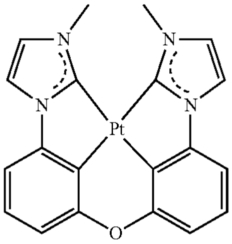
Pt-23
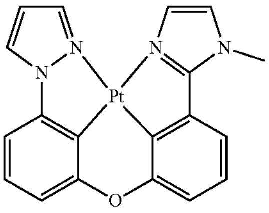
Pt-24
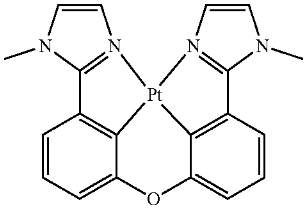
-continued
Ir-1
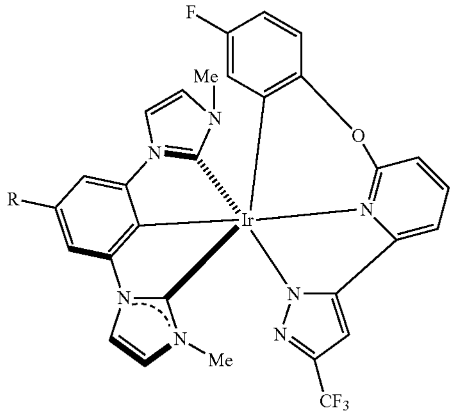
Ir-2
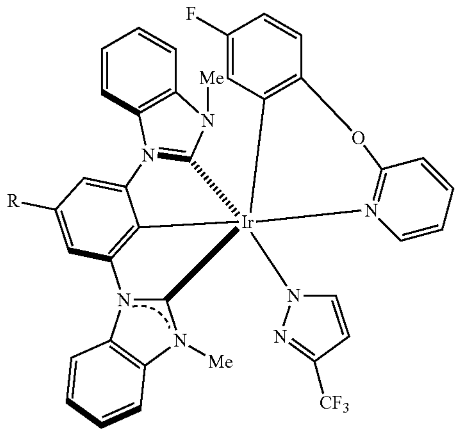
Ir-3
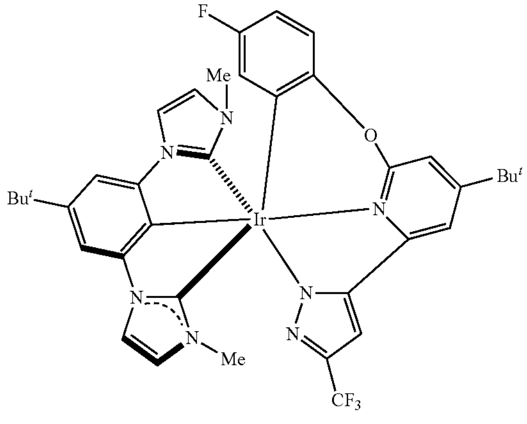

-continued
Ir-4
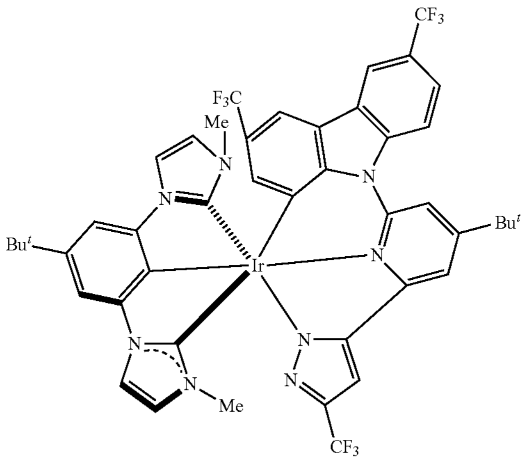
Ir-5
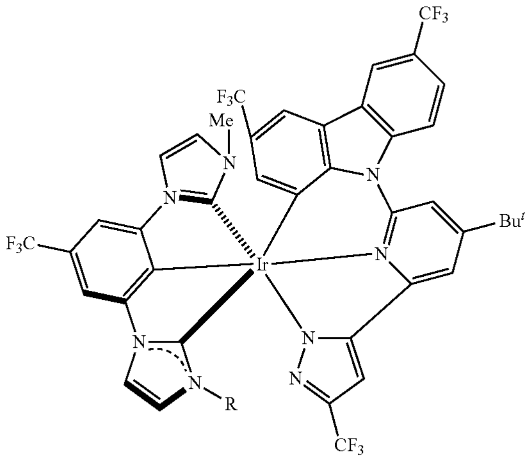
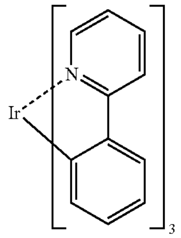
$Ir(ppy)_3$
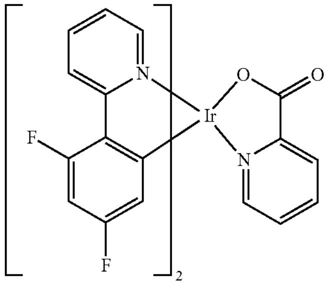
FIrpic
-continued
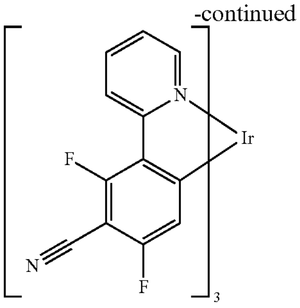
FCNIr
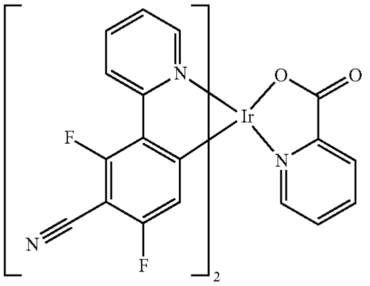
FCNIrpic
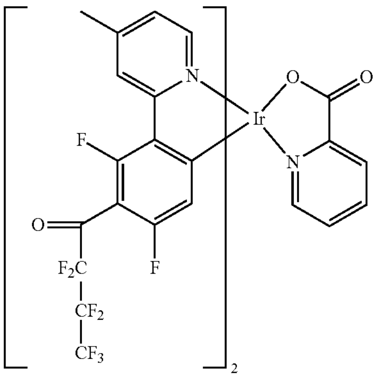
$(HF)_2Ir(pic)$
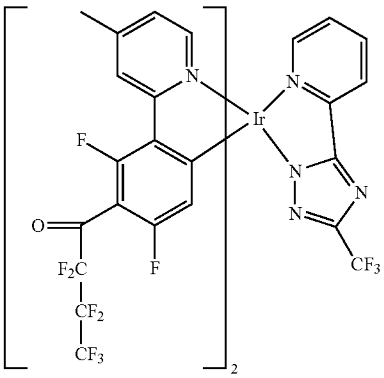
$(HF)_2Ir(fptc)$ -continued
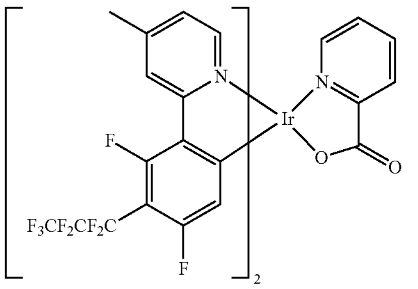
$(HFP)_2Ir(pic)$
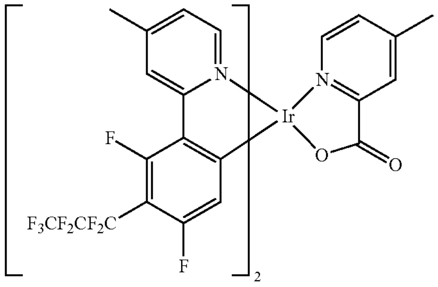
$(HFP)_2Ir(mpic)$
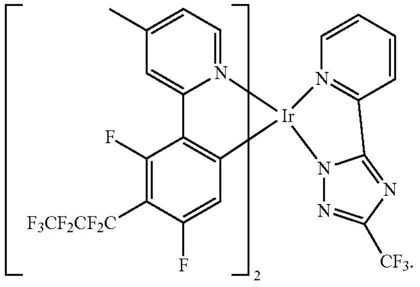
$(HFP)_2Ir(fptz)$
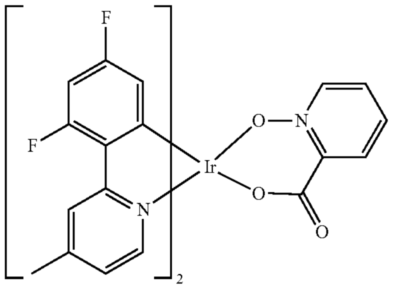
$(F_2CH_3ppy)_2Ir$(pic-N-oxide)
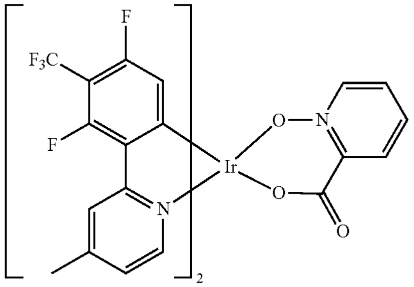
$(F_2CF_2CH_3ppy)_2Ir$(pic-N-oxide)
-continued
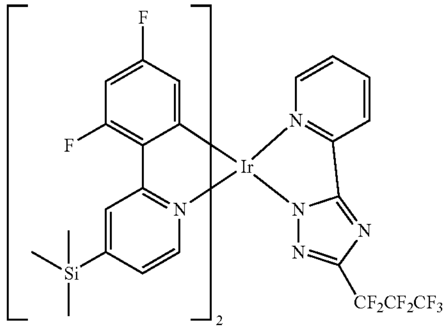
$Ir(F_2$-p-trimethylsilyl$)_2$(fptp)
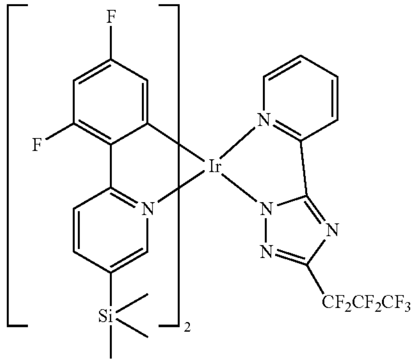
$Ir(F_2$-m-trimethylsilyl$)_2$(fptp)
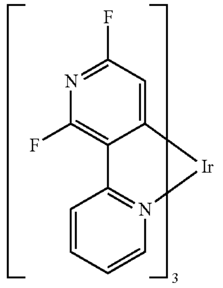
$Ir(dfpypy)_3$
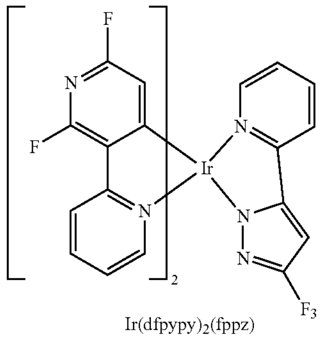
$Ir(dfpypy)_2(fppz)$ -continued
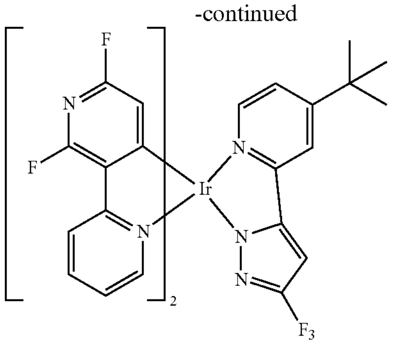
Ir(dfpypy)$_2$(fpbpz)
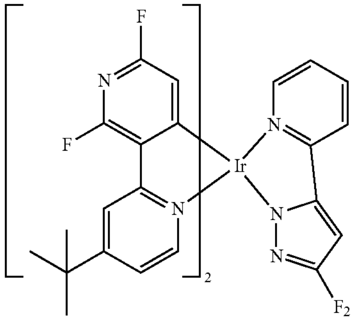
Ir(dfpybpy)$_2$(fppz)
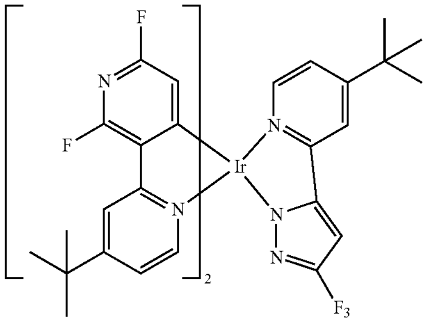
Ir(dfpybpy)$_2$(fpbpz)
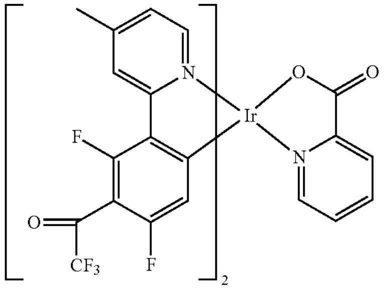
(TF)$_2$Ir(pic)
-continued
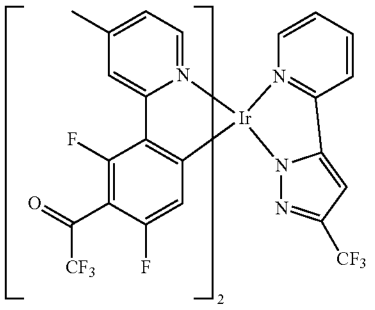
(TF)$_2$Ir(fptc)
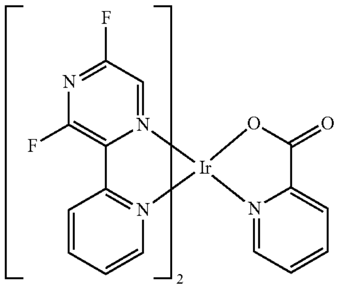
(dfpypy)$_2$Ir(pic)
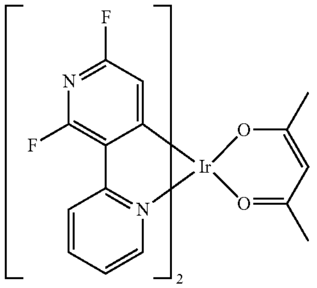
(dfpypy)$_2$Ir(acac)
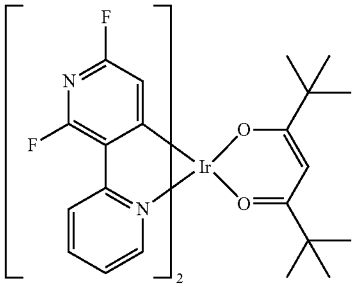
(dfpypy)$_2$Ir(dpm)
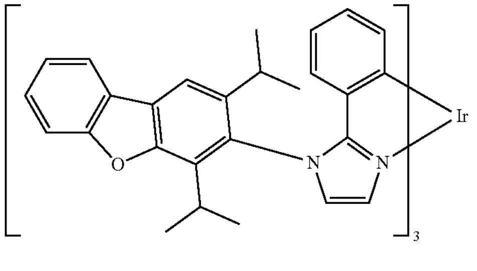
Ir(dbi)$_3$ -continued
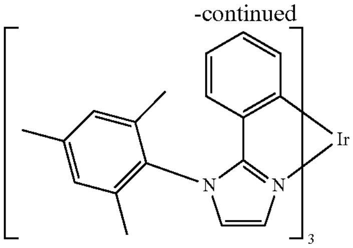
fac-Ir(mpim)$_3$
1
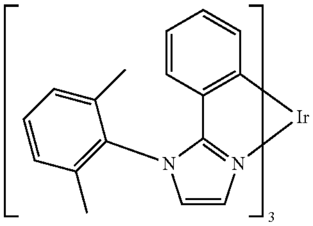
2
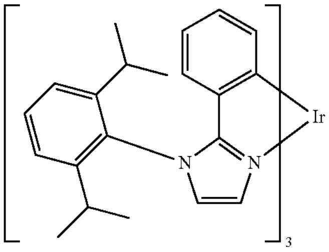
3
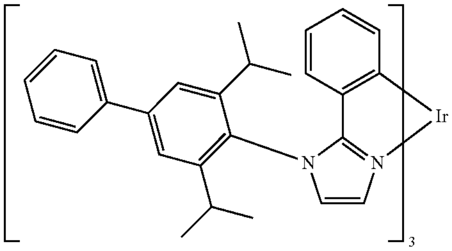
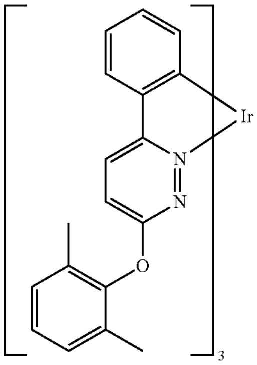
Ir(dmp)$_3$
-continued
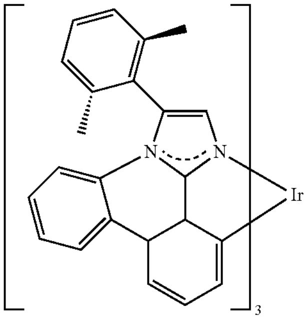
Ir(pmb)$_3$
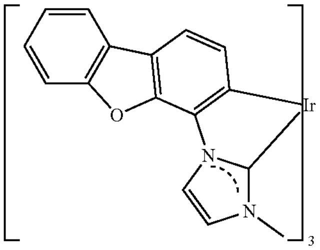
Ir(dbfmi)$_3$
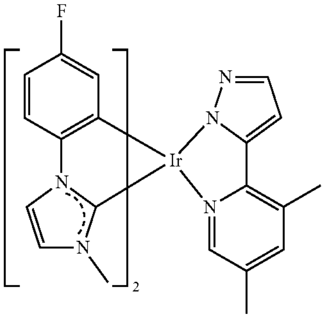
(fpmi)$_2$Ir(dmpypz)
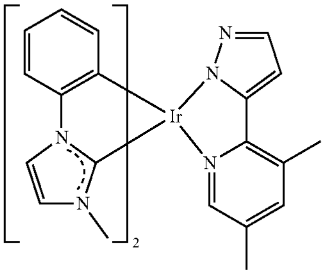
(mpmi)$_2$Ir(dmpypz)
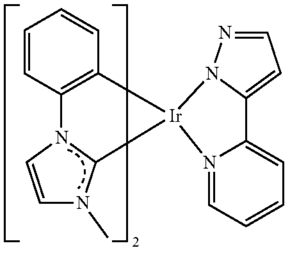
Ir(pmi)$_2$Ir(pypz)

-continued

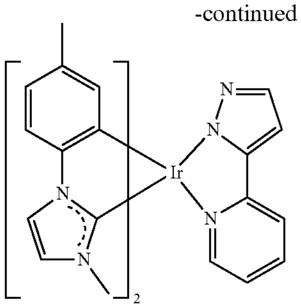

Ir(mpmi)$_2$Ir(pypz)

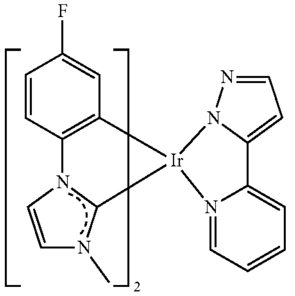

Ir(fpmi)$_2$Ir(pypz)

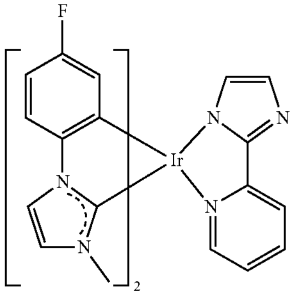

Ir(fpmi)$_2$Ir(pyim)

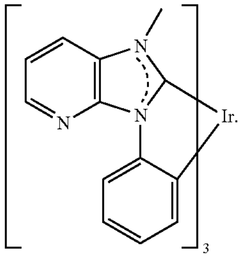

Ir(pmp)$_3$

In an embodiment, a weight ratio of the third compound to the fourth compound may be in a range of about 100:1 to about 1:100, but embodiments are not limited thereto.

In an embodiment, a difference between a maximum emission wavelength of light emitted from the third compound and a maximum emission wavelength of light emitted from the fourth compound may be in a range of about 0 nm to about 35 nm. For example, the difference between a maximum emission wavelength of light emitted from the third compound and a maximum emission wavelength of light emitted from the fourth compound may be in a range of about 0 nm to about 20 nm. For example, the difference between a maximum emission wavelength of light emitted from the third compound and a maximum emission wavelength of light emitted from the fourth compound may be in a range of about 0 nm to about 10 nm.

In an embodiment, the third compound and the fourth compound may each emit blue light. In an embodiment, the third compound may emit blue light having a maximum emission wavelength in a range of about 445 nm to about 470 nm, and the fourth compound may emit blue light having a maximum emission wavelength in a range of about 450 nm to about 480 nm. Thus, a difference between a maximum emission wavelength of blue light emitted from the third compound and a maximum emission wavelength of blue light emitted from the fourth compound may be in a range of about 0 nm to about 35 nm.

The light-emitting device according to an embodiment includes both the third compound and the fourth compound as dopants of the emission layer, and thus, the luminescence efficiency of the light-emitting device may be improved by the third compound, and the lifespan of the light-emitting device may be improved by the fourth compound.

In an embodiment, a total amount of the third compound and the fourth compound in the emission layer may be generally in a range of about 1 vol % to about 50 vol %, based on a total volume of the first compound and the second compound, but embodiments are not limited thereto. For example, the total amount of the third compound and the fourth compound in the emission layer may be in a range of about 5 vol % to about 50 vol %. For example, the total amount of the third compound and the fourth compound in the emission layer may be in a range of about 10 vol % to about 25 vol %.

Concentration Profile of Dopant in Emission Layer

Figure 4:
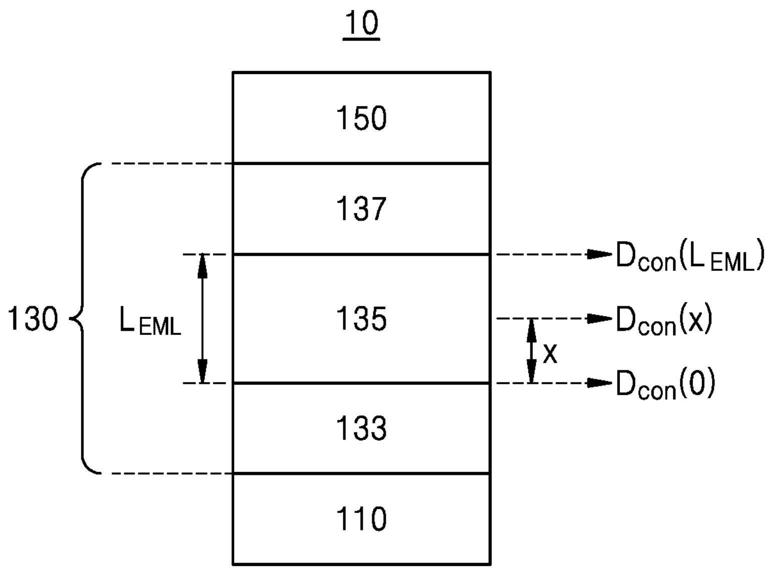
FIG. 4 is a schematic cross-sectional view of a structure of a light-emitting device according to an embodiment.

According to a cross-sectional view of a light-emitting device 10 of FIG. 4, an interlayer 130 may include an emission layer 135. The interlayer 130 may further include a hole transport region 133 between a first electrode 110 and the emission layer 135 and an electron transport region 137 between the emission layer 135 and a second electrode 150. The light-emitting device 10 of FIG. 4 is an example for explaining a concentration profile of a dopant, and a structure of the light-emitting device according to embodiments is not limited thereto.

Hereinafter, based on FIG. 4, a concentration profile will be described by using the third compound among the dopant of the disclosure as an example, but the following description may be applied to the fourth compound as well.

In an embodiment, a concentration profile of the third compound in the emission layer 135 may satisfy $N_1 \leq D_{con}(x) \leq N_2$ in a direction from the hole transport region 133 to the electron transport region 137, wherein in $D_{con}(x)$, x is, as a real number, a variable that satisfies $0 \leq x \leq L_{EML}$, $L_{EML}$ is a thickness of the emission layer 135, $D_{con}(x)$ indicates a concentration (vol %) of the third compound at a point spaced apart by x from the interface between the hole transport region 133 and the emission layer 135 toward the inside of the emission layer 135, $N_1$ (vol %) is a minimum value of a concentration of the third compound in the emission layer and may be about 0 vol % or more and less than 30 vol %, and $N_2$ (vol %) is a maximum value of a concentration of the third compound in the emission layer and may be greater than 0 vol % and less than about 30 vol %.

In this regard, $N_1$ and $N_2$ are different from each other, and $N_1 < N_2$ is satisfied.

The unit of x may be any unit. In an embodiment, the unit of x may be A.

In an embodiment, $D_{con}(0)$ may be $N_2$.

In an embodiment, $D_{con}(L_{EML})$ may satisfy $N_1<D_{con}(L_{EML})\leq N_2$.

A concentration profile of the third compound in the emission layer 135 may be continuous.

The concentration profile may be implemented via a deposition method of the related art. In an embodiment, when a deposition source of each material to be co-deposited is a linear deposition source, the concentration profile may be implemented by adjusting the arrangement of the linear deposition source, the deposition order, the scan speed, and the like, but embodiments are not limited thereto.

In an embodiment, at least one of the third compound and the fourth compound may be non-uniformly doped in the emission layer.

In an embodiment, the first electrode of the light-emitting device may be an anode, the second electrode of the light-emitting device may be a cathode, the interlayer may further include a hole transport region between the first electrode and the emission layer and an electron transport region between the emission layer and the second electrode layer, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

The wording "(interlayer and/or capping layer) includes a compound represented by Formula N" (N is any integer) as used herein may be understood as "(interlayer and/or capping layer) may include one kind of compound represented by Formula N or two different kinds of compounds, each represented by Formula N."

The term "interlayer" as used herein refers to a single layer and/or multiple layers located between the first electrode and the second electrode of the light-emitting device.

According to embodiments, provided is an electronic apparatus which may include the light-emitting device. The electronic apparatus may further include a thin-film transistor. In an embodiment, the electronic apparatus may further include a thin-film transistor including a source electrode and a drain electrode, wherein the first electrode of the light-emitting device may be electrically connected to the source electrode or the drain electrode. In an embodiment, the electronic apparatus may further include a color filter, a color conversion layer, a touch screen layer, a polarizing layer, or any combination thereof. The electronic apparatus may be the same as described herein.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described in connection with FIG. 1.

[First Electrode 110]

In FIG. 1, a substrate may be further included under the first electrode 110 or above the second electrode 150. The substrate may be a glass substrate or a plastic substrate. In an embodiment, the substrate may be a flexible substrate, and may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof.

In an embodiment, when the first electrode 110 is a semi-transmissive electrode or a reflective electrode, a material for forming the first electrode may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 110 may have a structure consisting of a single layer or a multilayer structure including multiple layers. In an embodiment, the first electrode 110 may have a three-layered structure of ITO/Ag/ITO.

[Interlayer 130]

The interlayer 130 may be located on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

In an embodiment, the interlayer 130 may include two or more light-emitting units stacked between the first electrode 110 and the second electrode 150, and at least one charge generation layer located between the two light-emitting units. When the interlayer 130 includes the two or more light-emitting units and the at least one charge generation layer as described above, the light-emitting device 10 may be a tandem light-emitting device.

[Hole Transport Region in Interlayer 130]

The hole transport region may have a structure consisting of a layer consisting of a single material, a structure consisting of a layer consisting of different materials, or a structure including multiple layers including different materials.

The hole transport region may include a hole injection layer, a hole transport layer, an emission auxiliary layer, an electron blocking layer, or any combination thereof.

For example, the hole transport region may have a multilayer structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked from the first electrode 110 in its respective stated order, but the structure of the hole transport region is not limited thereto.

The hole transport region may include a compound represented by Formula 201, a compound represented by Formula 202, or any combination thereof:

[Formula 201]

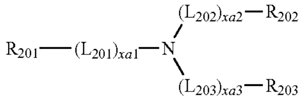

[Formula 202]

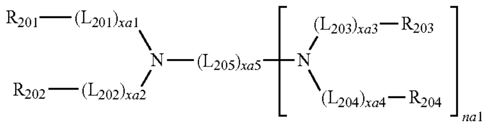

In Formulae 201 and 202, $L_{201}$ to $L_{204}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $L_{205}$ may be *—O—*', *—S—*', *—N($Q_{201}$)—*', a $C_1$-$C_{20}$ alkylene group that is unsubstituted or substituted with at least one $R_{10a}$, a $C_2$-$C_{20}$ alkenylene group that is unsubstituted or substituted with at least one $R_{10a}$, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $R_{201}$ and $R_{202}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other via a single bond, a $C_1$-$C_5$ alkylene group that is unsubstituted or substituted with at least one $R_{10a}$, or a $C_2$-$C_5$ alkenylene group that is unsubstituted or substituted with at least one $R_{10a}$, to form a $C_8$-$C_{60}$ polycyclic group that is unsubstituted or substituted with at least one $R_{10a}$, and na1 may be an integer from 1 to 4.

In an embodiment, each of Formulae 201 and 202 may include at least one of groups represented by Formulae CY201 to CY217:

CY201

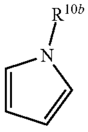

CY202

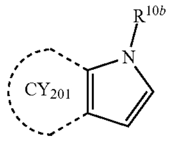

-continued

CY203

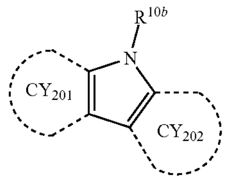

CY204

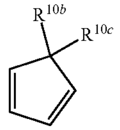

CY205

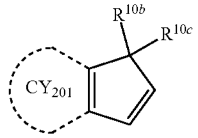

CY206

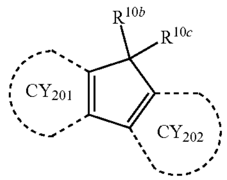

CY207

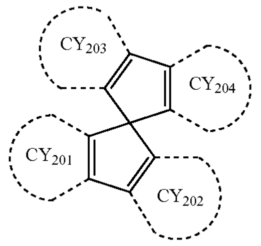

CY208

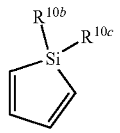

CY209

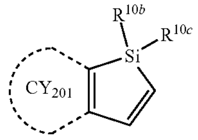

CY210

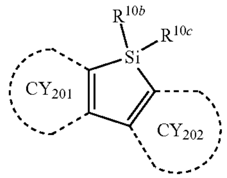

-continued

CY211

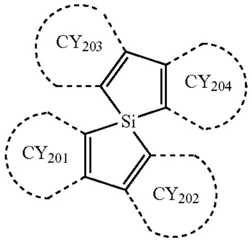

CY212

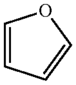

CY213

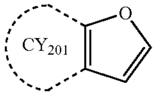

CY214

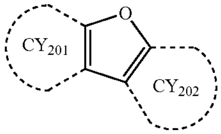

CY215

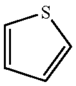

CY216

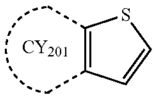

CY217

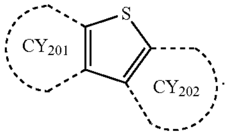

In Formulae CY201 to CY217, $R_{10b}$ and $R_{10c}$ may each independently be the same as described with respect to $R_{10a}$ as described herein, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, in Formulae CY201 to CY217, ring $CY_{201}$ to ring $CY_{204}$ may each independently be a benzene group, a naphthalene group, a phenanthrene group, or an anthracene group.

In an embodiment, each of Formulae 201 and 202 may include at least one of groups represented by Formulae CY201 to CY203.

In an embodiment, a compound represented by Formula 201 may include at least one of groups represented by Formulae CY201 to CY203 and at least one of groups represented by Formulae CY204 to CY217.

In an embodiment, in Formula 201, xa1 may be 1, $R_{201}$ may be a group represented by one of Formulae CY201 to CY203, xa2 may be 0, and $R_{202}$ may be a group represented by one of Formulae CY204 to CY207.

In an embodiment, each of Formulae 201 and 202 may not include a group represented by one of Formulae CY201 to CY203.

In an embodiment, each of Formulae 201 and 202 may not include a group represented by one of Formulae CY201 to CY203, and may include at least one of groups represented by Formulae CY204 to CY217.

In an embodiment, each of Formulae 201 and 202 may not include a group represented by one of Formulae CY201 to CY217.

In an embodiment, the hole transport region may include one of Compounds HT1 to HT58, m-MTDATA, TDATA, 2-TNATA, NPB(NPD), p-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

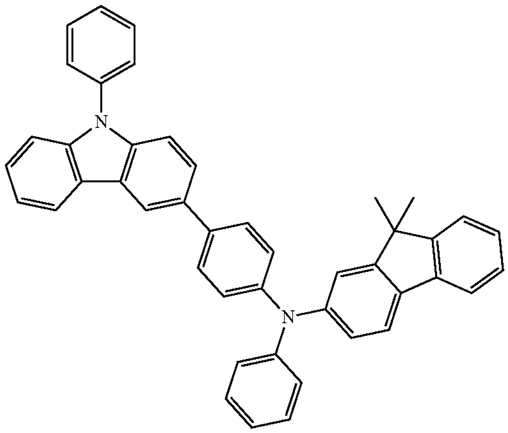

HT2

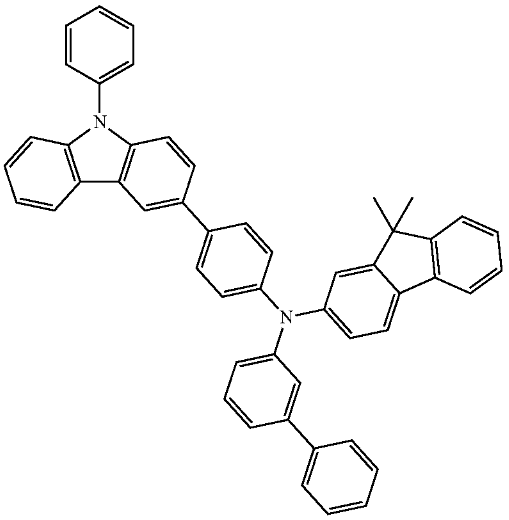

-continued
HT3
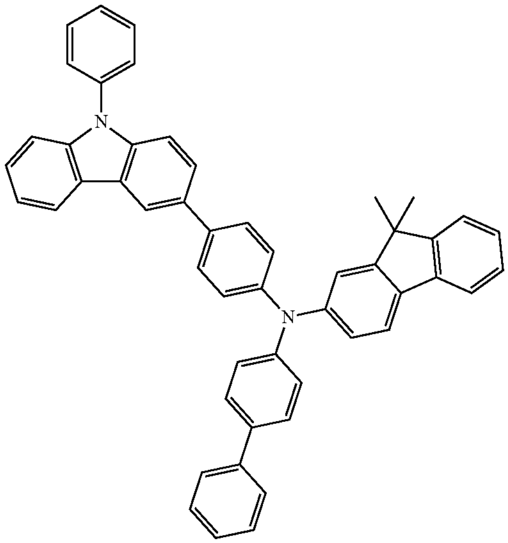
HT4
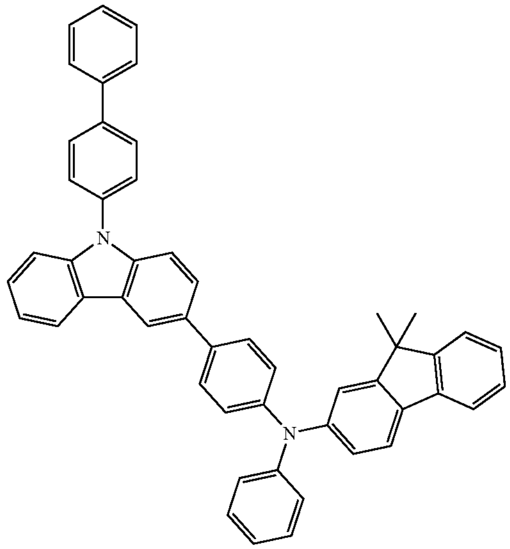
HT5
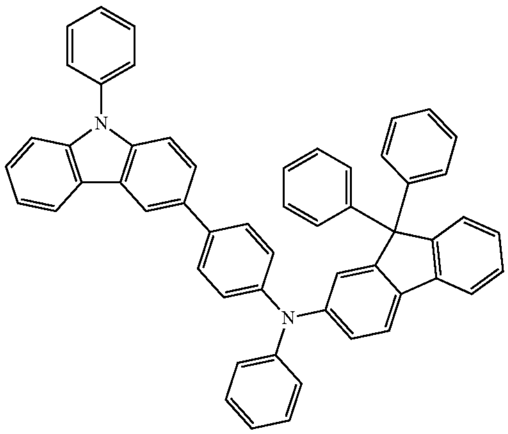
HT6
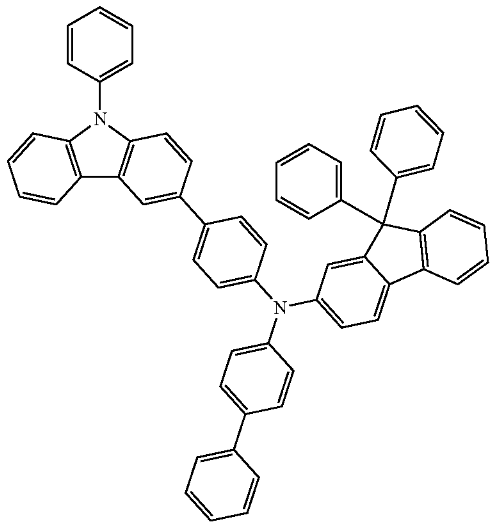
HT7
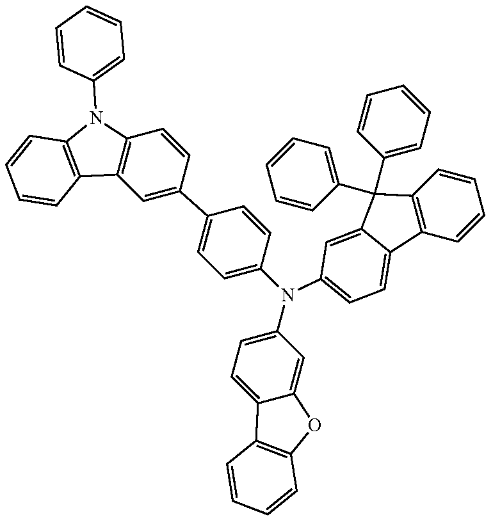
HT8
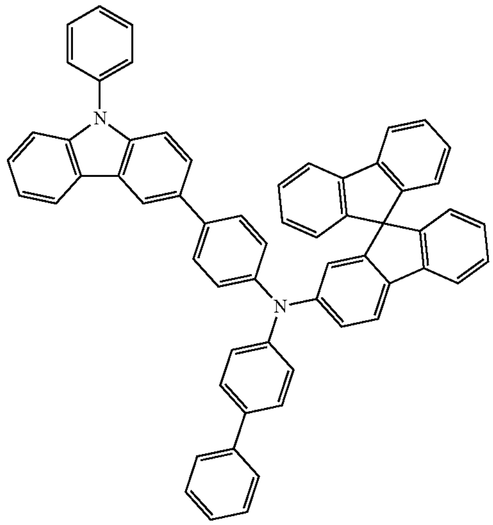

-continued
HT9
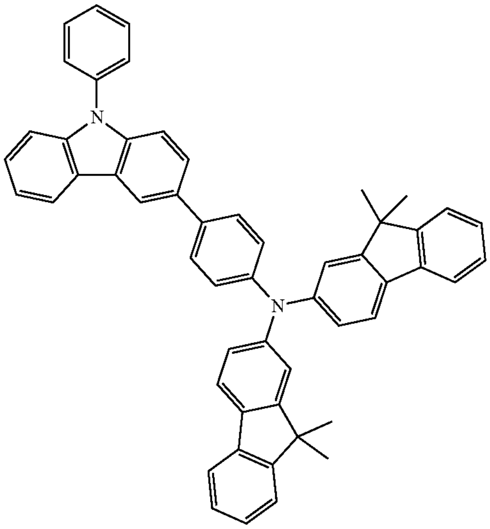
HT10
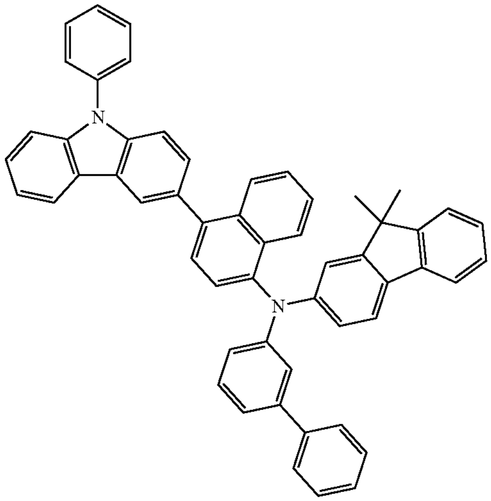
HT11
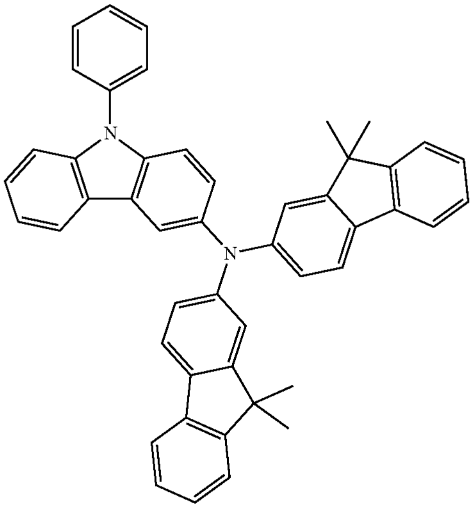
HT12
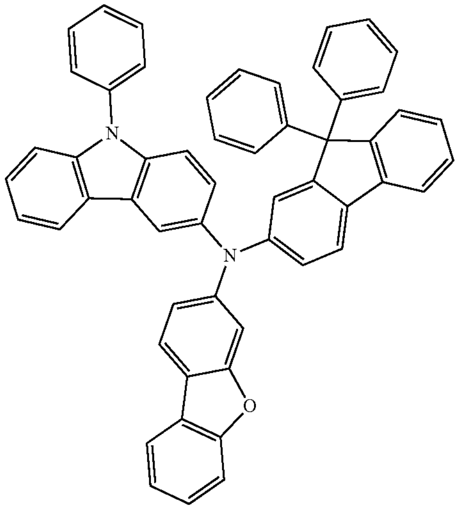
HT13
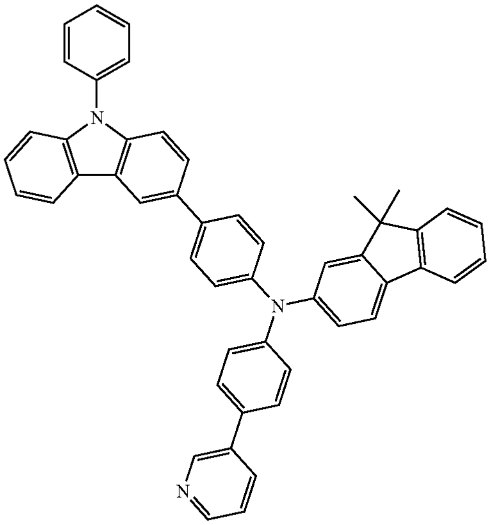
HT14
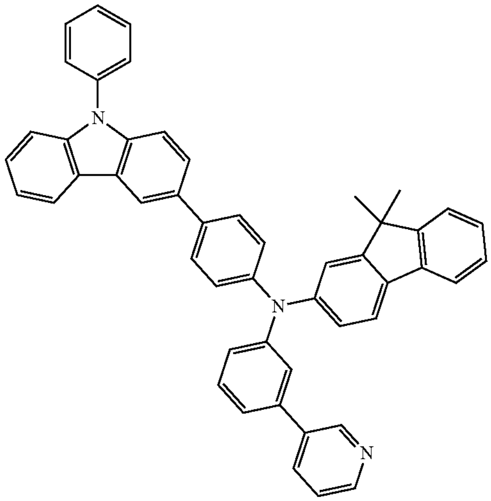

-continued
HT15
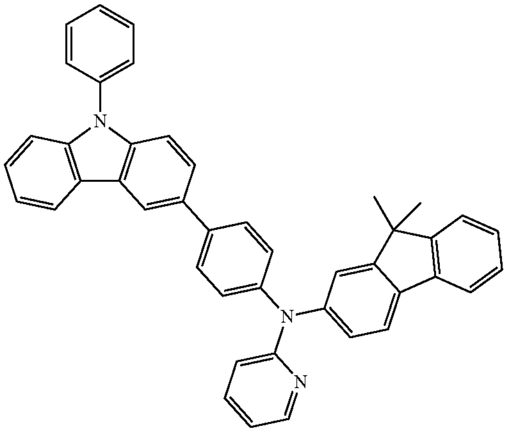
HT16
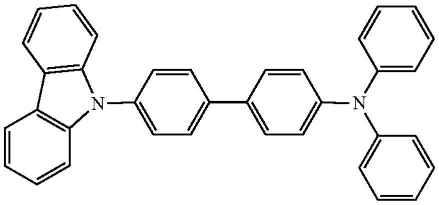
HT17
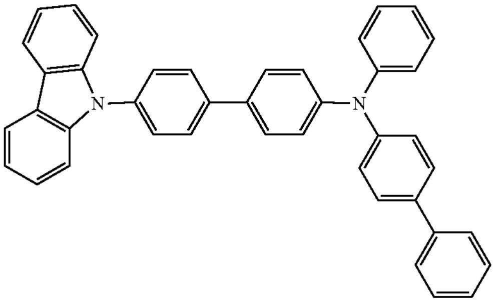
HT18
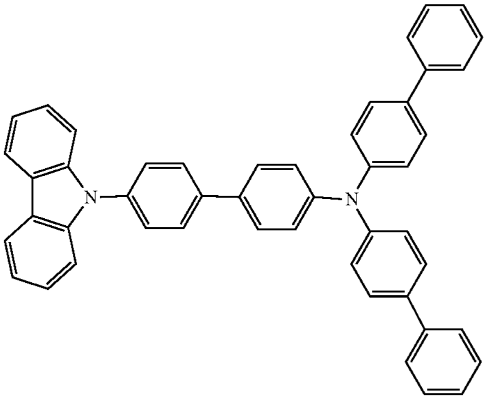
HT19
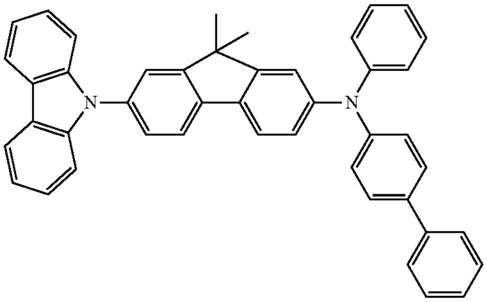
HT20
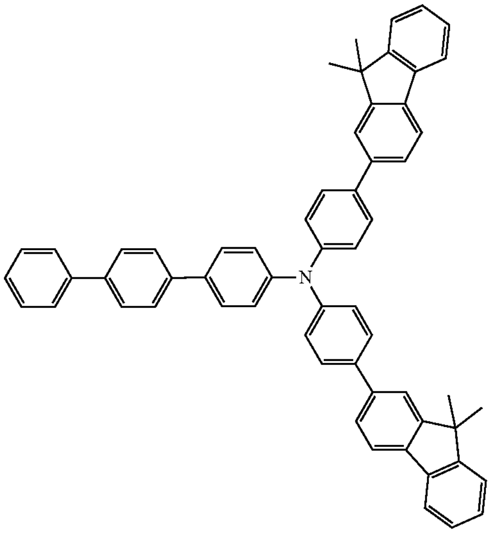

-continued
HT21
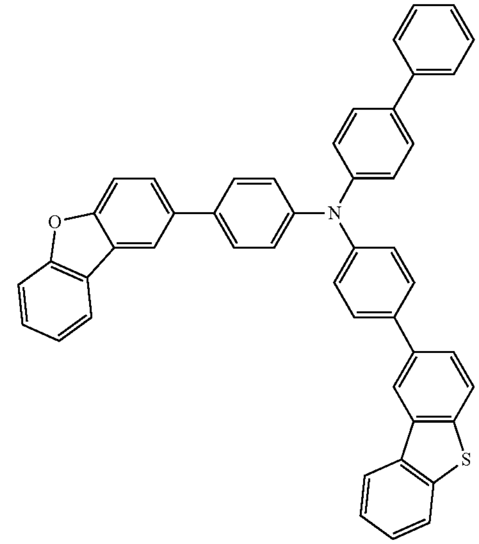
HT22
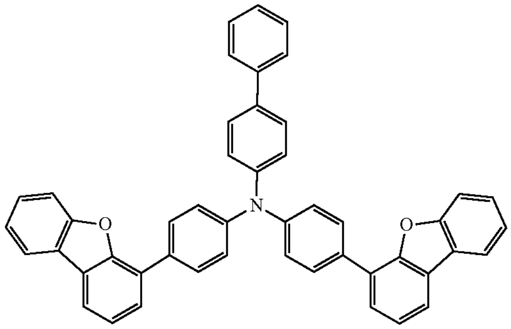
HT23
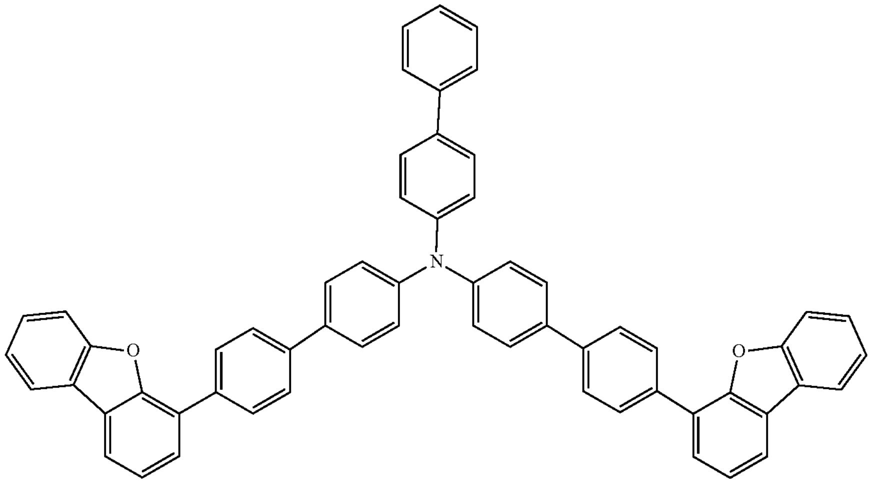
HT24
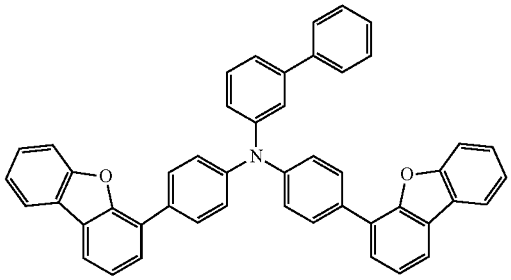
HT25
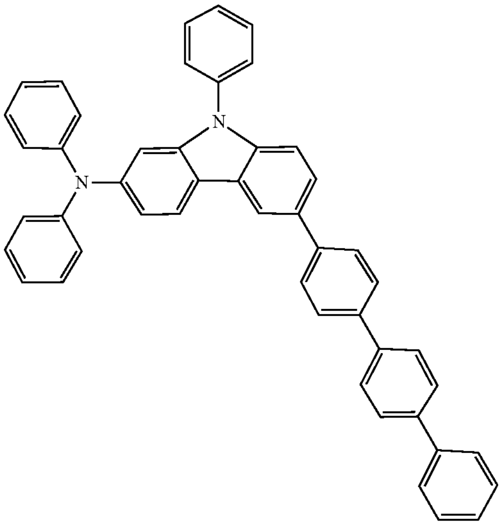

-continued
HT26
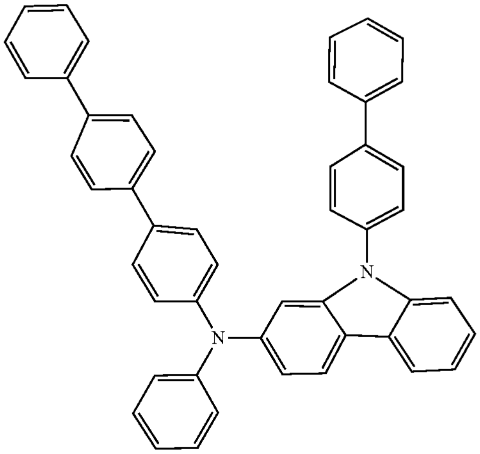
HT27
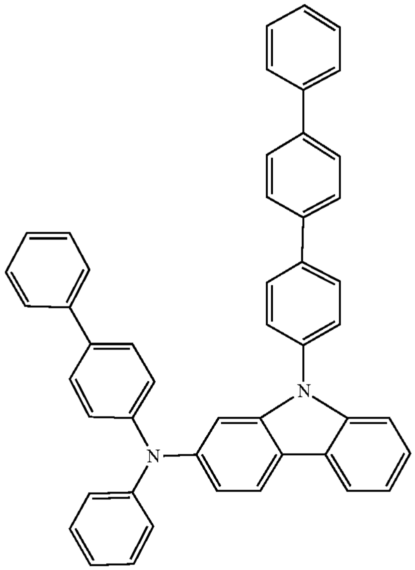
HT28
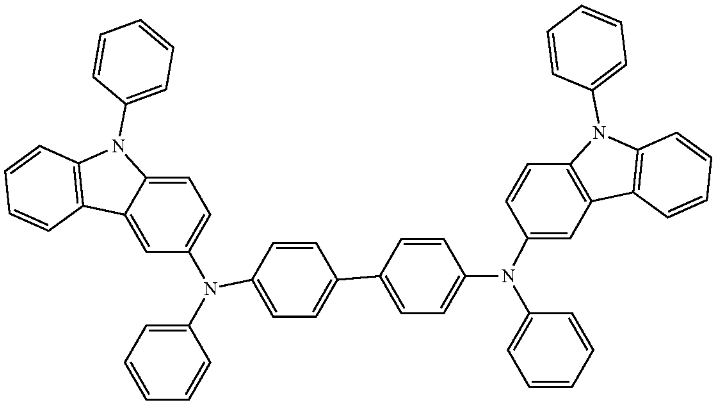
HT29
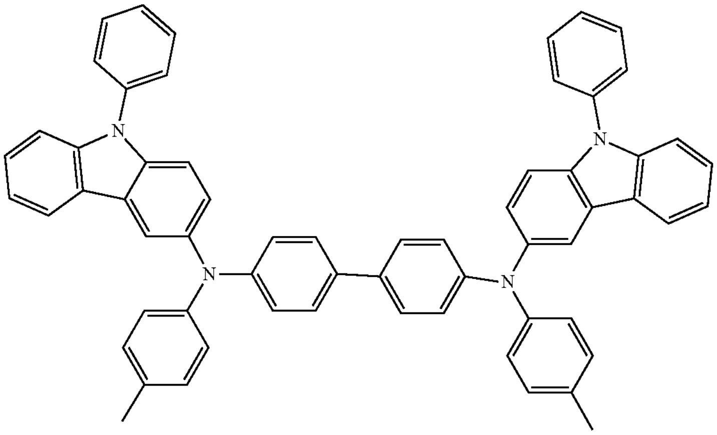

-continued
HT30
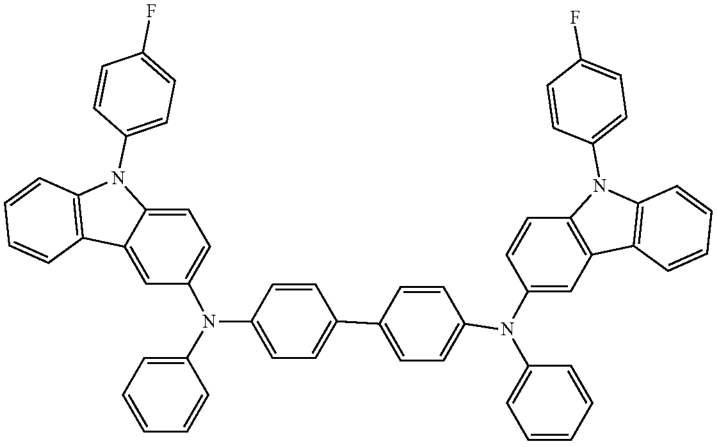
HT31
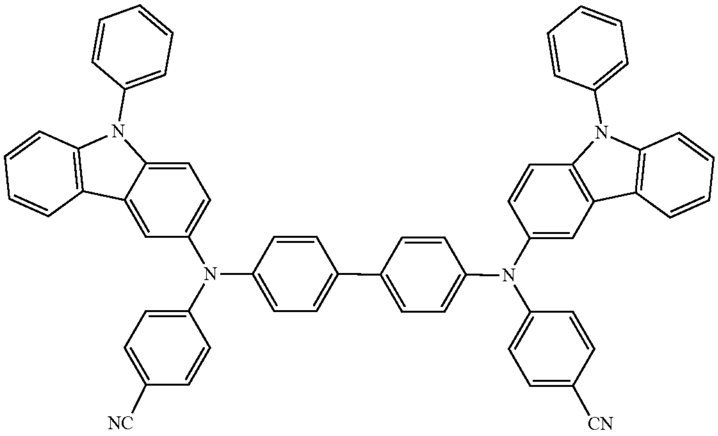
HT32
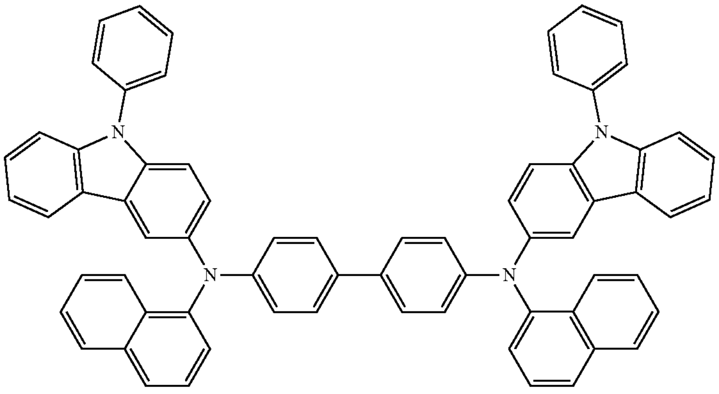

-continued
HT33
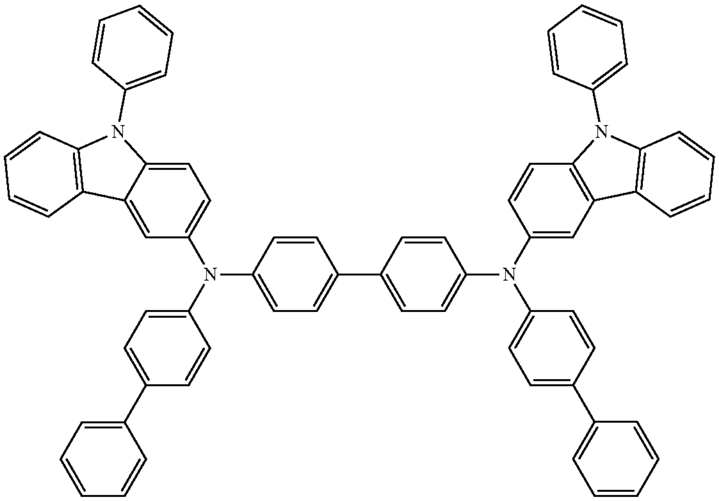
HT34
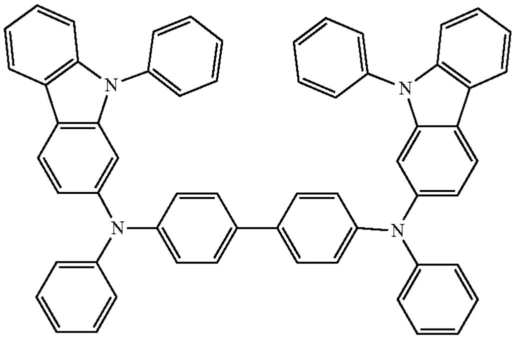
HT35
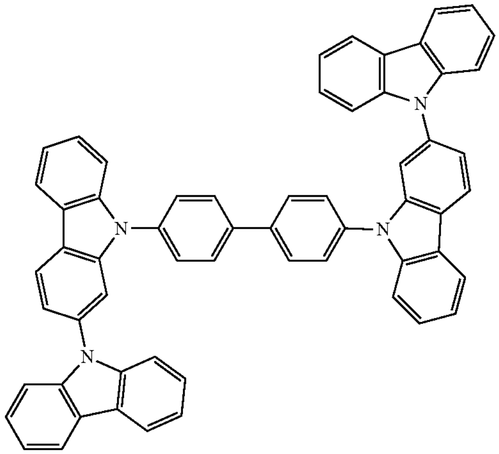
HT36
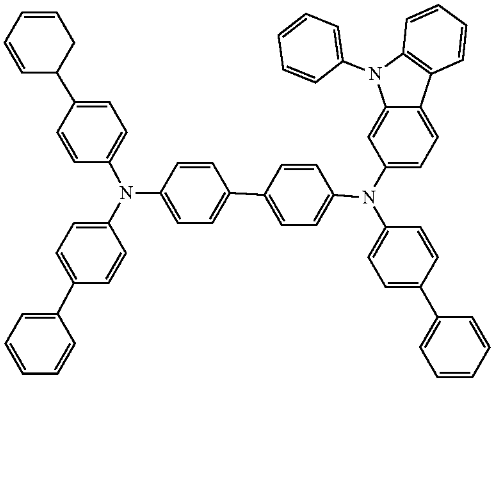
HT37
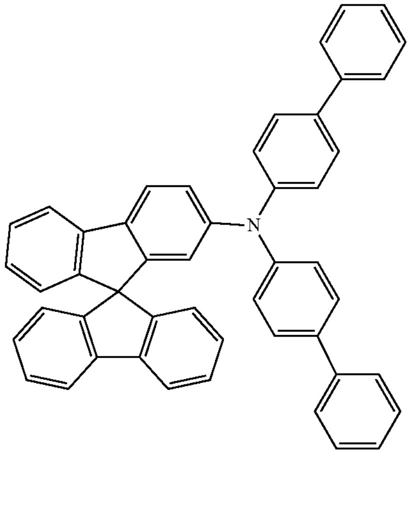

-continued
HT38
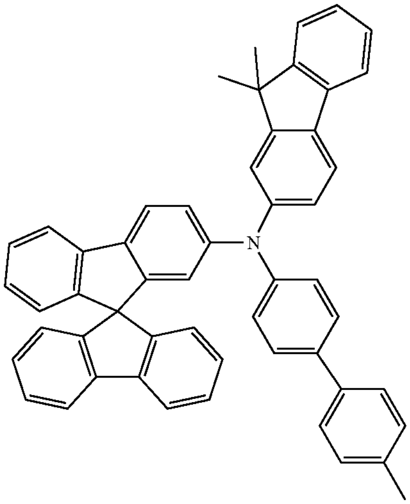
HT39
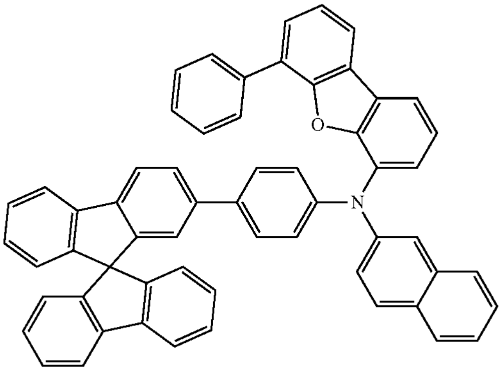
HT40
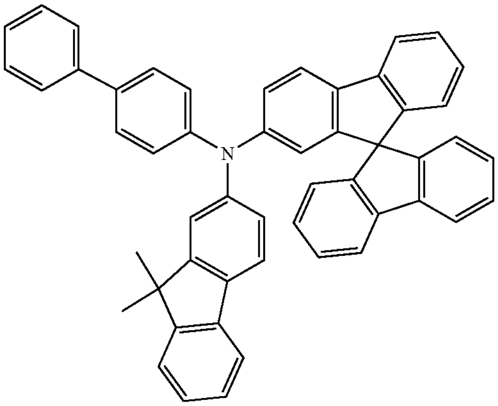
HT41
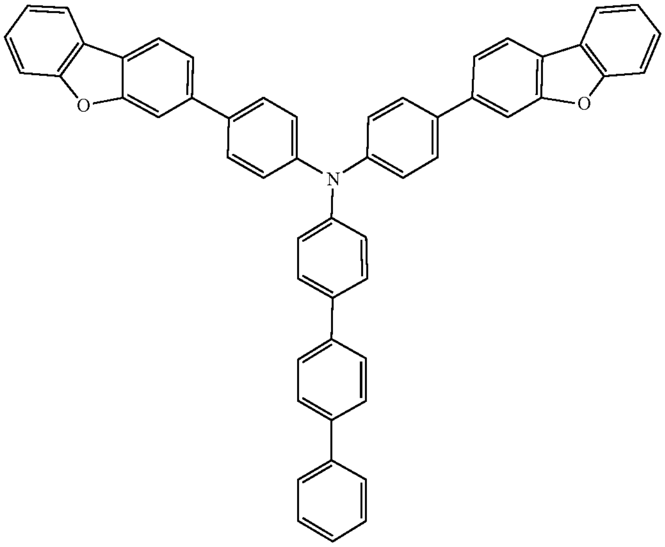

-continued
HT42
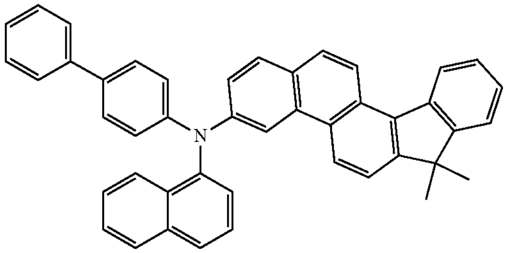
HT43
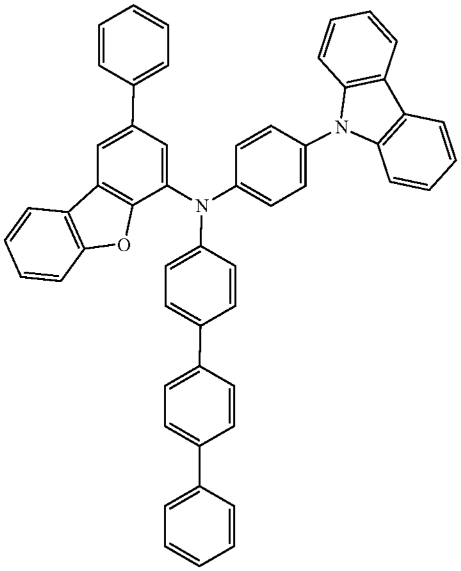
HT44
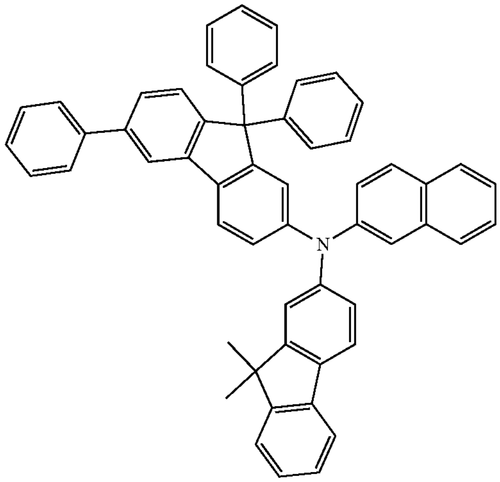
HT45
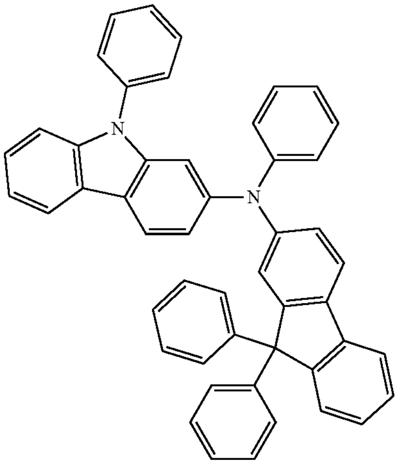
HT46
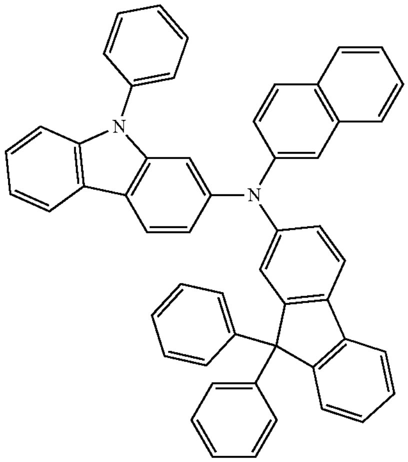

-continued
HT47
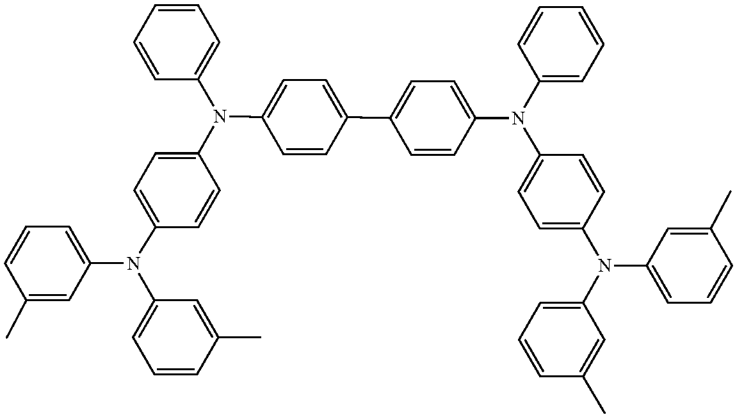
HT48
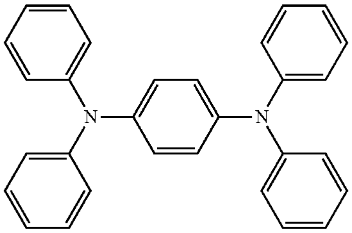
HT49
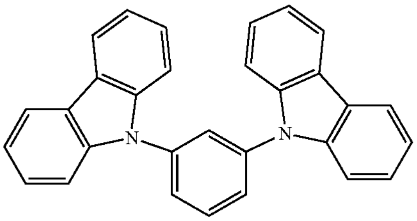
HT50
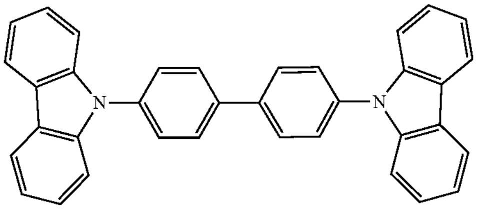
HT51
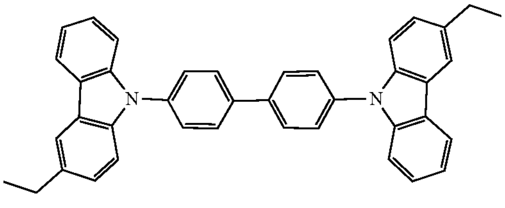
HT52
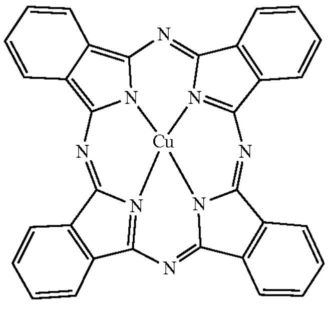
HT53
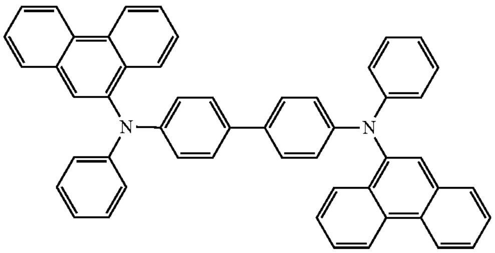

-continued
HT54
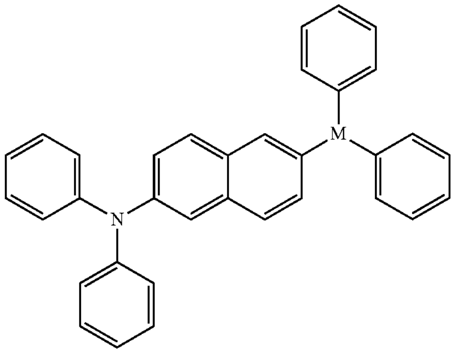
HT55
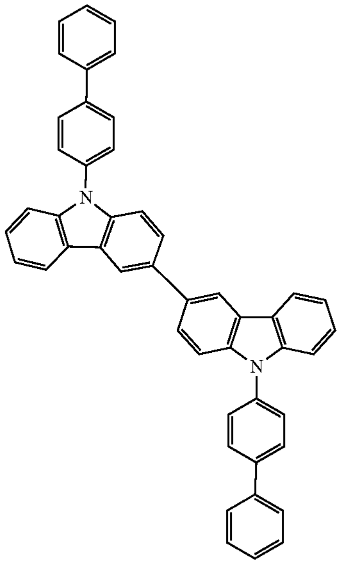
HT56
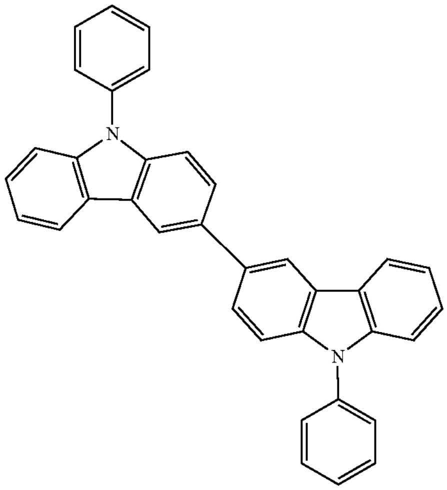
HT57
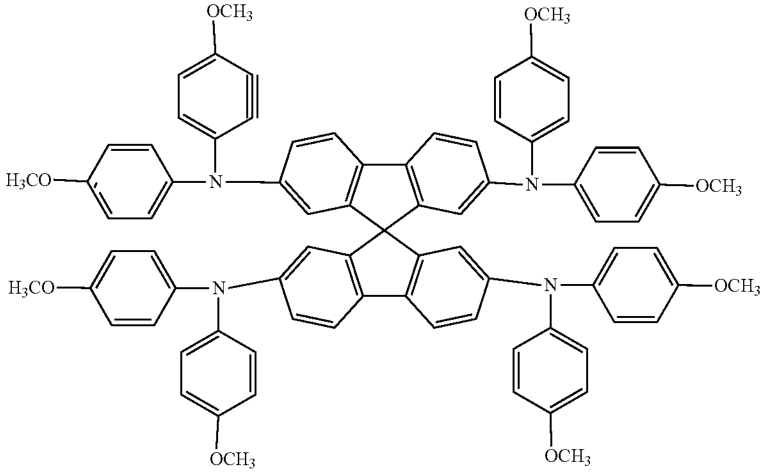

-continued
HT58
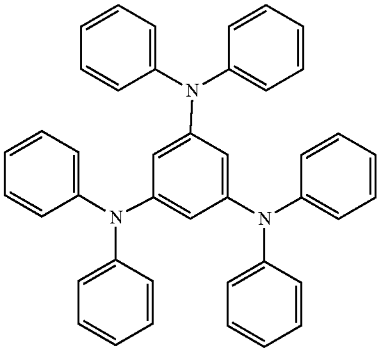
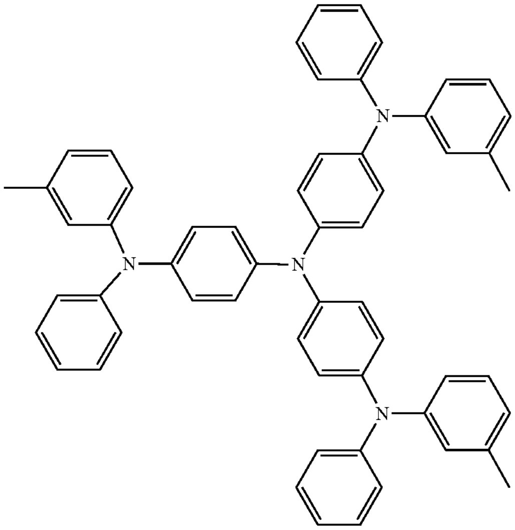
m-MTDATA
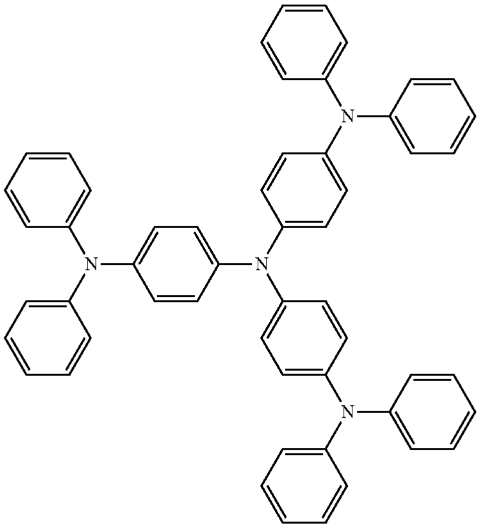
TDATA
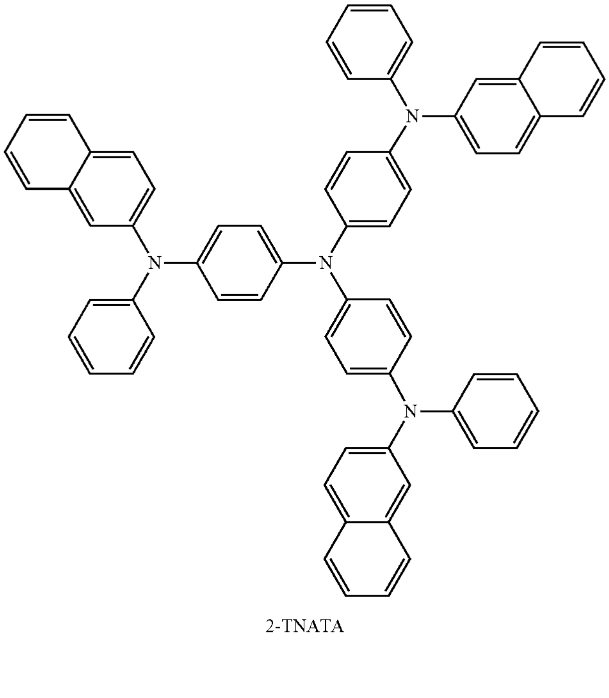
2-TNATA -continued
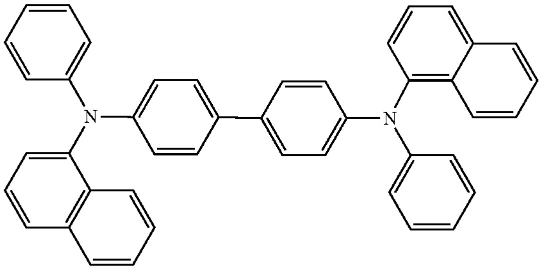
NPB
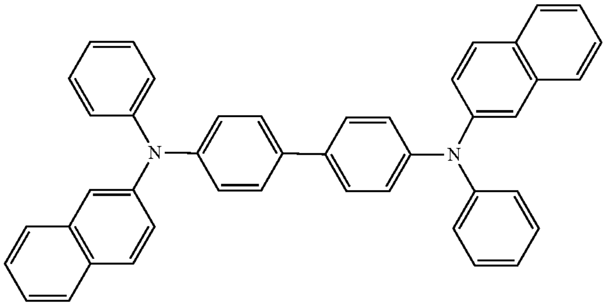
β-NPB
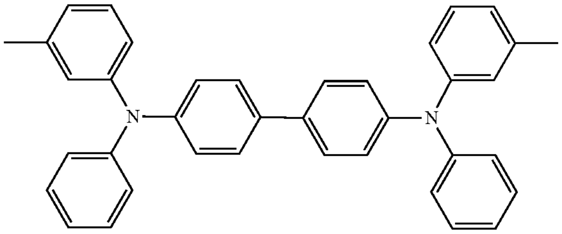
TPD
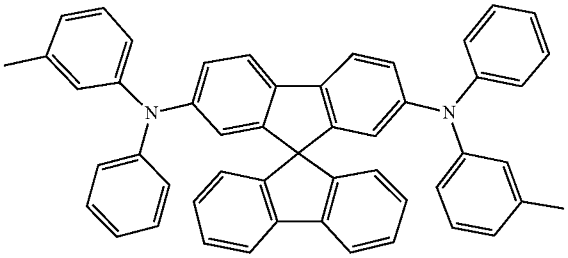
Spiro-TPD
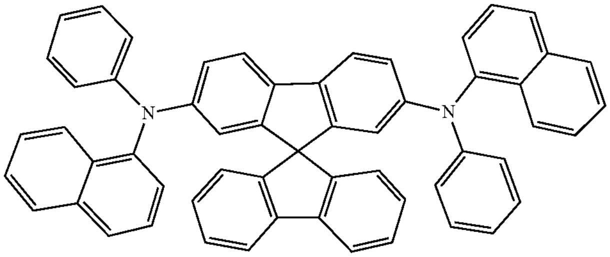
Spiro-NPB -continued

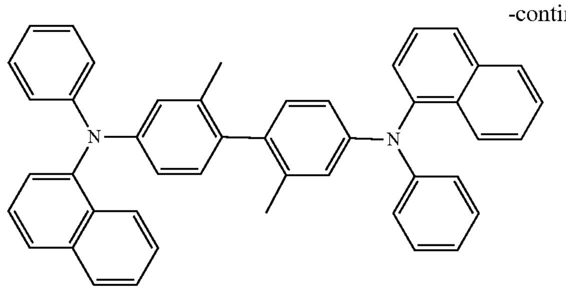

methylated-NPB

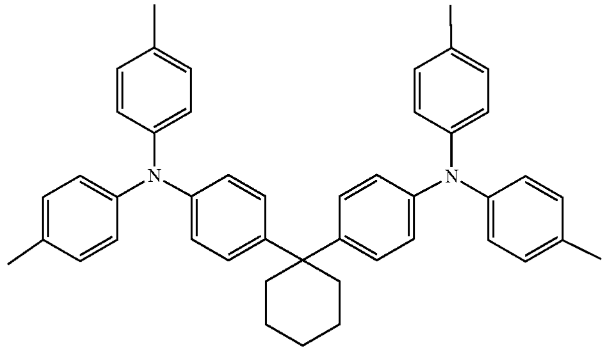

TPAC

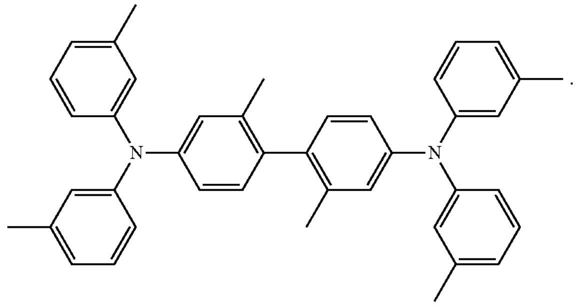

HMTPD

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 50 Å to about 9,000 Å, and a thickness of the hole transport layer may be in a range of about 50 Å to about 2,000 Å. For example, the thickness of the hole injection layer may be in a range of about 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole-transporting characteristics may be obtained without a substantial increase in driving voltage.

The emission auxiliary layer may increase light-emission efficiency by compensating for an optical resonance distance according to a wavelength of light emitted by an emission layer, and the electron blocking layer may block the leakage of electrons from an emission layer to a hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, a lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or any combination thereof.

Examples of the quinone derivative may include TCNQ, F4-TCNQ, and the like.

Examples of the cyano group-containing compound may include HAT-CN, F6-TNAP, Compound 201, and Compound 202, and a compound represented by Formula 221.

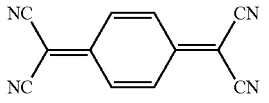

TCNQ

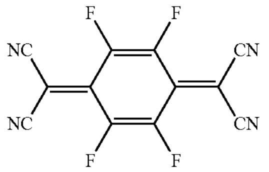

F4-TCNQ

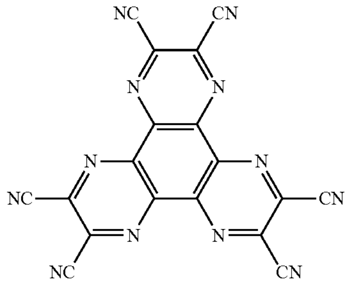

HAT-CN

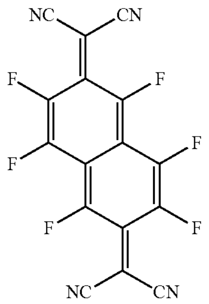

F6-TNAP

201

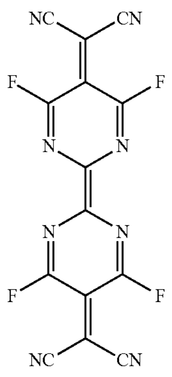

-continued

202

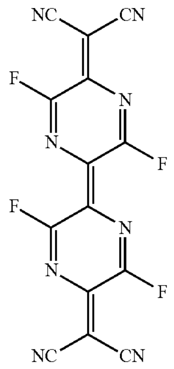

[Formula 221]

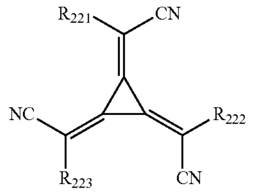

In Formula 221, $R_{221}$ to $R_{223}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be a non-metal, a metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

In an embodiment, examples of the compound containing element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCL_2$, $BeBr_2$, $MgBr_2$, $CaBr_2$, $SrBr_2$, $BaBr_2$, $Be_{12}$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $COI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

The emission layer may include a host and a dopant. The dopant may include a phosphorescent dopant, a fluorescent dopant, or any combination thereof.

An amount of the dopant in the emission layer may be in a range of about 0.01 parts by weight to about 15 parts by weight, based on 100 parts by weight of the host.

The emission layer may include a host and a dopant, the host may include a first compound and a second compound, the dopant may include a third compound and a fourth compound, and the first compound, the second compound, the third compound, and the fourth compound may be different from each other.

In an embodiment, the emission layer may include a quantum dot.

In an embodiment, the emission layer may include a delayed fluorescence material. The delayed fluorescence material may serve as a host or as a dopant in the emission layer.

[Host]

The host in the emission layer may include the first and second compounds as described herein.

In an embodiment, the host may include a compound represented by Formula 301:

$$[Ar_{301}]_{xb11}\text{-}[(L_{301})_{xb1}\text{-}R_{301}]_{xb21} \quad \text{[Formula 301]}$$

In Formula 301, $Ar_{301}$ and $L_{301}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are each independently the same as described in connection with $Q_1$.

In an embodiment, in Formula 301, when xb11 is 2 or more, two or more of $Ar_{301}$(s) may be linked to each other via a single bond.

In an embodiment, the host may include a compound represented by Formula 301-1, a compound represented by Formula 301-2, or any combination thereof:

[Formula 301-1]

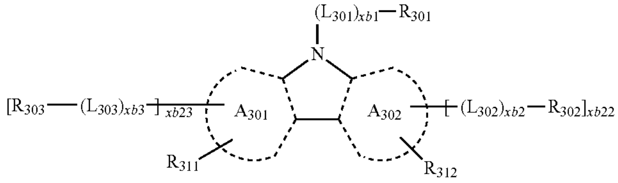

[Formula 301-2]

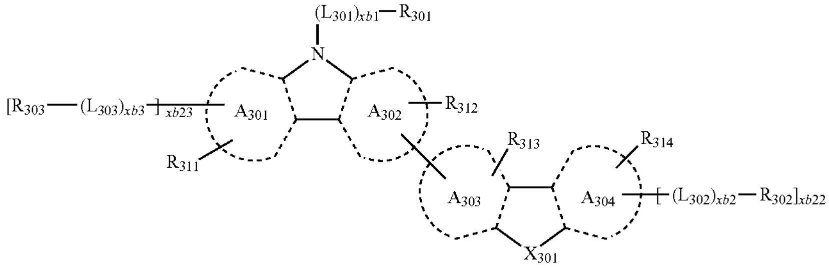

In Formulae 301-1 and 301-2, ring $A_{301}$ to ring $A_{304}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ are respectively the same as described herein, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are each independently the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or a combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

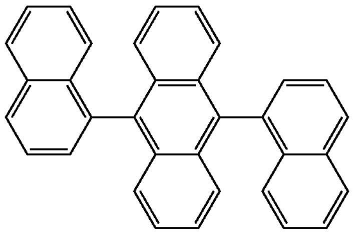

-continued

H2

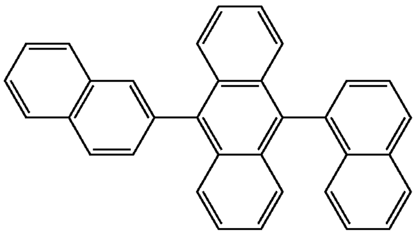

H3

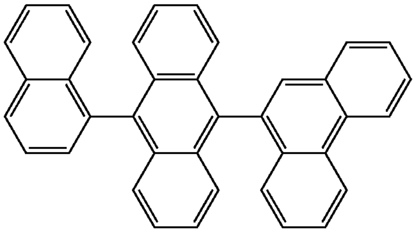

H4

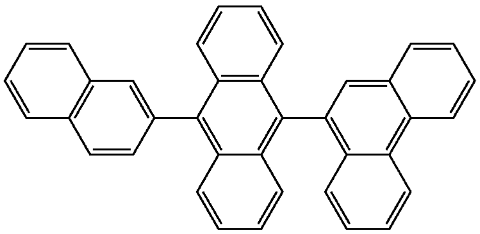

H5

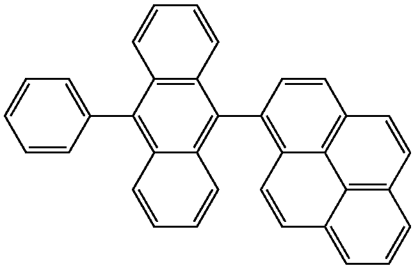

-continued
H6
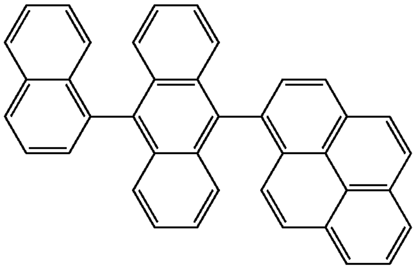
H7
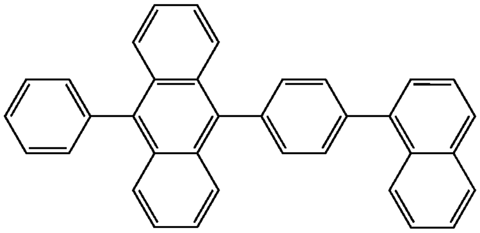
H8
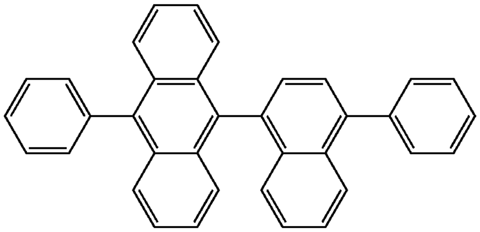
H9
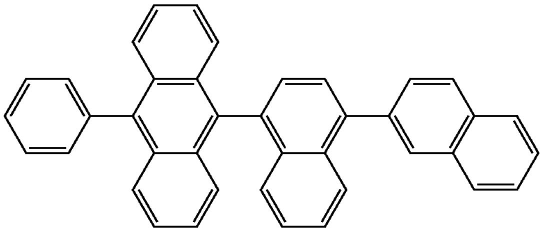
H10
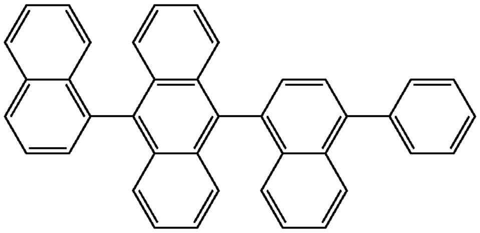
H11
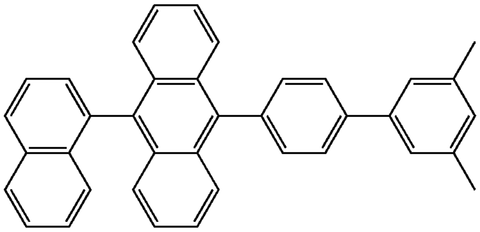
-continued
H12
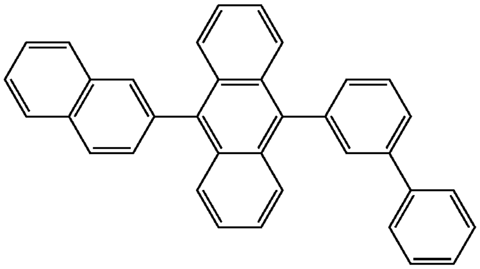
H13
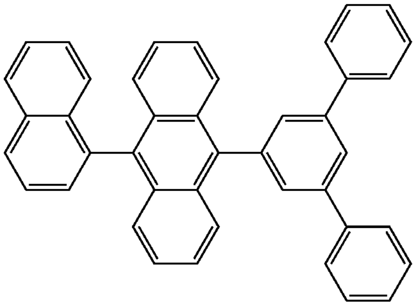
H14
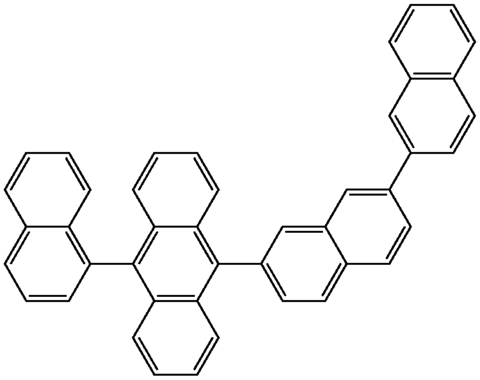
H15
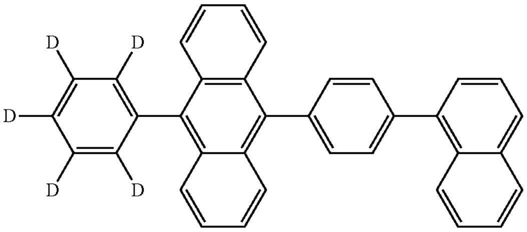
H16
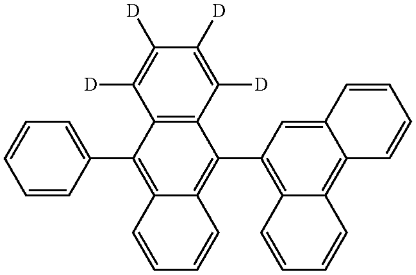

-continued
H17
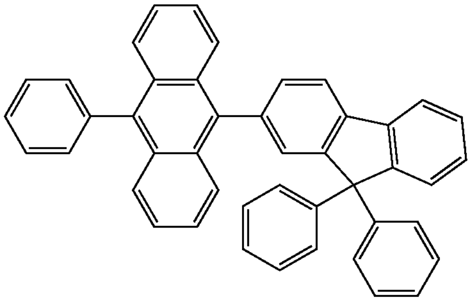
H18
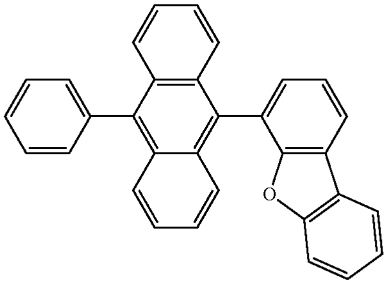
H19
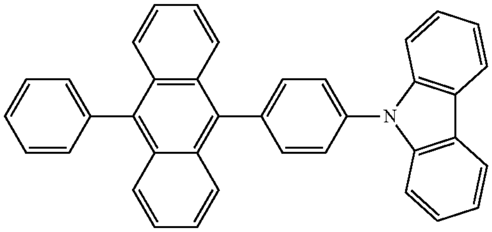
H20
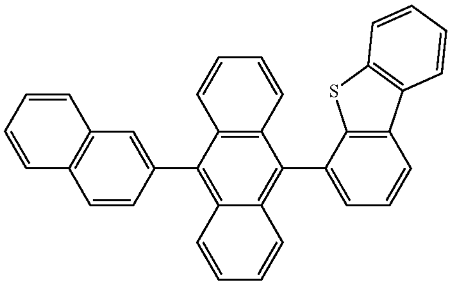
H21
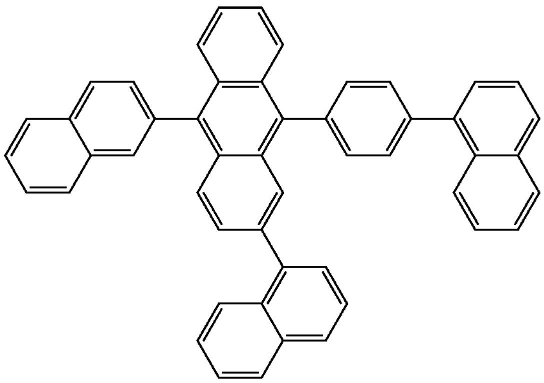
-continued
H22
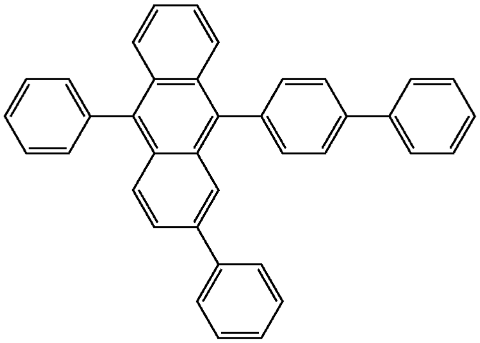
H23
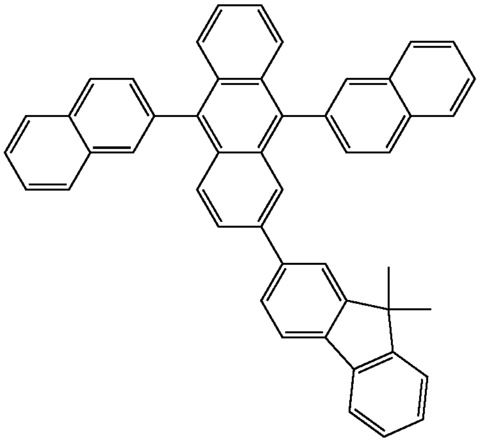
H24
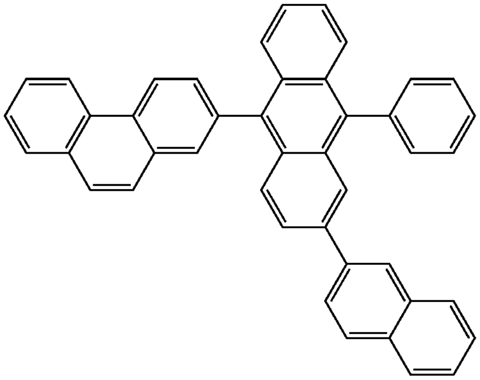

-continued
H25
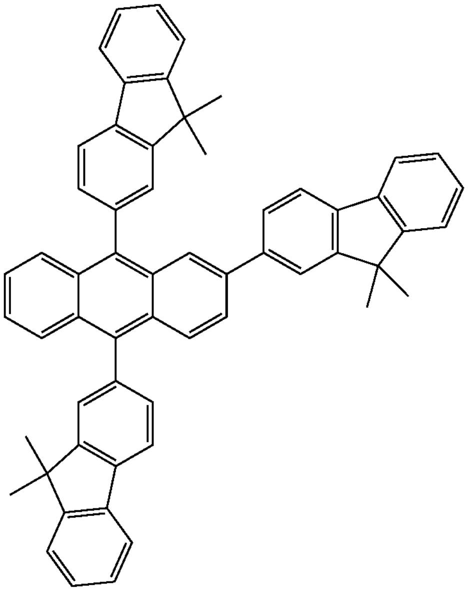
H26
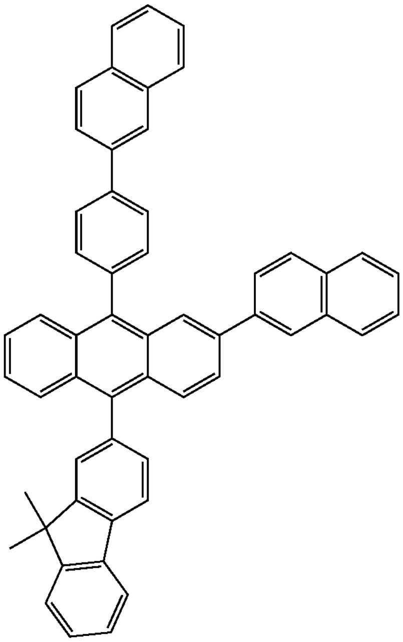
-continued
H27
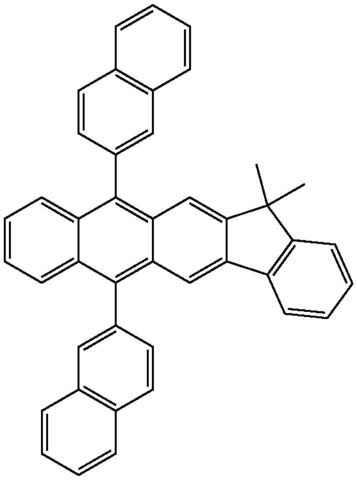
H28
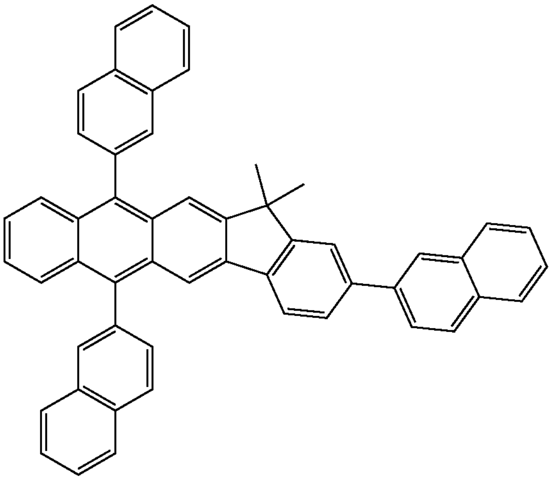
H29
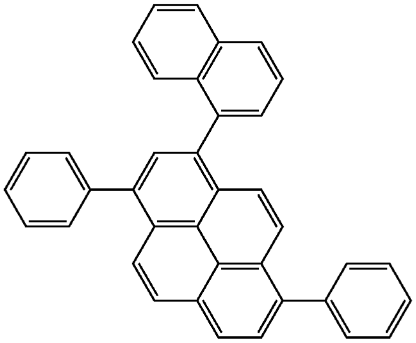

-continued
H30
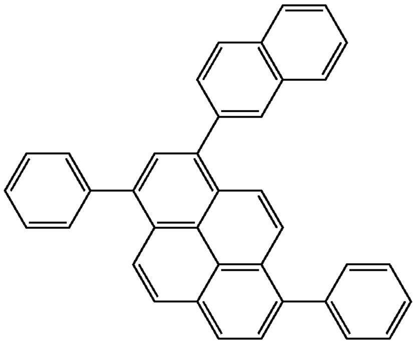
H31
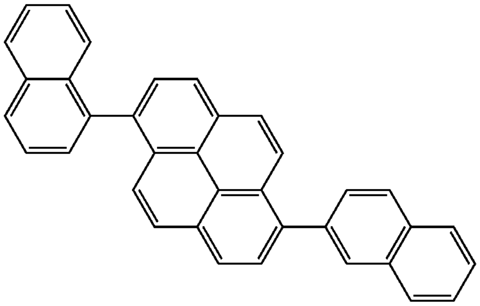
H32
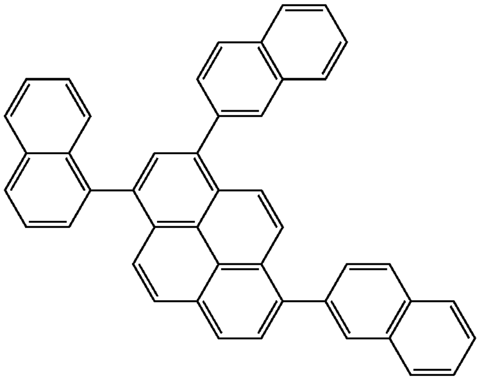
H33
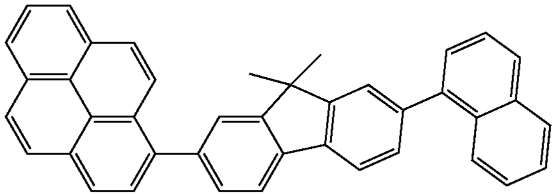
H34
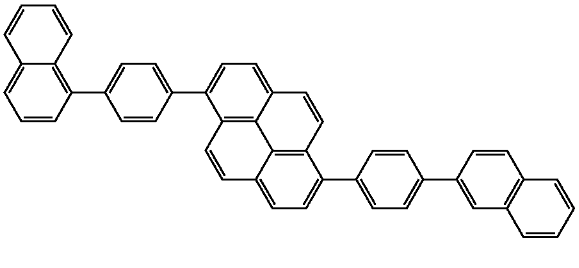
-continued
H35
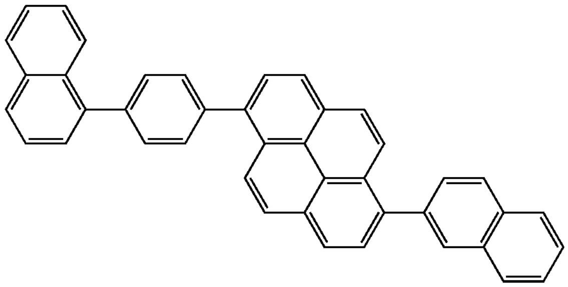
H36
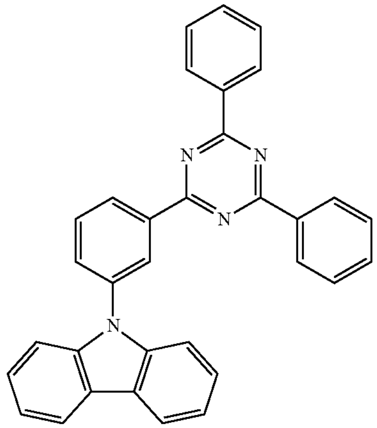
H37
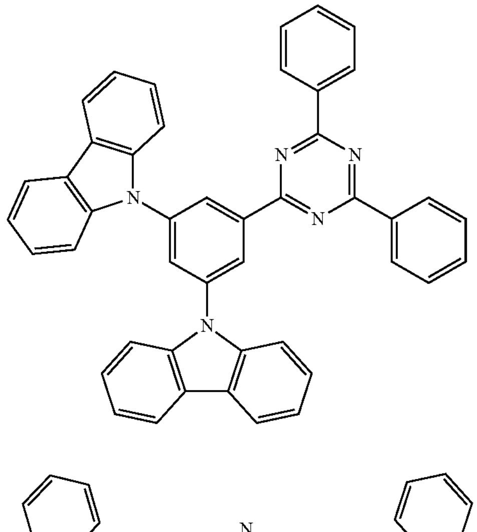
H38
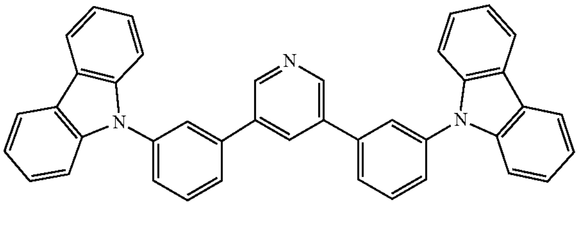

H39
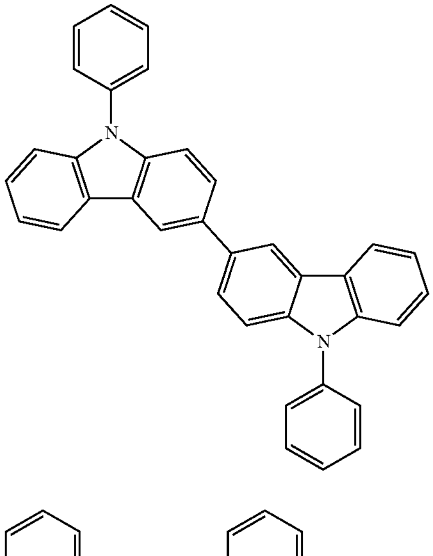
H40
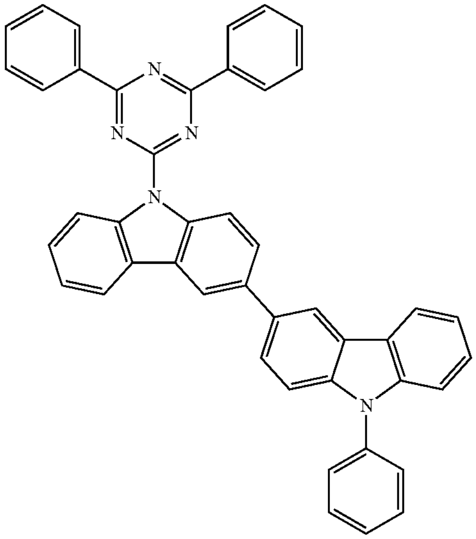
H41
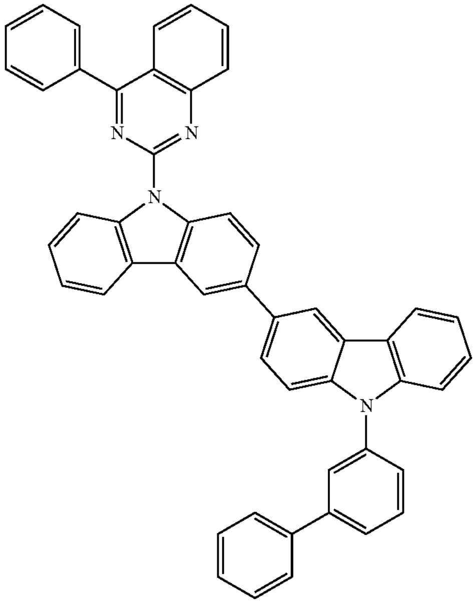
H42
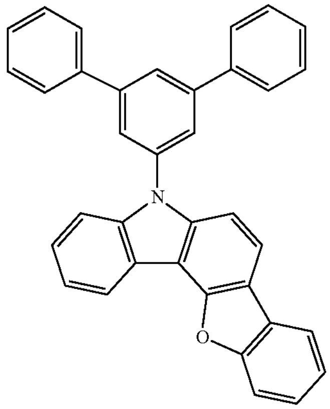
H43
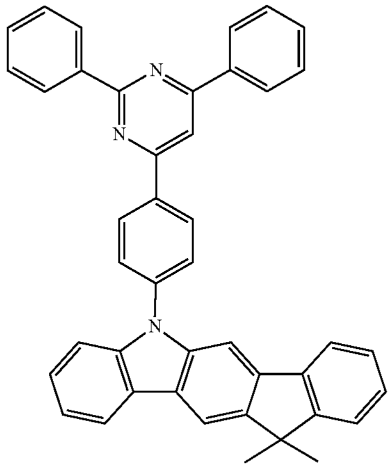
H44
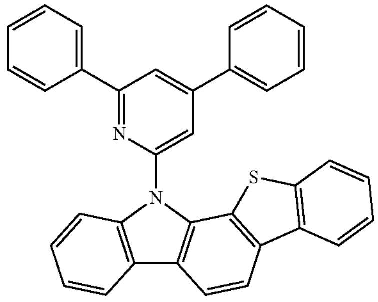
H45
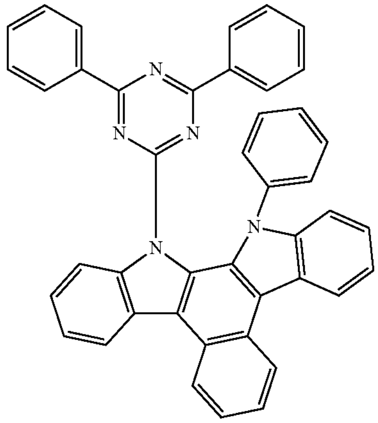

-continued
H46
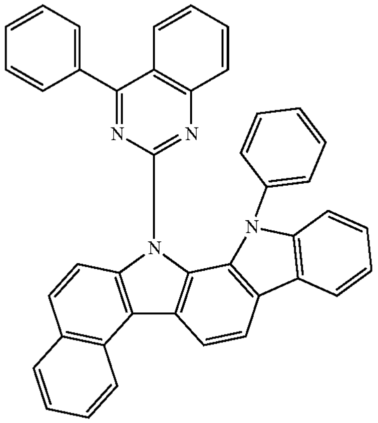
H47
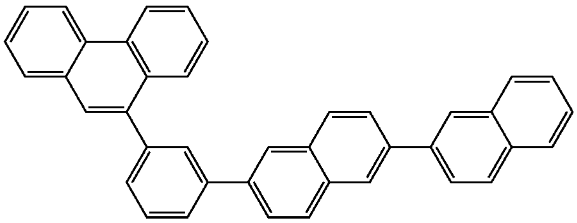
H48
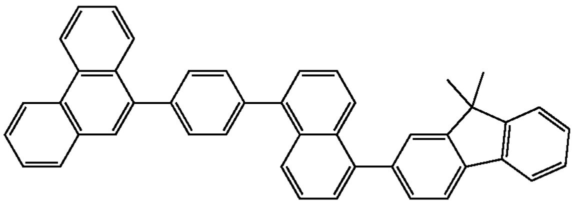
H49
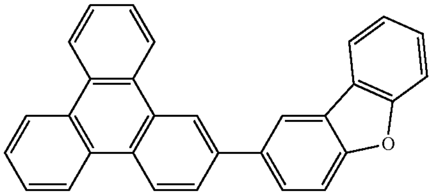
H50
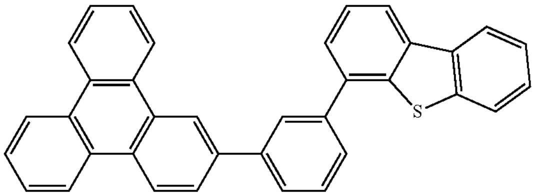
H51
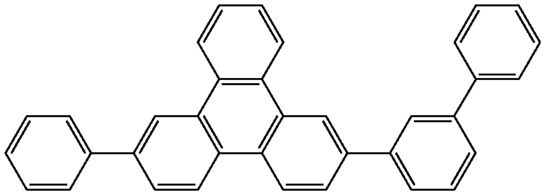
-continued
H52
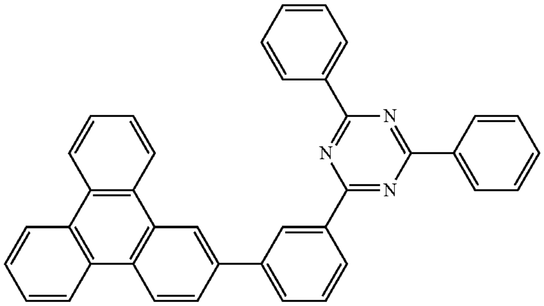
H53
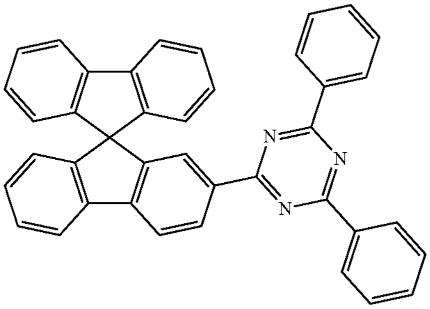
H54
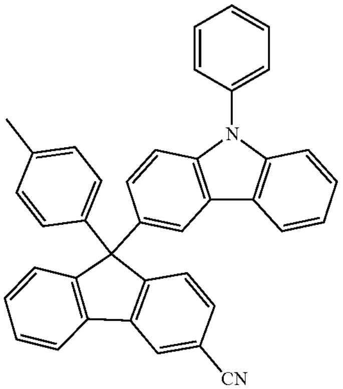
H55
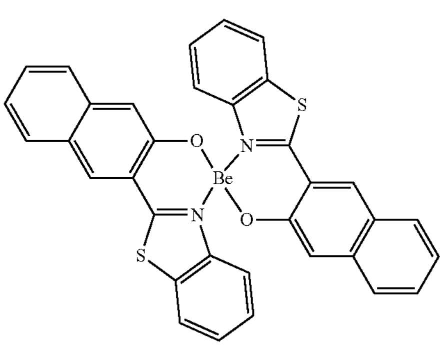

-continued
H56
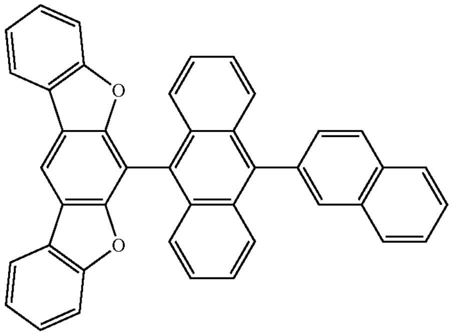
H57
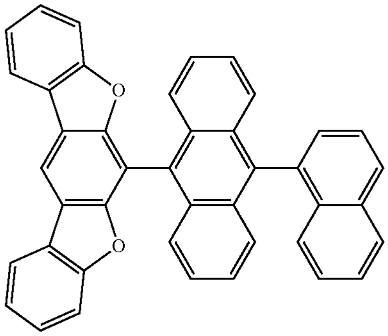
H58
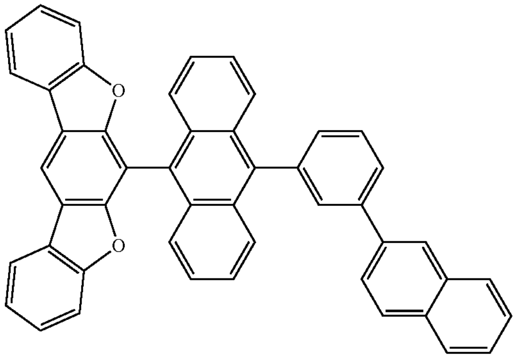
H59
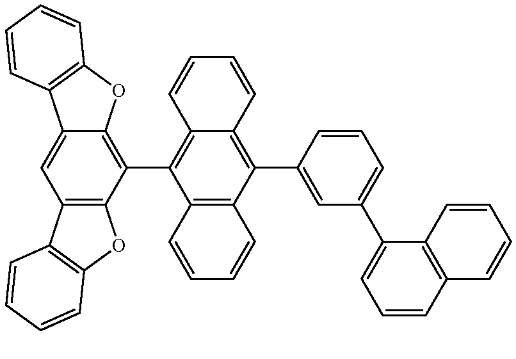
-continued
H60
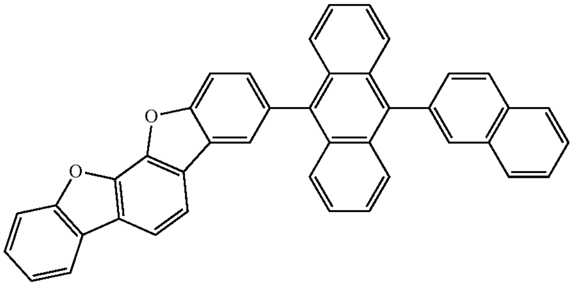
H61
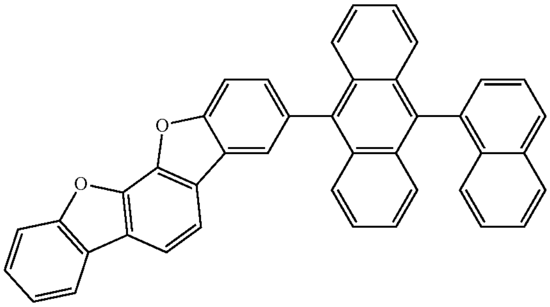
H62
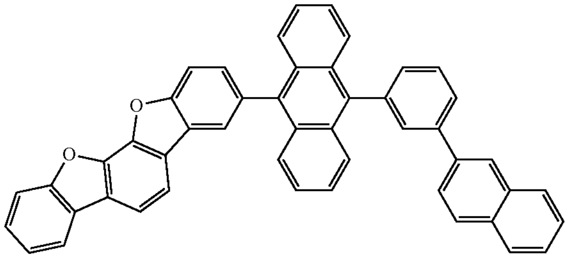
H63
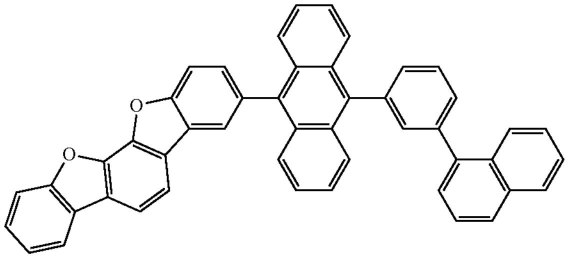
H64
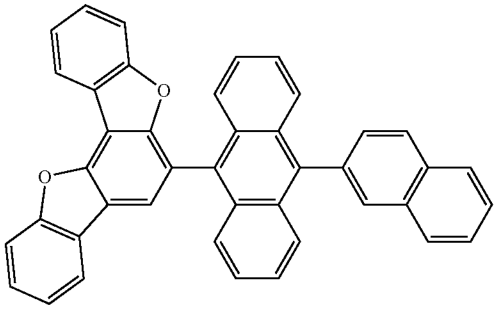

-continued
H65
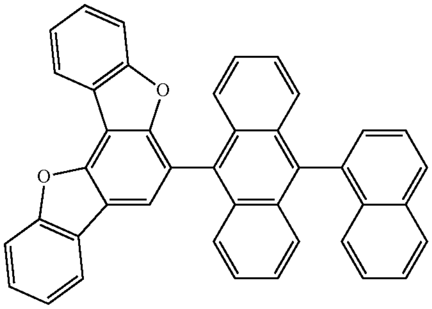
H66
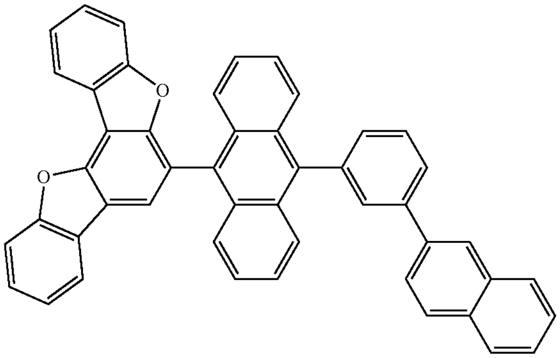
H67
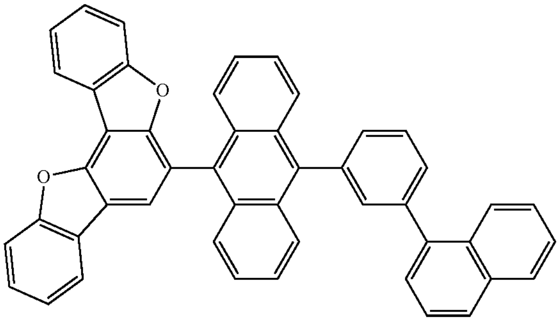
H68
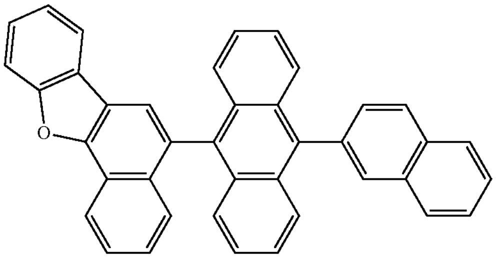
H69
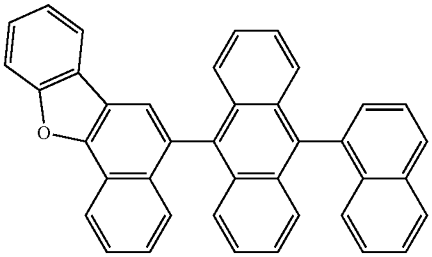
-continued
H70
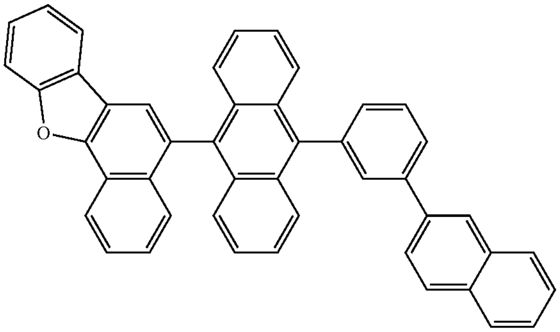
H71
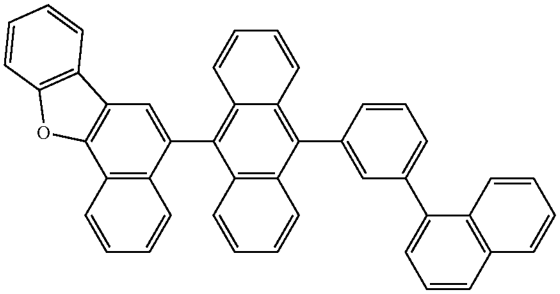
H72
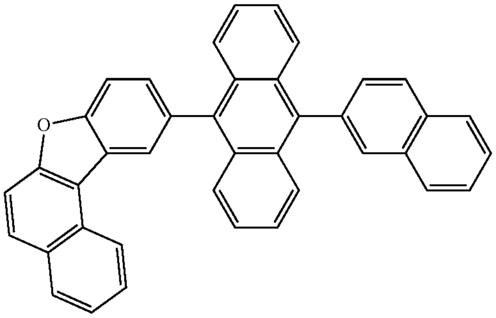
H73
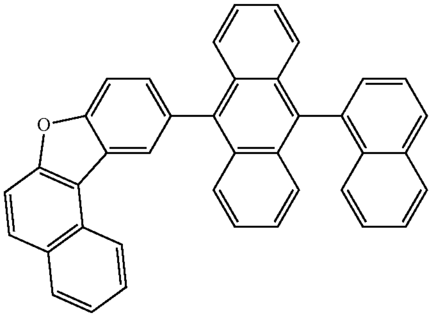

H74
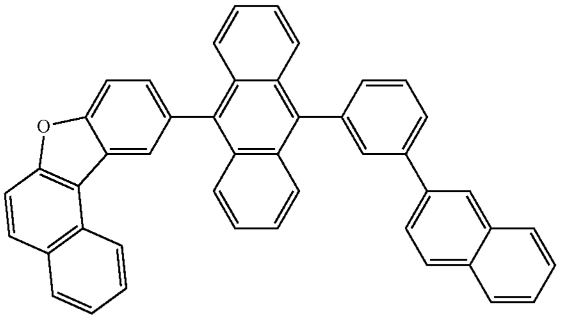
H75
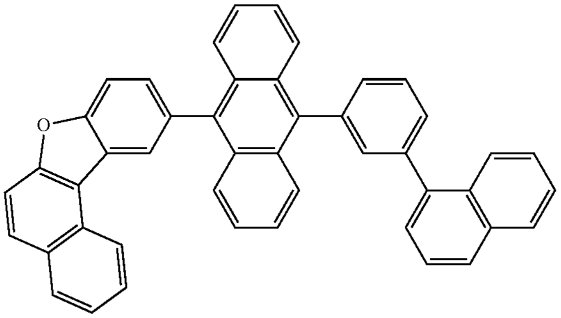
H76
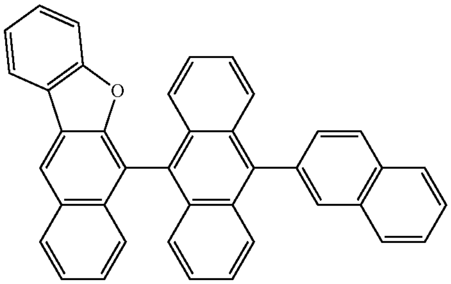
H77
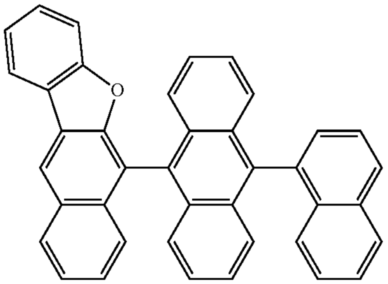
H78
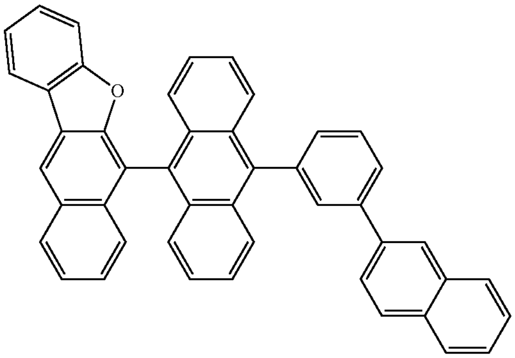
H79
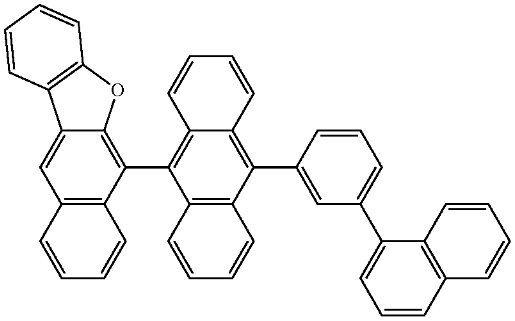
H80
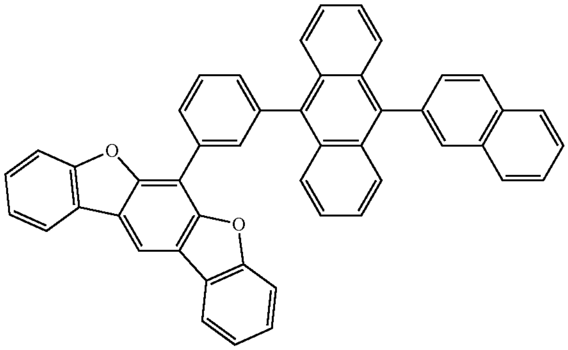
H81
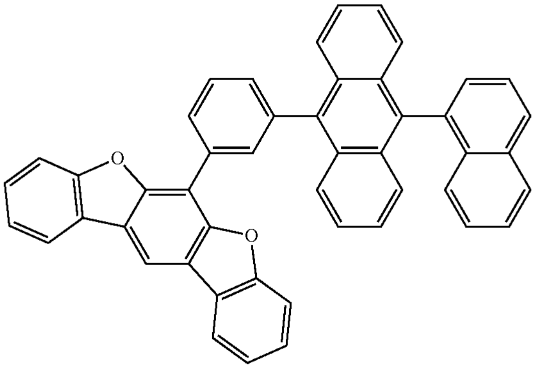
H82
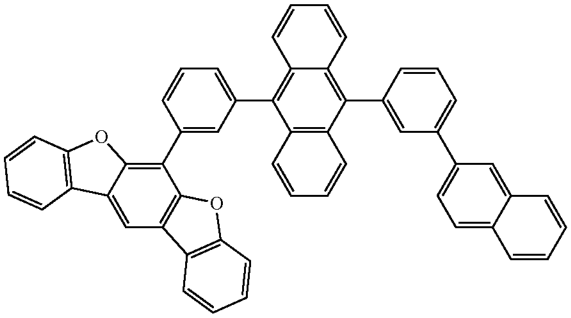

H83
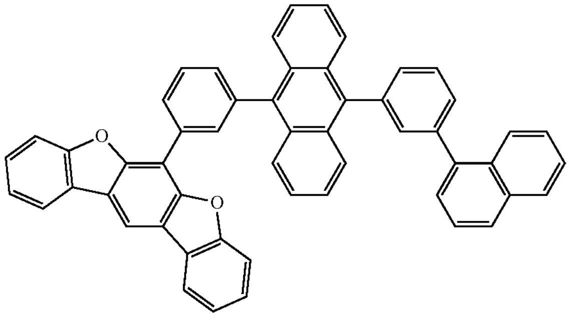
H84
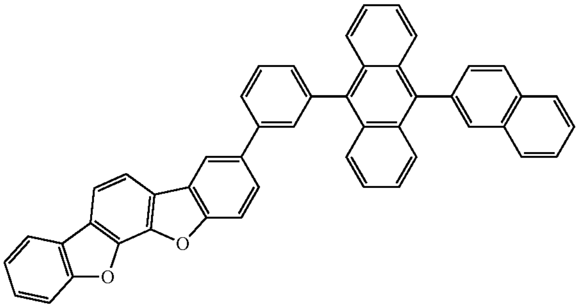
H85
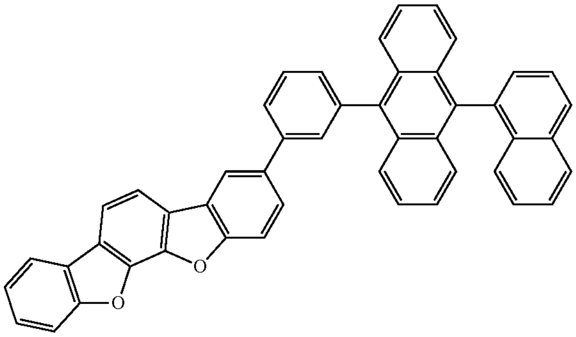
H86
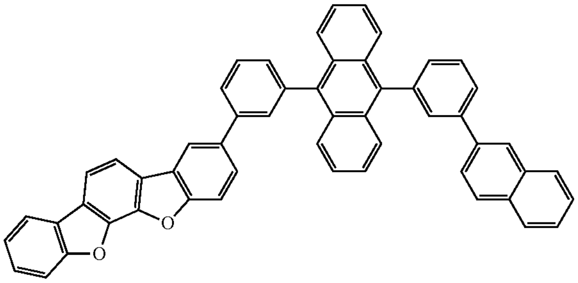
H87
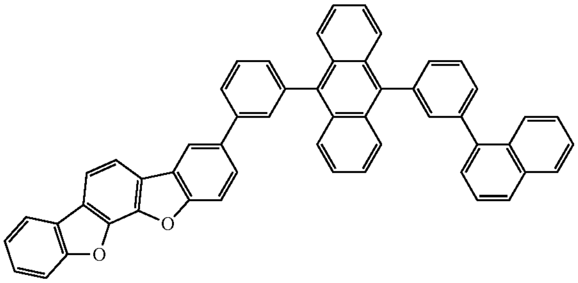
H88
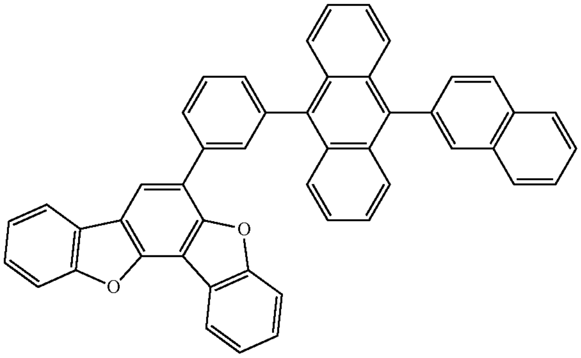
H89
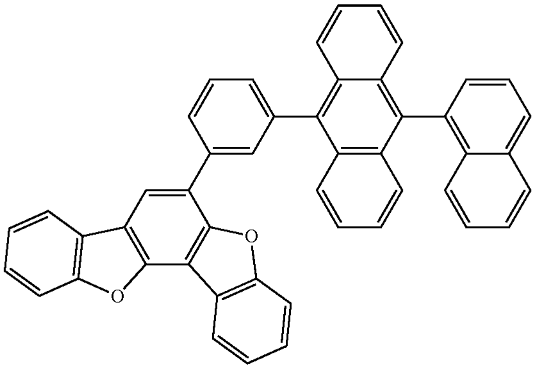
H90
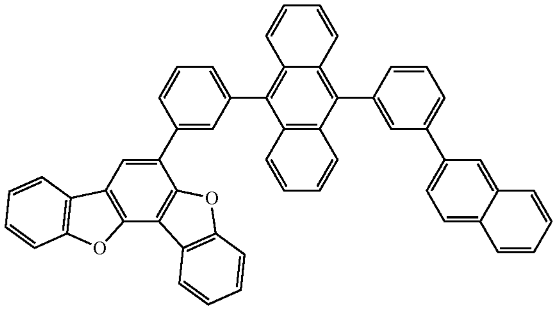
H91
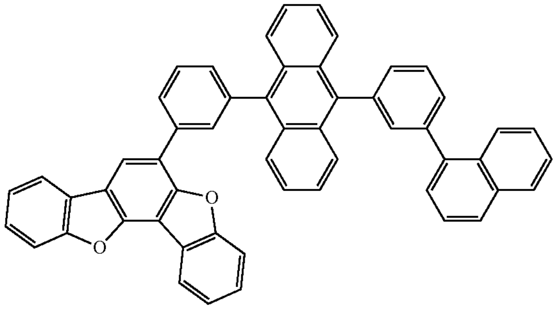

-continued
H92
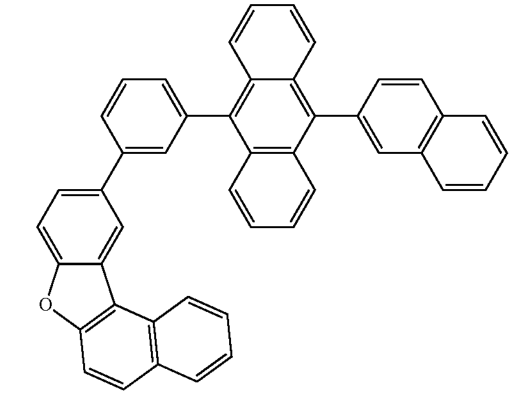
H93
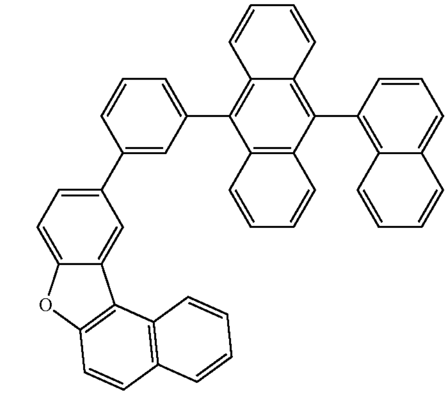
H94
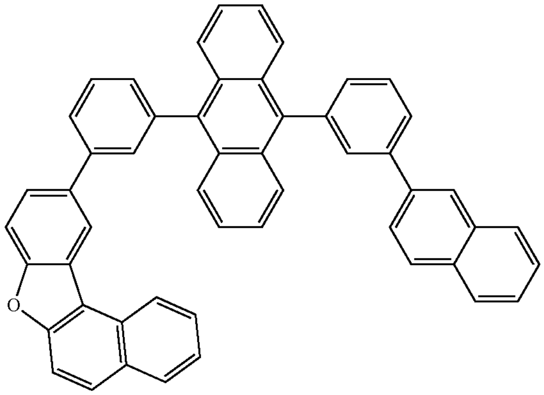
H95
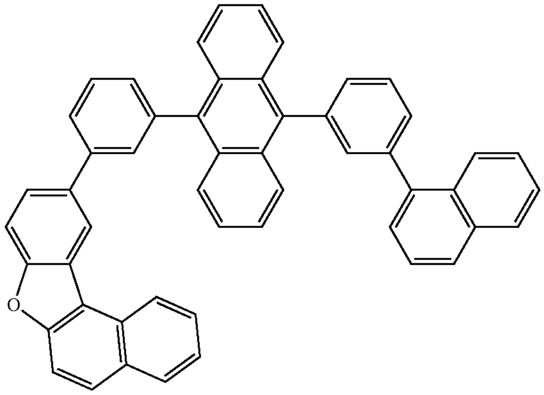
-continued
H96
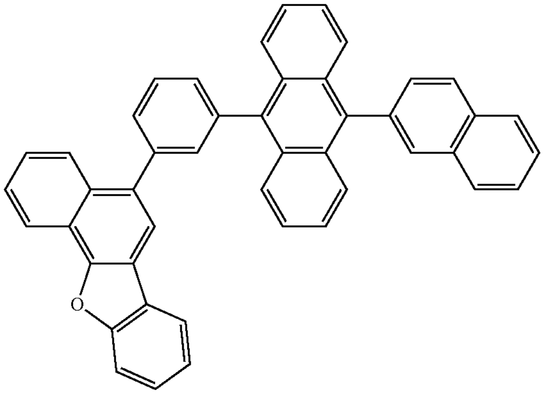
H97
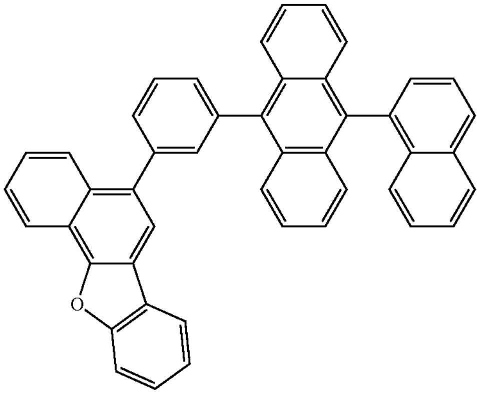
H98
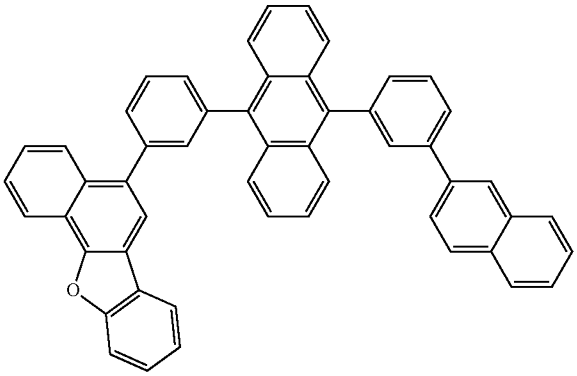
H99
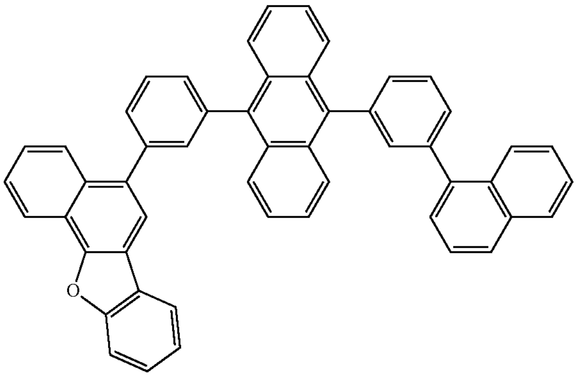

-continued
H100
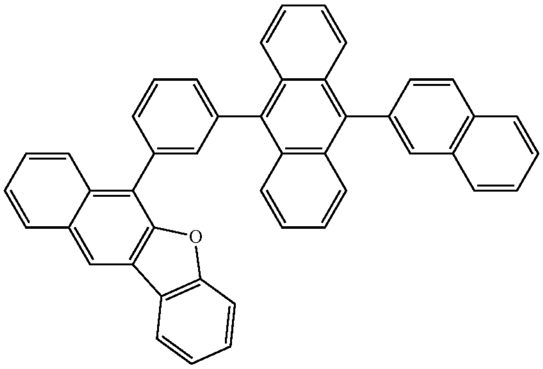
H101
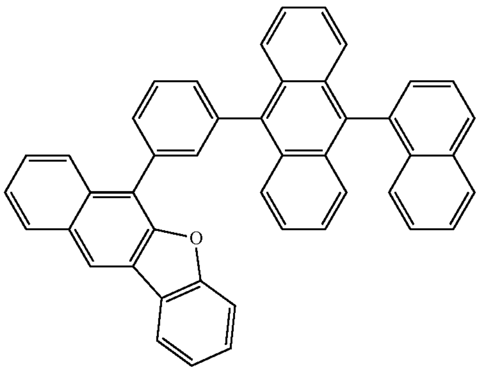
H102
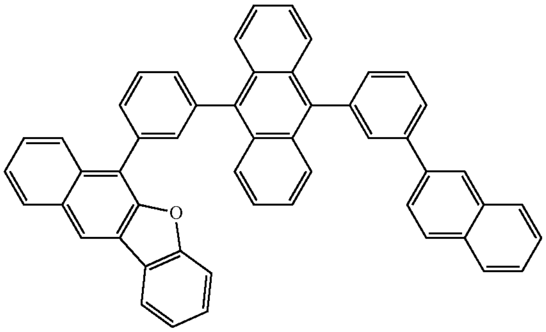
H103
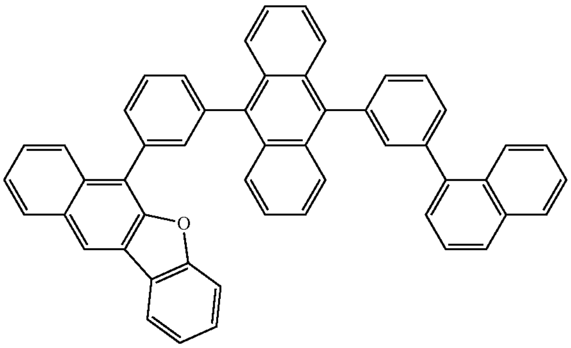
-continued
H104
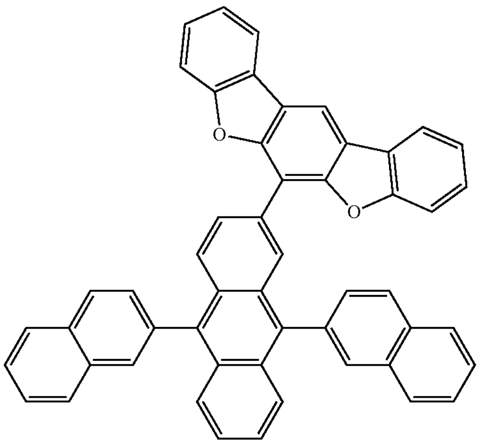
H105
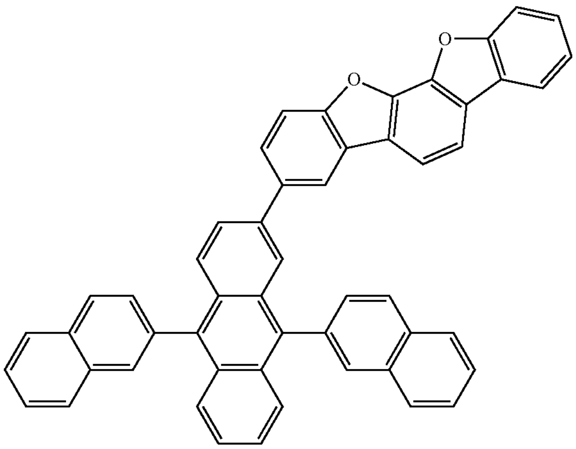
H106
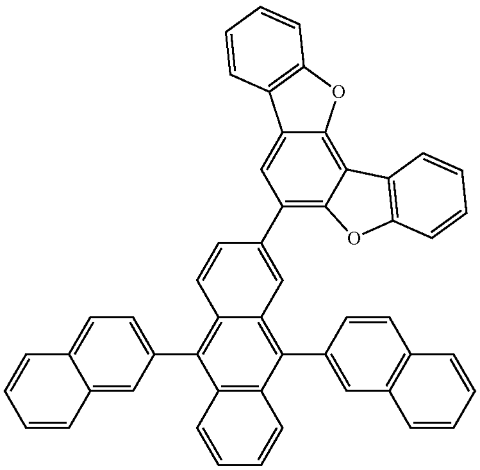

-continued
H107
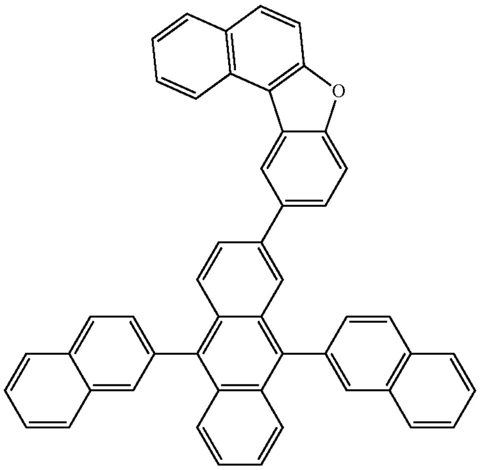
H108
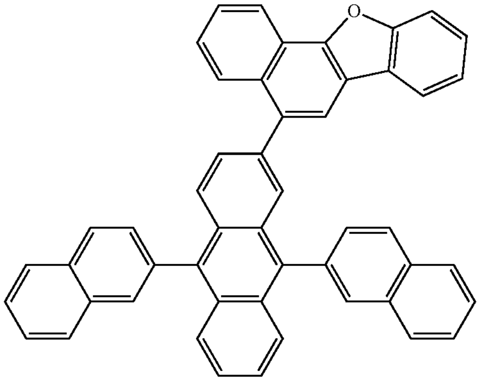
H109
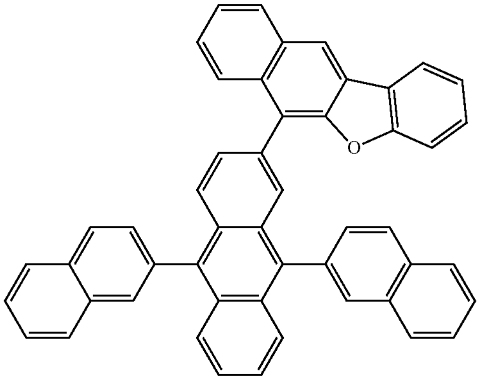
H110
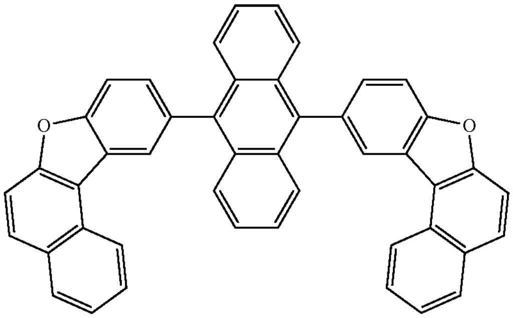
-continued
H111
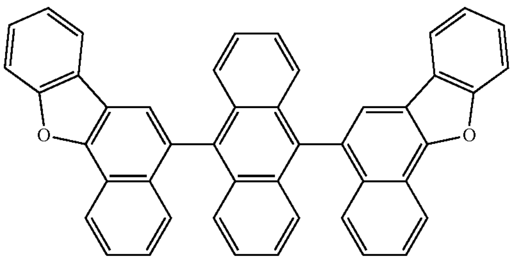
H112
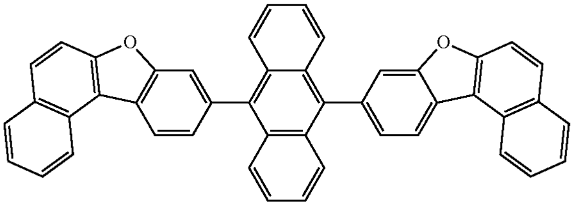
H113
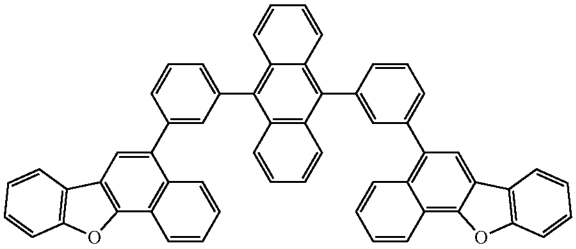
H114
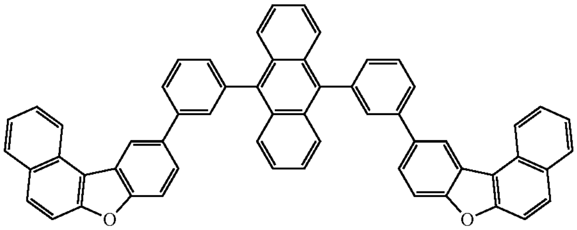
H115
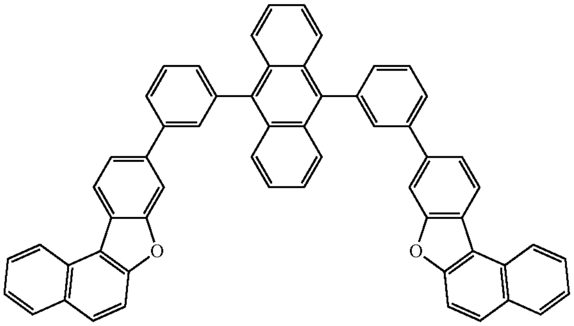

-continued
H116
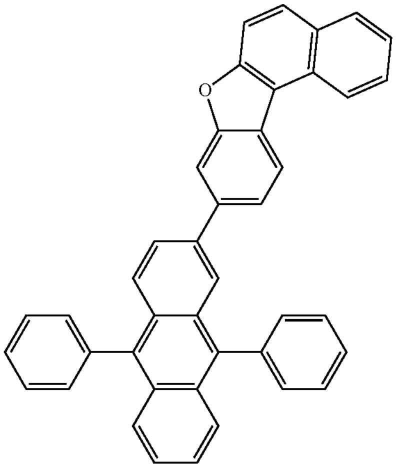
H117
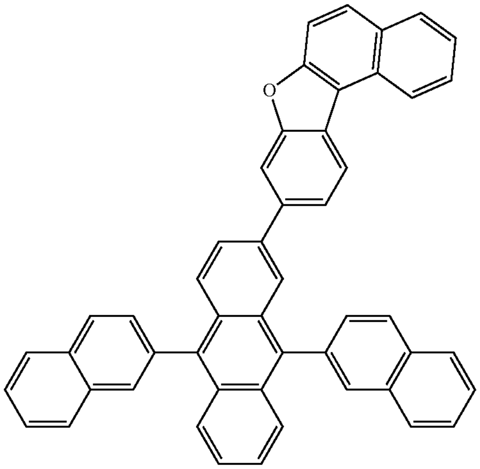
H118
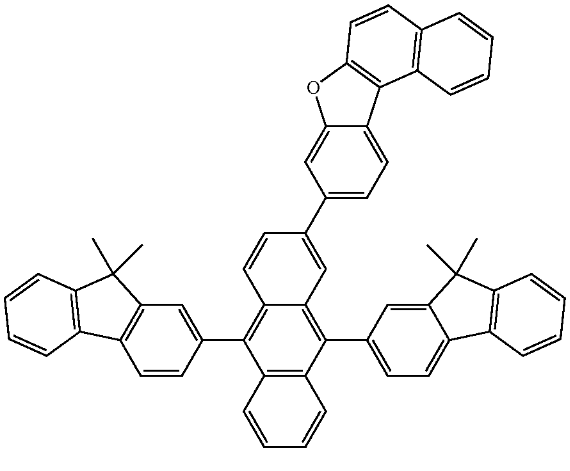
-continued
H119
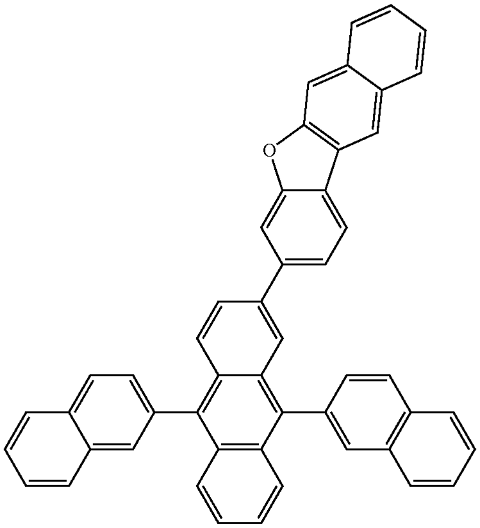
H120
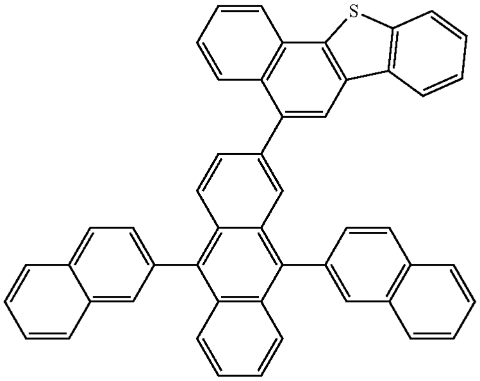
H121
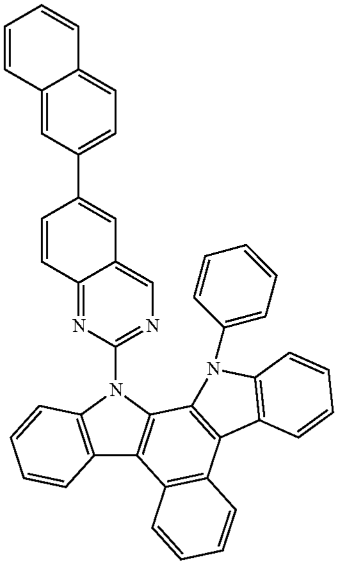

-continued

H122

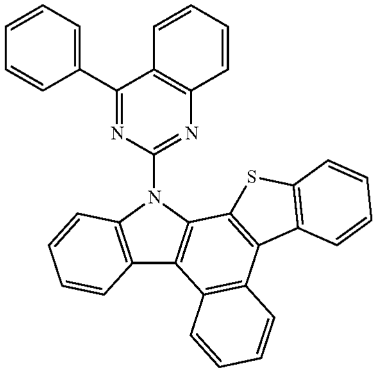

H123

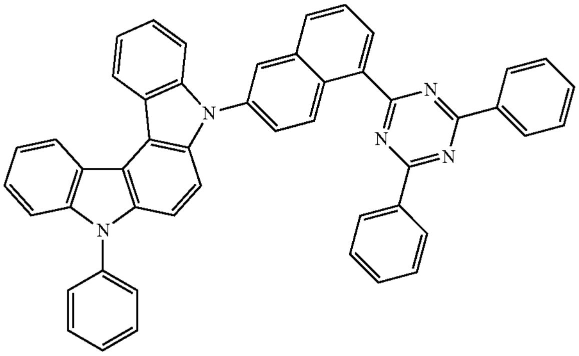

-continued

H124

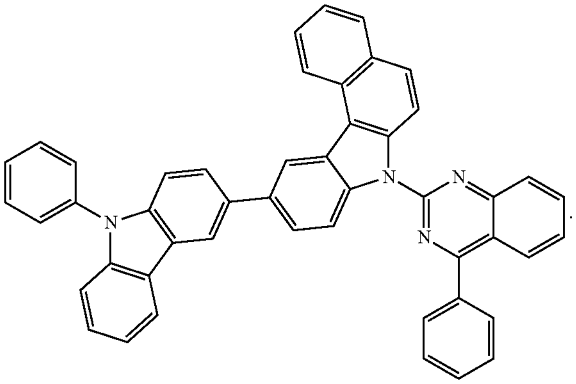

[Fluorescent Dopant]

In an embodiment, the emission layer may further include a fluorescent dopant.

The fluorescent dopant may include an amine group-containing compound, a styryl group-containing compound, or any combination thereof.

In an embodiment, the fluorescent dopant may include a compound represented by Formula 501:

[Formula 501]

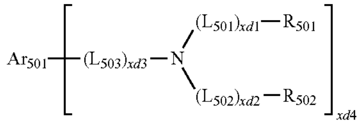

In Formula 501, $Ar_{501}$, $L_{501}$ to $L_{503}$, $R_{501}$, and $R_{502}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, xd1 to xd3 may each independently be 0, 1, 2, or 3, and xd4 may be 1, 2, 3, 4, 5, or 6.

In an embodiment, in Formula 501, $Ar_{501}$ may be a condensed cyclic group (for example, an anthracene group, a chrysene group, or a pyrene group) in which three or more monocyclic groups are condensed together.

In an embodiment, in Formula 501, xd4 may be 2.

In an embodiment, the fluorescent dopant may include one of Compounds FD1 to FD36, DPVBi, DPAVBi, or any combination thereof:

FD1
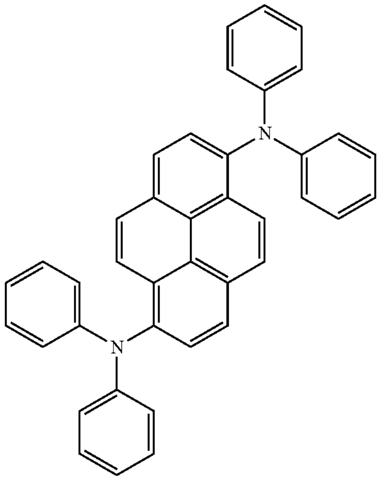
FD2
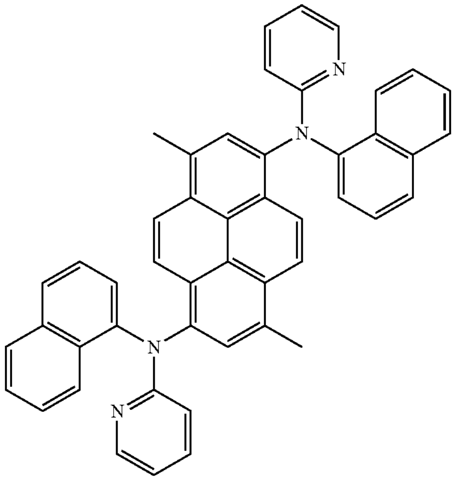
FD3
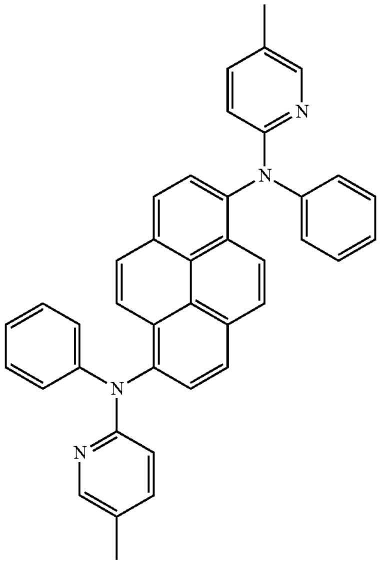
FD4
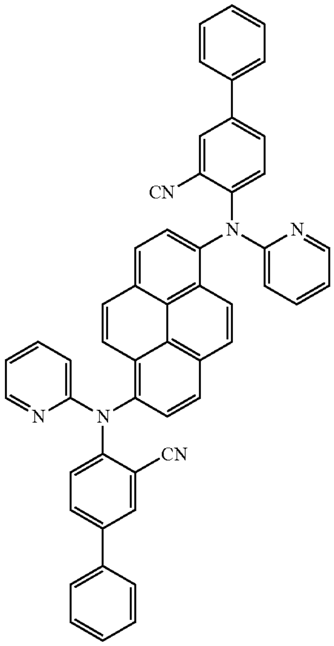
FD5
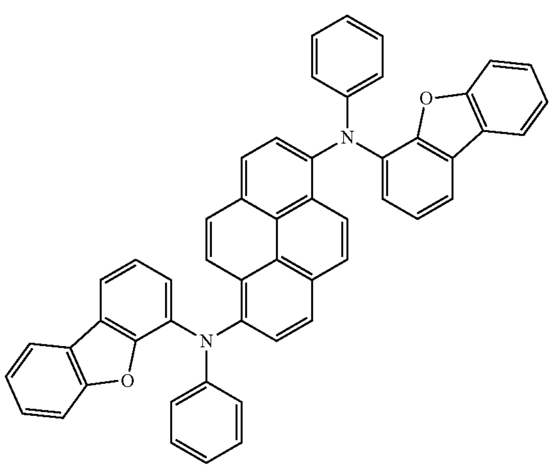
FD6
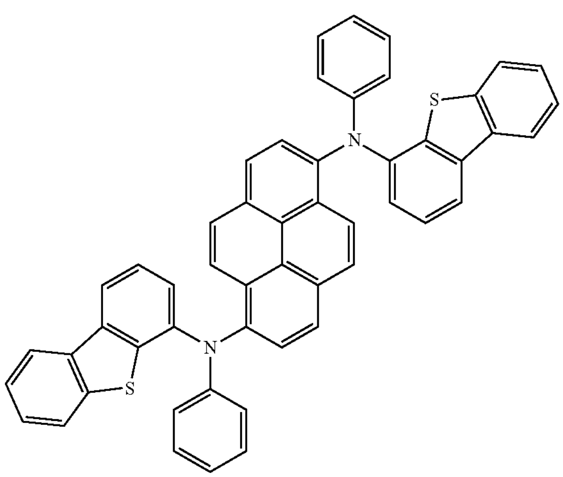

-continued
FD7
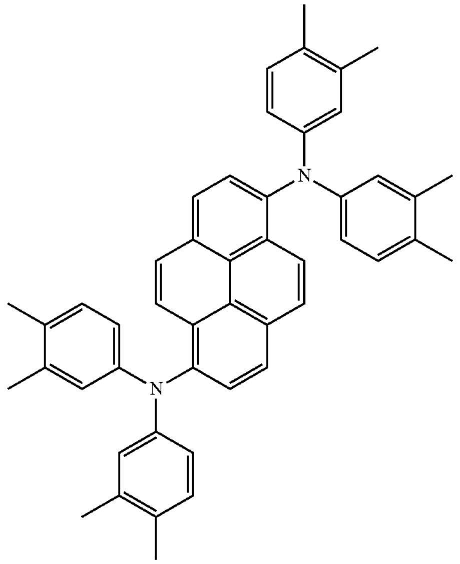
FD8
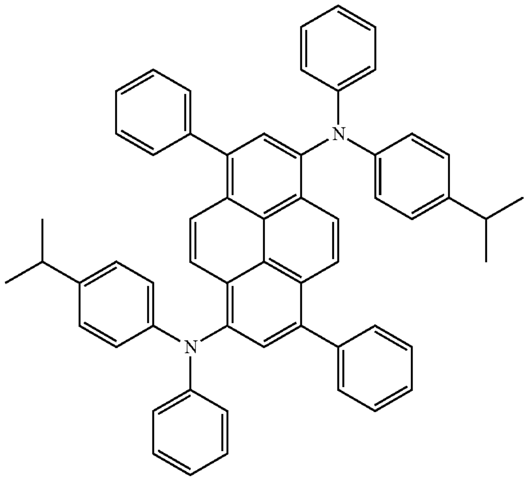
FD9
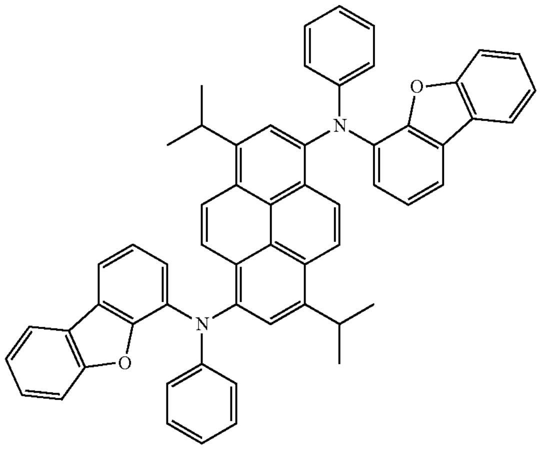
FD10
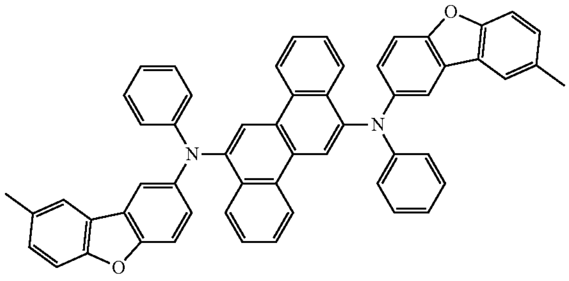
FD11
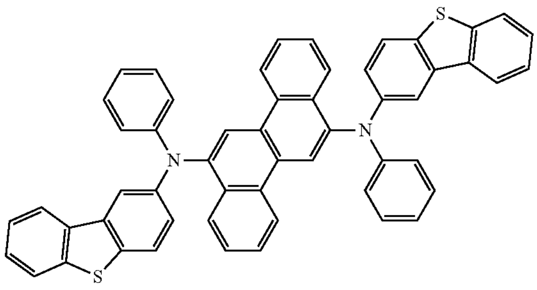
FD12
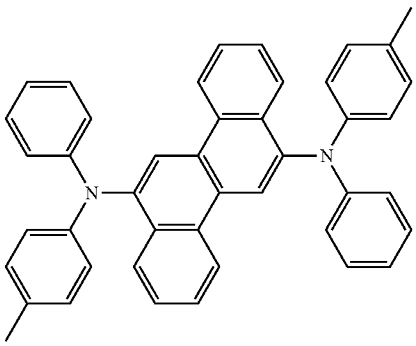

-continued
FD13
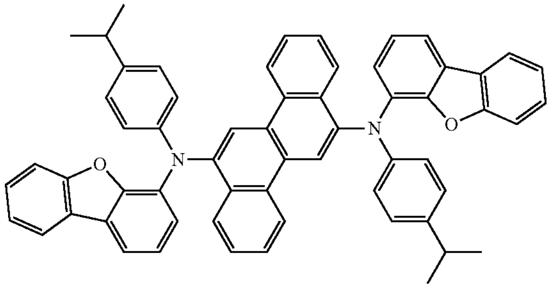
FD14
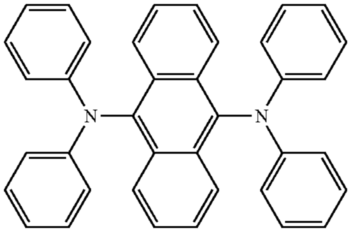
FD15
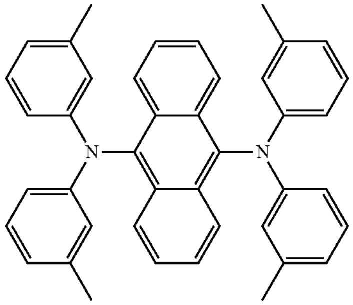
FD16
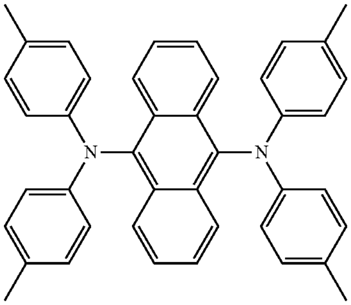
FD17
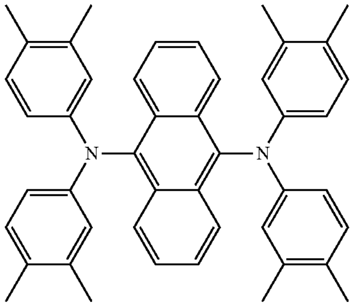
FD18
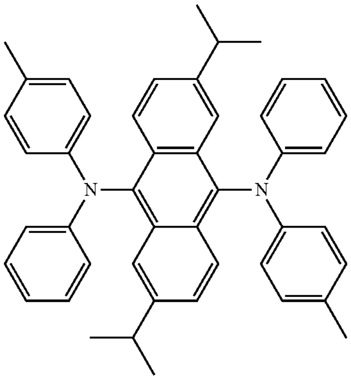
FD19
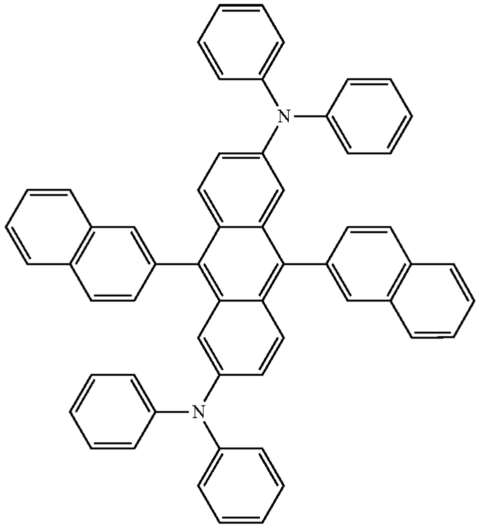
FD20
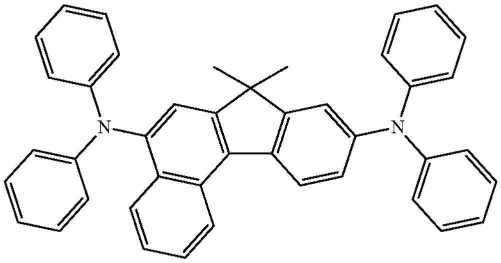

-continued
FD21
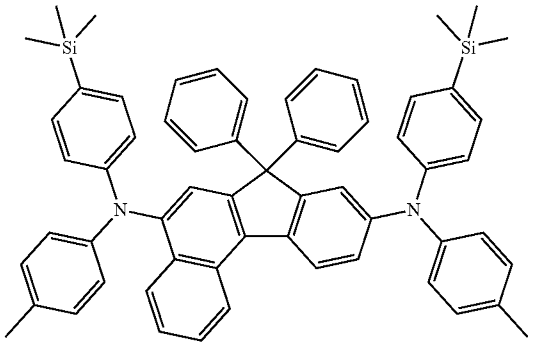
FD22
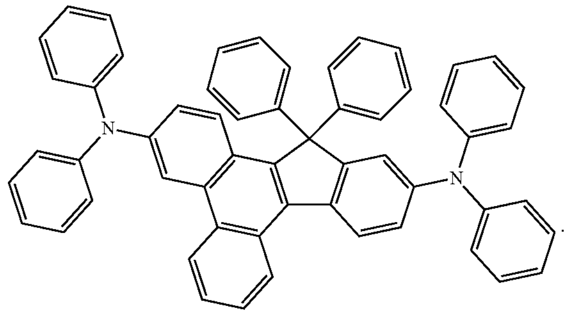
FD23
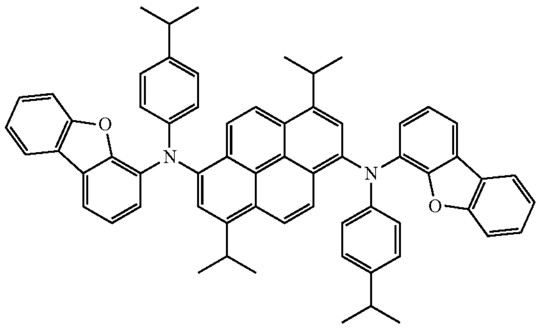
FD24
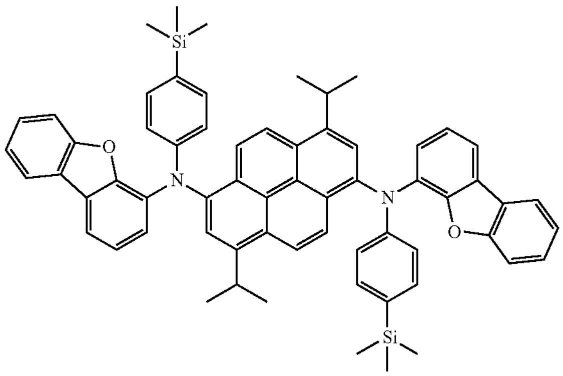
FD25
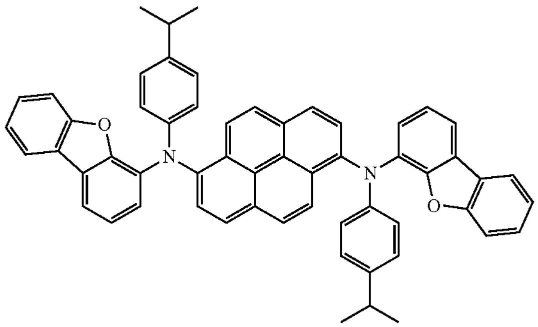
FD26
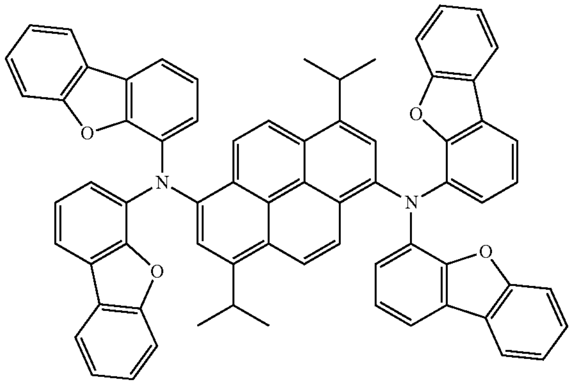
FD27
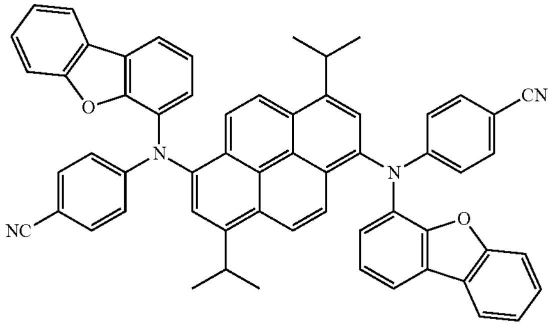
FD28
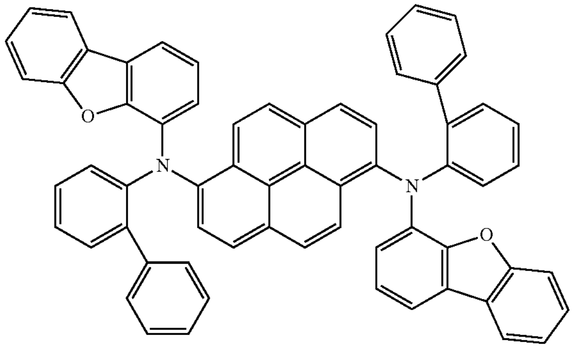

-continued
FD29
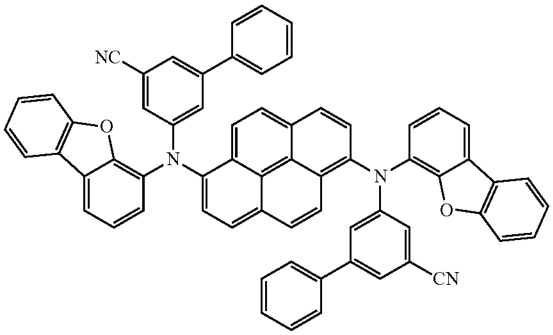
FD30
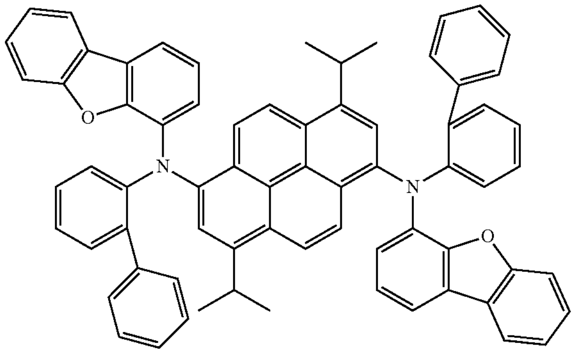
FD31
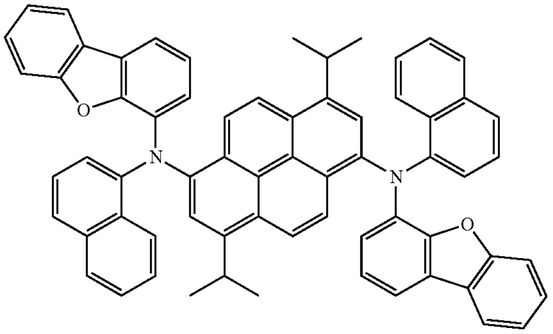
FD32
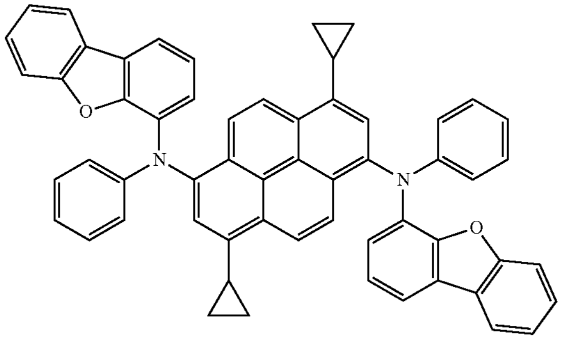
FD33
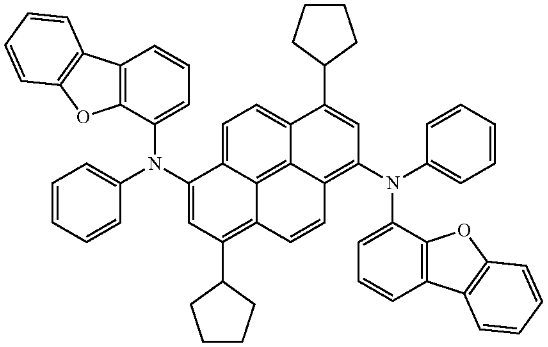
FD34
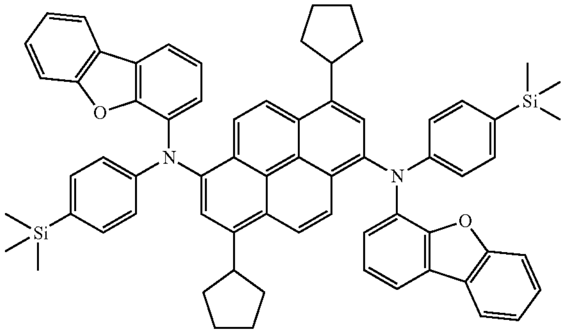
FD35
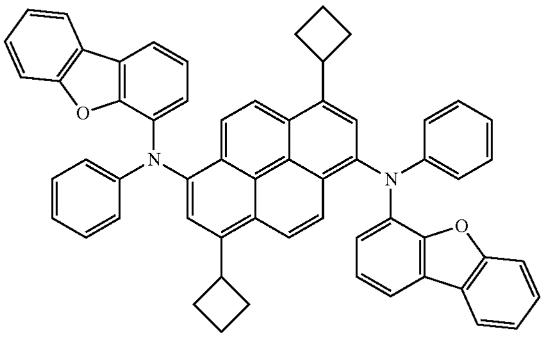
FD36
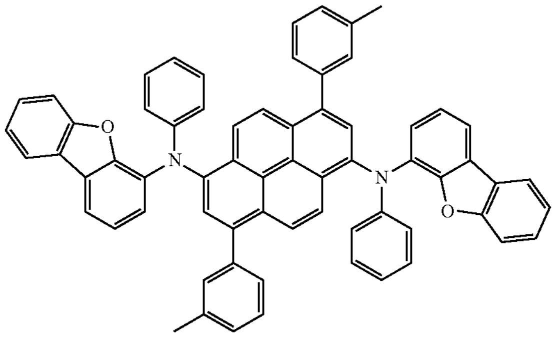

-continued

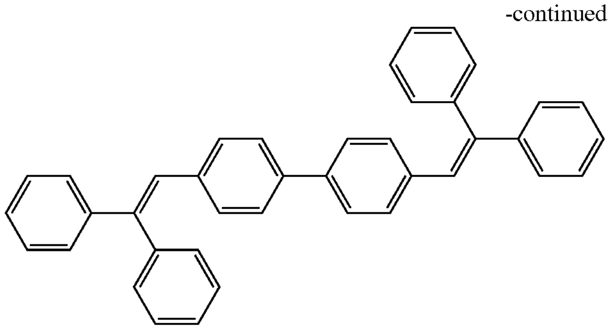

DPVBi

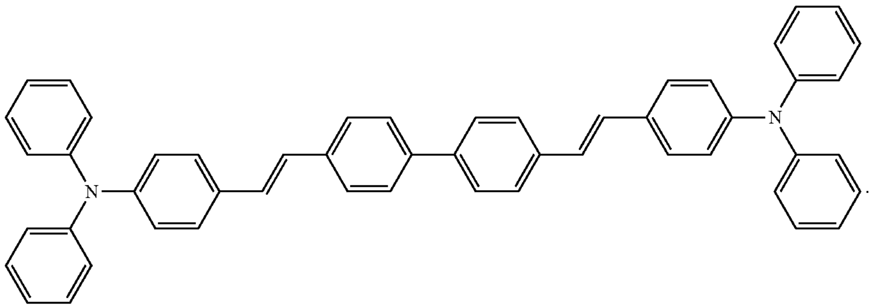

DPAVBi

[Delayed Fluorescence Material]

In an embodiment, the emission layer may further include a delayed fluorescence material.

In the specification, the delayed fluorescence material may be selected from compounds capable of emitting delayed fluorescence based on a delayed fluorescence emission mechanism.

The delayed fluorescence material included in the emission layer may serve as a host or as a dopant, depending on the type of other materials included in the emission layer.

In an embodiment, a difference between a triplet energy level (eV) of the delayed fluorescence material and a singlet energy level (eV) of the delayed fluorescence material may be greater than or equal to about 0 eV and less than or equal to about 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include: a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group); or a material including a $C_8$-$C_{60}$ polycyclic group in which two or more cyclic groups are condensed while sharing boron (B).

Examples of the delayed fluorescence material may include at least one of Compounds DF1 to DF9:

DF1(DMAC-DPS)

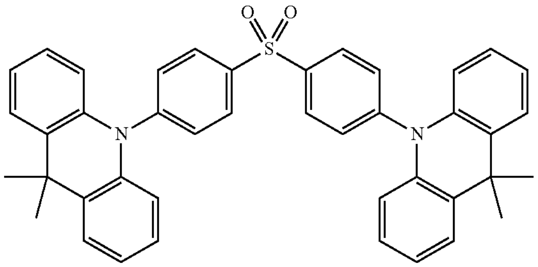

DF2(ACRFLCN)

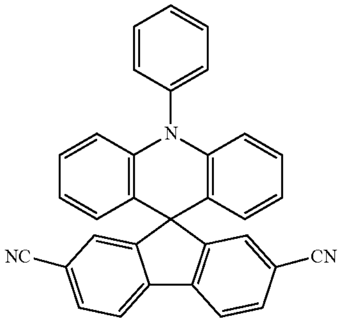

-continued

DF3(ACRSA)

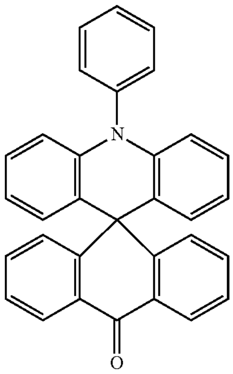

DF4(CC2TA)

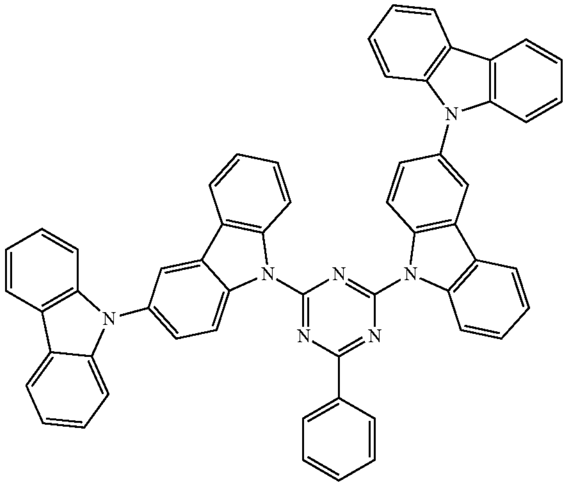

DF5(PIC-TRZ)

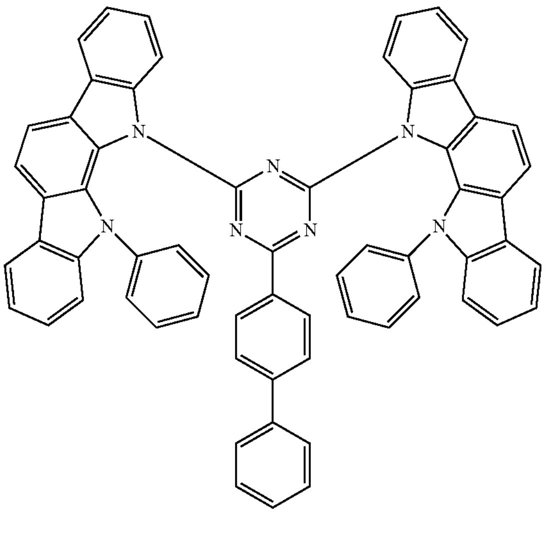

-continued

DF6(PIC-TRZ2)

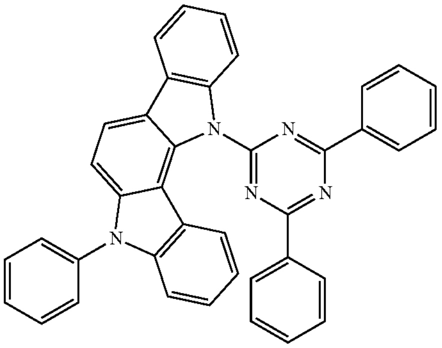

DF7(PXZ-TRZ)

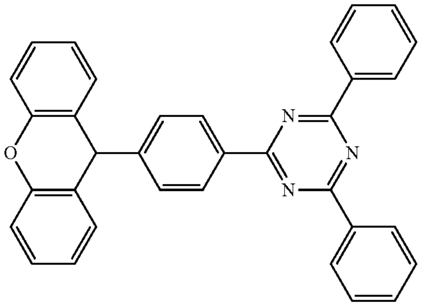

DF8(DABNA-1)

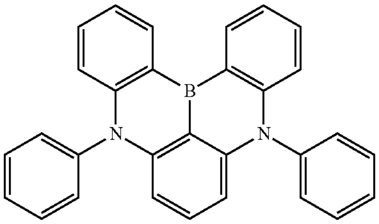

DF9(DABNA-2)

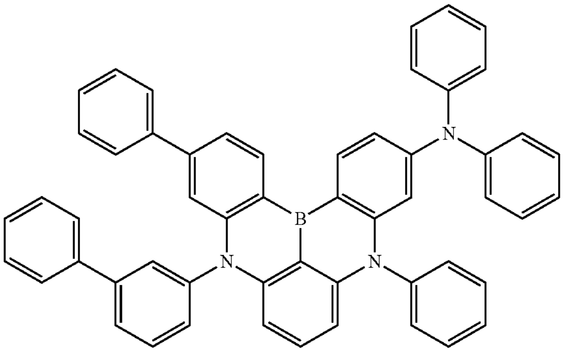

.

[Quantum Dot]

The emission layer may include a quantum dot.

In the specification, a quantum dot may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally serves as a dispersant coordinated on the surface of the quantum dot crystal and controls the growth of the crystal so that the growth of quantum dot particles may be controlled through a process which may be more readily performed than vapor deposition methods, such as metal organic chemical vapor deposition (MOCVD) or molecular beam epitaxy (MBE), and which requires low costs.

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include: a binary compound, such as CdS, CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include: a binary compound, such as GaN, GaP, GaAs, GaSb, AlN, AlP, AIAs, AISb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GalnNSb, GaInPAs, GalnPSb, InAlNP, InAlNAs, InAlNSb, InAlPAs, or InAlPSb; or any combination thereof. In an embodiment, the Group III-V semiconductor compound may further include Group II elements. Examples of the Group III-V semiconductor compound further including Group II elements may include InZnP, InGaZnP, InAlZnP, and the like.

Examples of the Group III-VI semiconductor compound may include: a binary compound, such as GaS, GaSe, $Ga_2Se_3$, GaTe, InS, InSe, $In_2S_3$, $In_2Se_3$, or InTe; a ternary compound, such as $InGaS_3$, or $InGaSe_3$; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof.

Examples of the Group IV element or compound may include: a single element material, such as Si or Ge; a binary compound, such as SiC or SiGe; or any combination thereof.

Each element included in a multi-element compound such as a binary compound, a ternary compound, or a quaternary compound, may exist in a particle at a uniform concentration or at a non-uniform concentration.

In an embodiment, the quantum dot may have a single structure or a core-shell structure. In the case that the quantum dot has a single structure, the concentration of each element included in the quantum dot may be uniform. In an embodiment, in case that the quantum dot has a core-shell structure, a material contained in the core and a material contained in the shell may be different from each other.

The shell of the quantum dot may serve as a protective layer to prevent chemical degeneration of the core to maintain semiconductor characteristics and/or may serve as a charging layer to impart electrophoretic characteristics to the quantum dot. The shell may be a single layer or a multilayer. An interface between the core and the shell of the quantum dot may have a concentration gradient in which the concentration of a material that is present in the shell decreases toward the core.

Examples of the shell of the quantum dot may include a metal oxide, a metalloid oxide, a non-metal oxide, a semiconductor compound, or any combination thereof. Examples of the metal oxide, the metalloid oxide, or the non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AIAs, AlP, AISb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color reproducibility may be increased. Light emitted through the quantum dot may be emitted in all directions, so that a wide viewing angle can be improved.

The quantum dot may be a spherical particle, a pyramidal particle, a multi-arm particle, a cubic nanoparticle, a nanotube particle, a nanowire particle, a nanofiber particle, or a nanoplate particle.

Since the energy band gap can be adjusted by controlling the size of the quantum dot, light having various wavelength bands can be obtained from the quantum dot emission layer. Therefore, by using quantum dots of different sizes, a light-emitting device that emits light of various wavelengths may be implemented. In an embodiment, the size of the quantum dot may be selected to emit red, green, and/or blue light. For example, the size of the quantum dot may be configured to emit white light by combining light of various colors.

In an embodiment, the emission layer may include a mixture of the first compound, the second compound, the third compound, and the fourth compound. In an embodiment, the mixture may be included in one emission layer. This is clearly distinct from a multilayer structure of an emission layer which includes an emission layer including the first compound, the second compound, and the third compound, and another emission layer including the first compound, the second compound, and the fourth compound.

In an embodiment, the emission layer may include a first emission layer and a second emission layer, and the first emission layer may be between the first electrode and the second emission layer, wherein the first emission layer may include the first compound, the second compound, and a first dopant, the second emission layer may include the first compound, the second compound, and a second dopant, the first dopant may be one of the third compound and the fourth compound, and the second dopant may be the other from among the third compound and the fourth compound.

As in the embodiment described above, the third compound and the fourth compound may respectively be included in different emission layers.

In an embodiment, the third compound may be included in a first emission layer, and the fourth compound may be included in a second emission layer. In another embodiment, the fourth compound may be included in the first emission layer, and the third compound may be included in the second emission layer.

The first emission layer and the second emission layer may directly contact each other, or an organic layer may be between the first emission layer and the second emission layer.

In an embodiment, the first emission layer and the second emission layer may directly contact each other.

In an embodiment, the light-emitting device may further include a charge generation layer between the first emission layer and the second emission layer. The charge generation layer may include an n-type charge generation layer and/or a p-type charge generation layer.

One emission layer among the first emission layer and the second emission layer and the charge generation layer may physically contact each other, and a layer which is not mentioned may be arranged between the one emission layer and the charge generation layer. In an embodiment, an electron transport region may be arranged between the first emission layer adjacent to the first electrode among the two emission layers and the charge generation layer. In an embodiment, a hole transport region may be arranged between the second emission layer adjacent to the second electrode among the two emission layers and the charge generation layer.

The charge generation layer generates a charge or separates the charge into a hole and an electron, and, to one of two adjacent light-emitting units, provides electrons, such that the charge generation layer serves as a cathode, and, to the other light-emitting unit, provides holes, such that the charge generation layer serves as an anode. The charge generation layer is not directly connected to an electrode, and separates adjacent light-emitting units.

The n-type refers to n-type semiconductor characteristics, which may be characteristics of injecting or transporting electrons. The p-type refers to p-type semiconductor characteristics, which may be characteristics of injecting or transporting holes.

In an embodiment, an amount of the first dopant in the first emission layer may be in a range of about 1 vol % to about 30 vol %, based on a total volume of the first emission layer, and an amount of the second dopant in the second emission layer may be in a range of about 1 vol % to about 30 vol %, based on a total volume of the second emission layer, but embodiments are not limited thereto.

A thickness of the first emission layer and a thickness of the second emission layer may each independently be in a range of about 10 Å to about 1,000 Å. For example, the thickness of the first emission layer and the thickness of the second emission layer may each independently be in a range of about 150 Å to about 500 Å. When the thicknesses of each of the first emission layer and the second emission layer are within these ranges, excellent light-emission characteristics may be obtained without a substantial increase in driving voltage.

In an embodiment, a ratio of a thickness of the first emission layer to a thickness of the second emission layer may be in a range of about 1:9 to about 9:1. In an embodiment, a ratio of a thickness of the first emission layer to a thickness of the second emission layer may be in a range of about 2:8 to about 8:2. For example, the ratio of a thickness of the first emission layer to a thickness of the second emission layer may be in a range of about 7:3 to about 3:7.

In an embodiment, a difference between a maximum emission wavelength of light emitted from the first emission layer and a maximum emission wavelength of light emitted from the second emission layer may be in a range of about 0 nm to about 30 nm. For example, the difference between a maximum emission wavelength of light emitted from the first emission layer and a maximum emission wavelength of light emitted from the second emission layer may be in a range of about 0 nm to about 20 nm. For example, the difference between a maximum emission wavelength of light emitted from the first emission layer and a maximum emission wavelength of light emitted from the second emission layer may be in a range of about 0 nm to about 10 nm.

In an embodiment, each of the first emission layer and the second emission layer may emit blue light. For example, a difference between a maximum emission wavelength of light emitted from the first emission layer and a maximum emission wavelength of light emitted from the second emission layer may be in a range of about 0 nm to about 30 nm. For example, the difference between a maximum emission wavelength of light emitted from the first emission layer and a maximum emission wavelength of light emitted from the second emission layer may be in a range of about 0 nm to about 20 nm. For example, the difference between a maximum emission wavelength of light emitted from the first emission layer and a maximum emission wavelength of light emitted from the second emission layer may be in a range of about 0 nm to about 10 nm.

In an embodiment, the emission layer may include a first emission layer, a second emission layer, and a third emission layer, the first emission layer may be between the first electrode and the second emission layer, and the second emission layer may be between the first electrode and the third emission layer, wherein the first emission layer may include the first compound, the second compound, and a first dopant, the second emission layer may include the first compound, the second compound, and a second dopant, the third emission layer may include the first compound, the second compound, and a third dopant, the first dopant and the third dopant may each independently be the third compound or the fourth compound, and the second dopant may be the third compound or the fourth compound and may be different from the first dopant.

As in the embodiment described above, the third compound and the fourth compound may respectively be included in different emission layers. In an embodiment, the third compound may be included in the first emission layer and in the third emission layer, and the fourth compound may be included in the second emission layer. In another embodiment, the fourth compound may be included in the first emission layer and the in third emission layer, and the third compound may be included in the second emission layer.

When the first emission layer and the third emission layer each include a third compound, a third compound included in the first emission layer and a third compound included in the third emission layer may be identical to or different from each other. For example, the first dopant and the third dopant may each independently be an organometallic compound represented by Formula 1, and may be identical to or different from each other.

When the first emission layer and the third emission layer each include a fourth compound, a fourth compound included in the first emission layer and a fourth compound included in the third emission layer may be identical to or different from each other. For example, the first dopant and the third dopant may each independently be an organometallic compound represented by Formula 2, and may be identical to or different from each other.

The first emission layer, the second emission layer, and the third emission layer may directly contact one another, and an organic layer may be arranged between the first emission layer and the second emission layer and/or between the second emission layer and the third emission layer.

In an embodiment, the first emission layer, the second emission layer, and the third emission layer may directly contact each other. For example, the second emission layer may be arranged at the interface between the first emission layer and the third emission layer.

In an embodiment, the light-emitting device may further include a charge generation layer arranged between two adjacent emission layers among the first emission layer, the second emission layer, and the third emission layer. The charge generation layer may include an n-type charge generation layer and/or a p-type charge generation layer. The term "adjacent" may refer to an arrangement relationship of the closest layers among the layers mentioned as being adjacent. In an embodiment, two adjacent emission layers may be two emission layers that are arranged closest to each other from among multiple emission layers.

One emission layer among the two emission layers and the charge generation layer may be physically in contact with each other, and a layer which is not mentioned may be arranged between the one emission layer and the charge generation layer. In an embodiment, an electron transport region may be arranged between an emission layer adjacent to the first electrode among the two adjacent emission layers and the charge generation layer. In an embodiment, a hole transport region may be arranged between an emission layer adjacent to the second electrode among the two adjacent emission layers and the charge generation layer.

In an embodiment, the first emission layer may include an amount of a first dopant in a range of about 1 vol % to about 30 vol % based on a total volume of the first emission layer, the second emission layer may include an amount of a second dopant in a range of about 1 vol % to about 30 vol % based on a total volume of the second emission layer, and the third emission layer may include an amount of a third dopant in a range of about 1 vol % to about 30 vol % based on a total volume of the third emission layer, but embodiments are not limited thereto.

A thickness of the first emission layer, a thickness of the second emission layer, and a thickness of the third emission layer may each independently be in a range of about 10 Å to about 1,000 Å. For example, the thickness of the first emission layer, the thickness of the second emission layer, and the thickness of the third emission layer may each independently be in a range of about 150 Å to about 500 Å. When the thicknesses of each of the first emission layer, the second emission layer, and the third emission layer are within these ranges, excellent light-emission characteristics may be obtained without a substantial increase in driving voltage.

In an embodiment, the first emission layer, the second emission layer, and the third emission layer may each emit blue light. For example, a difference between a maximum emission wavelength of light emitted from the first emission layer, a maximum emission wavelength of light emitted from the second emission layer, and a maximum emission wavelength of light emitted from the third emission layer may be in a range of about 0 nm to about 30 nm. For example, the difference between a maximum emission wavelength of light emitted from the first emission layer, a maximum emission wavelength of light emitted from the second emission layer, and a maximum emission wavelength of light emitted from the third emission layer may be in a range of about 0 nm to about 20 nm. For example, the difference between a maximum emission wavelength of light emitted from the first emission layer, a maximum emission wavelength of light emitted from the second emission layer, and a maximum emission wavelength of light emitted from the third emission layer may be in a range of about 0 nm to about 10 nm.

When the light-emitting device 10 is a full-color light-emitting device, the emission layer may be patterned into a red emission layer, a green emission layer, and/or a blue emission layer, according to a subpixel. In an embodiment, the emission layer may have a stacked structure of two or more layers of a red emission layer, a green emission layer, and a blue emission layer, in which the two or more layers may contact each other or may be separated from each other. In an embodiment, the emission layer may include two or more materials of a red light-emitting material, a green light-emitting material, and a blue light-emitting material, in which the two or more materials are mixed with each other in a single layer to emit white light.

A total thickness of the emission layer may be in a range of about 50 Å to about 1,000 Å. For example, the total thickness of the emission layer may be in a range of about 150 Å to about 600 Å. For example, the total thickness of the emission layer may be in a range of about 200 Å to about 600 Å. When the total thickness of the emission layer is within these ranges, excellent light-emission characteristics may be obtained without a substantial increase in driving voltage.

[Electron Transport Region in Interlayer 130]

The electron transport region may have a structure consisting of a layer consisting of a single material, a structure consisting of a layer consisting of different materials, or a structure including multiple layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, wherein the layers of each structure may be stacked from an emission layer in its respective stated order, but the structure of the electron transport region is not limited thereto.

In an embodiment, the electron transport region (for example, the buffer layer, the hole-blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21}$$ [Formula 601]

In Formula 601,

- $Ar_{601}$ and $L_{601}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$,
- xe11 may be 1, 2, or 3,
- xe1 may be 0, 1, 2, 3, 4, or 5,
- $R_{601}$ may be a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$),
- $Q_{601}$ to $Q_{603}$ are each independently the same as described in connection with $Q_1$,
- xe21 may be 1, 2, 3, 4, or 5, and
- at least one of $Ar_{601}$, $L_{601}$, and $R_{601}$ may each independently be a π electron-deficient nitrogen-containing $C_1$-$C_{60}$ cyclic group that is unsubstituted or substituted with at least one $R_{10a}$.

In an embodiment, in Formula 601, when xe11 is 2 or more, two or more of $Ar_{601}$(s) may be linked via a single bond.

In an embodiment, in Formula 601, $Ar_{601}$ may be a substituted or unsubstituted anthracene group.

In an embodiment, the electron transport region may include a compound represented by Formula 601-1:

[Formula 601-1]

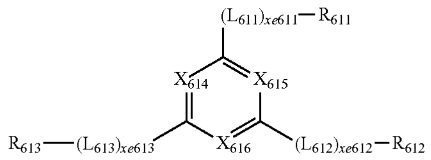

In Formula 601-1,

- $X_{614}$ may be N or C($R_{614}$), $X_{615}$ may be N or C($R_{615}$), $X_{616}$ may be N or C($R_{616}$), at least one of $X_{614}$ to $X_{616}$ may be N,
- $L_{611}$ to $L_{613}$ are each independently the same as described in connection with $L_{601}$,
- xe611 to xe613 are each independently the same as described in connection with xe1,
- $R_{611}$ to $R_{613}$ are each independently the same as described in connection with $R_{601}$, and
- $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$.

In an embodiment, in Formulae 601 and 601-1, xe1 and xe611 to xe613 may each independently be 0, 1, or 2.

The electron transport region may include one of Compounds ET1 to ET48, 2,9-dimethyl-4,7-diphenyl-1,10-phenanthroline (BCP), 4,7-diphenyl-1,10-phenanthroline (Bphen), $Alq_3$, BAlq, TAZ, NTAZ, 4,4'-bis(4,6-diphenyl-1,3,5-triazin-2-yl)biphenyl (BTB), 2,2',2"-(1,3,5-benzinetriyl)-tris(1-phenyl-1-H-benzimidazole) (TPBi), TPQ, 1,3,5-tris(3-pyridyl-3-phenyl)benzene (TmPyPB), or any combination thereof:

ET1

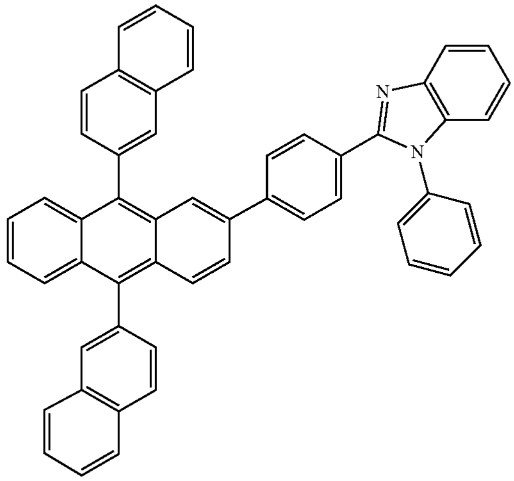

ET2

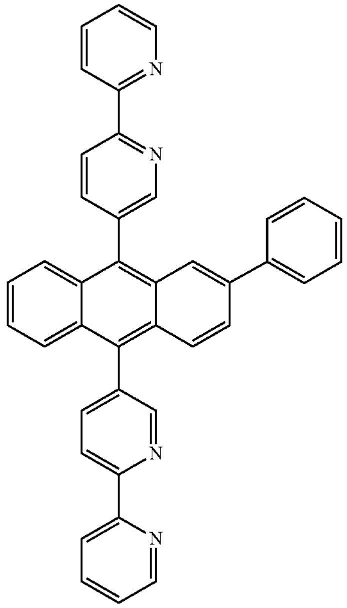

ET3
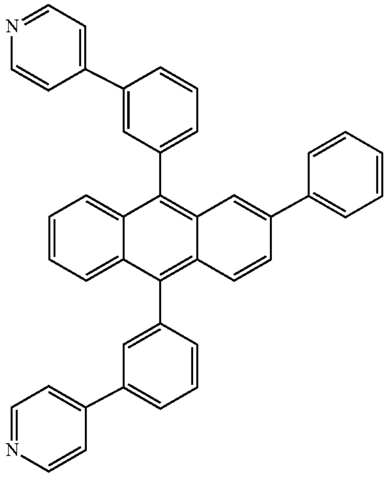
ET4
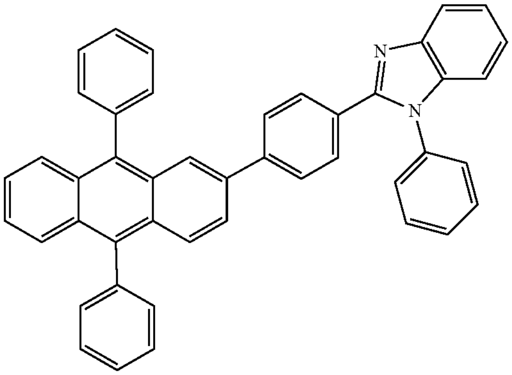
ET5
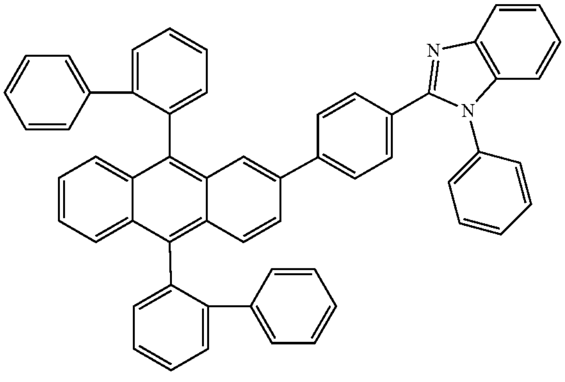
ET6
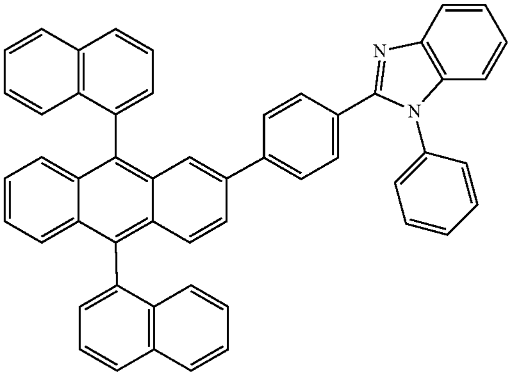
ET7
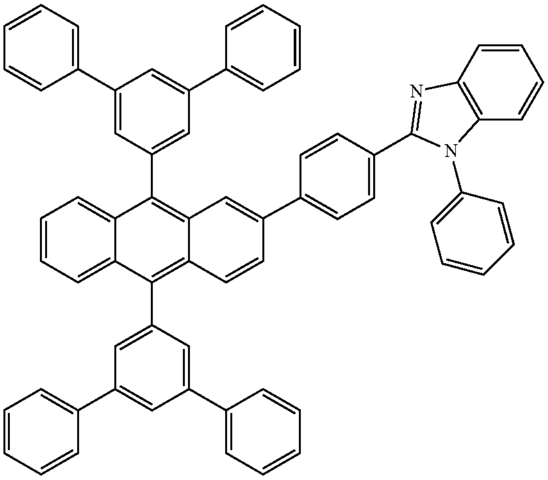
ET8
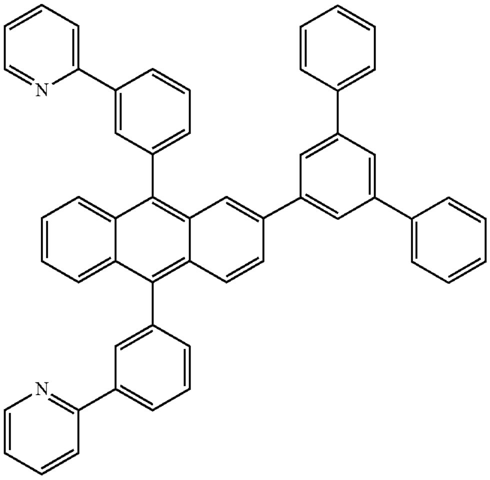

-continued
ET9
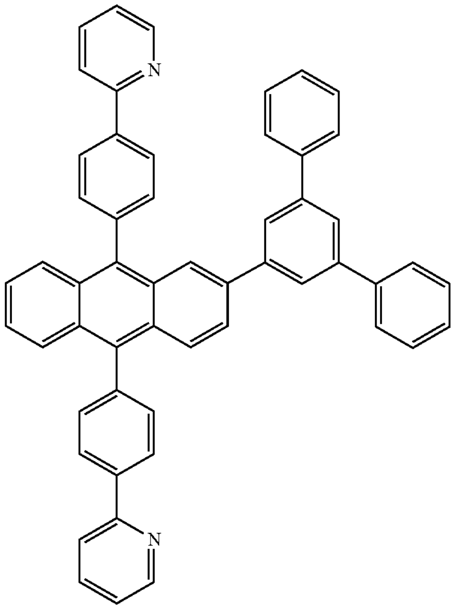
ET10
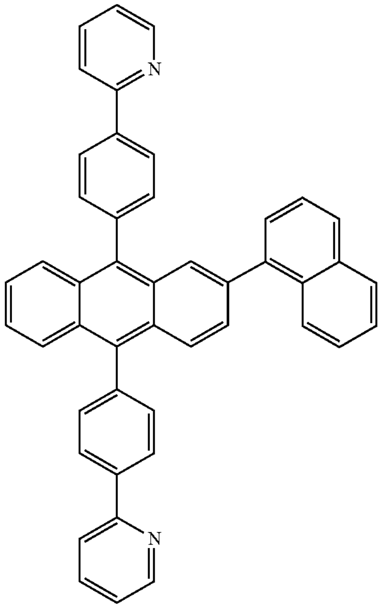
-continued
ET11
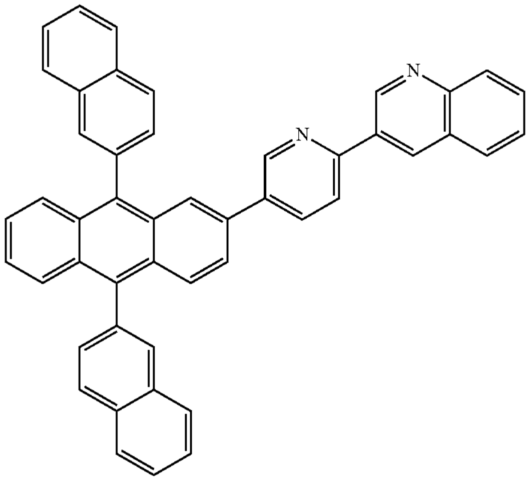
ET12
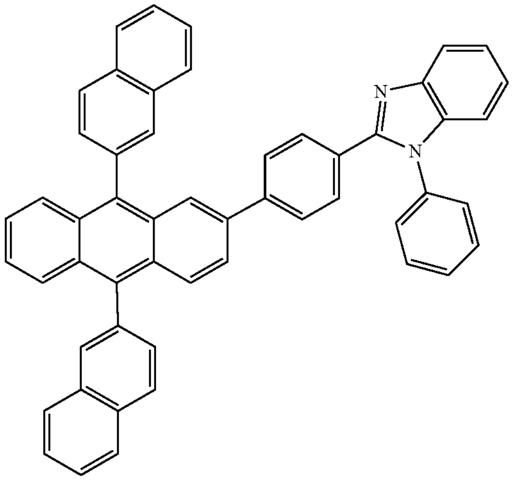
ET13
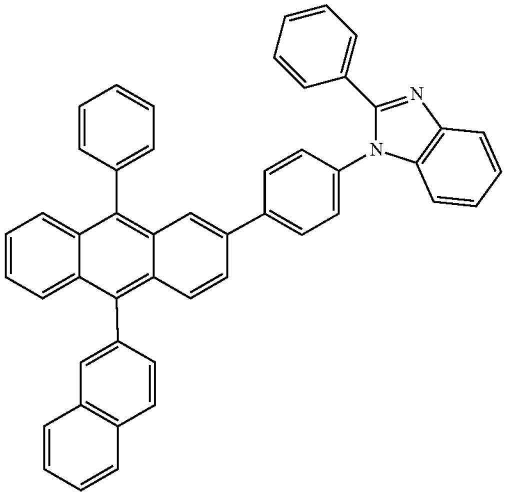

ET14
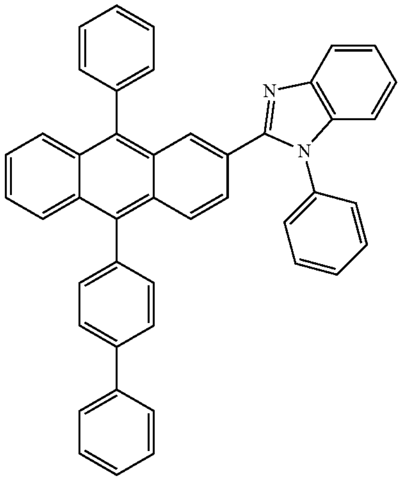
ET15
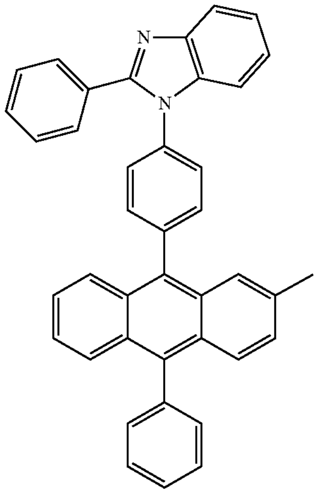
ET16
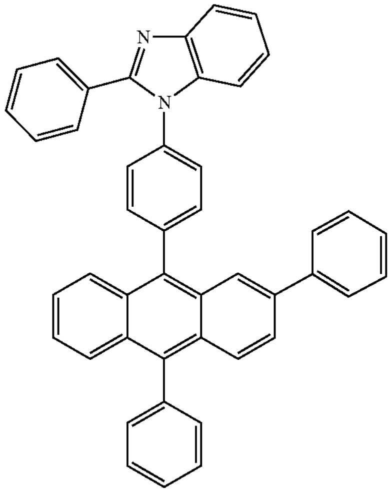
ET17
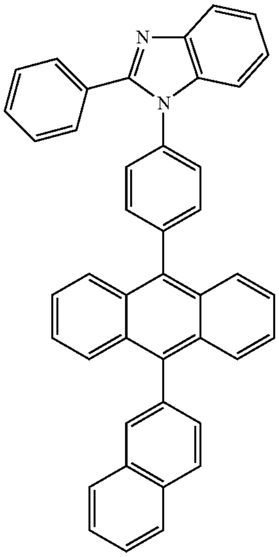
ET18
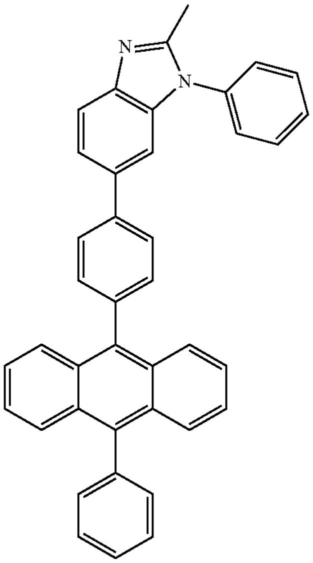
ET19
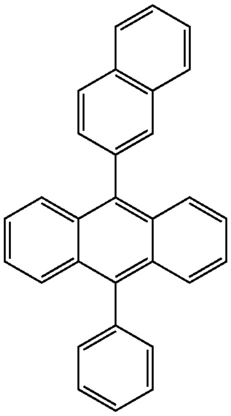

-continued
ET20
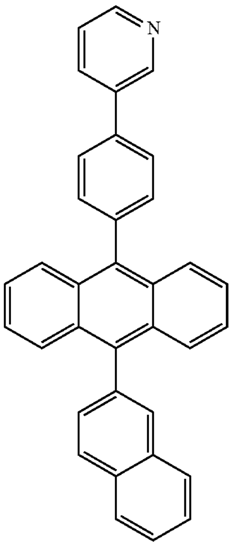
ET21
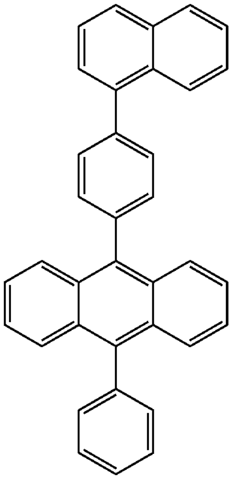
ET22
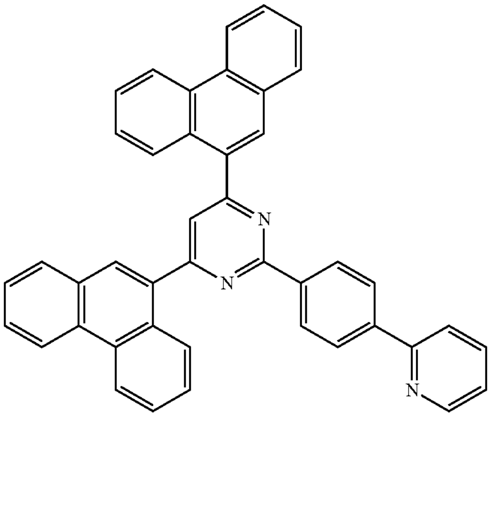
-continued
ET23
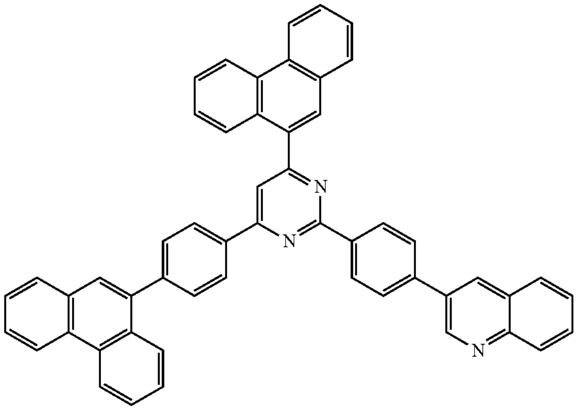
ET24
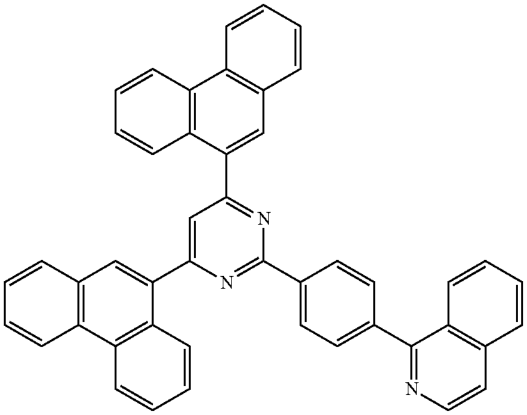
ET25
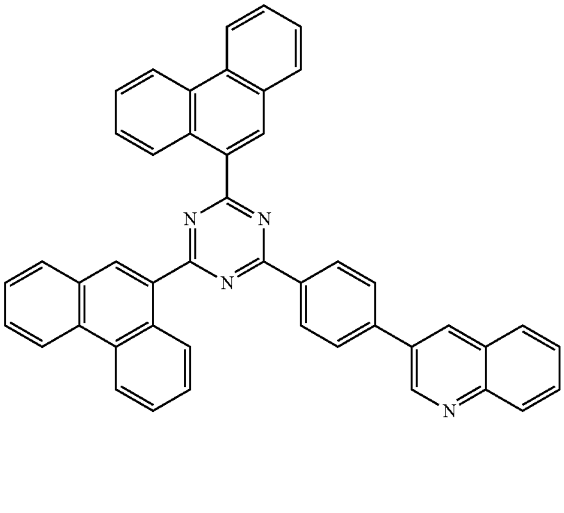

-continued
ET26
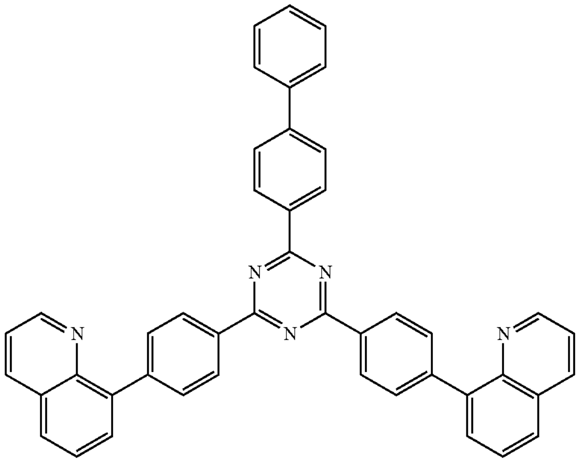
ET27
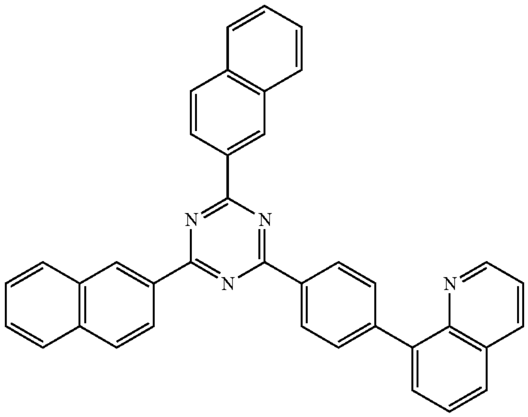
ET28
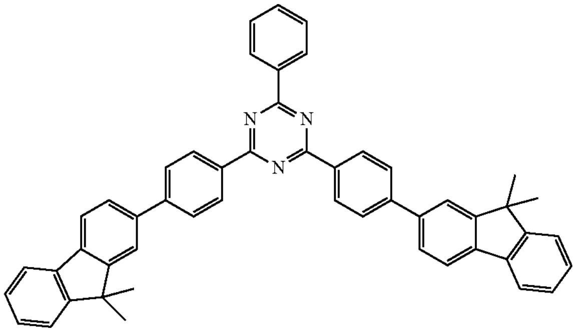
-continued
ET29
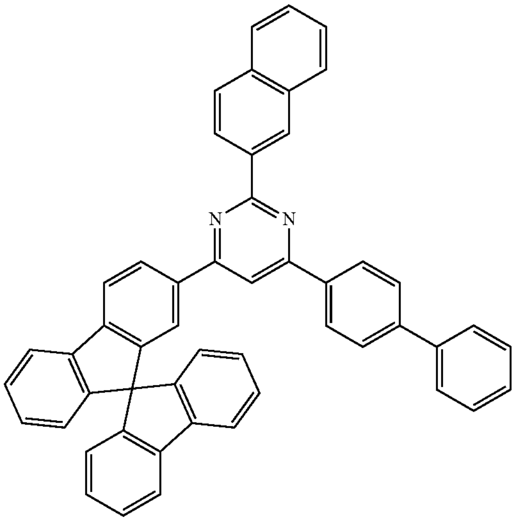
ET30
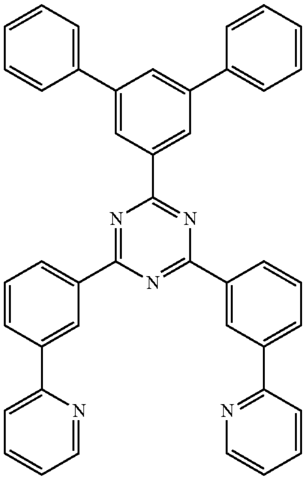
ET31
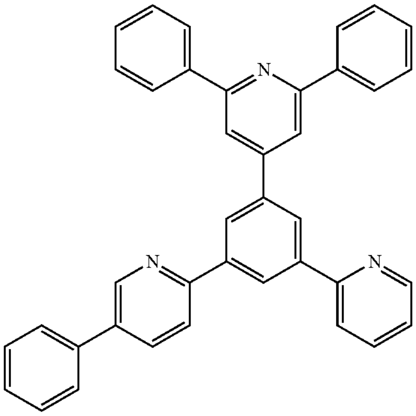

-continued
ET32
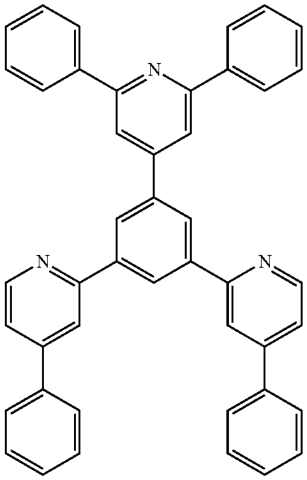
ET33
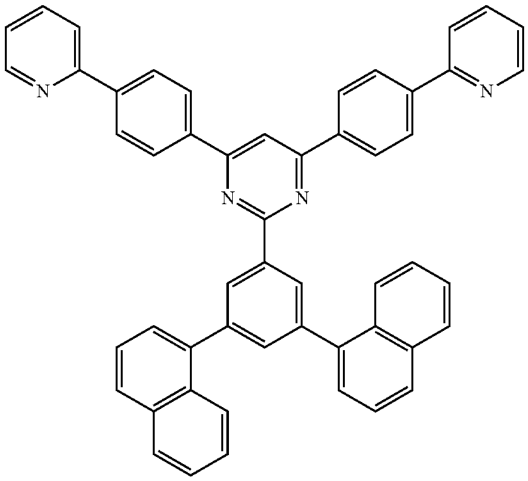
ET34
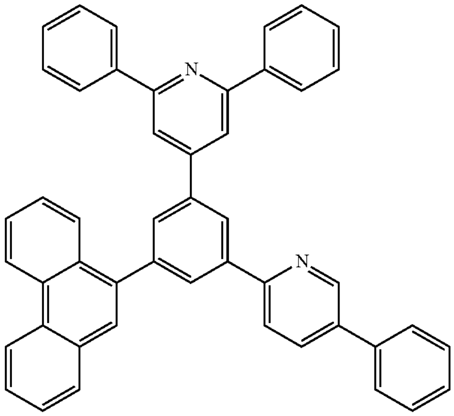
-continued
ET35
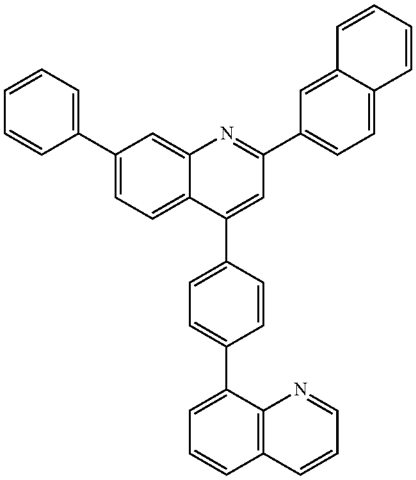
ET36
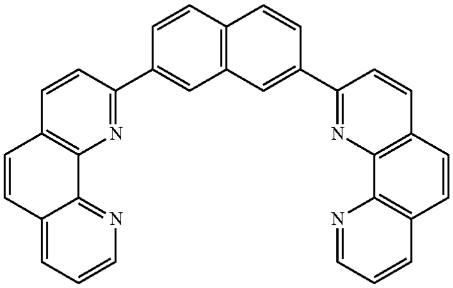
ET37
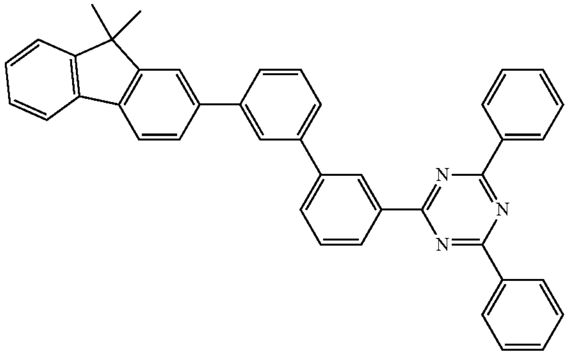
ET38
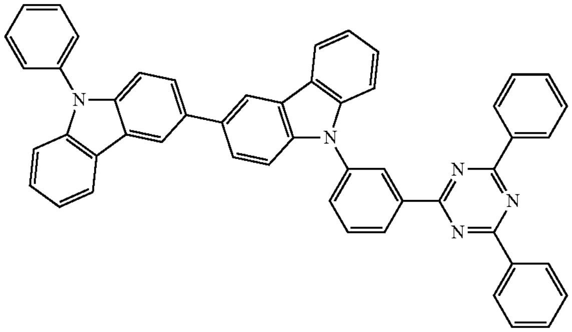

-continued
ET39
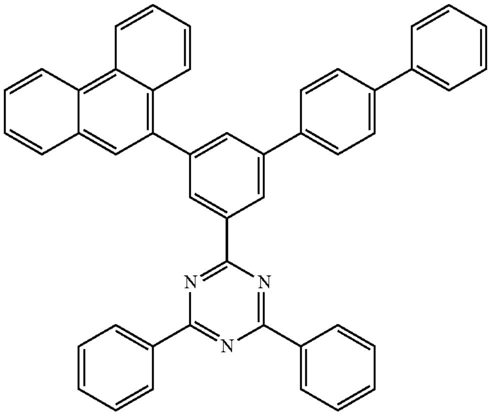
ET40
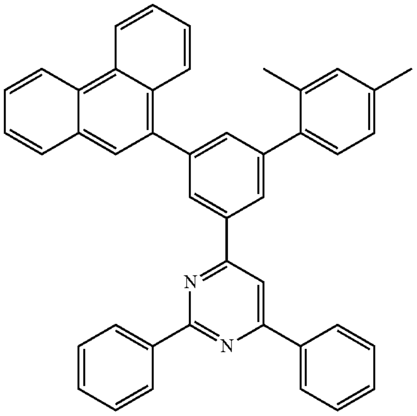
ET41
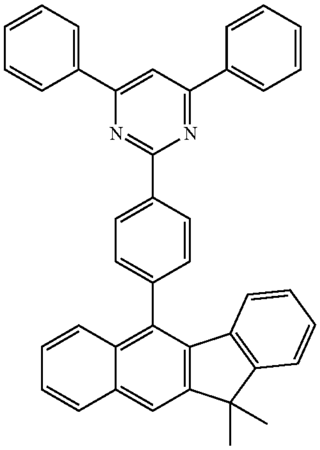
-continued
ET42
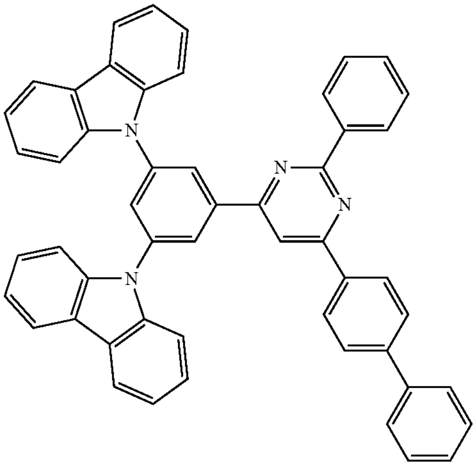
ET43
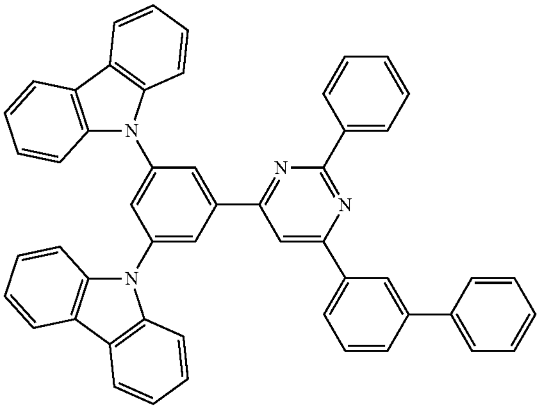
ET44
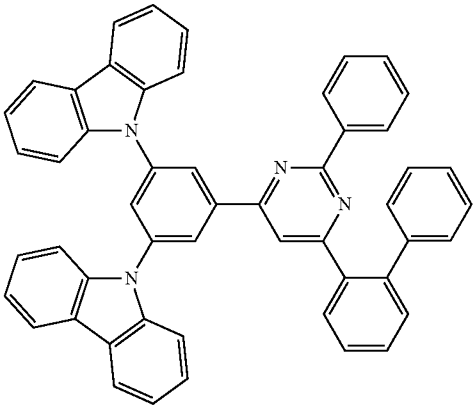
ET45
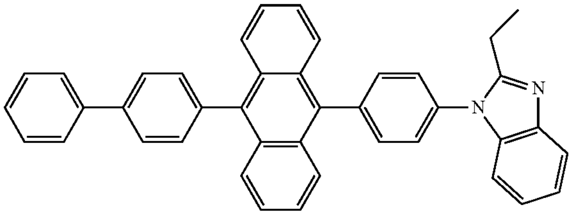

-continued
ET46
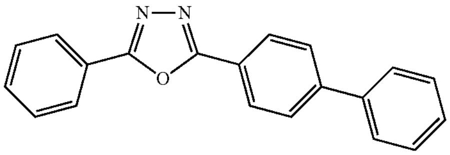
ET47
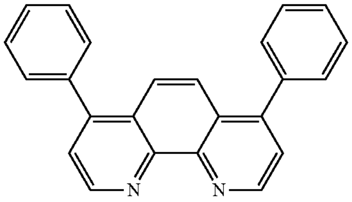
ET48
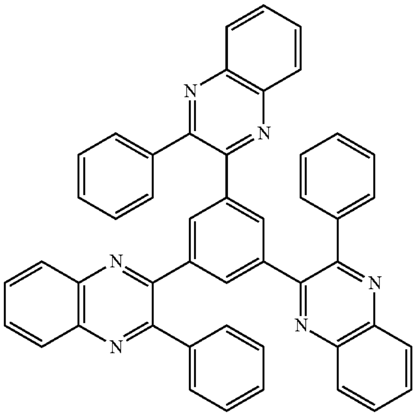
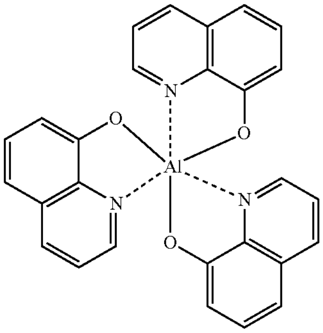
Alq3
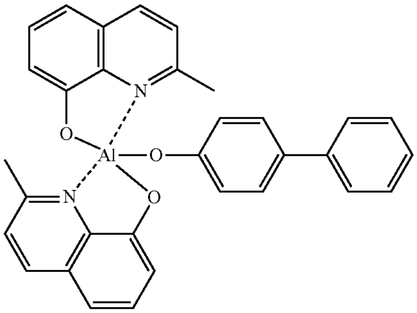
BAlq
-continued
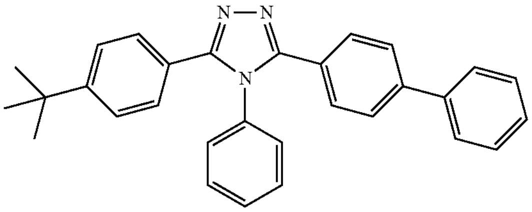
TAZ
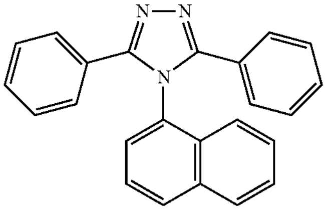
NTAZ
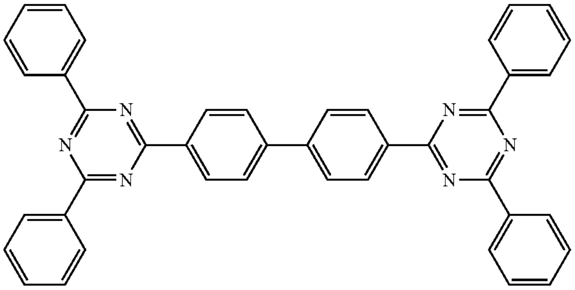
BTB
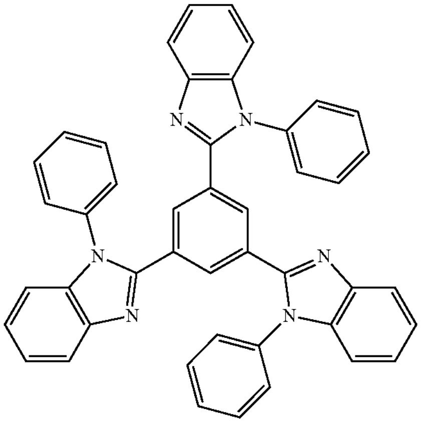
TPBi -continued

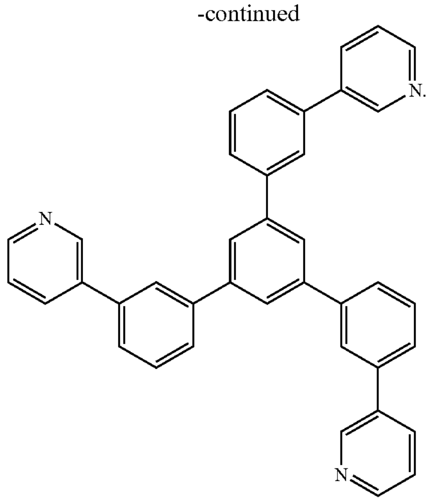

TmPyPB

A thickness of the electron transport region may be in a range of about 100 Å to about 5,000 Å. For example, the thickness of the electron transport region may be in a range of about 160 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may each independently be in a range of about 10 Å to about 1,000 Å, and a thickness of the electron transport layer may be in a range of about 100 Å to about 1,000 Å. For example, the thickness of the buffer layer, the hole blocking layer, or the electron control layer may each independently be in a range of about 30 Å to about 300 Å. For example, the thickness of the electron transport layer may be in a range of about 150 Å to about 500 Å. When the thicknesses of the buffer layer, the hole blocking layer, the electron control layer, the electron transport layer, and/or the electron transport region are within these ranges, satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or with the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or Compound ET-D2:

ET-D1

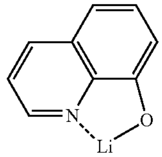

ET-D2

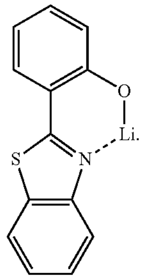

The electron transport region may include an electron injection layer that facilitates the injection of electrons from the second electrode 150. The electron injection layer may be in direct contact with the second electrode 150.

The electron injection layer may have a structure consisting of a layer consisting of a single material, a structure consisting of a layer consisting of different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, or KI; or any combination thereof. The alkaline earth metal-containing compound may include an alkaline earth metal compound, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI^3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, or $Lu_2Te_3$.

The alkali metal complex, the alkaline earth-metal complex, and the rare earth metal complex may include one of ions of the alkali metal, ions of the alkaline earth metal, and ions of the rare earth metal, and a ligand bonded to the metal ion (for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof).

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described herein. In an embodiment, the electron injection layer may further include an organic material (for example, a compound represented by Formula 601).

In an embodiment, the electron injection layer may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or any combination thereof. For example, the electron injection layer may be a KI:Yb co-deposited layer, a RbI:Yb co-deposited layer, a LiF:Yb co-deposited, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the ranges described above, satisfactory electron injection characteristics may be obtained without a substantial increase in driving voltage.

[n-Dopant]

The electron transport region may further include a charge-generation material such as an n-dopant, as well as the aforementioned materials, to improve conductive properties. The charge-generation material may be substantially homogeneously or non-homogeneously dispersed in the electron transport region.

The n-dopant may be a molecule and/or a neutral radical having a (more positive) HOMO greater than about −3.3 eV. For example, the n-dopant may have a (more positive) HOMO greater than about −2.8 eV. The HOMO of the n-dopant may be determined from cyclic voltammetry of oxidation potential.

In an embodiment, the n-dopant may include at least one of Compounds 701 to 706, but embodiments are not limited thereto:

701

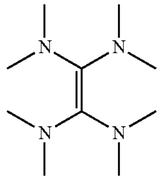

702

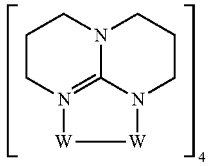

703

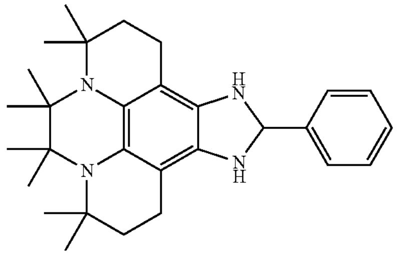

704

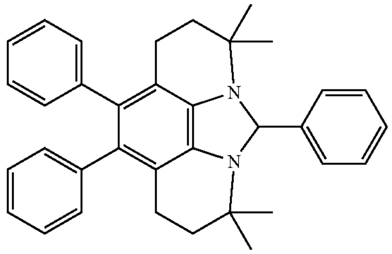

705

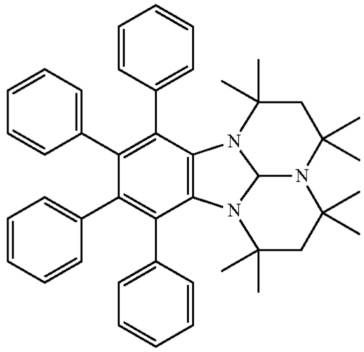

706

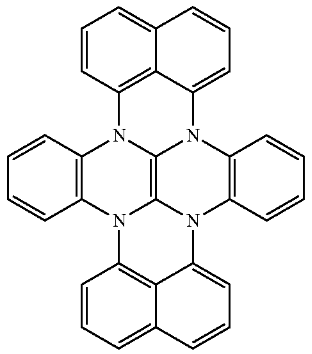

.

[Second Electrode 150]

The second electrode 150 may be located on the interlayer 130 having such a structure. The second electrode 150 may be a cathode, which is an electron injection electrode. The second electrode 150 may include a material having a low-work function, for example, a metal, an alloy, an electrically conductive compound, or any combination thereof.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multilayered structure.

[Capping Layer]

The light-emitting device 10 may include a first capping layer located outside the first electrode 110, and/or a second capping layer located outside the second electrode 150. For example, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110, which may be a semi-transmissive electrode or a transmissive electrode, and through the first capping layer. Light generated in an emission layer of the interlayer 130 of the light-emitting device 10 may be extracted toward the outside through the second electrode 150, which may be a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 may be increased, so that the emission efficiency of the light-emitting device 10 may be improved.

The first capping layer and the second capping layer may each include a material having a refractive index equal to or greater than about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof.

In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, β-NPB, or any combination thereof:

CP1

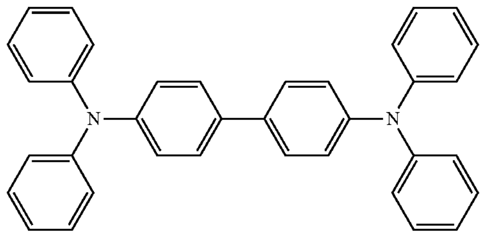

CP2

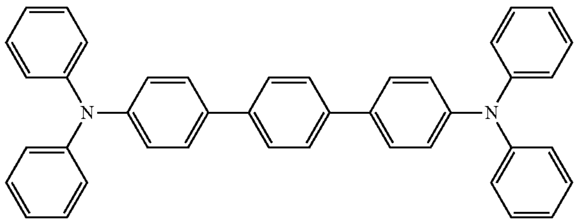

CP3

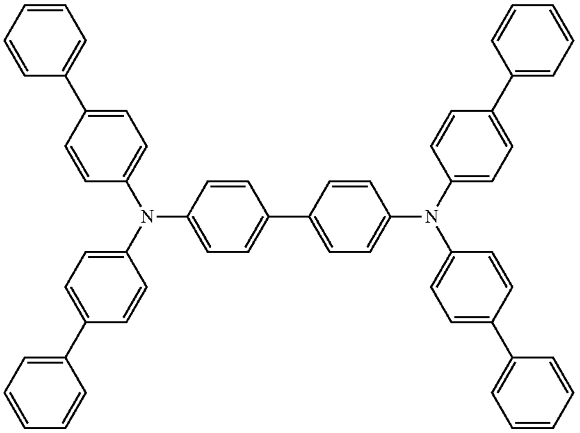

CP4

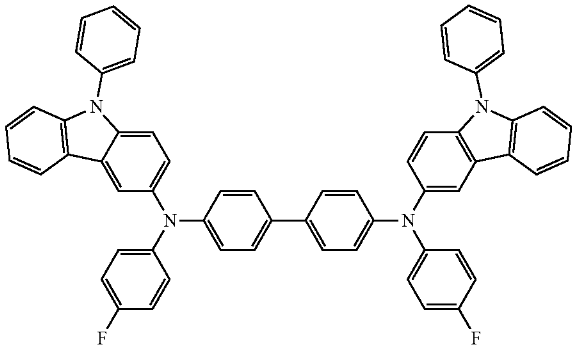

-continued

CP5

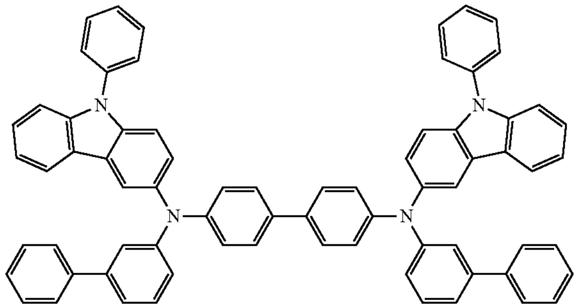

CP6

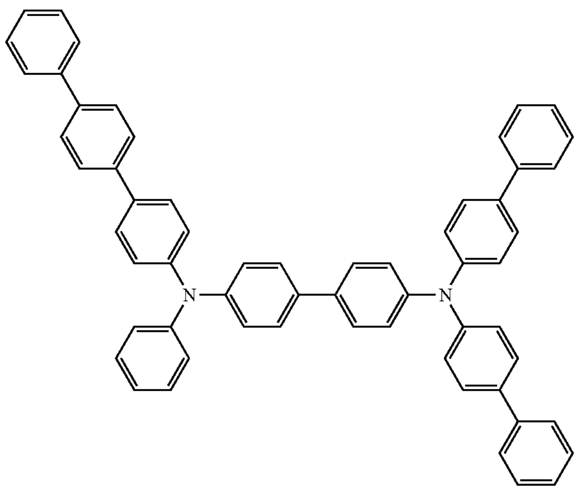

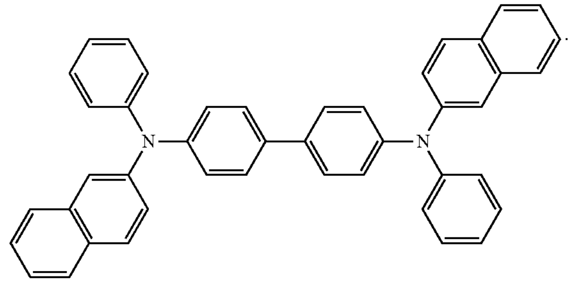

β-NPB

[Film]

The first compound, the second compound, the third compound, and the fourth compound may be included in various films. In an embodiment, a film including a mixture of the first compound, the second compound, the third compound, and the fourth compound may be provided. The film may be, for example, an optical member (or a light control means) (for example, a color filter, a color conversion member, a capping layer, a light extraction efficiency enhancement layer, a selective light absorbing layer, a polarizing layer, a quantum dot-containing layer, or like), a light-blocking member (for example, a light reflective layer, a light absorbing layer, or the like), or a protective member (for example, an insulating layer, a dielectric layer, or the like).

[Electronic Apparatus]

The light-emitting device may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. For example, the light emitted from the light-emitting device may be blue light or white light. The light-emitting device may be the same as described herein. In an embodiment, the color conversion layer may include quantum dots. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining layer may be located between the subpixels to define each subpixel.

The color filter may further include color filter areas and light-shielding patterns located between the color filter areas, and the color conversion layer may include color conversion areas and light-shielding patterns located between the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. For example, the first area may include a red quantum dot, the second area may include a green quantum dot, and the third area may not include a quantum dot. The quantum dot may be the same as described herein. The first area, the second area, and/or the third area may each further include a scatterer.

In an embodiment, the light-emitting device may emit first light, the first area may absorb the first light to emit first-first color light, the second area may absorb the first light to emit second-first color light, and the third area may absorb the first light to emit third-first color light. In this regard, the first first-color light, the second first-color light, and the third first-color light may have different maximum emission wavelengths. For example, the first light may be blue light, the first-first color light may be red light, the second-first color light may be green light, and the third-first color light may be blue light.

The electronic apparatus may further include a thin-film transistor in addition to the light-emitting device as described herein. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, etc.

The active layer may include crystalline silicon, amorphous silicon, organic semiconductor, oxide semiconductor, or the like.

The electronic apparatus may further include a sealing portion for sealing the light-emitting device. The sealing portion may be located between the color filter and/or the color conversion layer, and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin film encapsulation layer, the electronic apparatus may be flexible.

Various functional layers may be further included on the sealing portion, in addition to the color filter and/or the color conversion layer, according to the use of the electronic apparatus. Examples of the functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device as described herein, a biometric information collector.

The electronic apparatus may be applied to various displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
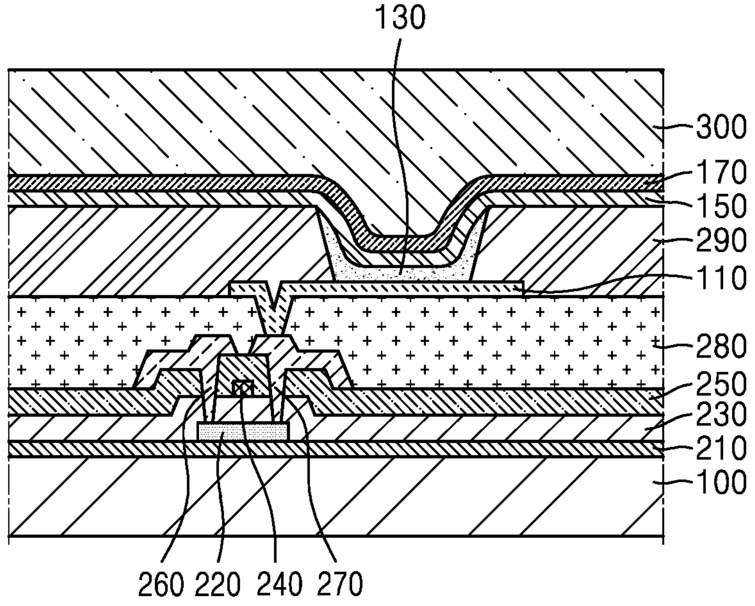
FIG. 2 is a schematic cross-sectional view of an electronic apparatus according to an embodiment.
Figure 3:
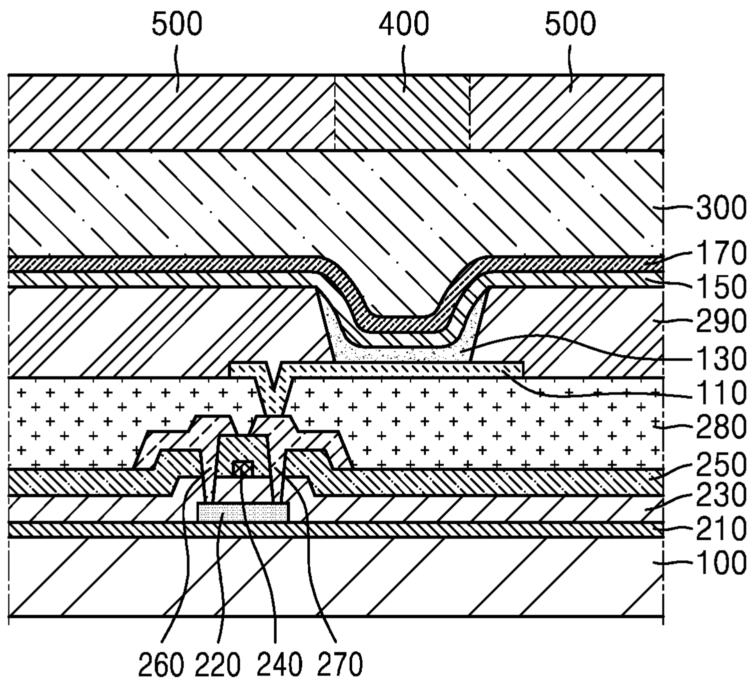
FIG. 3 is a schematic cross-sectional view of an electronic apparatus according to another embodiment.

[Description of FIGS. 2 and 3]

FIG. 2 is a schematic cross-sectional view of an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may respectively contact the exposed portions of the source region and the drain region of the active layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and may expose a portion of the drain electrode 270, and the first electrode 110 may be electrically connected to the exposed portion of the drain electrode 270.

A pixel-defining layer 290 containing an insulating material may be located on the first electrode 110. The pixel-defining layer 290 may expose a region of the first electrode 110, and an interlayer 130 may be formed in the exposed region of the first electrode 110. The pixel-defining layer 290 may be a polyimide or polyacrylic organic film. Although not shown in FIG. 2, at least some layers of the interlayer 130 may extend beyond the upper portion of the pixel-defining layer 290 to be provided in the form of a common layer.

The second electrode 150 may be located on the interlayer 130, and a capping layer 170 may be further included on the second electrode 150. The capping layer 170 may be formed to cover the second electrode 150. The capping layer 170 may be a capping layer as described herein.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or any combination thereof; or a combination of the inorganic film and the organic film.

FIG. 3 is a schematic cross-sectional view of an electronic apparatus according to another embodiment.

The electronic apparatus of FIG. 3 may differ from the electronic apparatus of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

[Manufacturing Method]

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100 °C. to about 500 °C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

[Definitions of Terms]

The term "$C_3$-$C_{60}$ carbocyclic group" as used herein may be a cyclic group consisting of carbon as the only ring-forming atoms and having three to sixty carbon atoms, and the term "$C_1$-$C_{60}$ heterocyclic group" as used herein may be a cyclic group that has one to sixty carbon atoms and further has, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group may have 3 to 61 ring-forming atoms.

The term "cyclic group" as used herein may include the $C_3$-$C_{60}$ carbocyclic group or the $C_1$-$C_{60}$ heterocyclic group.

The term "π electron-rich $C_3$-$C_{60}$ cyclic group" as used herein may be a cyclic group that has three to sixty carbon atoms and may not include *—N═*' as a ring-forming moiety, and the term "π electron-deficient nitrogen-containing $C_1$-$C_{60}$ cyclic group" as used herein may be a heterocyclic group that has one to sixty carbon atoms and may include *—N═*' as a ring-forming moiety.

In embodiments, the $C_3$-$C_{60}$ carbocyclic group may be a T1 group or a cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a cyclic group in which two or more T2 groups are condensed with each other, or a cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a cyclic group in which two or more T1 groups are condensed with each other, a T3 group, a cyclic group in which two or more T3 groups are condensed with each other, or a cyclic group in which at least one T3 group and at least one T1 group are condensed with each other (for example, the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be a T4 group, a cyclic group in which two or more T4 groups are condensed with each other, a cyclic group in which at least one T4 group and at least one T1 group are condensed with each other, a cyclic group in which at least one T4 group and at least one T3 group are condensed with each other, or a cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group, a monovalent group, or a polyvalent group (for example, a divalent group, a trivalent group, a tetravalent group, etc.), depending on the structure of a formula in connection with which the terms are used. For example, a "benzene group" may be a benzo group, a phenyl group, a phenylene group, or the like, which may be readily understood by one of ordinary skill in the art according to the structure of a formula including the "benzene group."

Examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —$O(A_{101})$ (wherein $A_{101}$ may be a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" as used herein may be a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system having six to sixty carbon atoms, and the term "$C_6$-$C_{60}$ arylene group" as used herein may be a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the respective rings may be condensed with each other.

The term "$C_1$-$C_{60}$ heteroaryl group" as used herein may be a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein may be a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the respective rings may be condensed with each other.

The term "monovalent non-aromatic condensed polycyclic group" as used herein may be a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein may be a divalent group having a same structure as a monovalent non-aromatic condensed polycyclic group.

The term "monovalent non-aromatic condensed heteropolycyclic group" as used herein may be a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as a monovalent non-aromatic condensed heteropolycyclic group.

The term "$C_6$-$C_{60}$ aryloxy group" as used herein may be a group represented by —O($A_{102}$) (wherein $A_{102}$ may be a $C_6$-$C_{60}$ aryl group), and the term "$C_6$-$C_{60}$ arylthio group" as used herein may be a group represented by —S($A_{103}$) (wherein $A_{103}$ may be a $C_6$-$C_{60}$ aryl group).

The term "$C_7$-$C_{60}$ aryl alkyl group" as used herein may be a group represented by -($A_{104}$)($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein may be a group represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

The group $R_{10a}$ as used herein may be:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

The groups $Q_1$ to $Q_3$, $Q_{11}$ to $Q_{13}$, $Q_{21}$ to $Q_{23}$, and $Q_{31}$ to $Q_{33}$ as used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein may be any atom other than a carbon atom or a hydrogen atom. Examples of the heteroatom may include O, S, N, P, Si, B, Ge, Se, or any combination thereof.

The term "third-row transition metal" as used herein may include hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the terms "tert-Bu" or "$Bu^t$" as used herein each refer to a tert-butyl group, and the term "OMe" as used herein refers to a methoxy group.

The term "biphenyl group" as used herein may be a "phenyl group substituted with a phenyl group." For example, the "biphenyl group" may be a substituted phenyl group having a $C_6$-$C_{60}$ aryl group as a substituent.

The term "terphenyl group" as used herein may be a "phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

The symbols * and *' as used herein, unless defined otherwise, each refer to a binding site to a neighboring atom in a corresponding formula or moiety.

Hereinafter, compounds according to embodiments and light-emitting devices according to embodiments will be described in detail with reference to the Synthesis Examples and Examples. The wording "B was used instead of A" used in describing Synthesis Examples means that an identical molar equivalent of B was used in place of A.

EXAMPLES

Evaluation Example 1

HOMO energy levels (eV) of host and dopant compounds used in Examples and Comparative Examples were evaluated using the DFT method of the Gaussian program, which is structure-optimized at the B3LYP/6-31G(d,p) level, and results thereof are shown in Table 1.

TABLE 1

| Compound | HOMO (eV) |
|---|---|
| CBP | -5.60 |
| DIC-TRZ | -5.05 |
| BD0-1 | -5.01 |
| BD0-2 | -4.85 |
| BD0-3 | -4.91 |
| BD0-4 | -4.88 |
| BD1 | -5.05 |
| BD2 | -4.92 |
| HT host1 | -5.33 |
| ET Host1 | -5.46 |

CBP

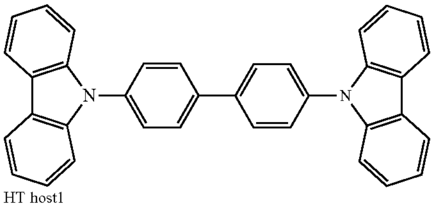

HT host1

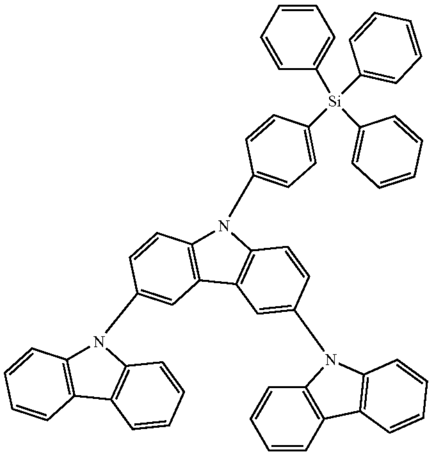 [SMILES: c1ccc([Si](c2ccccc2)(c2ccccc2)c2ccc(-n3c4ccc(-n5c6ccccc6c6ccccc65)cc4c4cc(-n5c6ccccc6c6ccccc65)ccc43)cc2)cc1]

DIC-TRZ

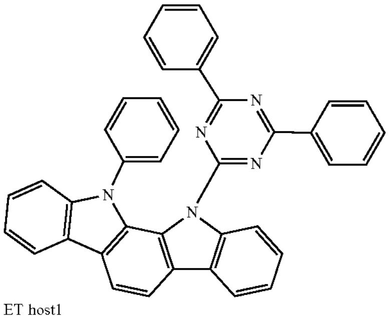

ET host1

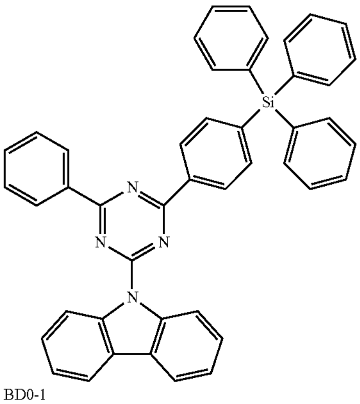

BD0-1

TABLE 1-continued

| Compound | HOMO (eV) |
|---|---|
| 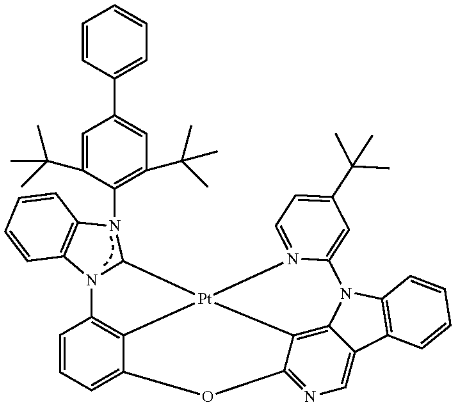 | |
| BD0-2 | |
| 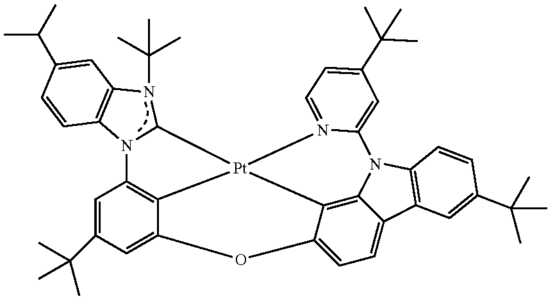 | |
| BD0-3 | |
| 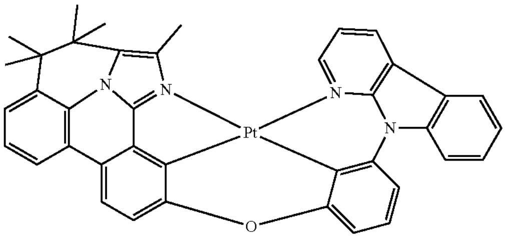 | |
| BD0-4 | |
| 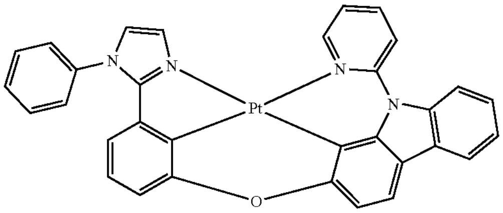 | |
| BD1 | |

TABLE 1-continued

| Compound | HOMO (eV) |
|---|---|
| 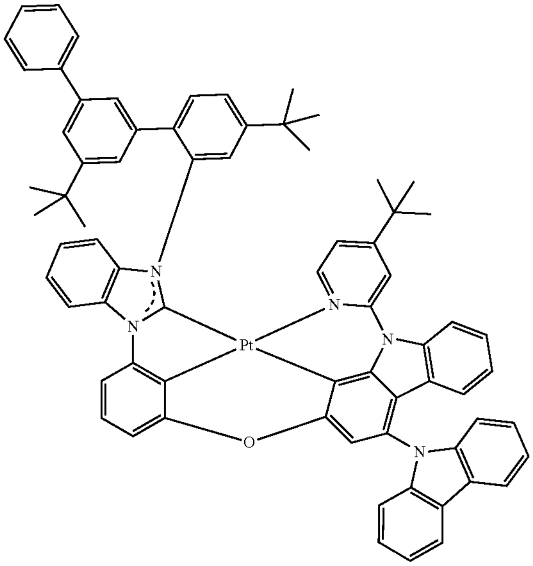 | |
| BD2 | |
| 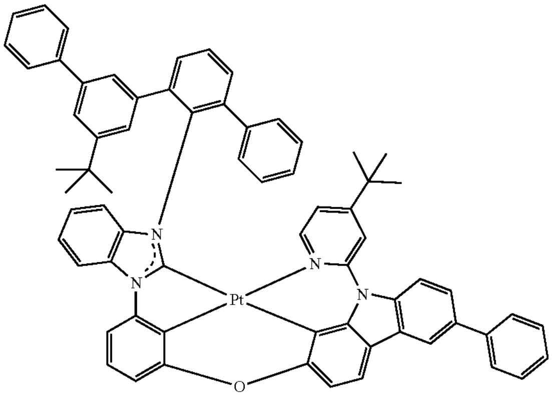 | |

Comparative Example 1

A Corning 15 Ω/cm[2] (1,200 Å) ITO glass substrate (anode) was cut to a size of 50 mm×50 mm×0.5 mm, sonicated with acetone, isopropyl alcohol, and pure water each for 15 minutes, and cleaned by irradiation of ultraviolet rays and exposure of ozone thereto for 30 minutes. The glass substrate was provided to a vacuum deposition apparatus.

HT18 and Compound 202 (2 wt %) were deposited on the ITO glass substrate to form a hole injection layer having a thickness of 100 Å, and HT18 was deposited on the hole injection layer to form a hole transport layer having a thickness of 1,000 Å.

TCTA was deposited on the hole transport layer to form an electron blocking layer having a thickness of 100 Å, thereby forming a hole transport region.

CBP as a host and BD1 (concentration of 10 vol %) as a dopant were co-deposited on the hole transport region to form an emission layer having a thickness of 300 Å.

DIC-TRZ was deposited on the emission layer to form a hole blocking layer having a thickness of 50 Å, and ET12 and Liq were deposited thereon at a weight ratio of 1:1 to form an electron transport layer having a thickness of 300 Å.

LiF was deposited on the electron transport layer to form an electron injection layer having a thickness of 10 Å, and Ag was deposited thereon to form a cathode having a thickness of 120 Å. HT18 was deposited on the cathode to form a capping layer having a thickness of 800 Å, thereby completing manufacture of an organic light-emitting device.
HT18
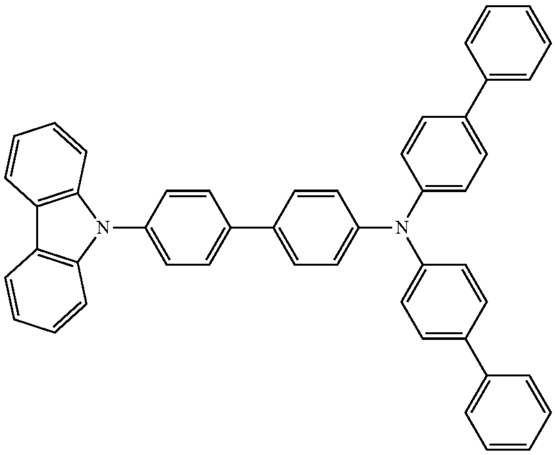
202
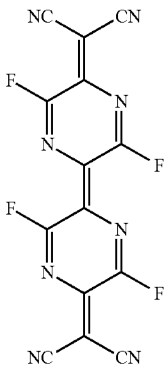
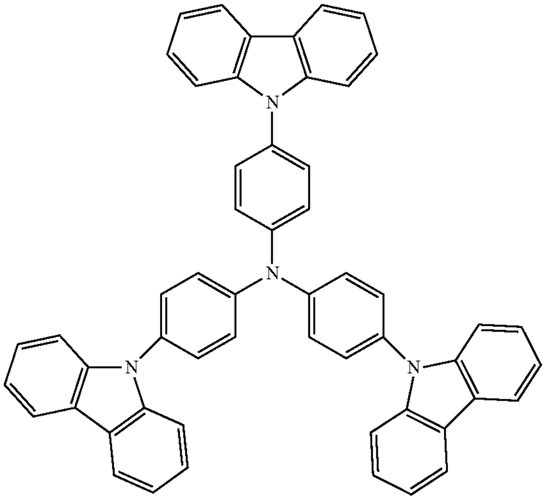
TCTA
-continued
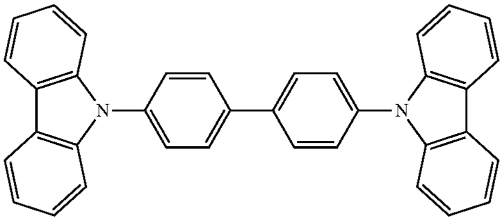
CBP
BD1
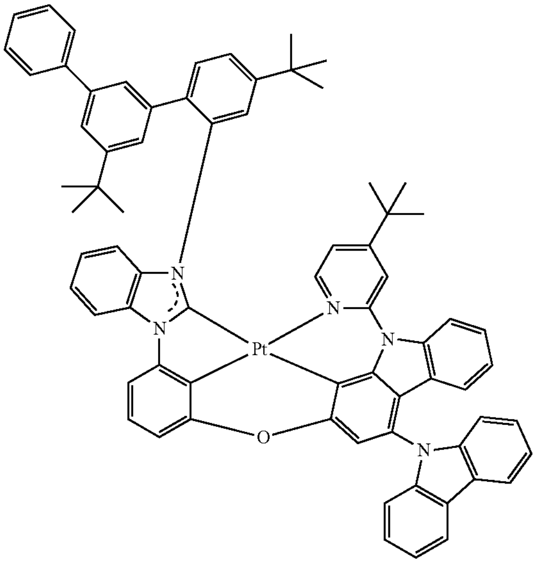
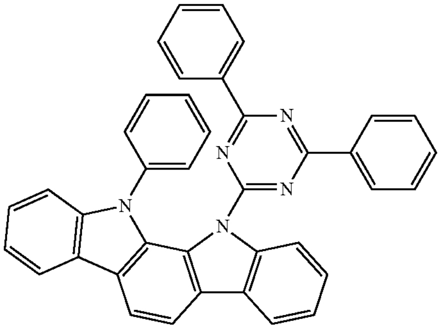
DIC-TRZ -continued

ET12

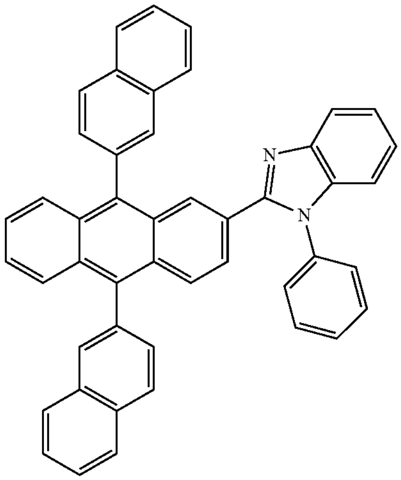

Comparative Examples 2 to 6 and Examples 1 and 2

Organic light-emitting devices were manufactured in the same manner as in Comparative Example 1, except that, in forming the emission layer, a host and a dopant, which are described in Table 2, were used.

In this regard, each of amounts of dopants described in Table 2 is a relative value (vol %) with respect to a total volume of a host compound. Also, Table 2 shows a weight ratio between host compounds.

Example 3 and Comparative Example 7

Organic light-emitting devices were manufactured in the same manner as in Comparative Example 1, except that, a host and a dopant described in Table 2 were used to form, as the emission layer, two emission layers including a first emission layer and a second emission layer, which were arranged sequentially from the anode.

Example 4 and Comparative Example 8

Organic light-emitting devices were manufactured in the same manner as in Comparative Example 1, except that, a host and a dopant described in Table 2 were used to form, as the emission layer, three emission layers including a first emission layer, a second emission layer, and a third emission layer, which were arranged sequentially from the anode.

TABLE 2

| | First emission layer | | Second emission layer | | Third emission layer | |
|---|---|---|---|---|---|---|
| No. | Host | Dopant | Host | Dopant | Host | Dopant |
| Comparative Example 1 | CBP (thickness of 300 Å) | BD1 (10 vol %) | — | — | — | — |
| Comparative Example 2 | CBP (thickness of 300 Å) | BD2 (10 vol %) | — | — | — | — |
| Comparative Example 3 | CBP:ET host1 (6:4)(thickness of 300 Å) | BD1 (5 vol %) + BD2 (15 vol %) | — | — | — | — |
| Comparative Example 4 | HT host1: ET host1 (6:4)(thickness of 300 Å) | BD0-1 (5 vol %) + BD2 (15 vol %) | — | — | — | — |
| Comparative Example 5 | HT host1: ET host1 (6:4) (thickness of 300 Å) | BD0-3 (5 vol %) + BD0-4 (15 vol %) | — | — | — | — |
| Comparative Example 6 | HT host1: ET host1 (6:4) (thickness of 300 Å) | BD0-1 (5 vol %) + BD0-2 (15 vol %) | — | — | — | — |
| Example1 | HT host1: ET host1 (6:4) (thickness of 300 Å) | BD1 (5 vol %) + BD2 (15 vol %) | — | — | — | — |
| Example 2 | HT host1: ET host1 (6:4) (thickness of 300 Å) | BD1 (15 vol % -> 5 vol % -> 8 vol %) + BD2 (13 vol %) | — | — | — | — |

TABLE 2-continued

| | First emission layer | | Second emission layer | | Third emission layer | |
|---|---|---|---|---|---|---|
| No. | Host | Dopant | Host | Dopant | Host | Dopant |
| Example 3 | HT host1: ET host1 (6:4) (thickness of 100 Å) | BD1 (15 vol %) | HT host1: ET host1 (5:5) (thickness of 200 Å) | BD2 (15 vol %) | — | — |
| Example 4 | HT host1: ET host1 (6:4) (thickness of 100 Å) | BD1 (15 vol %) | HT host1: ET host1 (5:5) (thickness of 150 Å) | BD2 (15 vol %) | HT host1:ET host1 (4:6) (thickness of 50 Å) | BD2 (5 vol %) |
| Comparative Example 7 | HT host1: ET host1 (6:4) (thickness of 100 Å) | BD0-1 (15 vol %) | HT host1: ET host1 (5:5) (thickness of 200 Å) | BD0-2 (15 vol %) | — | — |
| Comparative Example 8 | HT host1: ET host1 (6:4) (thickness of 100 Å) | BD0-1 (15 vol %) | HT host1: ET host1 (5:5) (thickness of 150 Å) | BD0-2 (15 vol %) | HT host1:ET host1 (4:6) (thickness of 50 Å) | BD0-2 (5 vol %) |

Evaluation Example 2

Each of the driving voltage (V) at 1,000 nit, luminescence efficiency (cd/A), and lifespan ($T_{95}$) of the organic light-emitting devices manufactured in Examples 1 to 4 and Comparative Examples 1 to 8 was measured using Keithley MU 236 and luminance meter PR650, and results thereof are shown in Table 3. In Table 3, the lifespan (T95) indicates a time (hr) for the luminance to reach 95% of its initial luminance.

|HOMO(H1)|−|HOMO(D1)| in Table 3 is a value obtained by subtracting an absolute value of a HOMO energy level (eV) of the third compound (or according to a corresponding device, among two different dopants, a dopant having a smaller negative value of a HOMO energy level (eV)) from an absolute value of a HOMO energy level (eV) of the first compound, and was calculated based on a HOMO energy level value of each compound in Table 1.

TABLE 3

| No. | \|HOMO(H1)\| − \|HOMO(D1)\| | Driving voltage (V) | CIE_y | Efficiency (cd/A) | $T_{95}$ (@ 1,000 nit) (hr) |
|---|---|---|---|---|---|
| Comparative Example 1 | 0.55 | 5.73 | 0.054 | 19.6 | 36 |
| Comparative Example 2 | 0.68 | 6.14 | 0.058 | 18.3 | 49 |
| Comparative Example 3 | 0.55 | 5.64 | 0.055 | 18.7 | 43 |
| Comparative Example 4 | 0.32 | 5.71 | 0.062 | 17.2 | 33 |
| Comparative Example 5 | 0.42 | 6.03 | 0.061 | 17.2 | 11 |
| Comparative Example 6 | 0.32 | 6.52 | 0.067 | 15.8 | 19 |
| Example 1 | 0.28 | 5.34 | 0.055 | 20.5 | 58 |
| Example 2 | 0.28 | 5.3 | 0.056 | 21.3 | 64 |
| Example 3 | 0.28 | 5.37 | 0.056 | 20.6 | 60 |
| Example 4 | 0.28 | 5.33 | 0.056 | 21.5 | 68 |
| Comparative Example 7 | 0.32 | 6.50 | 0.065 | 15.9 | 18 |
| Comparative Example 8 | 0.32 | 6.44 | 0.065 | 16.1 | 19 |

From Table 3, it was confirmed that the light-emitting devices of Examples 1 to 4 had improved characteristics in terms of driving voltage, color purity, efficiency, and/or lifespan, as compared to the light-emitting devices of Comparative Examples 1 to 8.

The light-emitting device may have high efficiency and a long lifespan.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising:

a first electrode;

a second electrode facing the first electrode; and an interlayer between the first electrode and the second electrode and comprising an emission layer, wherein the emission layer comprises a host and a dopant, the host comprises a first compound and a second compound, the dopant comprises a third compound and a fourth compound, the first compound, the second compound, the third compound, and the fourth compound are different from each other, the third compound is a platinum-containing organometallic compound, the platinum-containing organometallic compound comprises platinum and a first ligand bonded to the platinum, the first ligand comprises a carbene group, the carbon of the carbene group and the platinum are bonded together, and Expression 1 is satisfied:

$$|HOMO(H1)|-|HOMO(D1)|\leq 0.3\ eV. \qquad \text{[Expression 1]}$$

wherein in Expression 1,

HOMO(D1) is a highest occupied molecular orbital (HOMO) energy level (eV) of the third compound, HOMO(H1) is a HOMO energy level (eV) of the first compound, and HOMO(D1) and HOMO(H1) are each a negative value evaluated by a density functional theory (DFT) method, wherein the third compound is an organometallic compound represented by Formula 1

[Formula 1]

$M_1(L_{11})_{n11}(L_{12})_{n12}$,

1D

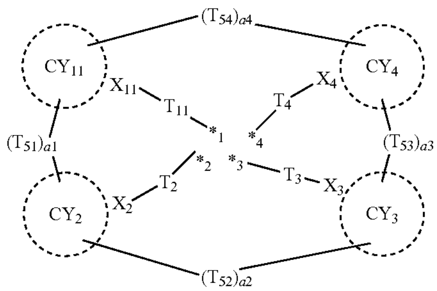

wherein in Formulae 1 and 1D, $M_1$ is platinum (Pt), $L_{11}$ is a ligand represented by Formula 1D, $L_{12}$ is a ligand, n11 is 1, n12 is 0, $X_2$ to $X_4$ are each independently nitrogen or carbon, $X_{11}$ is carbon, $CY_2$ to $CY_4$ and $CY_{11}$ are each independently a $C_5$-$C_{30}$ carbocyclic group or a $C_1$-$C_{30}$ heterocyclic group, $T_{51}$ to $T_{54}$ are each independently a single bond, *—O*', *—S—*', *—C(═O)—*', *—S(═O)—*', *—C($R_5$)($R_6$)—*', *—C($R_5$)═C($R_6$)—*', *—C($R_5$)═*', *═C═*', *—Si($R_5$)($R_6$)—*', *—B($R_5$)—*', *—N($R_5$)—*', or *—P($R_5$)—*', a1 to a3 are each independently 1, 2, or 3, a4 is 0, 1, 2, or 3, when a4 in Formula 1D is 0, $CY_{11}$ and $CY_4$ are not linked together, $T_2$ to $T_4$ are each independently a chemical bond, *—O—*', *—S—*', *—N($R_7$)—*', *—B($R_7$)—*', *—P($R_7$)—*', *—C($R_7$)($R_8$)—*', Si($R_7$)($R_8$)—*', *—C(═O)—*, or *—C(═S)—*', $T_{11}$ is a coordinate bond, $*_1$, $*_2$, $*_3$, and $*_4$ each indicate a binding site to $M_1$, $R_1$ to $R_8$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b1 to b4 are each independently an integer from 0 to 10, two or more adjacent groups of $R_1$ to $R_8$ and $T_{51}$ to $T_{54}$ are optionally bonded together to form a $C_5$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently; hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device of claim 1, wherein HOMO(D1) is less than or equal to about-5.0 eV.

3. The light-emitting device of claim 1, wherein Expression 2 is satisfied:

$$|HOMO(H1)-HOMO(H2)|\leq 0.5\ eV \qquad \text{[Expression 2]}$$

wherein in Expression 2,

HOMO(H1) is a HOMO energy level (eV) of the first compound,

HOMO(H2) is a HOMO energy level (eV) of the second compound, and

HOMO(H1) and HOMO(H2) are each a negative value evaluated by a DFT method.

4. The light-emitting device of claim 1, wherein Expression 4 is satisfied:

$$0.05\ \text{eV} \le |\text{HOMO}(D1) - \text{HOMO}(D2)| \le 0.15\ \text{eV} \qquad \text{[Expression 4]}$$

wherein in Expression 4,

HOMO(D1) is a HOMO energy level (eV) of the third compound,

HOMO(D2) is a HOMO energy level (eV) of the fourth compound, and

HOMO(D1) and HOMO(D2) are each a negative value evaluated by a DFT method.

5. The light-emitting device of claim 1, wherein the first compound is a hole transporting host, and the second compound is an electron transporting host or a bipolar host.

6. The light-emitting device of claim 1, wherein the first compound comprises at least one of groups represented by Formulae 3-1 to 3-3, and the second compound comprises at least one IT electron-deficient nitrogen-containing $C_1$-$C_{60}$ cyclic group:

3-1

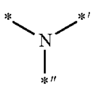

3-2

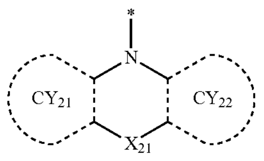

3-3

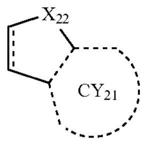

wherein in Formulae 3-1 to 3-3, ring $CY_{21}$ and ring $CY_{22}$ are each independently a TT electron-rich $C_3$-$C_{60}$ cyclic group or a pyridine group, $X_{21}$ is a single bond, or a linking group including O, S, N, B, C, Si, or a combination thereof, $X_{22}$ is a linking group including O, S, N, B, C, Si, or a combination thereof,

 in Formula 3-3 indicates a single bond or a double bond, and

*, *', and *" each indicate a binding site to a neighboring atom in the first compound.

7. The light-emitting device of claim 1, wherein the second compound is a compound represented by Formula 4:

[Formula 4]

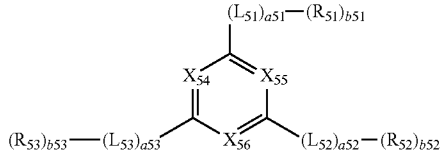

wherein in Formula 4, $X_{54}$ is N or $C[(L_{54})_{a54}$-$(R_{54})_{b54}]$, $X_{55}$ is N or $C[(L_{55})_{a55}$-$(R_{55})_{b55}]$, $X_{56}$ is N or $C[(L_{56})_{a56}$-$(R_{56})_{b56}]$, at least one of $X_{54}$ to $X_{56}$ is N, $L_{51}$ to $L_{56}$ are each independently a single bond, a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $a_{51}$ to $a_{56}$ are each independently an integer from 1 to 5, $R_{51}$ to $R_{56}$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, b51 to b56 are each independently an integer from 1 to 10, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-Coo arylthio group, a $C_7$-Coo aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

8. The light-emitting device of claim 1, wherein the fourth compound is an organometallic compound represented by Formula 2:

[Formula 2]

$M_2(L_{21})_{n21}(L_{22})_{n22}$

1A

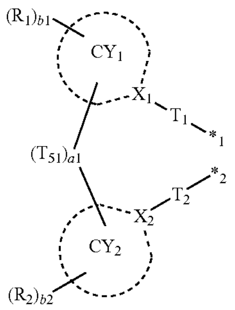

1B

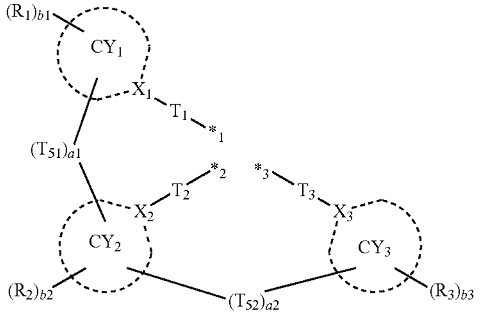

1C

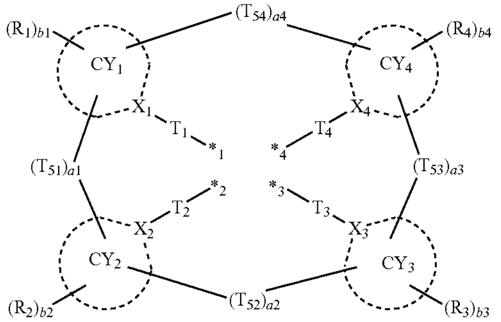

1D

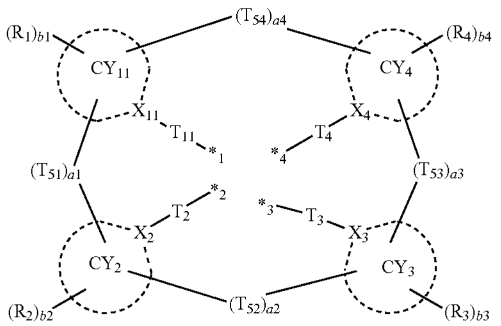

wherein in Formulae 2 and 1A to 1D, $M_2$ is platinum (Pt), palladium (Pd), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $L_{21}$ and $L_{22}$ are each independently a ligand represented by one of Formulae 1A to 1D, n21 are each independently 1, 2, or 3, n22 are each independently 0, 1, 2, 3, or 4, $X_1$ to $X_4$ are each independently nitrogen or carbon, $X_{11}$ is carbon, $CY_1$ to $CY_4$ and $CY_{11}$ are each independently a $C_5$-$C_{30}$ carbocyclic group or a $C_1$-$C_{30}$ heterocyclic group, $T_{51}$ to $T_{54}$ are each independently a single bond, *—O—*', *—S—*', *—C(═O)—*', *—S(═O)—*', *—C($R_5$)($R_6$)—*, *—C($R_5$)═C($R_6$)—*', *—C($R_5$)═*, *═C═*, *—Si($R_5$)($R_6$)—*', *—B($R_5$)—*', *—N($R_5$)—*, or *—P($R_5$)—*', a1 to a3 are each independently 1, 2, or 3, a4 is 0, 1, 2, or 3, when a4 in Formula 1C is 0, $CY_1$ and $CY_4$ are not linked together, when a4 in Formula 1D is 0, $CY_{11}$ and $CY_4$ are not linked together, $T_1$ to $T_4$ are each independently a chemical bond, *—O—*', *—S—*', *—N($R_7$)—*', *—B($R_7$)—*, *—P($R_7$)—*', *—C($R_7$)($R_8$)—*', Si($R_7$)($R_8$)—*, *—C(═O)—*, or *—C(═S)—*, $T_{11}$ is a coordinate bond, 1, *2, *3, and *4 each indicate a binding site to $M_1$ or $M_2$, $R_1$ to $R_8$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{6o}$ aryl alkyl group that is unsubstituted or substituted with at least one $R_{10a}$, a $C_2$-$C_{60}$ heteroaryl alkyl group that is unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b1 to b4 are each independently an integer from 0 to 10, two or more adjacent groups of $R_1$ to $R_8$ and $T_{51}$ to $T_{54}$ are optionally bonded together to form a $C_5$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or a combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

9. The light-emitting device of claim 8, wherein in Formula 1D, a4 is 0, and a group represented by

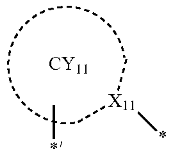

is a group represented by one of Formulae CY11-1 to CY11-8:

CY11-1

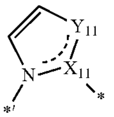

CY11-2

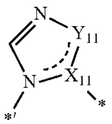

CY11-3

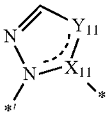

-continued

CY11-4

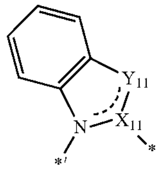

CY11-5

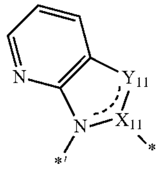

CY11-6

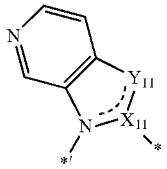

CY11-7

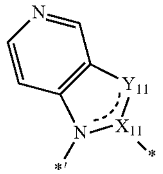

CY11-8

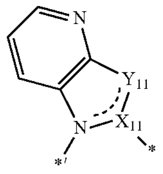

wherein in Formulae CY11-1 to CY11-8, $X_{11}$ is the same as described in Formula 1D, $Y_{11}$ comprises O, S, N, C, or Si,

* indicates a binding site to $T_{11}$ in Formula 1D, and

* indicates a binding site to $T_{51}$ in Formula 1D.

10. The light-emitting device of claim 8, wherein the third compound is a compound represented by Formula 1-1 or Formula 1-2, and the fourth compound is a compound represented by Formula 2-1 or Formula 2-2:

[Formula 1-1]

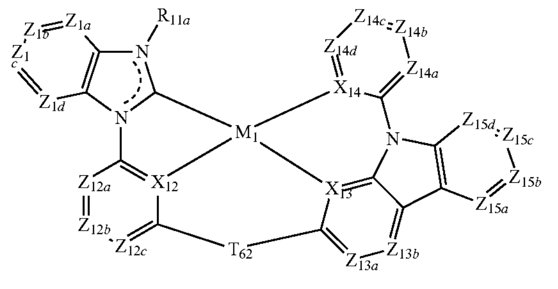

-continued

[Formula 1-2]

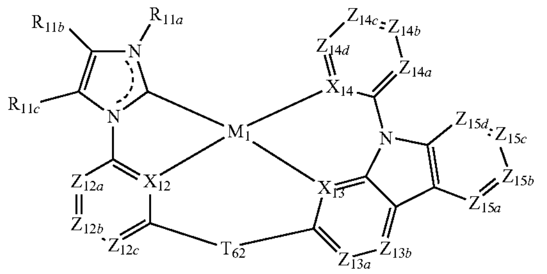

[Formula 2-1]

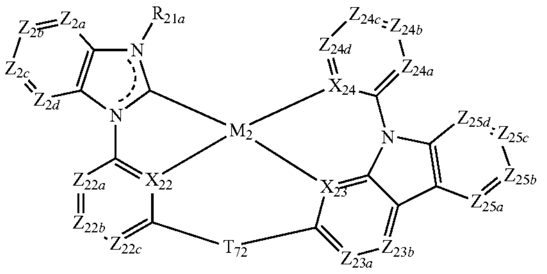

[Formula 2-2]

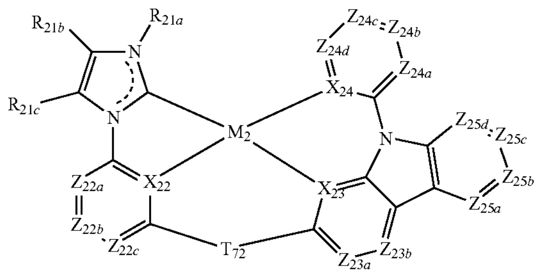

wherein in Formulae 1-1, 1-2, 2-1, and 2-2, $M_1$ and $M_2$ are respectively the same as described in Formulae 1 and 2, $X_{12}$ to $X_{14}$ and $X_{22}$ to $X_{24}$ are each independently nitrogen or carbon, $T_{62}$ and $T_{72}$ are respectively the same as described in connection with $T_{52}$ in Formulae 1B to 1D, $Z_{1a}$ is $C(R_{1a})$ or N,
$Z_{1b}$ is $C(R_{1b})$ or N,
$Z_{1c}$ is $C(R_{1c})$ or N,
$Z_{1d}$ is $C(R_{1d})$ or N,
$Z_{12a}$ is $C(R_{12a})$ or N,
$Z_{12b}$ is $C(R_{12b})$ or N,
$Z_{12c}$ is $C(R_{12c})$ or N,
$Z_{13a}$ is $C(R_{13a})$ or N,
$Z_{13b}$ is $C(R_{13b})$ or N,
$Z_{14a}$ is $C(R_{14a})$ or N,
$Z_{14b}$ is $C(R_{14b})$ or N,
$Z_{14c}$ is $C(R_{14c})$ or N,
$Z_{14d}$ is $C(R_{14d})$ or N,
$Z_{15a}$ is $C(R_{15a})$ or N,
$Z_{15b}$ is $C(R_{15b})$ or N,
$Z_{15c}$ is $C(R_{15c})$ or N,
$Z_{15d}$ is $C(R_{15d})$ or N,
$Z_{2a}$ is $C(R_{2a})$ or N,
$Z_{2b}$ is $C(R_{2b})$ or N,
$Z_{2c}$ is $C(R_{2c})$ or N,
$Z_{2d}$ is $C(R_{2d})$ or N,
$Z_{22a}$ is $C(R_{22a})$ or N,
$Z_{22b}$ is $C(R_{22b})$ or N,
$Z_{22c}$ is $C(R_{22c})$ or N,
$Z_{23a}$ is $C(R_{23a})$ or N,
$Z_{23b}$ is $C(R_{23b})$ or N,
$Z_{24a}$ is $C(R_{24a})$ or N,
$Z_{24b}$ is $C(R_{24b})$ or N,
$Z_{24c}$ is $C(R_{24c})$ or N,
$Z_{24d}$ is $C(R_{24d})$ or N,
$Z_{25a}$ is $C(R_{25a})$ or N,
$Z_{25b}$ is $C(R_{25b})$ or N,
$Z_{25c}$ is $C(R_{25c})$ or N,
$Z_{25d}$ is $C(R_{25d})$ or N, $R_{1a}$ to $R_{1d}$, $R_{11a}$ to $R_{11c}$, $R_{12a}$ to $R_{12c}$, $R_{13a}$, $R_{13b}$, $R_{14a}$ to $R_{14d}$, $R_{15a}$ to $R_{15d}$, $R_{2a}$ to $R_{2d}$, $R_{21a}$ to $R_{21c}$, $R_{22a}$ to $R_{22c}$, $R_{23a}$, $R_{23b}$, $R_{24a}$ to $R_{24d}$, and $R_{25a}$ to $R_{25d}$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, two or more adjacent groups of $R_{1a}$ to $R_{1d}$, $R_{11a}$ to $R_{11c}$, $R_{12a}$ to $R_{12c}$, $R_{13a}$, $R_{13b}$, $R_{14a}$ to $R_{14d}$, $R_{15a}$ to $R_{15d}$, $R_{2a}$ to $R_{2d}$, $R_{21a}$ to $R_{21c}$, $R_{22a}$ to $R_{22c}$, $R_{23a}$, $R_{23b}$, $R_{24a}$ to $R_{24d}$, and $R_{25a}$ to $R_{25d}$ are optionally bonded together to form a $C_5$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, and $R_{10a}$ and $Q_1$ to $Q_3$ are respectively the same as described in Formulae 1 and 2.

11. The light-emitting device of claim 10, wherein in Formulae 1-1 and 1-2, $R_{11a}$ and at least one of $R_{14a}$ to $R_{14d}$ are each independently an electron-donating group, in Formulae 2-1 and 2-2, $R_{21a}$ and at least one of $R_{23a}$, $R_{23b}$, $R_{24a}$ to $R_{24d}$, and $R_{25a}$ to $R_{25d}$ are each independently an electron-donating group, and the electron-donating group is an iso-propyl group, a tert-butyl group, or a group represented by one of Formulae 10-1 to 10-124:

10-1

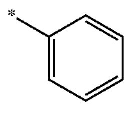

10-2

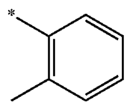

-continued
10-3
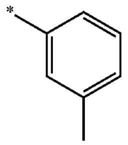
10-4
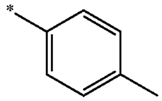
10-5
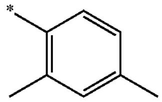
10-6
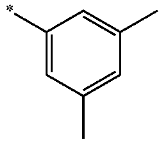
10-7
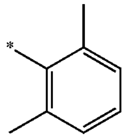
10-8
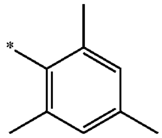
10-9
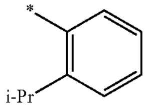
10-10
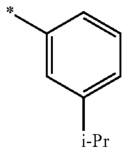
10-11
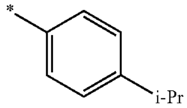
10-12
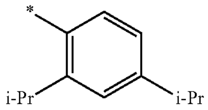
10-13
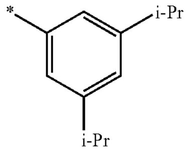
-continued
10-14
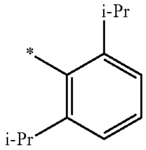
10-15
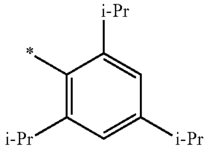
10-16
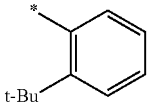
10-17
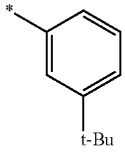
10-18
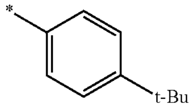
10-19
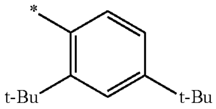
10-20
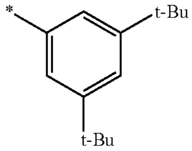
10-21
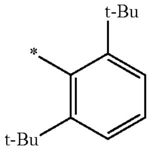
10-22
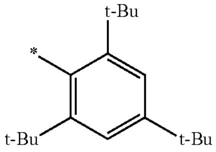
10-23
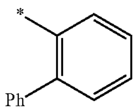
10-24
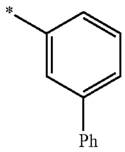

10-25
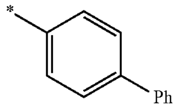
10-26
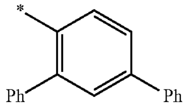
10-27
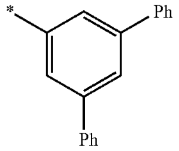
10-28
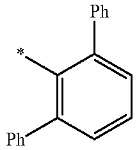
10-29
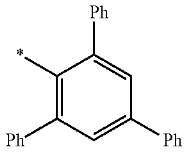
10-30
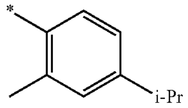
10-31
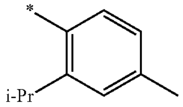
10-32
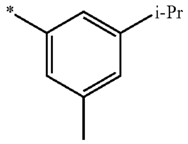
10-33
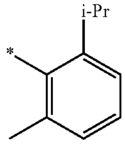
10-34
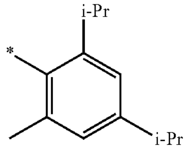
10-35
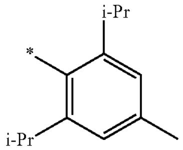
10-36
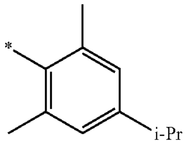
10-37
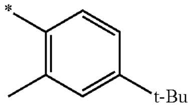
10-38
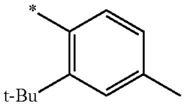
10-39
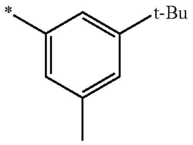
10-40
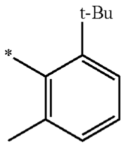
10-41
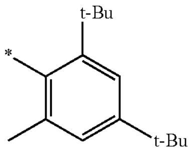
10-42
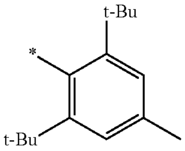
10-43
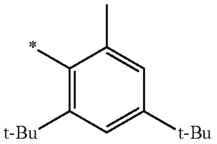
10-44
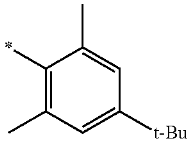
10-45
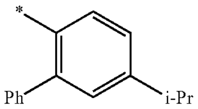
10-46
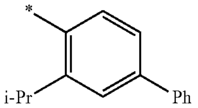

-continued
10-47
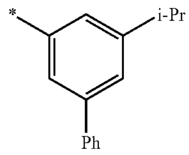
10-48
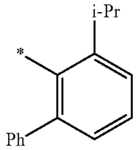
10-49
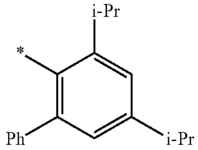
10-50
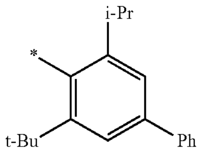
10-51
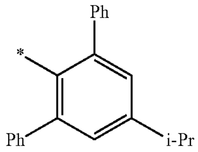
10-52
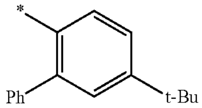
10-53
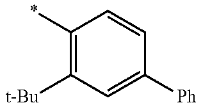
10-54
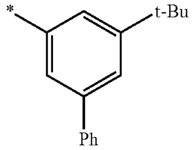
10-55
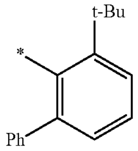
10-56
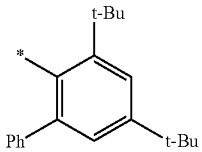
-continued
10-57
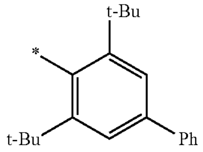
10-58
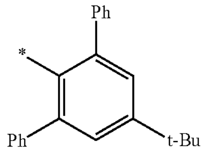
10-59
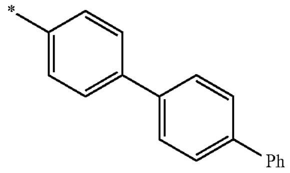
10-60
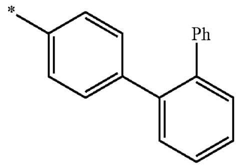
10-61
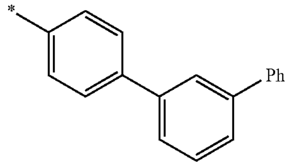
10-62
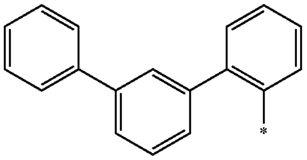
10-63
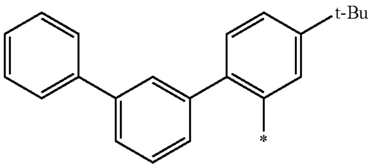
10-64
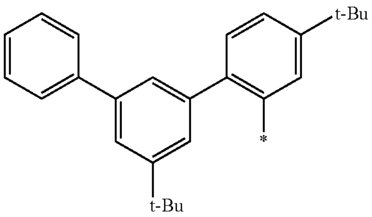
10-65
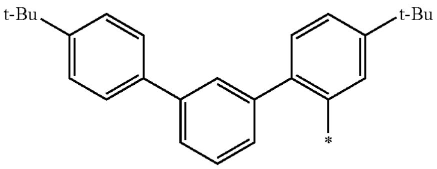

-continued
10-66
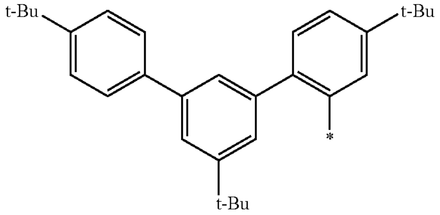
10-67
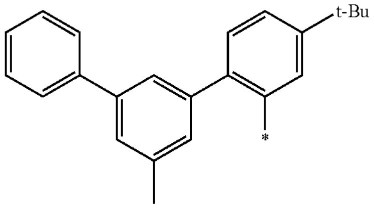
10-68
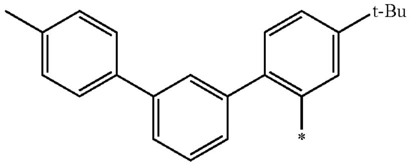
10-69
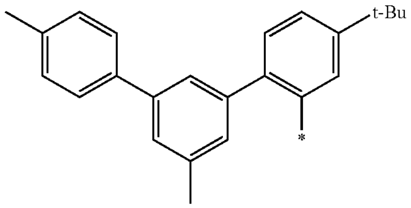
10-70
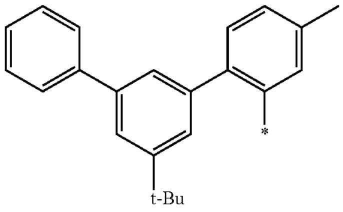
10-71
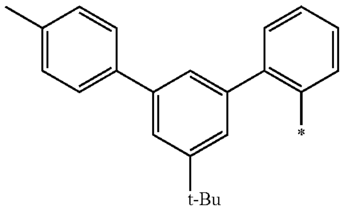
10-72
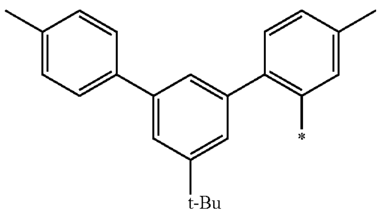
-continued
10-73
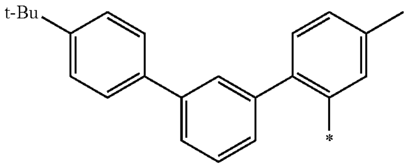
10-74
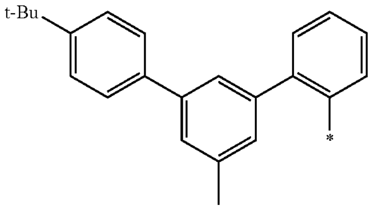
10-75
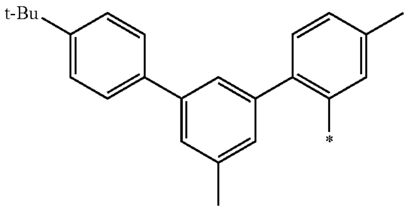
10-76
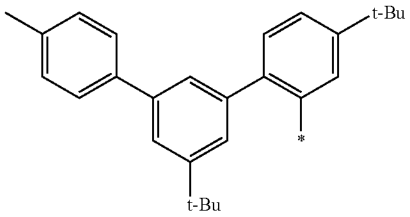
10-77
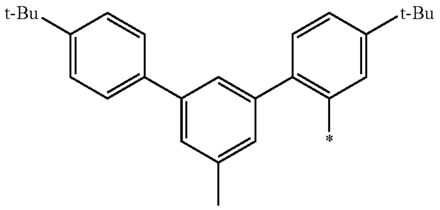
10-78
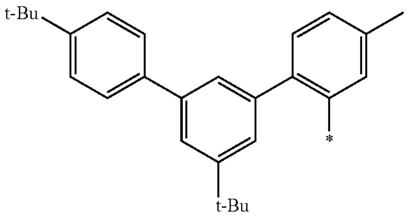
10-79
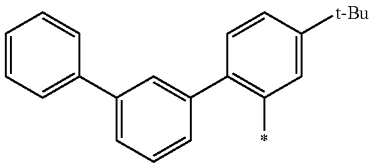

-continued
10-80
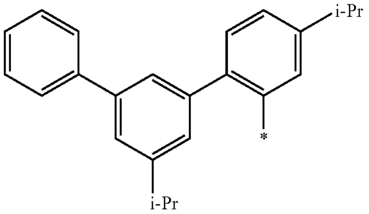
10-81
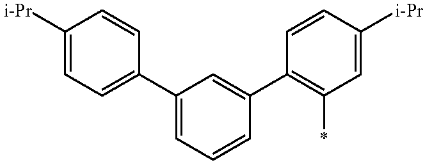
10-82
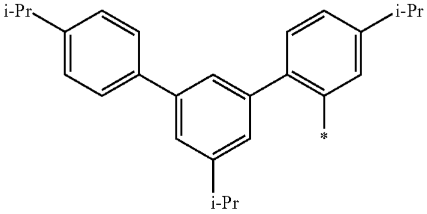
10-83
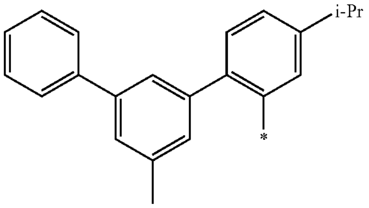
10-84
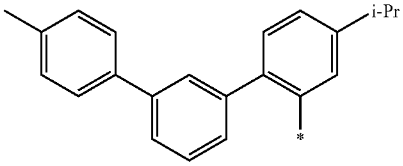
10-85
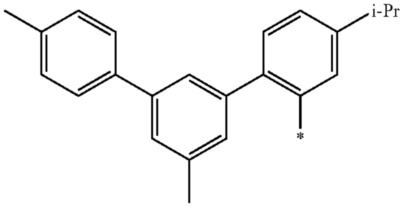
10-86
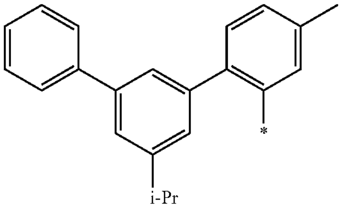
-continued
10-87
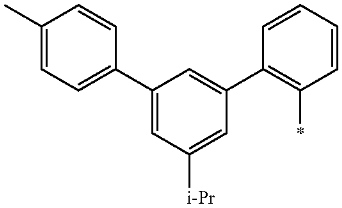
10-88
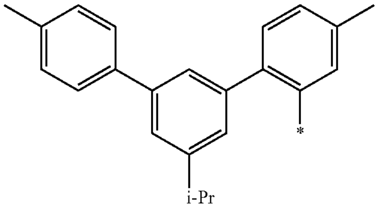
10-89
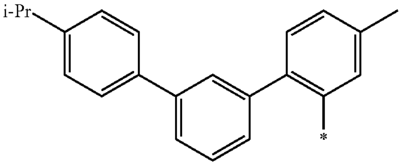
10-90
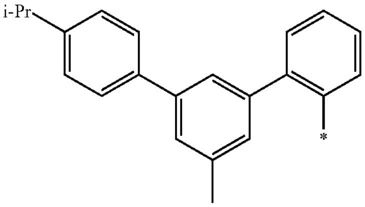
10-91
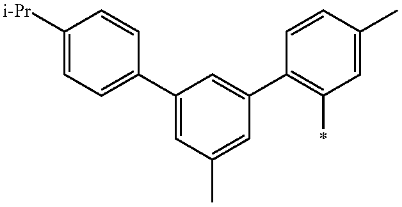
10-92
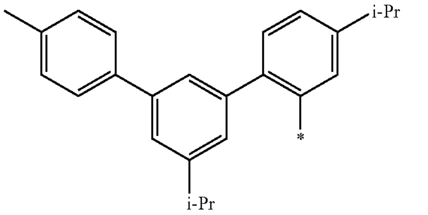
10-93
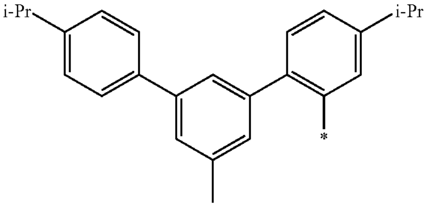

-continued
10-94
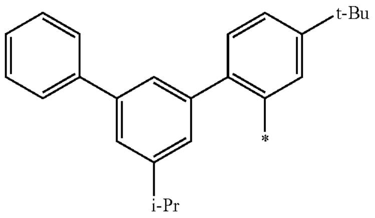
10-95
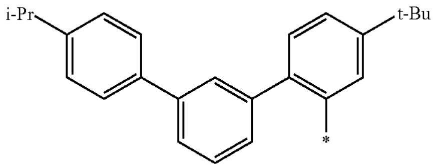
10-96
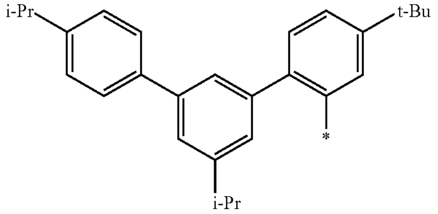
10-97
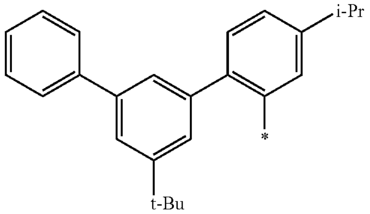
10-98
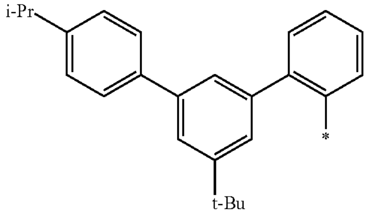
10-99
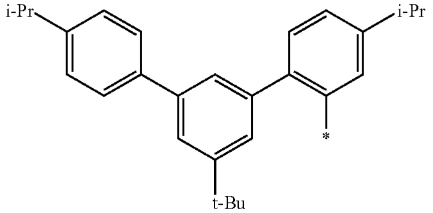
10-100
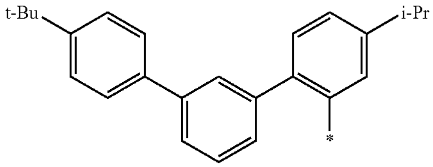
-continued
10-101
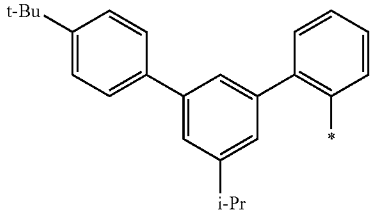
10-102
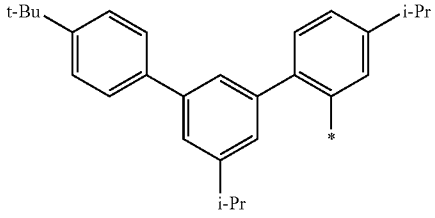
10-103
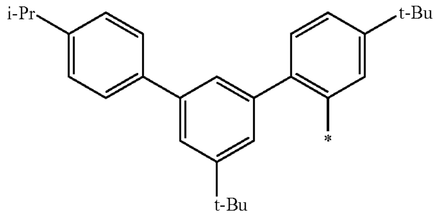
10-104
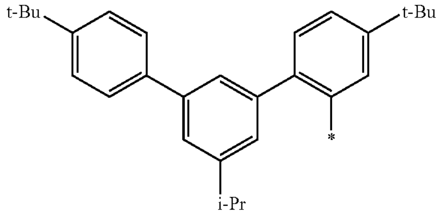
10-105
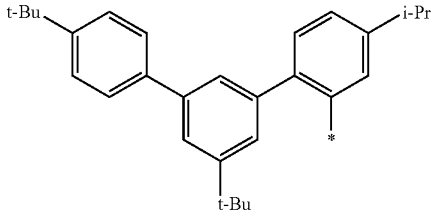
10-106
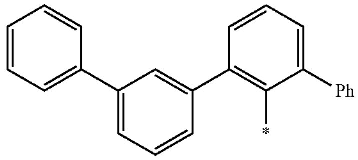
10-107
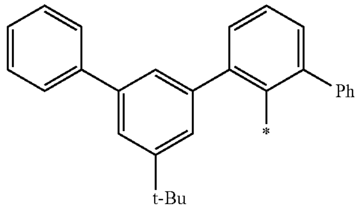

-continued
10-108
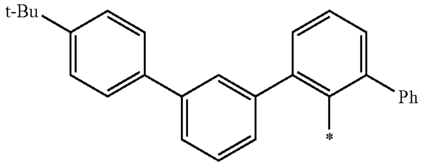
10-109
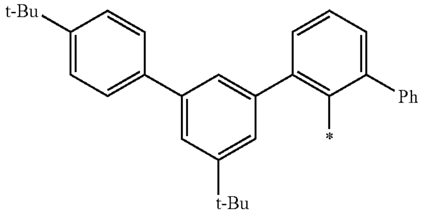
10-110
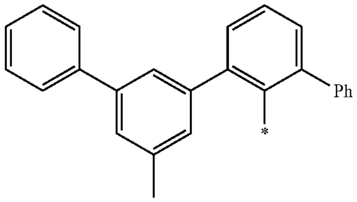
10-111
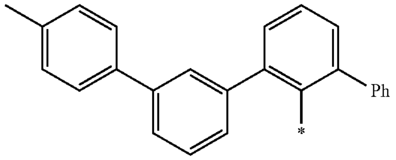
10-112
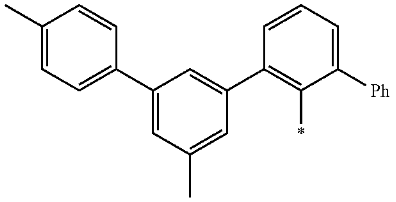
10-113
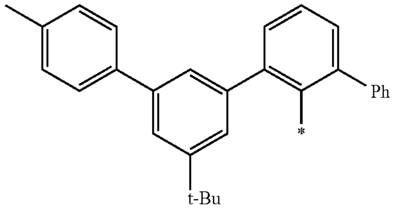
10-114
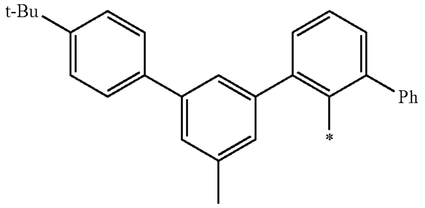
10-115
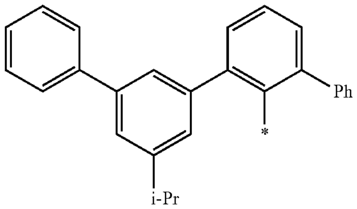
-continued
10-116
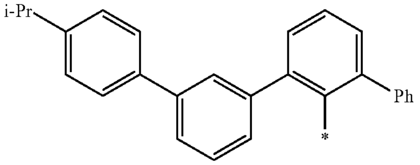
10-117
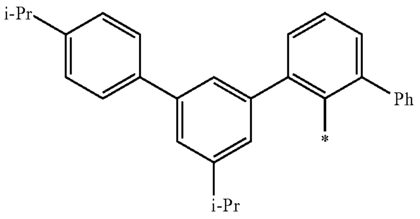
10-118
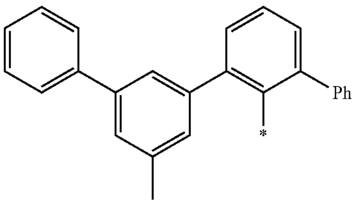
10-119
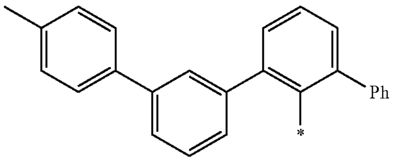
10-120
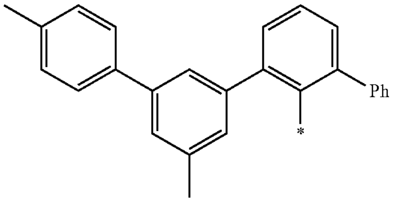
10-121
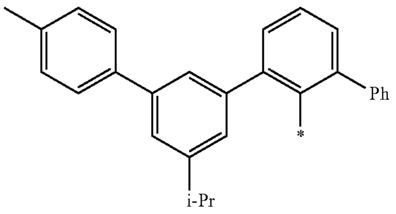
10-122
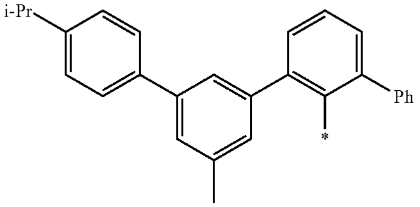

-continued 10-123

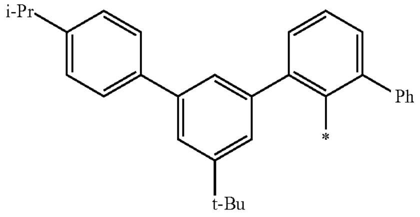

10-124

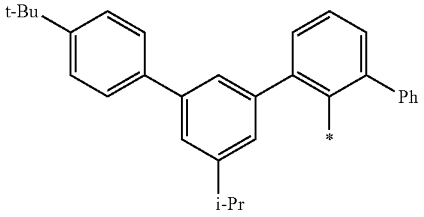

wherein in Formulae 10-1 to 10-124, i-Pr is an iso-propyl group, t-Bu is a t-butyl group, Ph is a phenyl group, and

* indicates a binding site to a neighboring atom.

12. The light-emitting device of claim 1, further comprising a capping layer on the second electrode, wherein the capping layer has a refractive index equal to or greater than about 1.6, with respect to a wavelength of about 589 nm.

13. The light-emitting device of claim 1, wherein the emission layer comprises a mixture of the first compound, the second compound, the third compound, and the fourth compound.

14. The light-emitting device of claim 1, wherein the emission layer comprises a first emission layer and a second emission layer, the first emission layer is between the first electrode and the second emission layer, the first emission layer comprises the first compound, the second compound, and a first dopant, the second emission layer comprises the first compound, the second compound, and a second dopant, the first dopant is one of the third compound and the fourth compound, and the second dopant is the other from among the third compound and the fourth compound.

15. The light-emitting device of claim 1, wherein the emission layer comprises a first emission layer, a second emission layer, and a third emission layer, the first emission layer is between the first electrode and the second emission layer, the second emission layer is between the first electrode and the third emission layer, the first emission layer comprises the first compound, the second compound, and a first dopant, the second emission layer comprises the first compound, the second compound, and a second dopant, the third emission layer comprises the first compound, the second compound, and a third dopant, the first dopant and the third dopant are each independently the third compound or the fourth compound, and the second dopant is the third compound or the fourth compound and is different from the first dopant.

16. The light-emitting device of claim 1, wherein at least one of the third compound and the fourth compound is non-uniformly doped in the emission layer.

17. An electronic apparatus comprising:

the light-emitting device of claim 1; and a thin-film transistor, wherein the thin-film transistor comprises a source electrode and a drain electrode, and the first electrode of the light-emitting device is electrically connected to the source electrode or the drain electrode.

18. A light-emitting device comprising:

a first electrode;

a second electrode facing the first electrode; and an interlayer between the first electrode and the second electrode and comprising an emission layer, wherein the emission layer comprises a host and a dopant, the host comprises a first compound and a second compound, the dopant comprises a third compound and a fourth compound, the first compound, the second compound, the third compound, and the fourth compound are different from each other, the third compound is a platinum-containing organometallic compound, the platinum-containing organometallic compound comprises platinum and a first ligand bonded to the platinum, the first ligand comprises a carbene group, carbon of the carbene group and the platinum are bonded together, and Expression 4 is satisfied:

$$0.05\ \text{eV} \le |\text{HOMO}(D1) - \text{HOMO}(D2)| \le 0.15\ \text{eV} \quad \text{[Expression 4]}$$

wherein in Expression 4,

HOMO(D1) is a highest occupied molecular orbital (HOMO) energy level (eV) of the third compound, HOMO(D2) is a HOMO energy level (eV) of the fourth compound, and HOMO(D1) and HOMO(D2) are each a negative value evaluated by a density functional theory (DFT) method, wherein the third compound is an organometallic compound represented by Formula 1

[Formula 1]

$M_1(L_{11})_{n11}(L_{12})_{n12}$, and

1D

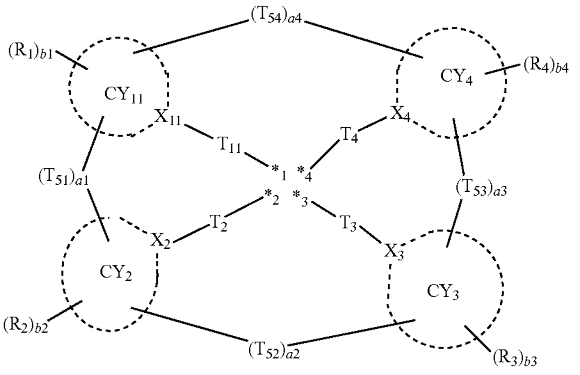

wherein in Formulae 1 and 1D, $M_1$ is platinum (Pt), $L_{11}$ is a ligand represented by Formula 1D, $L_{12}$ is a ligand, n11 is 1, n12 is 0, $X_2$ to $X_4$ are each independently nitrogen or carbon, $X_{11}$ is carbon, $CY_2$ to $CY_4$ and $CY_{11}$ are each independently a $C_5$-$C_{30}$ carbocyclic group or a $C_1$-$C_{30}$ heterocyclic group, $T_{51}$ to $T_{54}$ are each independently a single bond, *—O—*', *—S—*', *—C(═O)—*', *—S(═O)—*', *—C($R_5$)($R_6$)—*', *—C($R_5$)═C($R_6$)—*', *—C($R_5$) ═* *═C ═*', *—Si($R_5$)($R_6$)—*', *—B($R_5$)—*', *—N($R_5$)—* or * —P($R_5$)—*', a1 to a3 are each independently 1, 2, or 3, a4 is 0, 1, 2, or 3, when a4 in Formula 1D is 0, $CY_{11}$ and $CY_4$ are not linked together, $T_2$ to $T_4$ are each independently a chemical bond, *—O—*', *—S—*', *—N($R_7$)—*', *—B($R_7$)—*', *—P($R_7$)—*', *—C($R_7$)($R_8$)—*', Si($R_7$)($R_8$)—*', *—C(═O)—*, or *—C(═S)—*', $T_{11}$ is a coordinate bond, 1, *2, *3, and *4 each indicate a binding site to $M_1$, $R_1$ to $R_8$ are each independently hydrogen, deuterium, —F, —Cl, —Br, —I, a hydroxyl group, a cyano group, a nitro group, a $C_1$-$C_{60}$ alkyl group that is unsubstituted or substituted with at least one $R_{10a}$, a $C_2$-$C_{60}$ alkenyl group that is unsubstituted or substituted with at least one $R_{10a}$, a $C_2$-$C_{60}$ alkynyl group that is unsubstituted or substituted with at least one $R_{10a}$, a $C_1$-$C_{60}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, a $C_6$-$C_{60}$ aryloxy group that is unsubstituted or substituted with at least one $R_{10a}$, a $C_6$-$C_{60}$ arylthio group that is unsubstituted or substituted with at least one $R_{10a}$, a $C_7$-$C_{60}$ aryl alkyl group that is unsubstituted or substituted with at least one $R_{10a}$, a $C_2$-$C_{60}$ heteroaryl alkyl group that is unsubstituted or substituted with at least one $R_{10a}$, —C($Q_1$)($Q_2$)($Q_3$), —Si($Q_1$)($Q_2$)($Q_3$), —N($Q_1$)($Q_2$), —B($Q_1$)($Q_2$), —C(═O)($Q_1$), —S(═O)$_2$($Q_1$), or —P(═O)($Q_1$)($Q_2$), b1 to b4 are each independently an integer from 0 to 10, two or more adjacent groups of $R_1$ to $R_8$ and $T_{51}$ to $T_{54}$ are optionally bonded together to form a $C_5$-$C_{60}$ carbocyclic group that is unsubstituted or substituted with at least one $R_{10a}$ or a $C_1$-$C_{60}$ heterocyclic group that is unsubstituted or substituted with at least one $R_{10a}$, $R_{10a}$ is:

deuterium, —F, —$C_1$, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), —P(═O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), —P(═O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), or —P(═O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently; hydrogen; deuterium; —F; —Cl; —Br; —I ; a hydroxyl group; a cyano group; a nitro group; or a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

19. A light-emitting device comprising:

a first electrode;

a second electrode facing the first electrode; and an interlayer between the first electrode and the second electrode and comprising an emission layer, wherein the emission layer comprises a host and a dopant, the host comprises a first compound and a second compound, the dopant comprises a third compound and a fourth compound, the first compound, the second compound, the third compound, and the fourth compound are different from each other, the third compound is a platinum-containing organometallic compound, the platinum-containing organometallic compound comprises platinum and a first ligand bonded to the platinum, the first ligand comprises a carbene group, the carbon of the carbene group and the platinum are bonded together, and Expression 1 is satisfied:

$$HOMO(H1)|-|HOMO(D1)|\leq 0.3\ eV \quad \text{[Expression 1]}$$

wherein in Expression 1,

HOMO(D1) is a highest occupied molecular orbital (HOMO) energy level (eV) of the third compound, HOMO(H1) is a HOMO energy level (eV) of the first compound, and HOMO(D1) and HOMO(H1) are each a negative value evaluated by a density functional theory (DFT) method, wherein the first compound is a compound including at least one Si atom.

* * * * *